(12) United States Patent
Yamazaki et al.

(10) Patent No.: US 10,002,886 B2
(45) Date of Patent: Jun. 19, 2018

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Tokyo (JP); Yoshinori Ando, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days. days.

(21) Appl. No.: 15/485,371

(22) Filed: Apr. 12, 2017

(65) Prior Publication Data

US 2017/0221931 A1 Aug. 3, 2017

Related U.S. Application Data

(62) Division of application No. 14/579,249, filed on Dec. 22, 2014, now Pat. No. 9,627,418.

(30) Foreign Application Priority Data

| Dec. 26, 2013 | (JP) | 2013-269090 |
| Dec. 26, 2013 | (JP) | 2013-269129 |
| Jan. 17, 2014 | (JP) | 2014-006675 |

(51) Int. Cl.
*H01L 29/10* (2006.01)
*H01L 29/12* (2006.01)
(Continued)

(52) U.S. Cl.
CPC ...... *H01L 27/1225* (2013.01); *H01L 27/1251* (2013.01); *H01L 27/1255* (2013.01);
(Continued)

(58) Field of Classification Search
USPC ..... 257/57, 59, 83, 257, 290, 351, 368, 392, 257/66, 72, 252–254, 258; 438/30, 48,
(Continued)

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| CN | 101335273 A | 12/2008 |
| CN | 102543865 A | 7/2012 |

(Continued)

OTHER PUBLICATIONS

Coates.D et al., "Optical Studies of the Amorphous Liquid-Cholesteric Liquid Crystal Transitions:The "Blue Phase"", Physics Letters, Sep. 10, 1973, vol. 45A, No. 2, pp. 115-116.

(Continued)

*Primary Examiner* — Tram H Nguyen
(74) *Attorney, Agent, or Firm* — Fish & Richardson P.C.

(57) ABSTRACT

Disclosed is a semiconductor device having a first transistor and a second transistor over the first transistor. The first transistor includes a first semiconductor, and the second transistor includes an oxide semiconductor that is different from the first semiconductor. A gate of the first transistor is electrically connected to a source or drain electrode of the second transistor. The second transistor has a semiconductor layer including the oxide semiconductor over the source and drain electrodes and a gate electrode over the semiconductor layer with an insulating layer therebetween.

16 Claims, 66 Drawing Sheets

(51) Int. Cl.
  *H01L 27/12* (2006.01)
  *H01L 29/786* (2006.01)
  *H01L 29/66* (2006.01)
(52) U.S. Cl.
  CPC .... *H01L 27/1259* (2013.01); *H01L 29/66969* (2013.01); *H01L 29/7869* (2013.01); *H01L 29/78648* (2013.01); *H01L 29/78696* (2013.01)
(58) Field of Classification Search
  USPC ................ 438/128, 149, 151, 157, 161, 283
  See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,884,360 B2 | 2/2011 | Takechi et al. |
| 8,237,166 B2 | 8/2012 | Kumomi et al. |
| 8,354,674 B2 | 1/2013 | Kimura |
| 8,420,442 B2 | 4/2013 | Takechi et al. |
| 8,547,771 B2 | 10/2013 | Koyama |
| 8,772,130 B2 | 7/2014 | Ohki |
| 8,889,480 B2 | 11/2014 | Takechi et al. |
| 9,007,090 B2 | 4/2015 | Takemura |
| 9,627,418 B2* | 4/2017 | Yamazaki ........... H01L 27/1251 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0002590 A1 | 1/2009 | Kimura |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0193785 A1 | 8/2010 | Kimura |
| 2011/0097844 A1 | 4/2011 | Takechi et al. |
| 2011/0215326 A1* | 9/2011 | Godo ................. H01L 27/1225 257/57 |
| 2012/0319102 A1* | 12/2012 | Yamazaki ........... H01L 29/7869 257/43 |
| 2012/0327032 A1* | 12/2012 | Jeon ................. H01L 27/14609 345/175 |
| 2013/0009219 A1* | 1/2013 | Yamazaki ........... H01L 29/7869 257/288 |
| 2013/0052799 A1 | 2/2013 | Ohki |
| 2013/0237012 A1 | 9/2013 | Takechi et al. |
| 2013/0293266 A1 | 11/2013 | Takemura |
| 2013/0320334 A1* | 12/2013 | Yamazaki ........... H01L 29/7869 257/43 |
| 2014/0097867 A1 | 4/2014 | Koyama |
| 2014/0138675 A1* | 5/2014 | Yamazaki ......... H01L 29/66757 257/43 |
| 2015/0056747 A1 | 2/2015 | Takechi et al. |
| 2017/0263775 A1* | 9/2017 | Yamazaki ......... H01L 29/66969 |
| 2017/0288063 A1* | 10/2017 | Yamazaki ........... H01L 29/7869 |
| 2017/0309751 A1* | 10/2017 | Yamazaki ........... H01L 29/7869 |
| 2017/0323978 A1* | 11/2017 | Tokunaga ......... H01L 27/14616 |

FOREIGN PATENT DOCUMENTS

| | | |
|---|---|---|
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |

(56) References Cited

FOREIGN PATENT DOCUMENTS

| JP | 63-215519 A | 9/1988 |
|---|---|---|
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2008-042088 A | 2/2008 |
| JP | 2009-033145 A | 2/2009 |
| JP | 2010-161382 A | 7/2010 |
| JP | 2012-257187 A | 12/2012 |
| JP | 2013-021313 A | 1/2013 |
| JP | 2013-062499 A | 4/2013 |
| JP | 2013-165274 A | 8/2013 |
| JP | 2013-251893 A | 12/2013 |
| KR | 2014-0024866 A | 3/2014 |
| TW | 200917419 | 4/2009 |
| TW | 201234523 | 8/2012 |
| TW | 201303981 | 1/2013 |
| WO | WO-2004/114391 | 12/2004 |
| WO | WO-2012/172746 | 12/2012 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Costello.M et al., "Electron Microscopy of a Cholesteric Liquid Crystal and Its Blue Phase", Phys. Rev. A (Physcial Review. A), May 1, 1984, vol. 29, No. 5, pp. 2957-2959.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn Fe, Ni, Cu,or Zn] at Temperatures Over 1000° C.", Journal of solid State Chemistry, 1985, vol. 60, pp. 382-384.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Kitzerow.H et al., "Observation of Blue Phases in Chiral Networks", Liquid Crystals, 1993, vol. 14, No. 3, pp. 911-916.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (M=7, 8, 9 and 16) in the In2O3—ZnGa2O4—ZnO System", Journal of Solid State Chemistry, Apr. 1, 1995, vol. 116, No. 1, pp. 170-178.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Prins.M et al., "A Ferroelectric Transparent Thin-Film Transistor", Appl. Phys. Lett. (Applied Physics Letters) , Jun. 17, 1995, vol. 68, No. 25, pp. 3650-3652.
Li.C et al., "Modulated Structures of Homologous Compounds InMP3(ZnO)m (M=In,Ga; m=Integer) Described by Four-Dimensional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using CG-Silicon Technology", SID Digest '04 : SID International Symposium Digest of Technical Papers, 2003, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Lee.H et al., "Current Status of, Challenges to, and Perspective View of AM-OLED", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Park.S et al., "Challenge to Future Displays: Transparent AM-OLED Driven by PEALD Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "SUFTLA Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits, 2008, vol. 43. No. 1, pp. 292-299.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39. No. 1, pp. 1-4.
Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

(56) References Cited

OTHER PUBLICATIONS

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga Zn-Oxide TFT", SID International Symposium Digest of Technical Papers, May 31, 2009, vol. 40, pp. 184-187.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn-Oxide TFT", SID Digest '09 : SID International Symposium Digest of Technical Papers,. May 31, 2009, pp. 1110-1112.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaP3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters) , 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 15, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Teatment", Appl. Phys. Lett. (Applied Physics Letters) , Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N et al., "Crystallization and Reduction of SOL-GEL-Derived Zinc Oxide Films by Irradiation With Ultraviolet Lamp", Journal of SOL-GEL Science and Technology, 2003, vol. 26, pp. 181-184.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
International Search Report (Application No. PCT/IB2014/066993) dated Mar. 24, 2015.
Written Opinion (Application No. PCT/IB2014/066993) dated Mar. 24, 2015.

\* cited by examiner

FIG. 54A
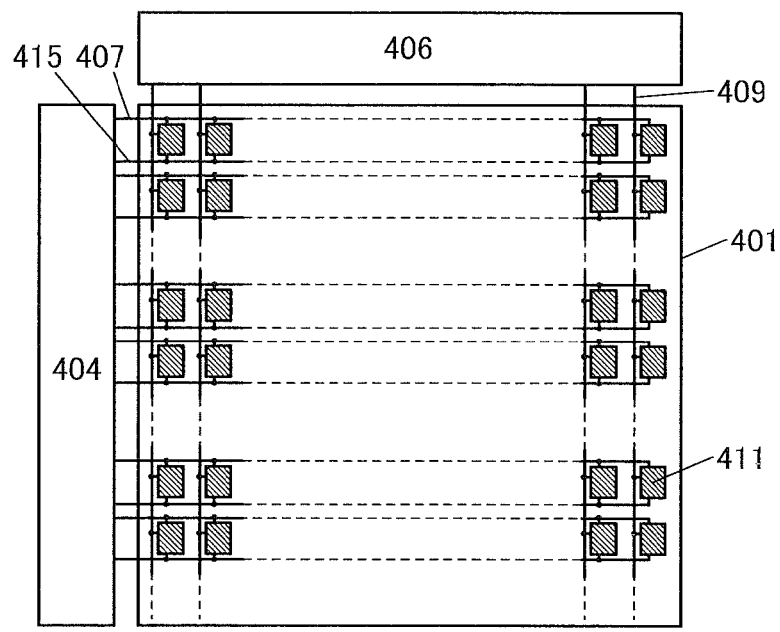
FIG. 54B
FIG. 54C
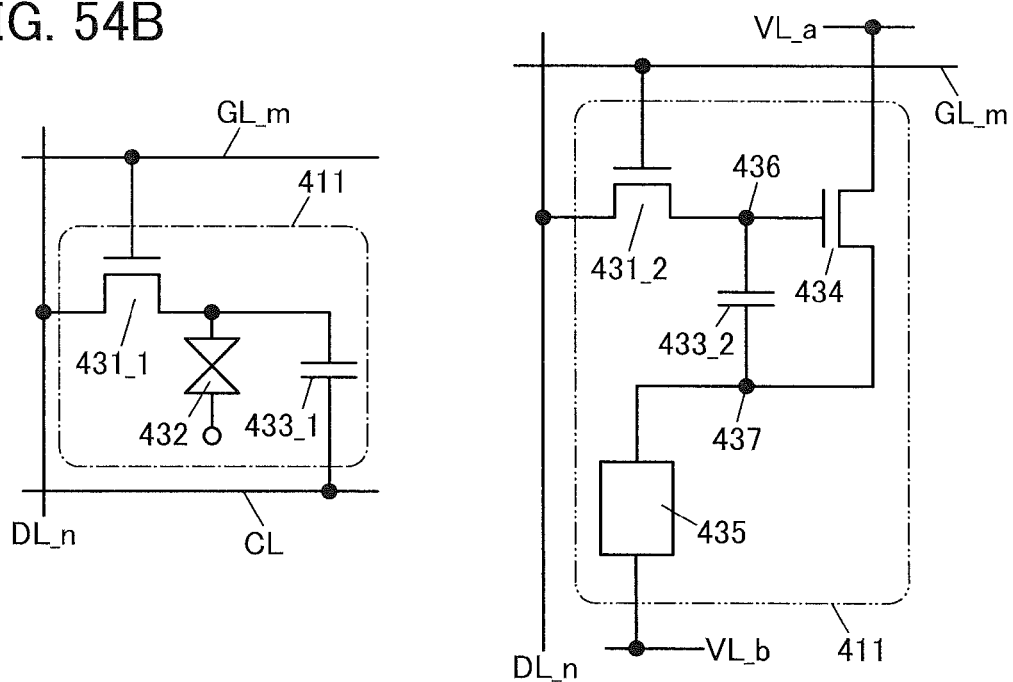

FIG. 60A
FIG. 60B
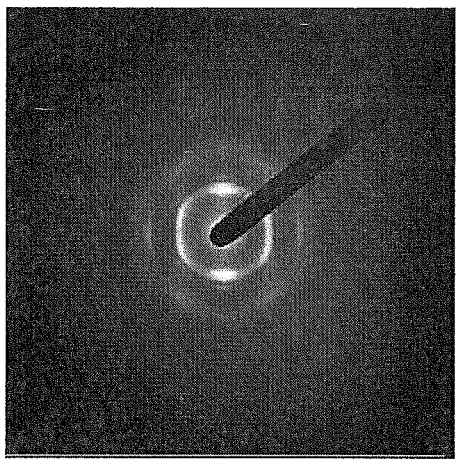
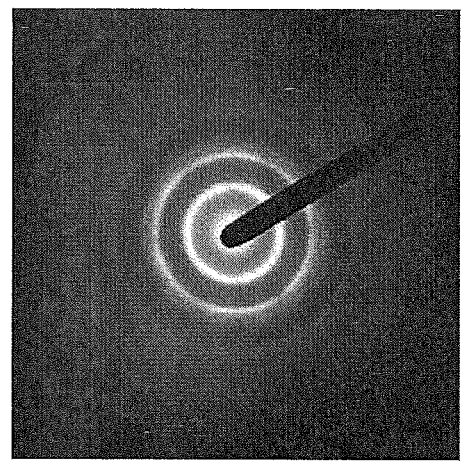

SEMICONDUCTOR DEVICE

CROSS-REFERENCE TO RELATED APPLICATIONS

This application is a divisional of U.S. application Ser. No. 14/579,249, filed Dec. 22, 2014, now allowed, which claims the benefit of foreign priority applications filed in Japan as Serial No. 2013-269090 on Dec. 26, 2013, Serial No. 2013-269129 on Dec. 26, 2013, and Serial No. 2014-006675 on Jan. 17, 2014, all of which are incorporated by reference.

TECHNICAL FIELD

One embodiment of the present invention relates to a semiconductor device. In particular, one embodiment of the present invention relates to a semiconductor device including an oxide semiconductor.

Note that one embodiment of the present invention is not limited to the above technical field. For example, one embodiment of the present invention relates to a memory device, a processor, a driving method thereof, or a manufacturing method thereof.

In this specification and the like, a semiconductor device generally means a device that can function by utilizing semiconductor characteristics. Thus, a semiconductor element such as a transistor or a diode and a semiconductor circuit are semiconductor devices. A display device, a light-emitting device, a lighting device, an electro-optical device, an electronic device, and the like may include a semiconductor element or a semiconductor circuit. Therefore, they may include a semiconductor device.

BACKGROUND ART

As silicon which is used as a semiconductor of a transistor, either amorphous silicon or polycrystalline silicon is used depending on the purpose. For example, in the case of a transistor included in a large-sized display device, it is preferred to use amorphous silicon, which can be formed using the established technique for forming a film on a large-sized substrate. In contrast, in the case of a transistor included in a high-performance display device where driver circuits are formed over the same substrate, it is preferred to use polycrystalline silicon, which can form a transistor having high field-effect mobility. As a method for forming polycrystalline silicon, high-temperature heat treatment or laser light treatment which is performed on amorphous silicon has been known.

In recent years, an oxide semiconductor has attracted attention. For example, a transistor which includes an amorphous oxide semiconductor containing indium, gallium, and zinc is disclosed (see Patent Document 1).

An oxide semiconductor can be formed by a sputtering method or the like, and thus can be used for a channel formation region of a transistor in a large-sized display device. A transistor including an oxide semiconductor has high field-effect mobility; therefore, a high-performance display device where driver circuits are formed over the same substrate can be obtained. In addition, there is an advantage that capital investment can be reduced because part of production equipment for a transistor including amorphous silicon can be retrofitted and utilized.

It is known that a transistor including an oxide semiconductor has an extremely low leakage current in an off state. For example, a low-power-consumption CPU utilizing the low leakage current of the transistor including an oxide semiconductor is disclosed (see Patent Document 2).

REFERENCE

Patent Document

[Patent Document 1] Japanese Published Patent Application No. 2006-165528

[Patent Document 2] Japanese Published Patent Application No. 2012-257187

DISCLOSURE OF INVENTION

An object of one embodiment of the present invention is to provide a transistor having high field-effect mobility. Another object is to provide a transistor having stable electrical characteristics. Another object is to provide a transistor with a small current that flows between a source and a drain in an off state (in a non-conduction state) (such a current is also referred to as an "off-state current" below). Another object is to provide a transistor with low power consumption. Another object is to provide a transistor with high reliability.

Another object is to provide a semiconductor device that occupies a small area. Another object is to provide a highly integrated semiconductor device. Another object is to provide a highly reliable semiconductor device.

Note that the descriptions of these objects do not disturb the existence of other objects. In one embodiment of the present invention, there is no need to achieve all of these objects. Other objects will be apparent from and can be derived from the description of the specification, the drawings, the claims, and the like.

One embodiment of the present invention is a semiconductor device including a first transistor and a second transistor. In the semiconductor device, the first transistor includes a first electrode, the second transistor includes a second electrode and a third electrode, and the first electrode is electrically connected to the third electrode. The second transistor includes a first semiconductor that is in contact with the third electrode, a second semiconductor that is in contact with the first semiconductor, and a third semiconductor that covers the second semiconductor. The second electrode overlaps with the first semiconductor, the second semiconductor, and the third semiconductor with an insulating layer positioned therebetween.

One embodiment of the present invention is a semiconductor device including a first transistor and a second transistor. In the semiconductor device, the first transistor includes a first electrode, the second transistor includes a second electrode, a third electrode, and a fourth electrode, and the first electrode is electrically connected to either the third electrode or the fourth electrode. The second transistor includes a first semiconductor over the third electrode and the fourth electrode, a second semiconductor over the first semiconductor, and a third semiconductor over the second semiconductor. The second electrode is positioned over the third semiconductor with an insulating layer positioned therebetween.

One embodiment of the present invention is a semiconductor device including a first electrode, a first insulating layer including an opening, a second insulating layer, a first semiconductor, a second semiconductor, a third semiconductor, a second electrode, and a third electrode. In the semiconductor device, the first insulating layer is positioned over the first electrode with the opening overlapping with the first electrode, the second insulating layer covers the opening, the first semiconductor is positioned over the second insulating layer, and the second electrode and the third electrode are positioned over the first semiconductor. The second semiconductor is positioned over the first semiconductor, the second electrode, and the third electrode, the third semiconductor is positioned over the second semiconductor, and the second semiconductor is covered with the third semiconductor.

One embodiment of the present invention is a semiconductor device including a first transistor and a second transistor. In the semiconductor device, the first transistor includes a first electrode, a first insulating layer including an opening, a second insulating layer, a first semiconductor, a second semiconductor, a third semiconductor, a second electrode, and a third electrode. The second transistor includes a fourth electrode and a fourth semiconductor. The first transistor includes the first insulating layer positioned over the first electrode with the opening overlapping with the first electrode, the second insulating layer covering the opening, the first semiconductor positioned over the second insulating layer, the second electrode and the third electrode positioned over the first semiconductor, the second semiconductor positioned over the first semiconductor, the second electrode, and the third electrode, and the third semiconductor positioned over the second semiconductor. The second semiconductor is covered with the third semiconductor.

One embodiment of the present invention is a semiconductor device including a first electrode, a second electrode, a third electrode, a first insulating layer, a second insulating layer, a first semiconductor, a second semiconductor, and a third semiconductor. In the semiconductor device, the first insulating layer includes an opening, the first insulating layer is positioned over the first electrode, the opening has a region overlapping with the first electrode, the second insulating layer is positioned over the opening, and the first semiconductor is positioned over the second insulating layer. The second electrode and the third electrode are positioned over the first semiconductor, the second semiconductor is positioned over the first semiconductor, the second electrode, and the third electrode, the third semiconductor is positioned over the second semiconductor, and the second semiconductor is covered with the third semiconductor.

One embodiment of the present invention is a semiconductor device including a first transistor and a second transistor. In the semiconductor device, the first transistor includes a first electrode, a second electrode, a third electrode, a first insulating layer, a second insulating layer, a first semiconductor, a second semiconductor, and a third semiconductor. The second transistor includes a fourth electrode and a fourth semiconductor. The first insulating layer includes an opening, the first insulating layer is positioned over the first electrode, the second insulating layer is positioned over the opening, and the first semiconductor is positioned over the second insulating layer. The second electrode and the third electrode are positioned over the first semiconductor, the second semiconductor is positioned over the first semiconductor, the second electrode, and the third electrode, the third semiconductor is positioned over the second semiconductor, and the second semiconductor is covered with the third semiconductor.

The first insulating layer may include a plurality of layers. The second insulating layer may include a plurality of layers.

Furthermore, the first insulating layer is preferably thicker than the second insulating layer.

A semiconductor included in the first transistor preferably has a different band gap than the second semiconductor.

An electron affinity of the first semiconductor and an electron affinity of the third semiconductor are preferably smaller than an electron affinity of the second semiconductor.

The first semiconductor, the second semiconductor, and the third semiconductor preferably include indium, gallium, or zinc. Moreover, the first semiconductor and the third semiconductor preferably include one or more kinds of metal elements included in the second semiconductor.

By using such materials, interface states are less likely to be generated at the interface between the first semiconductor and the second semiconductor and the interface between the second semiconductor and the third semiconductor.

Furthermore, it is preferable that a side surface of the second semiconductor is in contact with the third semiconductor. The first semiconductor, the second semiconductor, and the third semiconductor preferably include indium, gallium, or zinc. An electron affinity of the first semiconductor and an electron affinity of the third semiconductor are preferably smaller than an electron affinity of the second semiconductor.

Furthermore, the second semiconductor preferably has a different band gap than the fourth semiconductor. The fourth semiconductor is part of a crystalline semiconductor substrate.

As the first semiconductor, the second semiconductor, and the third semiconductor, an oxide semiconductor can be used, for example.

A transistor having high field-effect mobility can be provided. A transistor having stable electrical characteristics can be provided. A transistor with a small off-state current can be provided. A transistor with low power consumption can be provided. A transistor with high reliability can be provided.

A semiconductor device that occupies a small area can be provided. A highly integrated semiconductor device can be provided. A highly reliable semiconductor device can be provided.

Note that the description of these effects does not disturb the existence of other effects. One embodiment of the present invention does not necessarily have all of these effects. Other effects will be apparent from and can be derived from the description of the specification, the drawings, the claims, and the like.

BRIEF DESCRIPTION OF DRAWINGS

In the accompanying drawings:

FIG. 54A is a block diagram and FIGS. 54B and 54C are circuit diagrams each illustrating one embodiment of a semiconductor device;
FIGS. 60A and 60B show electron diffraction patterns of a CAAC-OS.

I. BEST MODE FOR CARRYING OUT THE INVENTION

Figure 1A:
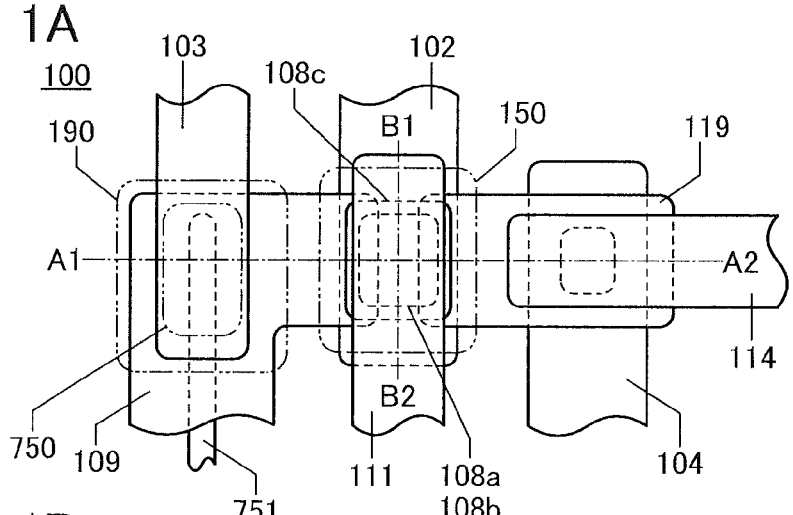
FIGS. 1A to 1C illustrate an example of a semiconductor device.

Embodiments will be described in detail with reference to drawings. Note that the present invention is not limited to the description below, and it is easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

The position, size, range, and the like of each component illustrated in the drawings and the like are not accurately represented in some cases to facilitate understanding of the invention. Therefore, the disclosed invention is not necessarily limited to the position, the size, the range, or the like disclosed in the drawings and the like. For example, in the actual manufacturing process, a resist mask or the like might be unintentionally reduced in size by treatment such as etching, which is not illustrated in some cases for easy understanding.

In a top view (also referred to as a plan view), some components might not be illustrated for easy understanding.

In this specification and the like, the term such as an "electrode" or a "wiring" does not limit a function of a component. For example, an "electrode" is used as part of a "wiring" in some cases, and vice versa. Further, the term "electrode" or "wiring" can also mean a combination of a plurality of "electrodes" and "wirings" formed in an integrated manner.

Note that the term "over" or "under" in this specification and the like does not necessarily mean that a component is placed "directly on and directly in contact with" another component or "directly below and directly in contact with" another component. For example, the expression "electrode B over insulating layer A" does not necessarily mean that the electrode B is on and in direct contact with the insulating layer A and can mean the case where another component is provided between the insulating layer A and the electrode B.

Furthermore, functions of a source and a drain might be switched depending on operation conditions, e.g., when a transistor having opposite polarity is employed or the direction of current flow is changed in circuit operation. Thus, it is difficult to define which is a source or a drain. Accordingly, the terms "source" and "drain" can be switched in this specification.

Note that in this specification and the like, the expression "electrically connected" includes the case where components are connected through an "object having any electric function". There is no particular limitation on an "object having any electric function" as long as electric signals can be transmitted and received between components that are connected through the object. Accordingly, even when the expression "electrically connected" is used in this specification, there is a case in which no physical connection is made and a wiring is just extended in an actual circuit.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly also includes the case where the angle is greater than or equal to 85° and less than or equal to 95.

In the specification and the like, the terms "identical", "the same", "equal", "uniform", and the like used in describing calculation values and actual measurement values allow for a margin of error of ±20% unless otherwise specified.

In this specification, in the case where an etching step is performed after a lithography process, a resist mask formed in the lithography process is removed after the etching step, unless otherwise specified.

A voltage usually refers to a potential difference between a given potential and a reference potential (e.g., a source potential or a ground potential (GND)). A voltage can be referred to as a potential and vice versa.

Note that a "semiconductor" may have characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Further, a "semiconductor" may have characteristics of a "conductor" in some cases when the conductivity is sufficiently high, for example. A "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of the semiconductor. For example, an element with a concentration of lower than 0.1 atomic % is an impurity. When an impurity is contained, the density of states (DOS) in a semiconductor may be increased, the carrier mobility may be decreased, or the crystallinity may be decreased. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is a silicon film, examples of an impurity which changes characteristics of the semiconductor include oxygen, Group 1 elements except hydrogen, Group 2 elements, Group 13 elements, and Group 15 elements.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. In addition, a term with an ordinal number in this specification and the like might be provided with a different ordinal number in a claim. Moreover, a term with an ordinal number in this specification and the like might not be provided with any ordinal number in a claim.

Note that in this specification, the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths are not necessarily the same in all regions. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths are not necessarily the same in all regions. In other words, the channel width of one transistor is not limited to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a channel with a three-dimensional structure (hereinafter referred to as a three-dimensional channel), an effective channel width is greater than an apparent channel width shown in a top view of the transistor, and this different causes unignorable influence in some cases. For example, in a miniaturized transistor having a three-dimensional channel, the proportion of a channel region formed in a side surface of a semiconductor is higher than the proportion of a channel region formed in a top surface of a semiconductor in some cases. In that case, an effective channel width is greater than an apparent channel width.

In a transistor having a three-dimensional channel, an effective channel width is difficult to measure in some cases. For example, to estimate an effective channel width from a design value, it is necessary to assume that the shape of a semiconductor is known. Therefore, in the case where the shape of a semiconductor cannot be determined accurately, it is difficult to measure an effective channel width accurately.

Therefore, an apparent channel width may be referred to as a "surrounded channel width (SCW)" in this specification and the like. Further, in this specification, in the case where the term "channel width" is simply used, it may denote a surrounded channel width or an apparent channel width. Alternatively, in this specification, in the case where the term "channel width" is simply used, it may denote an effective channel width in some cases. Note that a channel length, a channel width, an effective channel width, an apparent channel width, a surrounded channel width, and the like can be determined by analyzing a cross-sectional TEM image and the like.

Note that in the case where a field-effect mobility, a current value per channel width, and the like of a transistor are obtained by calculation, a surrounded channel width may be used for the calculation. In that case, they may be different from those calculated by using an effective channel width.

In this specification and the like, the trigonal and rhombohedral crystal systems are included in the hexagonal crystal system.

A. (Embodiment 1)

In this embodiment, a semiconductor device 100 of one embodiment of the present invention will be described with reference to drawings.

<Structure Example of Semiconductor Device>

Figure 1B:
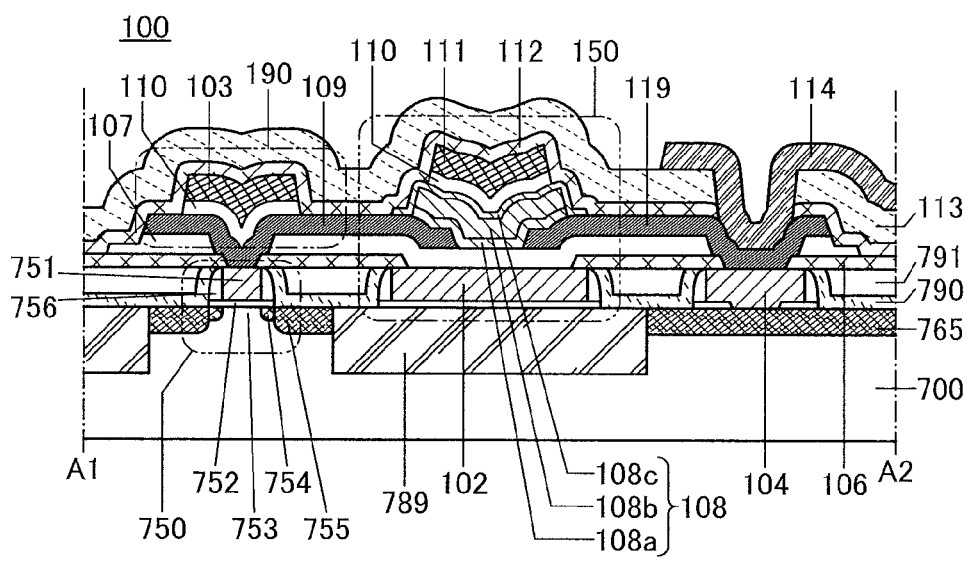
Figure 1C:
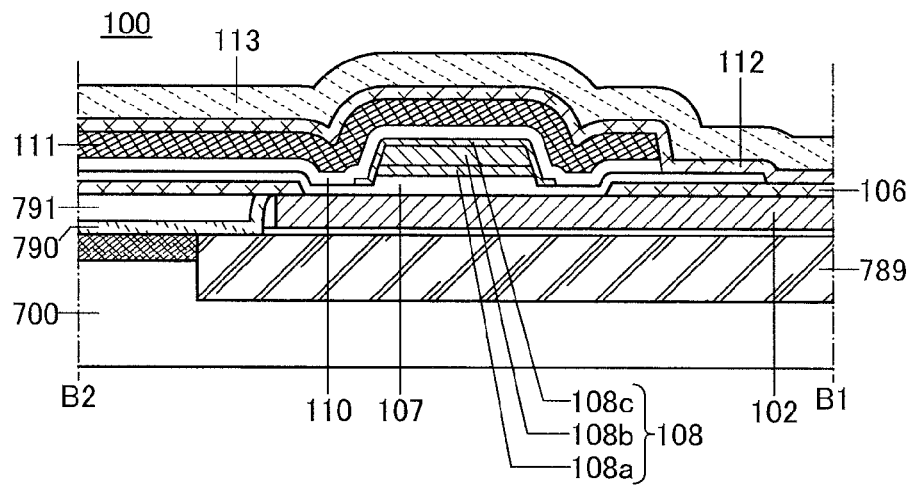

FIG. 1A is a top view of the semiconductor device 100. FIG. 1B is a cross-sectional view taken along dashed-dotted line A1-A2 in FIG. 1A. FIG. 1C is a cross-sectional view taken along dashed-dotted line B1-B2 in FIG. 1A. The semiconductor device 100 includes a transistor 750, a transistor 150, and a capacitor 190. FIG. 1B is a cross-sectional view of the transistor 150 in a channel length direction, and FIG. 1C is a cross-sectional view of the transistor 150 in a channel width direction.

[Transistor 750]

The transistor 750 included in the semiconductor device 100 is formed using a substrate 700. As the substrate 700, a single crystal semiconductor substrate or a polycrystalline semiconductor substrate of silicon or silicon carbide, a compound semiconductor substrate of silicon germanium, a silicon-on-insulator (SOI) substrate, or the like can be used. A transistor manufactured using a semiconductor substrate can operate at high speed.

In this embodiment, an example in which a p-type single crystal silicon substrate is used as the substrate 700 is described. The transistor 750 is a transistor whose channel is formed in the substrate 700. The transistor 750 includes a channel formation region 753, n-type impurity regions 754 functioning as lightly doped drain (LDD) regions or extension regions, n-type impurity regions 755 functioning as a source region and a drain region, an insulating layer 752, and an electrode 751. The electrode 751 serves as a gate electrode. The insulating layer 752 serves as a gate insulating layer. The n-type impurity regions 755 have a higher impurity concentration than the n-type impurity regions 754. A side surface of the electrode 751 is provided with a sidewall insulating layer 756. With the use of the electrode 751 and the sidewall insulating layer 756 as masks, the n-type impurity regions 754 and the n-type impurity regions 755 can be formed in a self-aligned manner.

The transistor 750 is separated from other transistors formed on the substrate 700 by an element separation region 789. An insulating layer 790 and an insulating layer 791 are formed around the electrode 751 and the sidewall insulating layer 756.

As the transistor 750, a transistor containing silicide (salicide) or a transistor which does not include a sidewall insulating layer may be used. When a structure that contains silicide (salicide) is used, resistance of the source region and the drain region can be further lowered and the speed of the semiconductor device is increased. Further, the semiconductor device can be operated at low voltage; thus, power consumption of the semiconductor device can be reduced.

Although not described in detail in this embodiment, an impurity element imparting n-type conductivity may be added to part of the substrate 700 to form an n-well, and a p-type transistor can be formed in a region where the n-well is formed. As the impurity element imparting n-type conductivity, phosphorus (P), arsenic (As), or the like can be used. As the impurity element imparting p-type conductivity, boron (B) or the like may be used.

[Transistor 150]

Figure 2A:
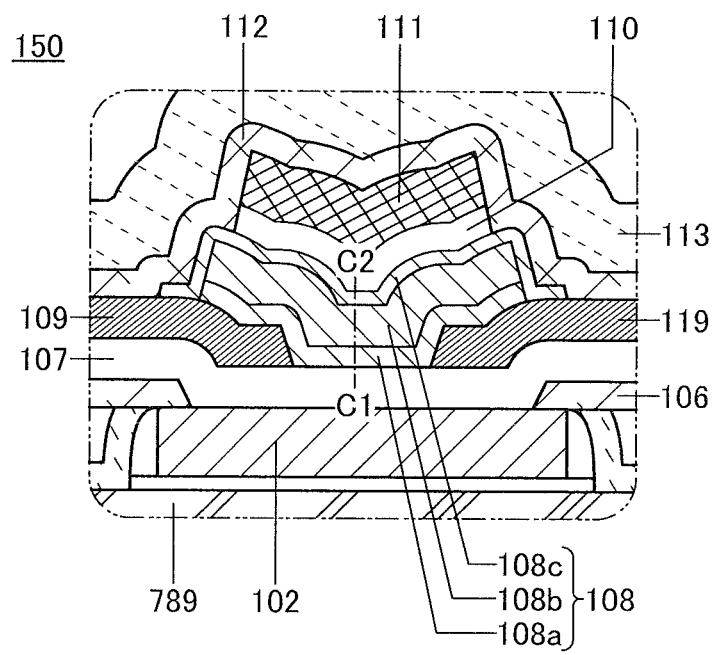
FIGS. 2A and 2B each illustrate an example of a semiconductor device.
Figure 3A:
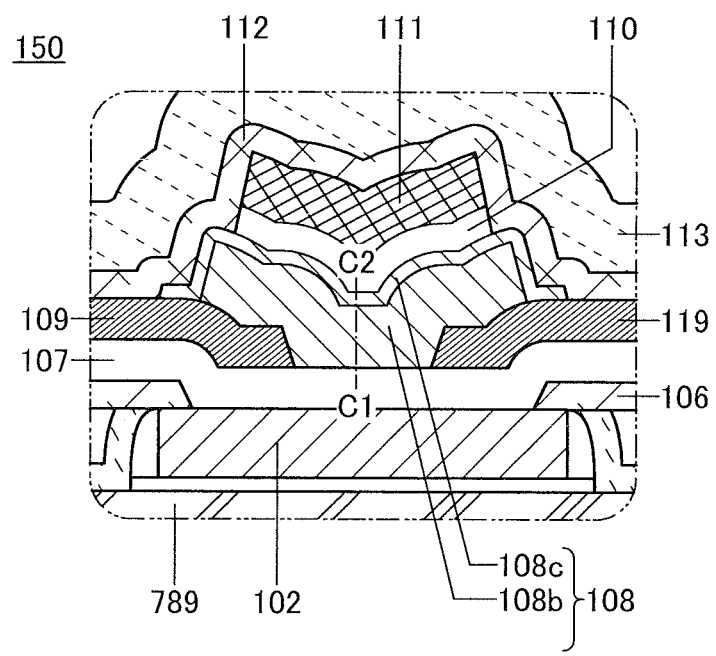
FIGS. 3A and 3B each illustrate an example of a semiconductor device.

The transistor 150 includes an electrode 102, an insulating layer 107, an electrode 109, an electrode 119, an oxide semiconductor layer 108 (an oxide semiconductor layer 108a, an oxide semiconductor layer 108b, and an oxide semiconductor layer 108c), an insulating layer 110, and an electrode 111. FIG. 2A is an enlarged view of the transistor 150 illustrated in FIG. 1B. Note that at least one of the oxide semiconductor layers 108a to 108c may be omitted from the oxide semiconductor layer 108, or another layer may be added to the oxide semiconductor layer 108. For example, the oxide semiconductor layer 108a may be omitted. FIG. 3A illustrates an example of that case.

An insulating layer 106 is formed over the insulating layer 791 so as to be in contact with part of the electrode 102, and the insulating layer 107 is formed over the insulating layer 106. Part of the insulating layer 107 is in contact with part of the electrode 102. The electrode 109 and the electrode 119 are formed over the insulating layer 107. The electrode 109 is electrically connected to the electrode 751 through an opening provided in the insulating layers 107 and 106. The electrode 119 is electrically connected to an electrode 104 through an opening provided in the insulating layers 107 and 106.

The oxide semiconductor layer 108a is formed over the electrodes 109 and 119 so as to be in contact with part of the insulating layer 107, and the oxide semiconductor layer 108b is formed over the oxide semiconductor layer 108a. The insulating layer 107 has a projection, and the oxide semiconductor layer 108a is formed over the projection (see FIGS. 1B and 1C). The oxide semiconductor layer 108c is formed to cover the oxide semiconductor layers 108a and 108b.

The electrode 111 is formed over the oxide semiconductor layer 108c with the insulating layer 110 provided therebetween. The electrode 111 overlaps at least each of the following: part of the oxide semiconductor layer 108b, part of the electrode 102, part of the electrode 109, and part of the electrode 119.

The electrodes 109 and 119 can function as a source electrode and a drain electrode.

The transistor 150 described as an example in this embodiment is a transistor which uses an oxide semiconductor for a semiconductor layer in which a channel is formed. The transistor 150 is of one kind of top-gate transistor and also one kind of staggered transistor. The transistor 150 includes a back gate electrode.

[Back Gate Electrode]

In general, the back gate electrode is formed using a conductive layer and positioned so that the channel formation region of the semiconductor layer is positioned between the gate electrode and the back gate electrode. Thus, the back gate electrode can function in a manner similar to that of the gate electrode. The potential of the back gate electrode may be the same as that of the gate electrode or may be a ground (GND) potential or an arbitrary potential. By changing a potential of the back gate electrode independently of the potential of the gate electrode, the threshold voltage of the transistor can be changed.

The electrodes 102 and 111 can both function as a gate electrode. Thus, the insulating layer 107 and the insulating layer 110 can both function as a gate insulating layer.

Note that in the case where one of the electrode 102 and the electrode 111 is referred to as a "gate electrode", the other is referred to as a "back gate electrode". For example, in the transistor 150, in the case where the electrode 111 is referred to as a "gate electrode", the electrode 102 is referred to as a "back gate electrode". In the case where the electrode 102 is used as a "gate electrode", the transistor 150 can be regarded as one kind of bottom-gate transistor. Furthermore, one of the electrode 102 and the electrode 111 may be referred to as a "first gate electrode", and the other may be referred to as a "second gate electrode".

By providing the electrode 102 and the electrode 111 so that the oxide semiconductor layer 108 is located therebetween, and by setting the potentials of the electrode 102 and the electrode 111 to be the same, a region of the oxide semiconductor layer 108 through which carriers flow is enlarged in the film thickness direction; thus, the transferred carriers is increased. As a result, the on-state current and field-effect mobility of the transistor 150 are increased.

Therefore, the transistor 150 has comparatively large on-state current in view of its area. That is, the area occupied by the transistor 150 can be small for required on-state current. With one embodiment of the present invention, the area occupied by a transistor can be reduced. Therefore, a semiconductor device having a high degree of integration can be provided.

The gate electrode and the back gate electrode are formed using conductive layers and thus each have a function of preventing an electric field generated outside the transistor from influencing the semiconductor layer in which the channel is formed.

Since the electrode 102 and the electrode 111 each have a function of blocking an outside electric field, charges of charged particles and the like generated on the substrate 700 side or above the electrode 111 do not influence the oxide semiconductor layer 108b. Therefore, degradation by a stress (degradation in a stress test such as a negative gate bias temperature (−GBT) stress test in which negative charges are applied to a gate) can be reduced, and variation of the threshold voltage by the drain voltage can be reduced. Note that this effect can be obtained when the electrodes 102 and 111 have the same potential or different potentials.

The BT stress test is one kind of accelerated test and can evaluate, in a short time, a change by long-term use (i.e., a change over time) in characteristics of transistors. The change in threshold voltage of the transistor between before and after the BT stress test is especially an important indicator when examining the reliability of the transistor. As the change in the threshold voltage is smaller, the transistor has higher reliability.

By providing the electrode 102 and the electrode 111 and setting the potentials of the electrode 102 and the electrode 111 to be the same, the change in threshold voltage is reduced. Accordingly, variation in electrical characteristics among a plurality of transistors is also reduced.

The transistor 150 including the back gate electrode has a small change in threshold voltage between before and after a +GBT stress test in which positive charges are applied to a gate.

In the case where light is incident on the back gate electrode side, when the back gate electrode is formed using a light-blocking conductive film, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

Note that the transistor 150 can be operated as long as either one of the electrodes 102 and 111 is included. Thus, in accordance with the purpose, formation of either one of the electrodes 102 and 111 may be omitted, in which case productivity of the semiconductor device can be increased.

[Energy Band Structure of Oxide Semiconductor Layer]

The oxide semiconductor layer 108 has a structure in which the oxide semiconductor layer 108a, the oxide semiconductor layer 108b, and the oxide semiconductor layer 108c are stacked.

The oxide semiconductor layer 108a, the oxide semiconductor layer 108b, and the oxide semiconductor layer 108c are each formed using a material including one or both of In and Ga. Typical examples are an In—Ga oxide (an oxide including In and Ga), an In—Zn oxide (an oxide including In and Zn), and an In-M-Zn oxide (an oxide including In, an element M, and Zn; the element M is one or plurality of metal elements selected from Al, Ti, Ga, Y, Zr, La, Ce, Nd, and Hf which have larger bonding strength to oxygen than In does).

The oxide semiconductor layer 108a and the oxide semiconductor layer 108c are preferably formed using a material including one or more kinds of metal elements included in the oxide semiconductor layer 108b. With the use of such a material, interface states at interfaces between the oxide semiconductor layer 108a and the oxide semiconductor layer 108b and between the oxide semiconductor layer 108c and the oxide semiconductor layer 108b are less likely to be generated. Accordingly, carriers are not likely to be scattered or captured at the interfaces, which results in an improvement in field-effect mobility of the transistor. Further, variation in threshold voltage of the transistor can be reduced. Thus, a semiconductor device having favorable electrical characteristics can be obtained.

The thicknesses of the oxide semiconductor layer 108a and the oxide semiconductor layer 108c are each greater than or equal to 3 nm and less than or equal to 100 nm, preferably greater than or equal to 3 nm and less than or equal to 50 nm. The thickness of the oxide semiconductor layer 108b is greater than or equal to 3 nm and less than or equal to 200 nm, preferably greater than or equal to 3 nm and less than or equal to 100 nm, further preferably greater than or equal to 3 nm and less than or equal to 50 nm.

When the oxide semiconductor layer 108b is an In-M-Zn oxide including In, M, and Zn at an atomic ratio of $x_2:y_2:z_2$ and each of the oxide semiconductor layer 108a and the oxide semiconductor layer 108c is an In-M-Zn oxide including In, M, and Zn at an atomic ratio of $x_1:y_1:z_1$, the oxide semiconductor layer 108a, the oxide semiconductor layer 108b, and the oxide semiconductor layer 108c can be arranged so that $y_1/x_1$ is larger than $y_2/x_2$. Preferably, the oxide semiconductor layer 108a, the oxide semiconductor layer 108c, and the oxide semiconductor layer 108b in which $y_1/x_1$ is 1.5 times or more as large as $y_2/x_2$ are selected. Still further preferably, the oxide semiconductor layer 108a, the oxide semiconductor layer 108c, and the oxide semiconductor layer 108b in which $y_1/x_1$ is 2 times or more as large as $y_2/x_2$ are selected. Still further preferably, the oxide semiconductor layer 108a, the oxide semiconductor layer 108c, and the oxide semiconductor layer 108b in which $y_1/x_1$ is 3 times or more as large as $y_2/x_2$ are selected. It is preferred that $y_1$ be larger than or equal to $x_1$ because the transistor can have stable electrical characteristics. However, when $y_1$ is three times or more as large as $x_1$, the field-effect mobility of the transistor is reduced; accordingly, $y_1$ is preferably smaller than three times $x_1$. When the oxide semiconductor layers 108a and 108c each have the above structure, each of the oxide semiconductor layers 108a and 108c can be a layer in which oxygen vacancy is less likely to be formed than in the oxide semiconductor layer 108b.

In the case of using an In-M-Zn oxide for the oxide semiconductor layers 108a and 108c, when Zn and O are eliminated from consideration, the atomic ratio between In and the element M is preferably as follows: the atomic percentage of In is less than 50 atomic % and the atomic percentage of the element M is greater than or equal to 50 atomic %; further preferably, the atomic percentage of In is less than 25 atomic % and the atomic percentage of the element M is greater than or equal to 75 atomic %. In the case of using an In-M-Zn oxide for the oxide semiconductor layer 108b, when Zn and O are eliminated from consideration, the atomic ratio between In and the element M is preferably as follows: the atomic percentage of In is greater than or equal to 25 atomic % and the atomic percentage of the element M is less than 75 atomic %; further preferably, the atomic percentage of In is greater than or equal to 34 atomic % and the atomic percentage of the element M is less than 66 atomic %.

For example, an In—Ga—Zn oxide which is formed using a target having an atomic ratio of In:Ga:Zn=1:3:2, 1:3:4, 1:3:6, 1:6:4, or 1:9:6 or an In—Ga oxide which is formed using a target having an atomic ratio of In:Ga=1:9 can be used for each of the oxide semiconductor layers 108a and 108c containing In or Ga. Further, an In—Ga—Zn oxide which is formed using a target having an atomic ratio of In:Ga:Zn=3:1:2, 1:1:1, or 5:5:6 can be used for the oxide semiconductor layer 108b. In each of the oxide semiconductor layers 108a, 108b, and 108c, the percentages of the atoms in the above atomic ratio vary within a range of 20% as an error.

In order to give stable electrical characteristics to the transistor including the oxide semiconductor layer 108b, it is preferable that impurities and oxygen vacancies in the oxide semiconductor layer 108b be reduced by highly purifying the oxide semiconductor layer 108b so that the oxide semiconductor layer 108b can be regarded as an intrinsic or substantially intrinsic semiconductor layer. Furthermore, it is preferable that at least the channel formation region of the oxide semiconductor layer 108b be regarded as an intrinsic or substantially intrinsic semiconductor layer.

Note that the substantially intrinsic oxide semiconductor layer refers to an oxide semiconductor layer in which the carrier density is higher than or equal to $1\times10^{-9}/cm^3$ and lower than $8\times10^{11}/cm^3$, preferably lower than $1\times10^{11}/cm^3$, further preferably lower than $1\times10^{10}/cm^3$.

Figure 4:
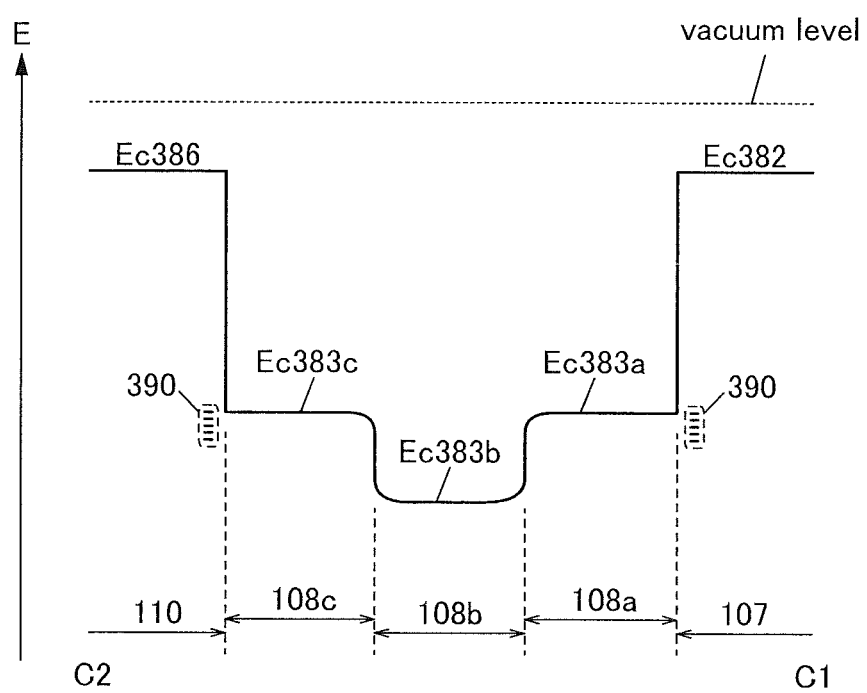
FIG. 4 shows an energy band structure.

A function and an effect of the oxide semiconductor layer 108 consisting of the oxide semiconductor layers 108a, 108b, and 108c are described using an energy band structure diagram of FIG. 4. FIG. 4 illustrates the energy band structure of a portion along dashed-dotted line C1-C2 in FIG. 2A. FIG. 4 illustrates the energy band structure of a channel formation region of the transistor 150.

In FIG. 4, Ec382, Ec383a, Ec383b, Ec383c, and Ec386 are the energies of the conduction band minimum in the insulating layer 107, the oxide semiconductor layer 108a, the oxide semiconductor layer 108b, the oxide semiconductor layer 108c, and the insulating layer 110, respectively.

Here, a difference in energy between the vacuum level and the conduction band minimum (this difference is also referred to as "electron affinity") corresponds to a value obtained by subtracting an energy gap from a difference in energy between the vacuum level and the valence band maximum (this difference is also referred to as an "ionization potential"). The energy gap can be measured using a spectroscopic ellipsometer (e.g., UT-300 manufactured by HORIBA JOBIN YVON SAS.). The difference in energy between the vacuum level and the valence band maximum can be measured using an ultraviolet photoelectron spectroscopy (UPS) device (e.g., VersaProbe manufactured by ULVAC-PHI, Inc.).

An In—Ga—Zn oxide which is formed using a target having an atomic ratio of In:Ga:Zn=1:3:2 has an energy gap of approximately 3.5 eV and an electron affinity of approximately 4.5 eV. An In—Ga—Zn oxide which is formed using a target having an atomic ratio of In:Ga:Zn=1:3:4 has an energy gap of approximately 3.4 eV and an electron affinity of approximately 4.5 eV. An In—Ga—Zn oxide which is formed using a target having an atomic ratio of In:Ga:Zn=1:3:6 has an energy gap of approximately 3.3 eV and an electron affinity of approximately 4.5 eV. An In—Ga—Zn oxide which is formed using a target having an atomic ratio of In:Ga:Zn=1:6:2 has an energy gap of approximately 3.9 eV and an electron affinity of approximately 4.3 eV. An In—Ga—Zn oxide which is formed using a target having an atomic ratio of In:Ga:Zn=1:6:8 has an energy gap of approximately 3.5 eV and an electron affinity of approximately 4.4 eV. An In—Ga—Zn oxide which is formed using a target having an atomic ratio of In:Ga:Zn=1:6:10 has an energy gap of approximately 3.5 eV and an electron affinity of approximately 4.5 eV. An In—Ga—Zn oxide which is formed using a target having an atomic ratio of In:Ga:Zn=1:1:1 has an energy gap of approximately 3.2 eV and an electron affinity of approximately 4.7 eV. An In—Ga—Zn oxide which is formed using a target having an atomic ratio of In:Ga:Zn=3:1:2 has an energy gap of approximately 2.8 eV and an electron affinity of approximately 5.0 eV.

Since the insulating layer 107 and the insulating layer 110 are insulators, Ec382 and Ec386 are closer to the vacuum level (have a smaller electron affinity) than Ec383$a$, Ec383$b$, and Ec383$c$.

Furthermore, Ec383$a$ is closer to the vacuum level than Ec383$b$. Specifically, Ec383$a$ is preferably located closer to the vacuum level than Ec383$b$ by 0.05 eV or more, 0.07 eV or more, 0.1 eV or more, or 0.15 eV or more and simultaneously by 2 eV or less, 1 eV or less, 0.5 eV or less, or 0.4 eV or less.

Furthermore, Ec383$c$ is closer to the vacuum level than Ec383$b$. Specifically, Ec383$c$ is preferably located closer to the vacuum level than Ec383$b$ by 0.05 eV or more, 0.07 eV or more, 0.1 eV or more, or 0.15 eV or more and simultaneously by 2 eV or less, 1 eV or less, 0.5 eV or less, or 0.4 eV or less.

In the vicinity of the interface between the oxide semiconductor layers 108$a$ and 108$b$ and the vicinity of the interface between the oxide semiconductor layers 108$b$ and 108$c$, mixed regions are formed; thus, the energy of the conduction band minimum continuously changes. In other words, no state or few states exist at these interfaces.

Accordingly, electrons transfer mainly through the oxide semiconductor layer 108$b$ in the stacked-layer structure having the above energy band structure. Therefore, even when an interface state exists at an interface between the oxide semiconductor layer 108$a$ and the insulating layer 107 or an interface between the oxide semiconductor layer 108$c$ and the insulating layer 110, the interface state hardly influences the transfer of the electrons. In addition, since no interface state or few interface states exist at the interface between the oxide semiconductor layer 108$a$ and the oxide semiconductor layer 108$b$ and the interface between the oxide semiconductor layer 108$c$ and the oxide semiconductor layer 108$b$, the transfer of electrons is not interrupted in the region. Accordingly, high field-effect mobility can be obtained in the transistor 150 having the above stacked-layer structure of the oxide semiconductor layers.

Note that although trap states 390 due to impurities or defects might be formed in the vicinity of the interface between the oxide semiconductor layer 108$a$ and the insulating layer 107 and in the vicinity of the interface between the oxide semiconductor layer 108$c$ and the insulating layer 110 as illustrated in FIG. 4, the oxide semiconductor layer 108$b$ can be spaced from the trap states owing to the existence of the oxide semiconductor layer 108$a$ and the oxide semiconductor layer 108$c$.

In the transistor 150 described in this embodiment, the side surfaces and the top surface of the oxide semiconductor layer 108$b$ are in contact with the oxide semiconductor layer 108$c$, and the bottom surface of the oxide semiconductor layer 108$b$ is in contact with the oxide semiconductor layer 108$a$. In this manner, the oxide semiconductor layer 108$b$ is surrounded by the oxide semiconductor layers 108$a$ and 108$c$, whereby the influence of the trap states can be further reduced.

However, in the case where an energy difference between Ec383$a$ or Ec383$c$ and Ec383$b$ is small, electrons in the oxide semiconductor layer 108$b$ might reach the trap states by overcoming the energy gap. The electrons are trapped by the trap states, which generates a negative fixed charge at the interface with the insulating layer, causing the threshold voltage of the transistor to be shifted in the positive direction.

Therefore, each of the energy differences between Ec383$a$ and Ec383$b$ and between Ec383$c$ and Ec383$b$ is preferably set to be larger than or equal to 0.1 eV, further preferably larger than or equal to 0.15 eV, in which case a change in the threshold voltage of the transistor can be reduced and the transistor can have favorable electrical characteristics.

The band gap of each of the oxide semiconductor layer 108$a$ and the oxide semiconductor layer 108$c$ is preferably wider than that of the oxide semiconductor layer 108$b$.

With one embodiment of the present invention, a transistor with a small variation in electrical characteristics can be provided. Accordingly, a semiconductor device with a small variation in electrical characteristics can be provided. With one embodiment of the present invention, a transistor with high reliability can be provided. Accordingly, a semiconductor device with high reliability can be provided.

An oxide semiconductor has a band gap of 2 eV or more; therefore, a transistor including an oxide semiconductor in a semiconductor layer in which a channel is formed has an extremely small off-state current. Specifically, the off-state current per micrometer of channel width at room temperature can be lower than $1 \times 10^{-20}$ A, lower than $1 \times 10^{-22}$ A, or lower than $1 \times 10^{-24}$ A. That is, the on/off ratio of the transistor can be greater than or equal to 20 digits and less than or equal to 150 digits.

With one embodiment of the present invention, a transistor with low power consumption can be provided. Accordingly, a semiconductor device with low power consumption can be provided.

Note that the above-described three-layer structure is an example. For example, a two-layer structure without either one of the oxide semiconductor layers 108$a$ and 108$c$ may be employed.

As illustrated in FIG. 1C, in the transistor 150 in the channel width direction, the electrode 111 covers the oxide semiconductor layer 108$b$. By the existence of the insulating layer 107 having the projection, the side surfaces of the oxide semiconductor layer 108$b$ can be covered with the electrode 111. That is, the transistor 150 has a structure in which the oxide semiconductor layer 108$b$ can be electrically surrounded by an electric field of the electrode 111 (a structure of a transistor in which a semiconductor is electrically surrounded by an electric field of a conductive film is referred to as a surrounded channel (s-channel) structure). Therefore, a channel can be formed in the entire oxide semiconductor layer 108$b$ (bulk). In the s-channel structure, the drain current of the transistor is increased, so that a larger amount of on-state current can be obtained. Furthermore, the entire channel formation region of the oxide semiconductor layer 108$b$ can be depleted by the electric field of the electrode 111. Accordingly, the off-state current of the transistor with an s-channel structure can be further reduced.

Figure 2B:
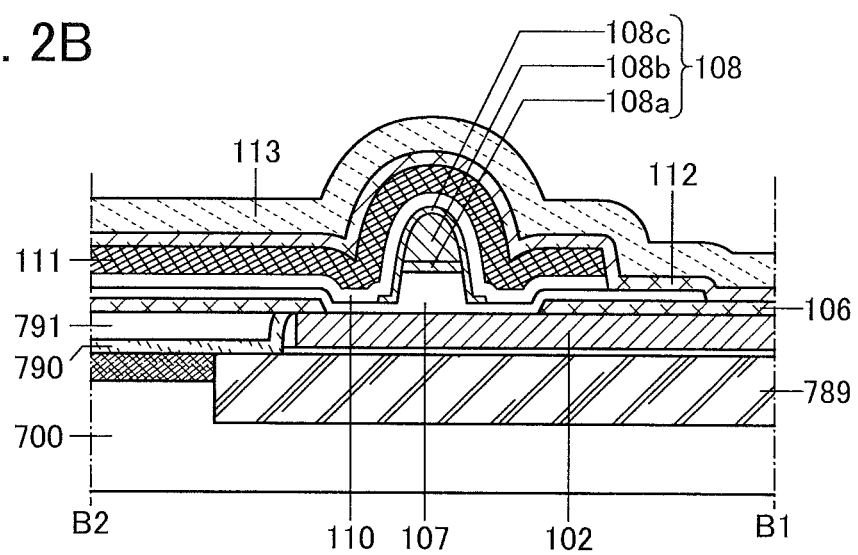
Figure 3B:
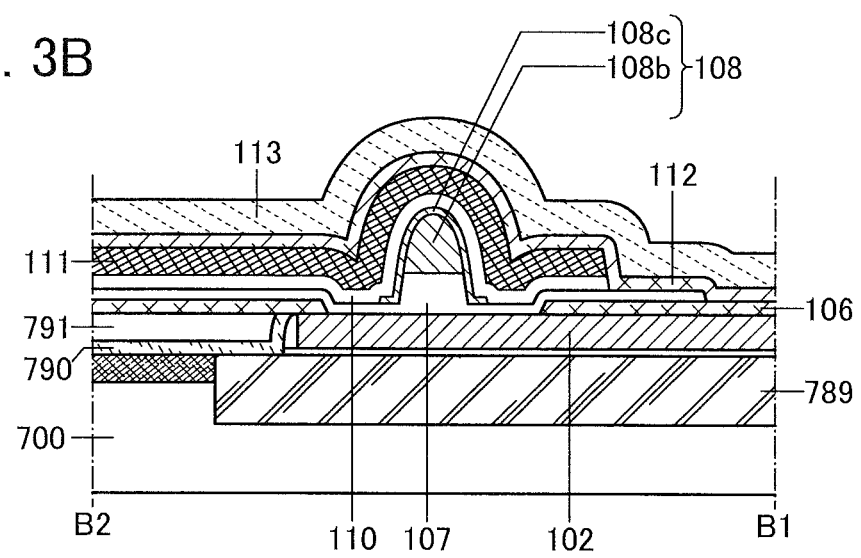

When the projection of the insulating layer 107 is increased in height, side surfaces of the oxide semiconductor layer 108$a$ are covered with the electrode 111, and the channel width is shortened as illustrated in FIG. 2B, the effects of the s-channel structure to increase the on-state current and reduce the off-state current can be enhanced. As illustrated in FIG. 3B, the oxide semiconductor layer 108a may be omitted.

[Capacitor 190]

The capacitor 190 includes the electrode 109, the insulating layer 110, and an electrode 103. In general, a capacitor has a structure in which a dielectric is sandwiched between two electrodes. In the capacitor 190, the insulating layer 110 functions as the dielectric, the electrode 109 functions as one of the electrodes, and the electrode 103 functions as the other electrode.

By overlapping the transistor 750 with the capacitor 190, the area occupied by the semiconductor device 100 can be reduced. Therefore, with one embodiment of the present invention, a semiconductor device having a high degree of integration can be provided.

Next, other components of the semiconductor device 100 will be described.

An insulating layer 112 and an insulating layer 113 are formed to cover the transistor 150 and the capacitor 190. An electrode 114 formed over the insulating layer 113 is electrically connected to the electrode 119 through an opening formed in the insulating layers 112 and 113.

The element separation region 789 can be formed by a shallow trench isolation (STI) method or a local oxidation of silicon (LOCOS) method. The STI method can reduce the generation of a bird's beak in an element isolation region, which is caused in the LOCOS element isolation method, and can reduce the size of the element isolation region. Thus, it is preferable to employ the STI method to form the element separation region 789.

The insulating layer 752 can be formed with a single-layer structure or a stacked-layer structure of an oxide insulating material such as silicon oxide or a nitride insulating material such as silicon nitride. The insulating layer 752 can be formed by a sputtering method, a CVD method, an evaporation method, a thermal oxidation method, or the like.

The electrodes 102 and 104 are formed using the same layer as the electrode 751. The electrodes 102, 104, and 751 are formed using a conductive material that can withstand heat treatment performed in a later step. In this embodiment, the electrodes 102, 104, and 751 are formed using n-type silicon.

The electrode 104 is connected to an n-type impurity region 765 through an opening provided in the insulating layer 752.

The sidewall insulating layer 756 can be formed by a known method using an oxide insulating material such as silicon oxide or a nitride insulating material such as silicon nitride.

The insulating layers 790 and 791 can be formed by a sputtering method, a CVD method, an evaporation method, a thermal oxidation method, or the like using an insulating material such as silicon oxide, silicon oxynitride, silicon nitride, silicon nitride oxide, gallium oxide, hafnium oxide, yttrium oxide, aluminum oxide, or aluminum oxynitride.

The insulating layer 106 is formed over the insulating layer 790, the insulating layer 791, the electrode 751, the electrode 102, and the electrode 104. The insulating layer 106 is preferably formed using an insulating film that has a function of preventing diffusion of impurities such as oxygen, hydrogen, water, an alkali metal, or an alkaline earth metal. Examples of the insulating film include silicon oxide, silicon oxynitride, silicon nitride, silicon nitride oxide, gallium oxide, hafnium oxide, yttrium oxide, aluminum oxide, aluminum oxynitride, and the like. When the insulating film is formed using silicon nitride, gallium oxide, hafnium oxide, yttrium oxide, aluminum oxide, or the like, diffusion of impurities from the substrate 700 side to the oxide semiconductor layer 108b can be reduced. Note that the insulating layer 106 can be formed by a sputtering method, a CVD method, an evaporation method, a thermal oxidation method, or the like. The insulating layer 106 can be formed with a single-layer structure or a stacked-layer structure of any of these materials.

For example, the insulating layer 107 can be formed with a single-layer structure or a stacked-layer structure using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide. The insulating layer 107 can be formed by a sputtering method, a CVD method, an evaporation method, a thermal oxidation method, or the like.

In the case where the insulating layer 107 is a stacked-layer film, films in the stacked-layer film may be formed by different formation methods. For example, the first layer may be formed by an MOCVD method and the second layer may be formed by a sputtering method. Alternatively, the first layer may be formed by an ALD method and the second layer may be formed by an MOCVD method. Alternatively, the first layer may be formed by an ALD method and the second layer may be formed by a sputtering method. Alternatively, the first layer may be formed by an ALD method, the second layer may be formed by a sputtering method, and the third layer may be formed by an ALD method. When films are formed by different formation methods as described above, the films can have different functions or different properties. Further, by stacking the films, a more appropriate film can be formed as a stacked-layer film.

The insulating layer 107 is preferably formed using an insulating layer containing oxygen at a higher proportion than oxygen in the stoichiometric composition. From such an insulating layer, part of oxygen is released by heating. A preferred example is an insulating layer of which the released oxygen converted into oxygen atoms is greater than or equal to $1.0 \times 10^{18}$ atoms/cm$^3$ or greater than or equal to $3.0 \times 10^{20}$ atoms/cm$^3$ in TDS analysis. Note that the temperature of the film surface in the TDS analysis is higher than or equal to 100° C. and lower than or equal to 700° C., or higher than or equal to 100° C. and lower than or equal to 500° C.

The electrode 103, the electrode 109, the electrode 111, the electrode 114, and the electrode 119 can be formed with a single-layer structure or a stacked-layer structure using any of metals such as aluminum, titanium, chromium, nickel, copper, yttrium, zirconium, molybdenum, manganese, silver, tantalum, and tungsten, or an alloy containing any of these metals as its main component. For example, a single-layer structure of a copper film containing manganese; a two-layer structure in which an aluminum film is stacked over a titanium film; a two-layer structure in which an aluminum film is stacked over a tungsten film; a two-layer structure in which a copper film is stacked over a copper-magnesium-aluminum alloy film; a two-layer structure in which a copper film is stacked over a titanium film; a two-layer structure in which a copper film is stacked over a tungsten film; a three-layer structure in which a titanium film or a titanium nitride film, an aluminum film or a copper film, and a titanium film or a titanium nitride film are stacked in this order; a three-layer structure in which a molybdenum film or a molybdenum nitride film, an aluminum film or a copper film, and a molybdenum film or a molybdenum nitride film are stacked in this order; a three-layer structure in which a tungsten film, a copper film, and a tungsten film are stacked in this order; and the like can be given. Alternatively, an alloy film or a nitride film in which aluminum and one or more elements selected from titanium, tantalum, tungsten, molybdenum, chromium, neodymium, and scandium are combined may be used.

Note that a conductive material containing oxygen such as indium tin oxide, zinc oxide, indium oxide including tungsten oxide, indium zinc oxide including tungsten oxide, indium oxide including titanium oxide, indium tin oxide including titanium oxide, indium zinc oxide, or indium tin oxide to which silicon oxide is added, or a conductive material containing nitrogen such as titanium nitride or tantalum nitride may be used. It is also possible to use a stacked-layer structure formed using a material containing the above metal element and conductive material containing oxygen. It is also possible to use a stacked-layer structure formed using a material containing the above metal element and conductive material containing nitrogen. It is also possible to use a stacked-layer structure formed using a material containing the above metal element, a conductive material containing oxygen, and a conductive material containing nitrogen.

Note that, as to the electrode 109 and the electrode 119, at least portions in contact with the oxide semiconductor layer 108 are preferably formed using a material that does not transmit oxygen such as titanium nitride, indium tin oxide, ruthenium oxide, or indium gallium zinc oxide including nitrogen.

The electrode 109 and the electrode 119 can be formed by a sputtering method, a CVD method, an evaporation method, or the like.

The insulating layer 110 can be formed using a material and a method that are similar to those of the insulating layer 107.

The insulating layer 112 is preferably formed using an insulating film that has a function of preventing diffusion of impurities such as oxygen, hydrogen, water, an alkali metal, or an alkaline earth metal. By forming the insulating layer 112 with such a material, diffusion of impurities to the oxide semiconductor layer 108 from the outside can be prevented. Diffusion of oxygen contained in the oxide semiconductor layer 108 to the outside can also be reduced. The insulating layer 112 can be formed using a material and a method that are similar to those of the insulating layer 106.

The semiconductor device 100 includes a region where the insulating layer 106 is in contact with the insulating layer 112. In FIG. 1B, a region where the insulating layer 106 is in contact with the insulating layer 112 is illustrated at both ends of the drawing. This structure can enhance the effect of preventing diffusion of impurities to the oxide semiconductor layer 108 from the outside. In addition, this structure can enhance the effect of preventing diffusion of oxygen contained in the oxide semiconductor layer 108 to the outside. With one embodiment of the present invention, a highly reliable semiconductor device can be provided.

The insulating layer 112 can be formed using a material and a method that are similar to those of the insulating layer 106. Note that the insulating layer 112 is not limited to an insulating layer which contains oxygen at a higher proportion than oxygen in the stoichiometric composition.

The electrode 114 can be formed using a material and a method that are similar to those of the electrodes 109 and 119.

A planarization insulating layer may be provided over the electrode 114 and the insulating layer 113. The planarization insulating layer can be formed using an organic material having heat resistance, such as a polyimide, an acrylic resin, a benzocyclobutene-based resin, a polyamide, or an epoxy resin. Other than such organic materials, it is possible to use a low-dielectric constant material (a low-k material), a siloxane-based resin, phosphosilicate glass (PSG), borophosphosilicate glass (BPSG), or the like. The planarization insulating layer may be formed by stacking a plurality of insulating films formed using these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or fluorine. The organic group may include fluorine.

There is no particular limitation on the method for forming the planarization insulating layer, and any of the following methods can be used depending on the material of the planarization insulating layer; a sputtering method; an SOG method; spin coating; dipping; spray coating; a droplet discharging method (e.g., an ink-jet method); a printing method (e.g., screen printing, or offset printing); or the like. When the baking step of the planarization insulating layer also serves as heat treatment for another layer, a semiconductor device can be manufactured efficiently.

[Film Formation Method]

A variety of films such as the metal films, the semiconductor films, and the inorganic insulating films can be formed by a sputtering method or a plasma CVD method, but such films may be formed by another method, e.g., a thermal chemical vapor deposition (CVD) method. A metal organic chemical vapor deposition (MOCVD) method or an atomic layer deposition (ALD) method may be employed as an example of the thermal CVD method.

A thermal CVD method has an advantage that no defect due to plasma damage is generated since it does not utilize plasma for film formation.

Deposition by a thermal CVD method may be performed in such a manner that a source gas and an oxidizer are supplied to the chamber at a time, the pressure in the chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the first source gas is introduced so that the source gases are not mixed, and then a second source gas is introduced. In the case where the first source gas and the inert gas are introduced at a time, the inert gas serves as a carrier gas, and the inert gas may also be introduced at the same time as the second source gas is introduced. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated a plurality of times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the metal films, the semiconductor films, and the inorganic insulating films which have been described in this embodiment can be formed by a thermal CVD method such as an MOCVD method or an ALD method. For example, in the case where an In—Ga—Zn—O film is formed, trimethylindium, trimethylgallium, and dimethylzinc are used. Without limitation to the above combination, triethylgallium can be used instead of trimethylgallium and diethylzinc can be used instead of dimethylzinc.

For example, in the case where a hafnium oxide film is formed with a deposition apparatus employing ALD, two kinds of gases, i.e., ozone ($O_3$) as an oxidizer and a source gas which is obtained by vaporizing liquid containing a solvent and a hafnium precursor (e.g., a alkoxide or a hafnium amide such as tetrakis(dimethylamide)hafnium are used. Examples of another material liquid include tetrakis(ethylmethylamide)hafnium.

For example, in the case where an aluminum oxide film is formed using a deposition apparatus employing ALD, two kinds of gases, e.g., $H_2O$ as an oxidizer and a source gas which is obtained by vaporizing liquid containing a solvent and an aluminum precursor (e.g., trimethylaluminum) are used. Examples of another material liquid include tris(dimethylamide)aluminum, triisobutylaluminum, and aluminum tris(2,2,6,6-tetramethyl-3,5-heptanedionate).

For example, in the case where a silicon oxide film is formed using a deposition apparatus employing ALD, hexachlorodisilane is adsorbed on a surface where a film is to be formed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced a plurality of times to form an initial tungsten film, and then a $WF_6$ gas and an $H_2$ gas are alternately introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas are sequentially introduced a plurality of times to form an In—O layer, a $Ga(CH_3)_3$ gas and an $O_3$ gas are alternately introduced to form a GaO layer, and then a $Zn(CH_3)_2$ gas and an $O_3$ gas are alternately introduced to form a ZnO layer. Note that the order of these layers is not limited to this example. A mixed compound layer such as an In—Ga—O layer, an In—Zn—O layer, or a Ga—Zn—O layer may be formed by using these gases. Note that although an $H_2O$ gas which is obtained by bubbling with an inert gas such as Ar may be used instead of an $O_3$ gas, it is preferable to use an $O_3$ gas which does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

<Example of Method for Manufacturing Semiconductor Device>

A method for manufacturing the semiconductor device 100 will be described with reference to FIGS. 5A to 5D, FIGS. 6A to 6D, FIGS. 7A to 7D, and FIGS. 8A to 8C. Note that FIGS. 5A to 5D, FIGS. 6A to 6D, FIGS. 7A to 7D, and FIGS. 8A to 8C correspond to cross-sectional views taken along dashed-dotted line A1-A2 in FIG. 1A.

First, the element separation region 789 is formed in the substrate 700 by an STI method. In this embodiment, n-type single crystal silicon is used as the substrate 700. Next, the transistor 750 is formed in part of the region except the element separation region 789. As the insulating layer 752, silicon oxide formed by a thermal oxidation method is used. As the electrode 751, n-type polycrystalline silicon formed by a CVD method is used. The electrode 102 and the electrode 104 can be formed at the same time as the electrode 751. Note that before the formation of the electrodes 751, 102, and 104, part of the insulating layer 752 is removed to form an opening 757. As the sidewall insulating layer 756, silicon oxynitride formed by a CVD method is used.

The n-type impurity regions 754 and the n-type impurity regions 755 can be formed by a known method such as an ion implantation method. The n-type impurity region 765 can be formed at the same time as the n-type impurity regions 755.

After the transistor 750 is formed, the insulating layer 790 containing hydrogen is formed to cover the transistor 750, the electrode 102, and the electrode 104. In this embodiment, silicon oxynitride containing hydrogen formed by a CVD method is used as the insulating layer 790. After the insulating layer 790 is formed, treatment for adding hydrogen to the insulating layer 790 may be performed. The treatment for adding hydrogen can be performed with an ion implantation apparatus, an ion doping apparatus, or a plasma treatment apparatus.

Next, the insulating layer 791 is formed over the insulating layer 790. In this embodiment, silicon oxynitride formed by a CVD method is used as the insulating layer 791.

Next, heat treatment for diffusing hydrogen contained in the insulating layer 790 to the transistor 750 to reduce defects due to dangling bonds or the like in the transistor 750 is performed. The heat treatment is performed at a temperature higher than or equal to 300° C. and lower than or equal to 800° C., preferably higher than or equal to 400° C. and lower than or equal to 700° C. The treatment time is shorter than or equal to 24 hours. Heat treatment for over 24 hours is not preferable because the productivity is reduced. By this heat treatment, defects due to dangling bonds or the like in the transistor 750 are reduced, and in addition hydrogen that is an impurity in an oxide semiconductor can be reduced.

There is no particular limitation on the heat treatment apparatus used for the heat treatment, and the apparatus may be provided with a device for heating an object by heat radiation or heat conduction from a heating element such as a resistance heating element. For example, an electric furnace, or a rapid thermal annealing (RTA) apparatus such as a lamp rapid thermal annealing (LRTA) apparatus or a gas rapid thermal annealing (GRTA) apparatus can be used. The LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas.

Next, chemical mechanical polishing (CMP) treatment is performed to expose surfaces of the electrodes 751, 102, and 104. By the CMP treatment, unevenness of the surfaces can be reduced, and coverage with an insulating layer or a conductive layer to be formed later can be increased (see FIG. 5A).

The heat treatment may be performed after the CMP treatment.

Next, the insulating layer 106 is formed to cover the insulating layer 790, the insulating layer 791, the electrode 751, the electrode 102, and the electrode 104. The insulating layer 106 preferably has a thickness of more than or equal to 10 nm and less than or equal to 200 nm, and further preferably more than or equal to 10 nm and less than or equal to 100 nm. In this embodiment, as the insulating layer 106, 50-nm-thick aluminum oxide is deposited by a sputtering method.

Figure 5A:
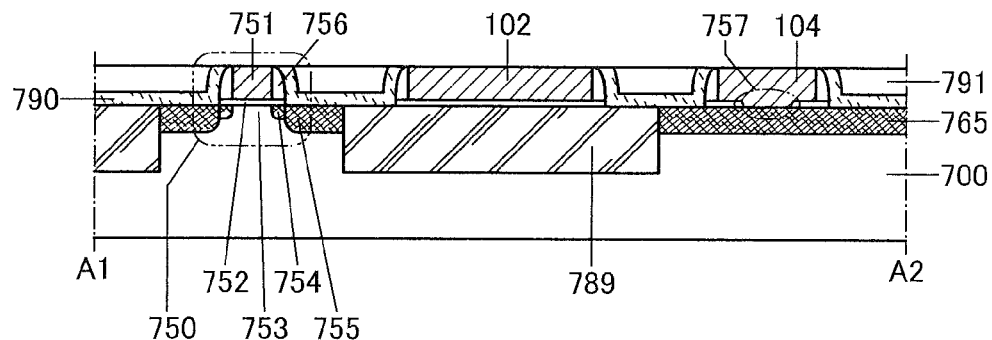
FIGS. 5A to 5D illustrate an example of a manufacturing process of a semiconductor device.
Figure 5B:
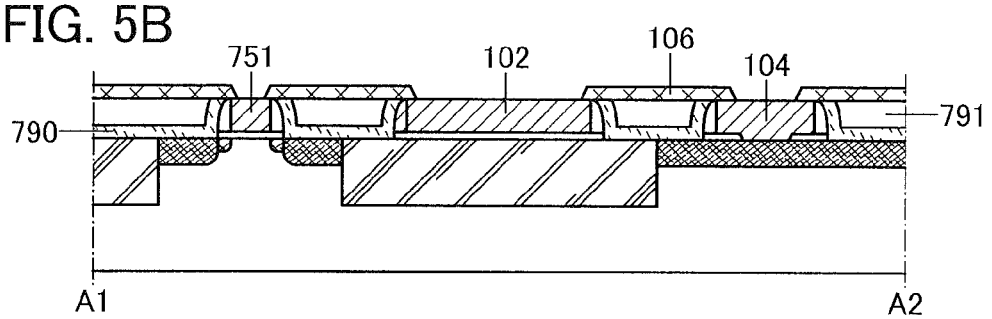
Figure 5C:
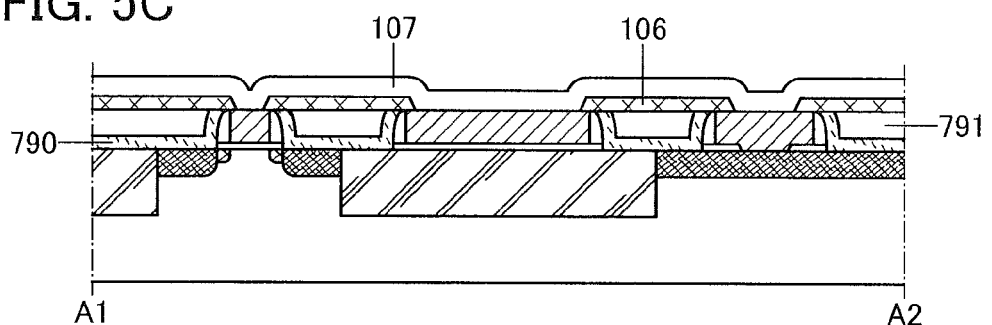

Next, part of the insulating layer 106 is selectively etched using a resist mask to expose the surfaces of the electrodes 751, 102, and 104 (see FIG. 5B).

The resist mask can be formed by a lithography method, a printing method, an inkjet method, or the like as appropriate. Formation of the resist mask by an inkjet method needs no photomask; thus, manufacturing cost can be reduced.

The insulating layer 106 may be etched by either one or both of a dry etching method and a wet etching method. After the etching of the insulating layer 106, the resist mask is removed.

Note that the heat treatment may be performed after the formation of the insulating layer 106.

Next, the insulating layer 107 is formed. The insulating layer 107 preferably has a thickness of more than or equal to 10 nm and less than or equal to 200 nm, and further preferably more than or equal to 10 nm and less than or equal to 100 nm. In this embodiment, as the insulating layer 107, 100-nm-thick silicon oxynitride containing oxygen at a higher proportion than oxygen in the stoichiometric composition is used. The insulating layer 107 can be formed by a CVD method (see FIG. 5C).

The insulating layer containing excess oxygen can be formed by performing treatment for adding oxygen to an insulating layer. The treatment for adding oxygen can be performed by heat treatment under an oxygen atmosphere or performed with an ion implantation apparatus, an ion doping apparatus, or a plasma treatment apparatus. As a gas for adding oxygen, an oxygen gas of $^{16}O_2$, $^{18}O_2$, or the like, a nitrous oxide gas, an ozone gas, or the like can be used. In this specification, the treatment for adding oxygen is also referred to as "oxygen doping treatment".

Figure 5D:
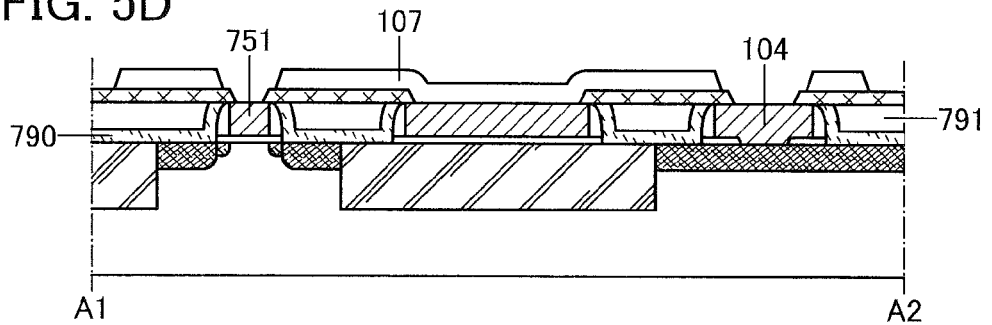

Next, part of the insulating layer 107 is selectively etched using a resist mask to expose the surfaces of the electrodes 751 and 104 (see FIG. 5D). The insulating layer 107 may be etched by either one or both of a dry etching method and a wet etching method.

Figure 6A:
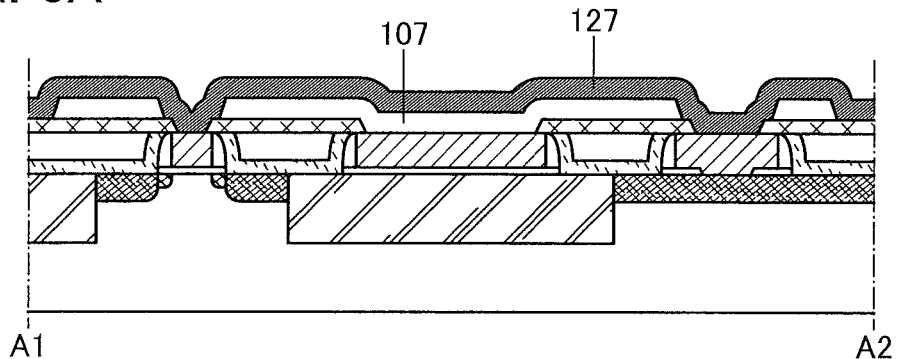
FIGS. 6A to 6D illustrate an example of a manufacturing process of a semiconductor device.

Next, a conductive layer 127 for forming the electrode 109 and the electrode 119 is formed over the insulating layer 107 (see FIG. 6A). In this embodiment, as the conductive layer 127, 100-nm-thick tungsten is deposited by a sputtering method.

Figure 6B:
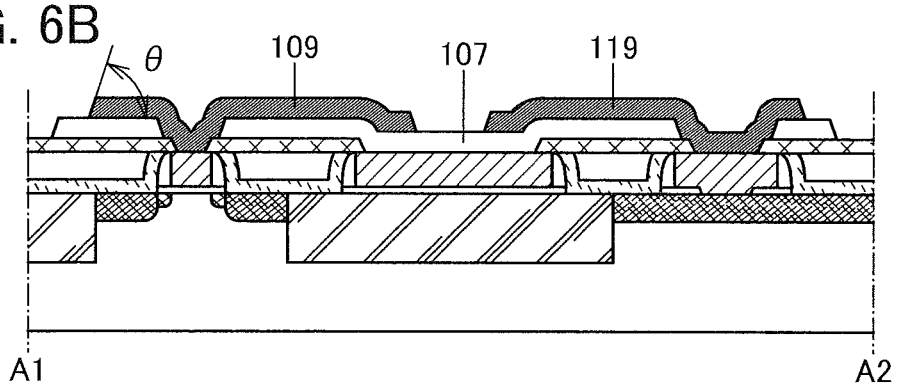
Figure 6C:
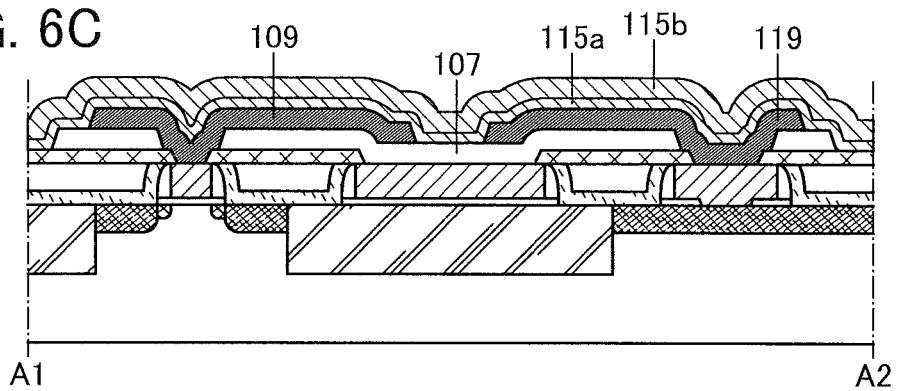
Figure 6D:
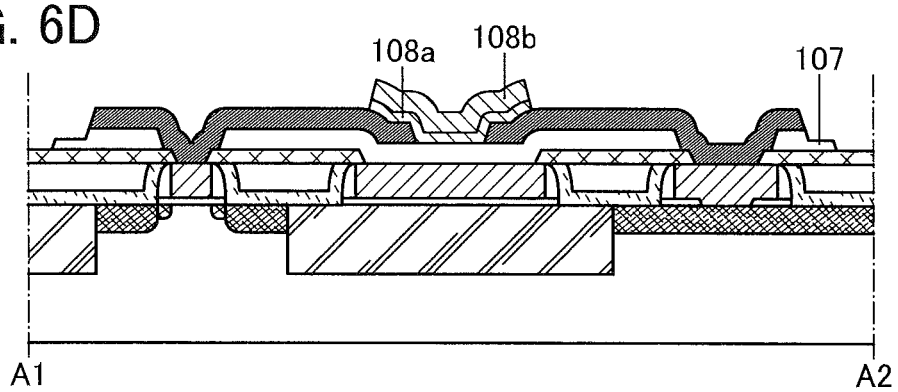

Next, part of the conductive layer 127 is selectively etched using a resist mask, so that the electrode 109 and the electrode 119 (including other electrodes and wirings formed using the same conductive layer) are formed (see FIG. 6B). The etching of the conductive layer 127 may be performed by a dry etching method, a wet etching method, or both of them.

Note that when a transistor having a very short channel length is formed, the electrodes 109 and 119 may be formed in such a manner that the resist mask is formed by a method suitable for thin line processing, such as an electron beam exposure, extreme ultraviolet (EUV) exposure, or a liquid immersion exposure, and then etching treatment is performed. Note that by the use of a positive type resist for the resist mask, the exposed region can be minimized and throughput can be thus improved. In this manner, a transistor having a channel length of 30 nm or less can be formed.

When the electrodes 109 and 119 (including other electrodes and wirings formed using the same conductive layer) each have an end portion with a tapered shaped, the coverage with a layer that covers side surfaces of the electrodes 109 and 119 can be improved. Specifically, the edge has a taper angle θ of 80° or less, preferably 60° or less, further preferably 45° or less. Note that the "taper angle" refers to an inclination angle formed by a side surface and a bottom surface of a layer having a taper shape when the layer is seen from the cross-section direction of the layer (i.e., the plane perpendicular to the surface of the substrate). A taper angle smaller than 90° is called forward tapered angle and a taper angle larger than 90° is called inverse tapered angle (see FIG. 6B).

When the cross-section of each of the end portions of the electrodes 109 and 119 (including other electrodes and wirings formed using the same conductive layer) has a step-like shape including a plurality of steps, the coverage with a layer that covers the electrodes 109 and 119 can be improved. The above description is not limited to the electrode 109 and the electrode 119, and by providing a forward taper shape or a step-like shape of the end portion of each layer, a phenomenon in that a layer formed to cover the end portion is cut (disconnection) at the end portion can be prevented, so that the coverage becomes favorable.

Next, an oxide semiconductor layer 115a for forming the oxide semiconductor layer 108a is formed over the insulating layer 107, the electrode 109, and the electrode 119. Furthermore, an oxide semiconductor layer 115b for forming the oxide semiconductor layer 108b is formed over the oxide semiconductor layer 115a.

The oxide semiconductor layers are each preferably formed by a sputtering method. As the sputtering method, an RF sputtering method, a DC sputtering method, an AC sputtering method, or the like can be used. In some cases, the DC sputtering method and the AC sputtering method can form a uniform film compared with the RF sputtering method.

In this embodiment, as the oxide semiconductor layer 115a, 20-nm-thick In—Ga—Zn oxide is deposited by a sputtering method using an In—Ga—Zn oxide target (In:Ga:Zn=1:3:2). As the oxide semiconductor layer 115b, 30-nm-thick In—Ga—Zn oxide is deposited by a sputtering method using an In—Ga—Zn oxide target (In:Ga:Zn=1:1:1) (see FIG. 6A). Note that the constituent elements and compositions applicable to the oxide semiconductor layer 115a and the oxide semiconductor layer 115b are not limited thereto.

The oxygen doping treatment may be performed after the formation of the oxide semiconductor layer 115a. The oxygen doping treatment may be performed after the formation of the oxide semiconductor layer 115b.

Next, a resist mask is formed over the oxide semiconductor layer 115b, and part of the oxide semiconductor layer 115a and part of the oxide semiconductor layer 115b are selectively etched using the resist mask, so that the oxide semiconductor layers 108a and 108b are formed. The insulating layer 107 is slightly etched in the region exposed by the etching of the oxide semiconductor layer 115a, so that the insulating layer 107 in that region is reduced in thickness. The etching depth in that region is preferably more than or equal to 20% and less than or equal to 50% of the original thickness of the insulating layer 107.

The oxide semiconductor layer 115a and the oxide semiconductor layer 115b may be etched by either one or both of a dry etching method and a wet etching method. After the etching, the resist mask is removed. In this manner, the insulating layer 107 having the projection can be formed (see FIG. 6D).

Next, heat treatment is preferably performed to reduce impurities such as moisture and hydrogen contained in the oxide semiconductor layers 108a and 108b and to purify the oxide semiconductor layers 108a and 108b.

For example, the oxide semiconductor layer 108a and the oxide semiconductor layer 108b are subjected to heat treatment in a reduced-pressure atmosphere, an inert gas atmosphere of nitrogen, a rare gas, or the like, an oxidizing gas atmosphere, or an ultra-dry air atmosphere (the moisture amount estimated by a dew point meter in a cavity ring down laser spectroscopy (CRDS) system is 20 ppm (−55° C. by conversion into a dew point) or less, preferably 1 ppm or less, further preferably 10 ppb or less). Note that the oxidizing atmosphere refers to an atmosphere including an oxidizing gas such as oxygen, ozone, or nitrogen oxide at 10 ppm or higher. The inert gas atmosphere refers to an atmosphere including the oxidizing gas at lower than 10 ppm and is filled with nitrogen or a rare gas.

By the heat treatment, in addition to the release of the impurities, diffusion of oxygen contained in the insulating layer 107 to the oxide semiconductor layers 108a and 108b occurs to reduce oxygen vacancies in the oxide semiconductor layers 108a and 108b. Note that the heat treatment may be performed in such a manner that heat treatment is performed in an inert gas atmosphere, and then another heat treatment is performed in an atmosphere containing an oxidizing gas at 10 ppm or more, 1% or more, or 10% or more. The heat treatment may be performed at any time after the oxide semiconductor layers 115a and 115b are formed.

The heat treatment is performed at a temperature higher than or equal to 250° C. and lower than or equal to 650° C., preferably higher than or equal to 300° C. and lower than or equal to 500° C. The treatment time is shorter than or equal to 24 hours. Heat treatment for over 24 hours is not preferable because the productivity is reduced.

In this embodiment, after heat treatment is performed at 450° C. in a nitrogen gas atmosphere for 1 hour, heat treatment is performed at 450° C. in an oxygen gas atmosphere for 1 hour.

Next, an oxide semiconductor layer 115c for forming the oxide semiconductor layer 108c is formed. In this embodiment, as the oxide semiconductor layer 115c, 5-nm-thick In—Ga—Zn oxide is deposited by a sputtering method using an In—Ga—Zn oxide target (In:Ga:Zn=1:3:2) (see FIG. 7A). Note that the constituent elements and compositions applicable to the oxide semiconductor layer 115c are not limited thereto.

Figure 7A:
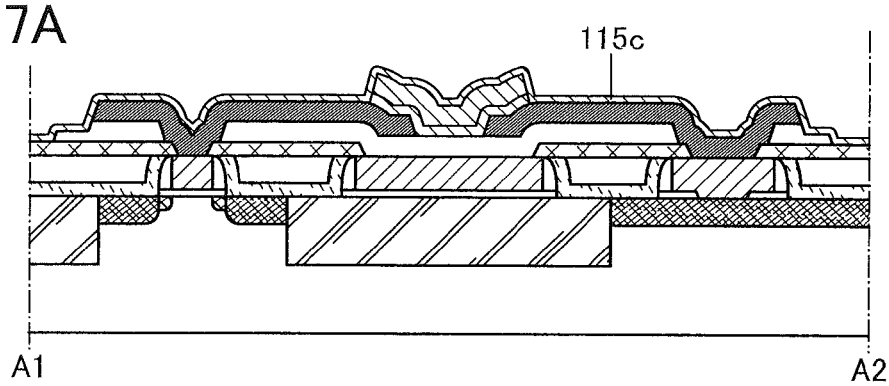
FIGS. 7A to 7D illustrate an example of a manufacturing process of a semiconductor device.
Figure 7B:
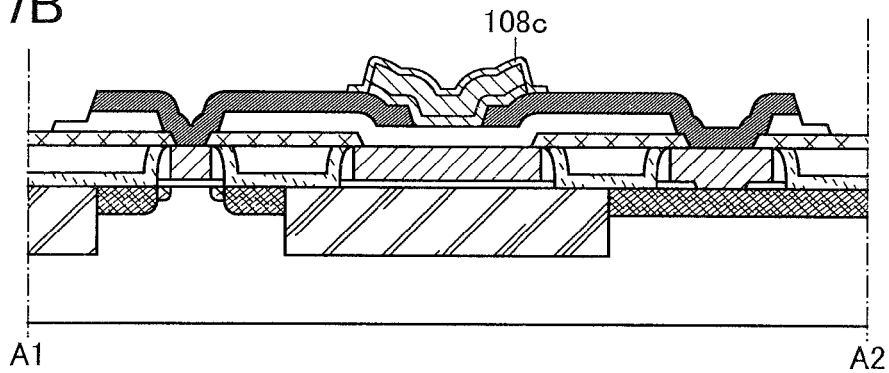
Figure 7C:
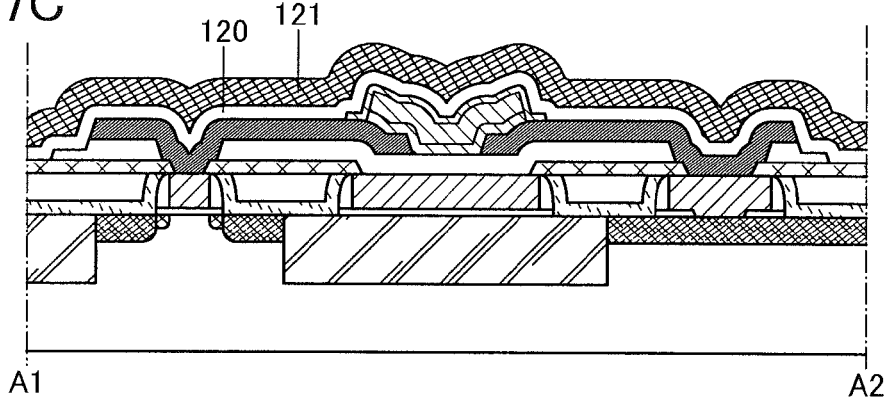
Figure 7D:
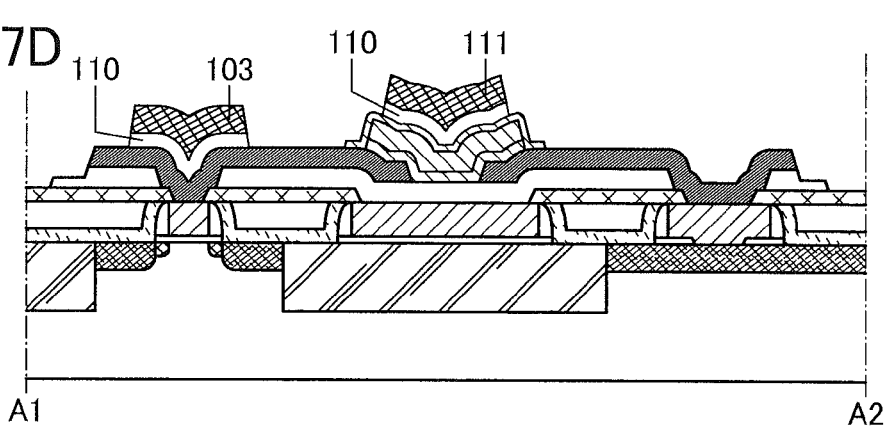

Then, part of the oxide semiconductor layer 115c is selectively etched using a resist mask, so that the oxide semiconductor layer 108c is formed (see FIG. 7B).

The oxide semiconductor layer 115c may be etched by either one or both of a dry etching method and a wet etching method. After the etching, the resist mask is removed.

Next, an insulating layer 120 for forming the insulating layer 110 is formed. In this embodiment, as the insulating layer 120, 20-nm-thick silicon oxynitride is deposited by a plasma CVD method (see FIG. 7C).

Then, a conductive layer 121 for forming the electrodes 103 and 111 is formed over the insulating layer 120. In this embodiment, the conductive layer 121 is formed by depositing 30-nm-thick tantalum nitride and 135-nm-thick tungsten by a sputtering method (see FIG. 7C).

Next, part of the conductive layer 121 is selectively etched using a resist mask, so that the electrode 103 and the electrode 111 (including other electrodes and wirings formed using the same conductive layer) are formed. The etching of the conductive layer may be performed by a dry etching method, a wet etching method, or both of them. After that, the resist mask is removed.

Next, part of the insulating layer 120 is etched using the electrode 103 and the electrode 111 as masks, so that the insulating layer 110 is formed. The etching of the insulating layer 120 may be performed with the resist mask used for etching the conductive layer 121 unremoved. Furthermore, the etching of the conductive layer 121 and the etching of the insulating layer 120 may be performed in the same etching step (see FIG. 7D).

In this manner, the transistor 750, the transistor 150, and the capacitor 190 are formed.

Next, the insulating layer 112 is formed. In this embodiment, 70-nm-thick aluminum oxide is formed as the insulating layer 112. After the formation of the insulating layer 112, oxygen doping treatment may be performed.

Figure 8A:
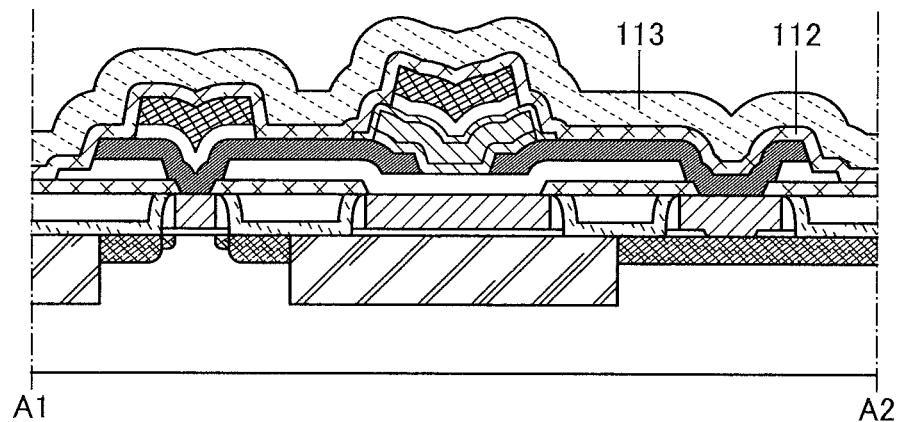
FIGS. 8A to 8C illustrate an example of a manufacturing process of a semiconductor device.

Then, the insulating layer 113 is formed over the insulating layer 112 (see FIG. 8A). In this embodiment, 300-nm-thick silicon oxynitride is formed as the insulating layer 113. After the formation of the insulating layer 113, oxygen doping treatment may be performed.

Next, heat treatment may be performed in a reduced-pressure atmosphere, an inert gas atmosphere of nitrogen, a rare gas, or the like, an oxidizing gas atmosphere, or an ultra-dry air atmosphere. The heat treatment is performed at a temperature higher than or equal to 250° C. and lower than or equal to 650° C., preferably higher than or equal to 300° C. and lower than or equal to 500° C. The treatment time is shorter than or equal to 24 hours. Heat treatment for over 24 hours is not preferable because the productivity is reduced.

Figure 8B:
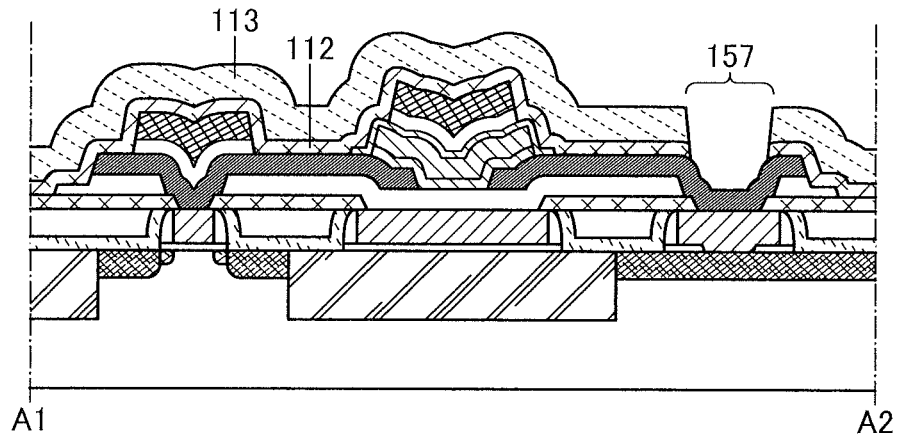
Figure 8C:
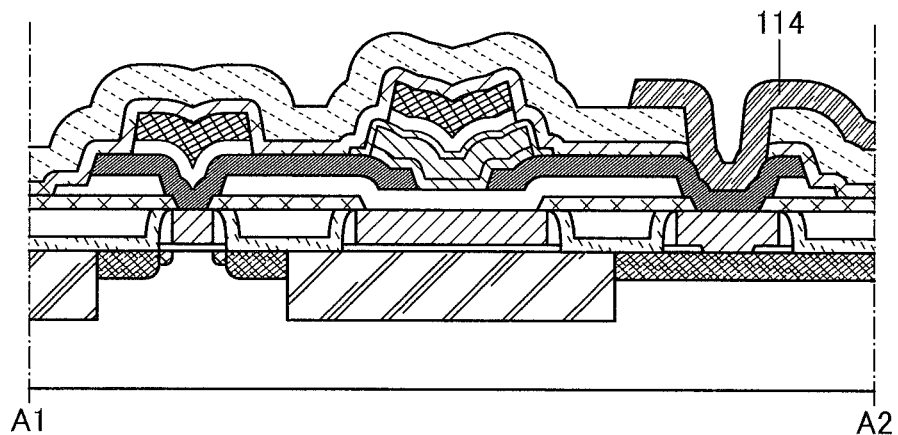

Next, part of the insulating layer 112 and part of the insulating layer 113 are selectively etched using a resist mask to form an opening 157 (see FIG. 8B).

Then, a conductive layer for forming the electrode 114 is formed. In this embodiment, the conductive layer is formed to have a three-layer structure including a 50-nm-thick titanium layer, a 200-nm-thick aluminum layer, and a 50-nm-thick titanium layer in this order by a sputtering method. Then, part of the conductive layer is selectively etched using a resist mask formed over the conductive layer, so that the electrode 114 is formed (see FIG. 8C).

Next, heat treatment may be performed in a reduced-pressure atmosphere, an inert gas atmosphere of nitrogen, a rare gas, or the like, an oxidizing gas atmosphere, or an ultra-dry air atmosphere. The heat treatment is performed at a temperature higher than or equal to 250° C. and lower than or equal to 650° C. preferably higher than or equal to 300° C. and lower than or equal to 500° C. The treatment time is shorter than or equal to 24 hours. Heat treatment for over 24 hours is not preferable because the productivity is reduced.

Through the above-described process, the semiconductor device 100 is manufactured.

<Variation of Semiconductor Device>

FIGS. 9A to 9C and FIGS. 10A to 10C illustrate variations of the semiconductor device 100.

Figure 9A:
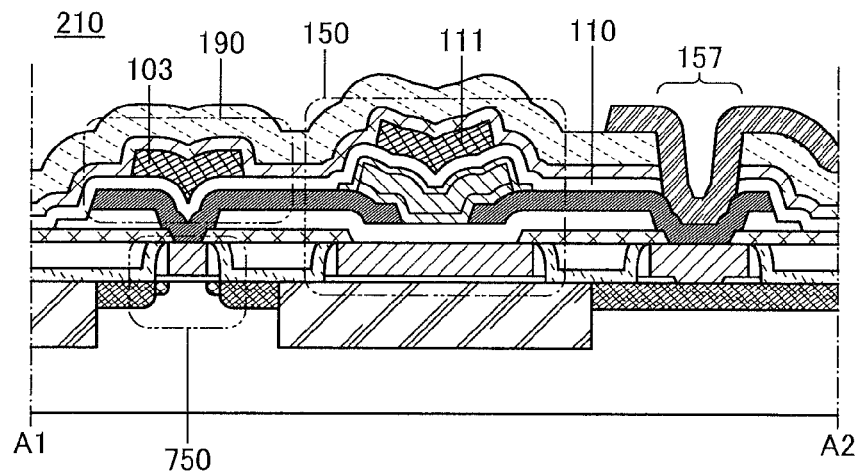
FIGS. 9A to 9C each illustrate an example of a semiconductor device.

As in a semiconductor device 210 illustrated in FIG. 9A, part of the insulating layer 110 may be left without being etched after the electrodes 103 and 111 are formed. In this case, the step of etching part of the insulating layer 110 after the formation of the electrodes 103 and 111 can be eliminated, increasing the productivity of the semiconductor device.

Figure 9B:
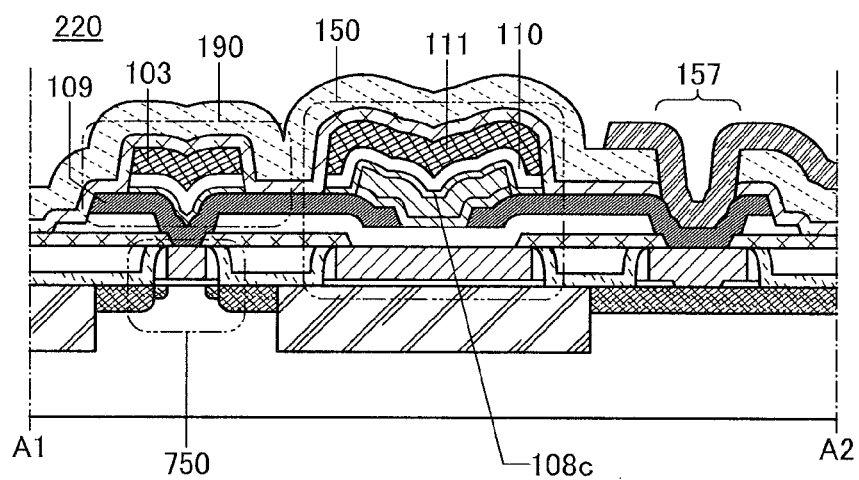

As in a semiconductor device 220 illustrated in FIG. 9B, part of the insulating layer 110 and part of the oxide semiconductor layer 108c may be selectively etched using the electrode 103 and the electrode 111 as masks. In this case, selective etching of the insulating layer 110 and the oxide semiconductor layer 108c can be performed in the same process for forming the electrodes 103 and 111; accordingly, the step of forming the oxide semiconductor layer 108c before the formation of the insulating layer 110 can be eliminated, increasing the productivity of the semiconductor device.

In the semiconductor device 220, part of the oxide semiconductor layer 108c as well as part of the insulating layer 110 is formed between the electrode 103 and the electrode 109 in the capacitor 190. By using the insulating layer 110 and the oxide semiconductor layer 108c as a dielectric layer of the capacitor 190, the distance between the electrode 103 and the electrode 109 can be increased, which increases the withstand voltage of the capacitor 190. Moreover, leakage current between the electrode 103 and the electrode 109 can be reduced. Accordingly, the reliability of the semiconductor device can be improved. In addition, power consumption of the semiconductor device can be reduced.

Figure 9C:
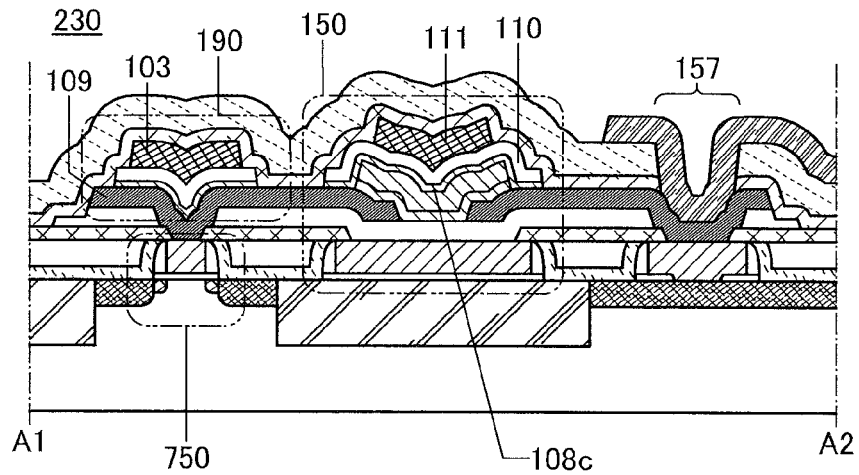

As in a semiconductor device 230 illustrated in FIG. 9C, after the oxide semiconductor layer 108c and the insulating layer 110 are formed successively, part of the insulating layer 110 and part of the oxide semiconductor layer 108c may be selectively removed using a resist mask, and then the electrodes 103 and 111 may be formed.

Figure 10A:
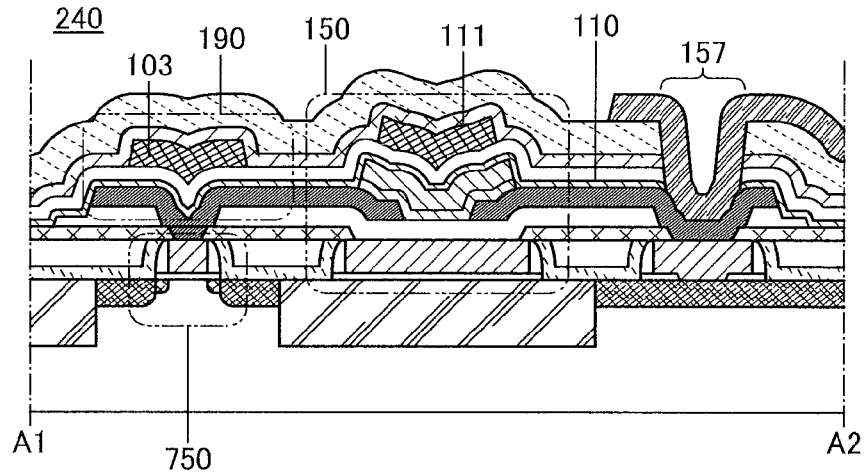
FIGS. 10A to 10C each illustrate an example of a semiconductor device.

As in a semiconductor device 240 illustrated in FIG. 10A, it is possible to omit etching of the insulating layer 110 and the oxide semiconductor layer 108c.

Figure 10B:
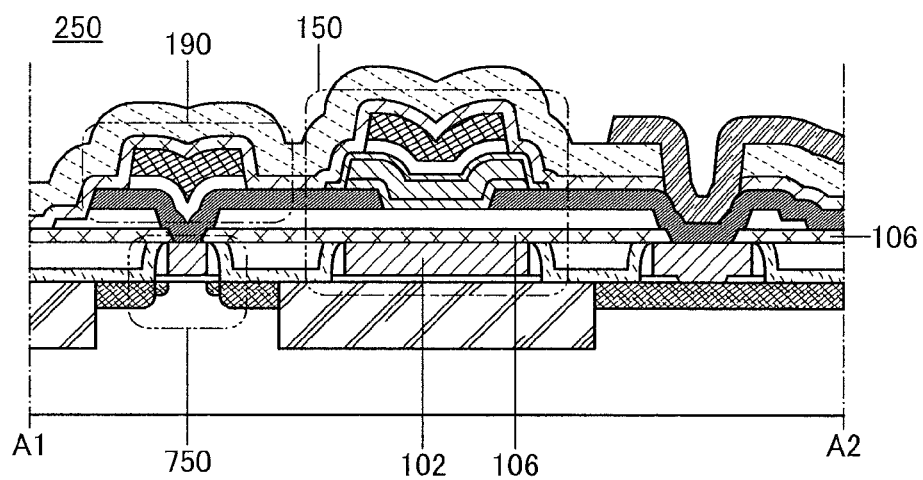

As in a semiconductor device 250 illustrated in FIG. 10B, the insulating layer 106 over the electrode 102 may be left without being removed. This structure can enhance the effect of preventing diffusion of impurities to the oxide semiconductor layer 108 from the outside. In addition, this structure can enhance the effect of preventing diffusion of oxygen contained in the oxide semiconductor layer 108 to the outside.

Figure 10C:
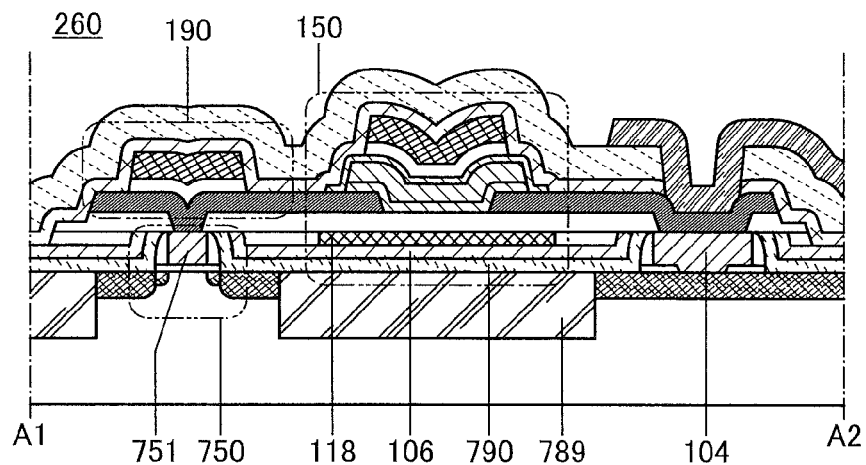

As in a semiconductor device 260 illustrated in FIG. 10C, the insulating layer 106 may be formed over the insulating layer 790, and an electrode 118 that can function like the electrode 102 may be provided over the insulating layer 106. Since the insulating layer 106 is formed over the insulating layer 790 in the semiconductor device 260, the electrode 102 cannot be formed at the same time as the electrodes 751 and 104. For this reason, the electrode 118 that can function like the electrode 102 is formed over the insulating layer 106. However, by providing the insulating layer 106 below the electrode 118, the electrode 118 can be positioned closer to the oxide semiconductor layer 108 by the thickness of the insulating layer 106; accordingly, the effect of the electrode 118 as a gate electrode or a back gate electrode can be enhanced. The electrode 118 can be formed using a material and a method that are similar to those of the electrode 103, the electrode 109, the electrode 111, the electrode 114, or the electrode 119.

With one embodiment of the present invention, a semiconductor device with favorable electrical characteristics can be provided. With one embodiment of the present invention, a semiconductor device with high productivity can be provided. Furthermore, with one embodiment of the present invention, a highly reliable semiconductor device can be provided. Furthermore, with one embodiment of the present invention, a semiconductor device with low power consumption can be provided.

In this embodiment, oxide semiconductors are described as examples of the semiconductor layers of the transistor 150. However, one embodiment of the present invention is not limited to these examples, and an amorphous semiconductor, a microcrystalline semiconductor, a polycrystalline semiconductor, or the like may be used as examples of the semiconductor layers. For example, amorphous silicon, microcrystalline germanium, polycrystalline silicon, or the like may be used. In the case where a higher field effect mobility of the transistor 150 is required for example, polycrystalline silicon or the like may be used as a semiconductor layer of the transistor 150. Alternatively, a compound semiconductor such as silicon carbide, gallium arsenide, or a nitride semiconductor, an organic semiconductor, or the like may be used.

This embodiment can be combined with any of the other embodiments described in this specification as appropriate.

(Embodiment 2)

In this embodiment, a semiconductor device 1100 having a different structure from the semiconductor device 100 and the like disclosed in Embodiment 1 will be described with reference to drawings. To avoid repeated description in this embodiment, description of the same portions as those of the semiconductor device 100 and the like is omitted unless otherwise specified.

<Structure Example of Semiconductor Device>

Figure 11A:
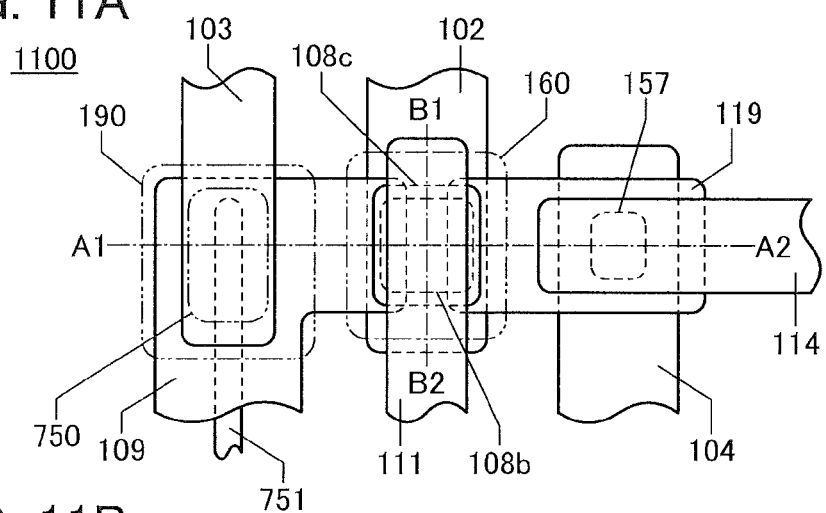
FIGS. 11A to 11C illustrate an example of a semiconductor device.
Figure 11B:
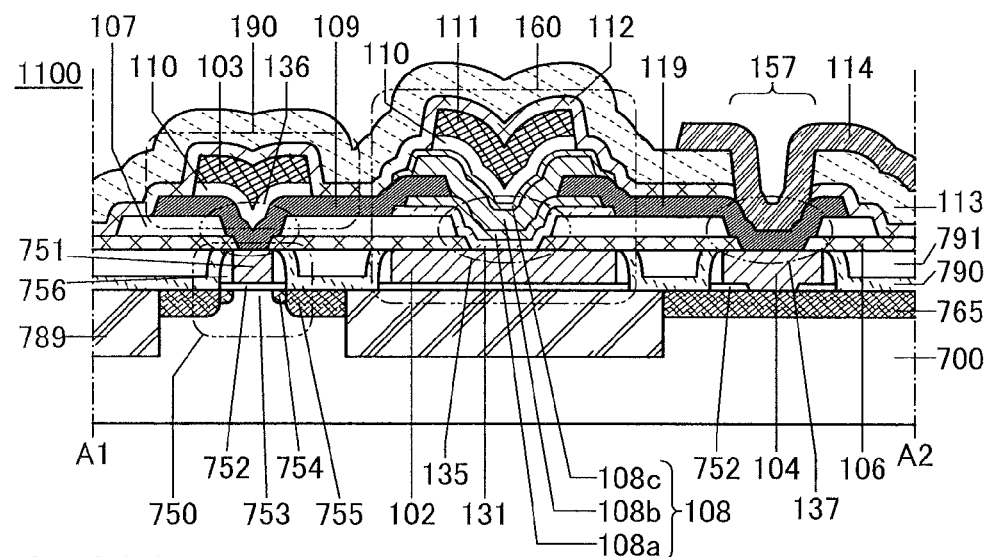
Figure 11C:
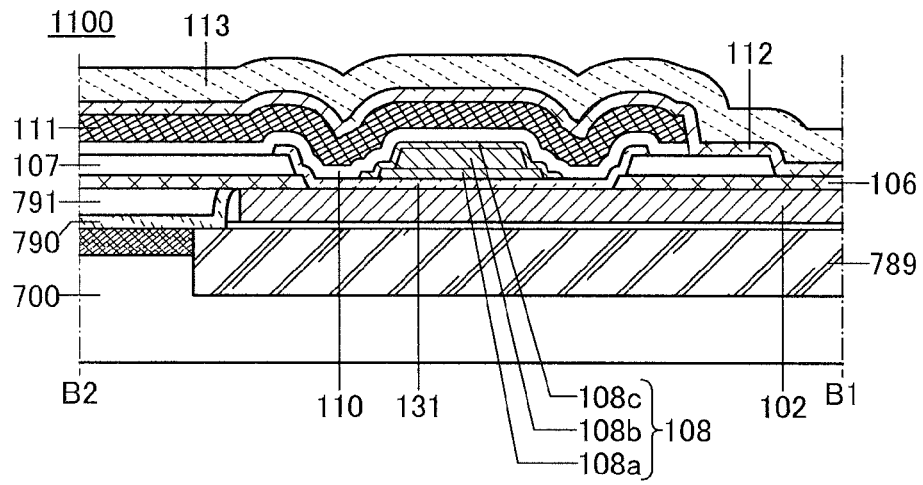

FIG. 11A is a top view of the semiconductor device 1100. FIG. 11B is a cross-sectional view taken along dashed-dotted line A1-A2 in FIG. 11A. FIG. 11C is a cross-sectional view taken along dashed-dotted line B1-B2 in FIG. 11A. The semiconductor device 1100 includes the transistor 750, a transistor 160, and the capacitor 190. FIG. 11B is a cross-sectional view of the transistor 160 in a channel length direction, and FIG. 11C is a cross-sectional view of the transistor 160 in a channel width direction.

[Transistor 750]

The transistor 750 of the semiconductor device 1100 is formed using the substrate 700, in the same manner as that of the semiconductor device 100 described in Embodiment 1. In this embodiment, an example in which a p-type single crystal silicon substrate is used as the substrate 700 is described. The transistor 750 is a transistor whose channel is formed in the substrate 700.

[Transistor 160]

Figure 12A:
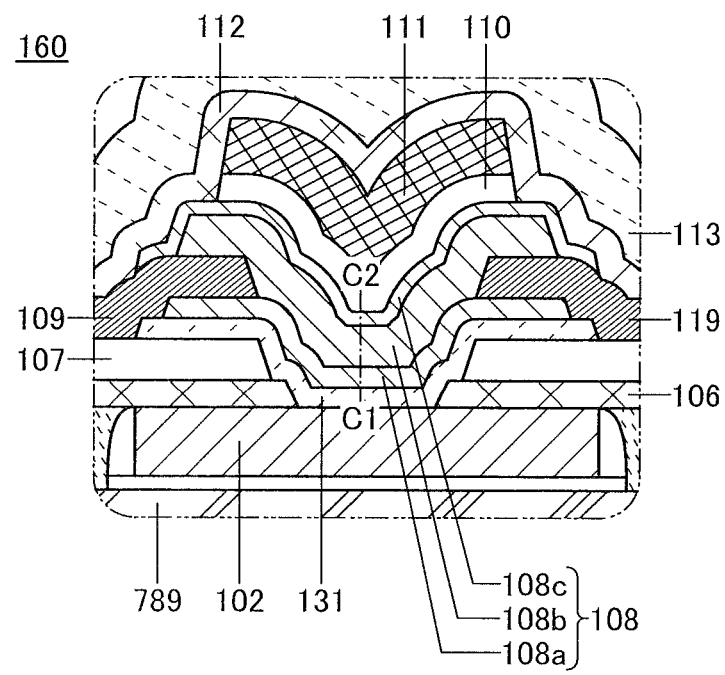
FIGS. 12A and 12B each illustrate an example of a semiconductor device.
Figure 13A:
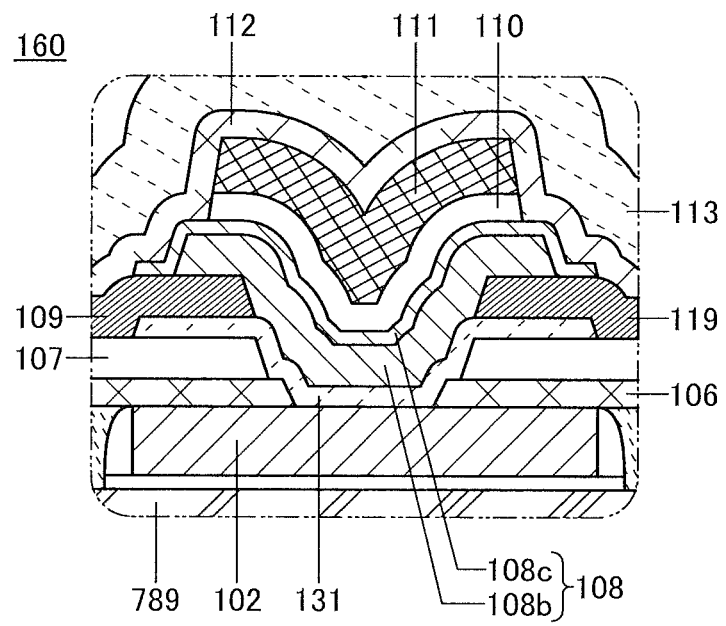
FIGS. 13A and 13B each illustrate an example of a semiconductor device.

The transistor 160 includes the electrode 102, the insulating layer 107, the electrode 109, the electrode 119, the oxide semiconductor layer 108 (the oxide semiconductor layer 108a, the oxide semiconductor layer 108b, and the oxide semiconductor layer 108c), the insulating layer 110, and the electrode 111. FIG. 12A is an enlarged view of the transistor 160 illustrated in FIG. 11B. Note that at least one of the oxide semiconductor layers 108a to 108c may be omitted from the oxide semiconductor layer 108, or another layer may be added to the oxide semiconductor layer 108. For example, the oxide semiconductor layer 108a may be omitted. FIG. 13A illustrates an example of that case.

An insulating layer 106 is formed over the insulating layer 791 so as to be in contact with part of the electrode 102, and the insulating layer 107 is formed over the insulating layer 106. An opening 135 is formed in part of the insulating layer 106 and part of the insulating layer 107 so as to overlap with the electrode 102. An insulating layer 131 is formed to cover the opening 135. The oxide semiconductor layer 108a is formed so as to overlap with and positioned over the insulating layer 131. The electrode 109 and the electrode 119 are formed over the insulating layer 107 so as to be in contact with part of the oxide semiconductor layer 108a. The electrode 109 is electrically connected to the electrode 751 through an opening 136 provided in the insulating layers 107 and 106. The electrode 119 is electrically connected to the electrode 104 through an opening 137 provided in the insulating layers 107 and 106.

The oxide semiconductor layer 108b is formed over the electrodes 109 and 119 and the oxide semiconductor layer 108a. The oxide semiconductor layer 108c is formed to cover the oxide semiconductor layer 108b (see FIGS. 11B and 11C).

The electrode 111 is formed over the oxide semiconductor layer 108c with the insulating layer 110 provided therebetween. The electrode 111 overlaps at least each of the following: part of the oxide semiconductor layer 108b, part of the electrode 102, part of the electrode 109, and part of the electrode 119.

The electrodes 109 and 119 can function as a source electrode and a drain electrode.

The transistor 160 described as an example in this embodiment is a transistor which uses an oxide semiconductor for a semiconductor layer in which a channel is formed. The transistor 160 is of one kind of top-gate transistor and also one kind of staggered transistor. The transistor 160 includes a back gate electrode.

Like the transistors disclosed in Embodiment 1, the transistor 160 has comparatively large on-state current in view of its area. That is, the area occupied by the transistor 160 can be small for required on-state current. With one embodiment of the present invention, the area occupied by a transistor can be reduced. Therefore, a semiconductor device having a high degree of integration can be provided.

When the gate insulating layer is thin, electric field generated from the gate electrode can be efficiently transmitted to the semiconductor layer, whereby electrical characteristics of the semiconductor device can be improved. With the thin gate insulating layer, however, an electrical breakdown can be easily caused in the gate insulating layer between electrodes or wirings, lowering the reliability of the semiconductor device.

With one embodiment of the present invention which is formed by forming the opening 135 by removing part of the insulating layer 106 and part of the insulating layer 107 which overlap with the electrode 102, forming the insulating layer 131 to cover the opening 135, and forming the oxide semiconductor layer 108 over the insulating layer 131, a change in the potential of the electrode 102 can be efficiently transmitted to the oxide semiconductor layer 108. Moreover, because the insulating layer 106 and the insulating layer 107 are left in the region other than the opening 135, the above-mentioned electrical breakdown is unlikely to occur between wirings. Note that the thickness of the insulating layer 131 is preferably less than the total thickness of the insulating layer 106 and the insulating layer 107. With one embodiment of the present invention, a semiconductor device with favorable electrical characteristics can be provided. Furthermore, a semiconductor device with high reliability can be provided.

The transistor 160 can be operated as long as either one of the electrodes 102 and 111 is included. Thus, in accordance with the purpose, formation of either one of the electrodes 102 and 111 may be omitted, in which case productivity of the semiconductor device can be increased.

The oxide semiconductor layer 108 has a structure in which the oxide semiconductor layer 108a, the oxide semiconductor layer 108b, and the oxide semiconductor layer 108c are stacked.

Note that although trap states due to impurities or defects might be formed in the vicinity of the interface between the oxide semiconductor layer 108a and the insulating layer 131 and in the vicinity of the interface between the oxide semiconductor layer 108c and the insulating layer 110, the oxide semiconductor layer 108b can be spaced from the trap states owing to the existence of the oxide semiconductor layer 108a and the oxide semiconductor layer 108c.

Note that the above-described three-layer structure is an example. For example, a two-layer structure without either one of the oxide semiconductor layers 108a and 108c may be employed.

As illustrated in FIG. 11C, in the transistor 160 in the channel width direction, the electrode 111 covers the oxide semiconductor layer 108b. By covering the side surfaces of the oxide semiconductor layer 108b with the electrode 111, the s-channel structure in which the oxide semiconductor layer 108b is electrically surrounded by an electric field of the electrode 111 is formed.

Figure 12B:
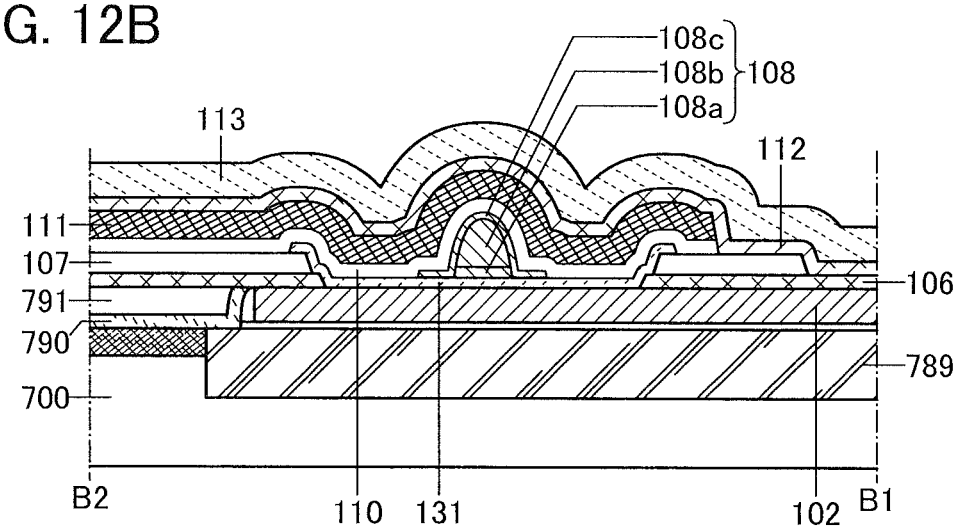
Figure 13B:
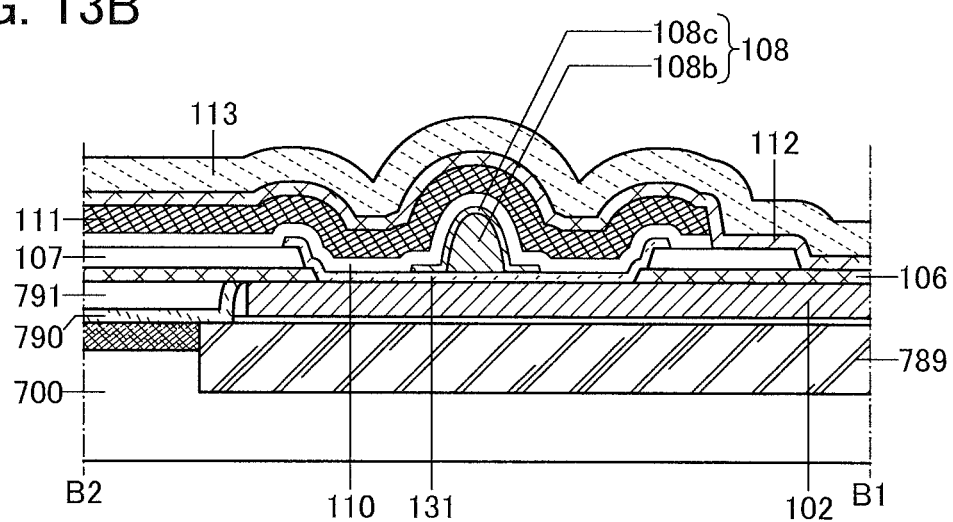

When the oxide semiconductor layer 108b is increased in thickness and the channel width is shortened as illustrated in FIG. 12B, the effects of increasing the on-state current and reducing the off-state current by the s-channel structure can be enhanced. As illustrated in FIG. 13B, the oxide semiconductor layer 108a may be omitted.

[Capacitor 190]

The capacitor 190 includes the electrode 109, the insulating layer 110, and the electrode 103. By overlapping the transistor 750 with the capacitor 190, the area occupied by the semiconductor device 1100 can be reduced. Therefore, with one embodiment of the present invention, a semiconductor device having a high degree of integration can be provided.

Next, other components of the semiconductor device 1100 will be described.

The insulating layer 112 and the insulating layer 113 are formed to cover the transistor 160 and the capacitor 190. The electrode 114 formed over the insulating layer 113 is electrically connected to the electrode 119 through the opening 157 formed in the insulating layers 112 and 113.

The electrodes 102 and 104 are formed using the same layer as the electrode 751. The electrodes 102, 104, and 751 are formed using a conductive material that can withstand heat treatment performed in a later step. In this embodiment, the electrodes 102, 104, and 751 are formed using n-type silicon.

The electrode 104 is connected to the n-type impurity region 765 through an opening provided in the insulating layer 752.

The insulating layer 131 can be formed using a material and a method that are similar to those of the insulating layer 107.

The insulating layer 107 and the insulating layer 131 are preferably formed using an insulating layer containing oxygen at a higher proportion than oxygen in the stoichiometric composition.

The semiconductor device 1100 includes a region where the insulating layer 106 is in contact with the insulating layer 112. In FIG. 11B, a region where the insulating layer 106 is in contact with the insulating layer 112 is illustrated at both ends of the drawing. This structure can enhance the effect of preventing diffusion of impurities to the oxide semiconductor layer 108 from the outside. In addition, this structure can enhance the effect of preventing diffusion of oxygen contained in the oxide semiconductor layer 108 to the outside. With one embodiment of the present invention, a highly reliable semiconductor device can be provided.

A planarization insulating layer may be provided over the electrode 114 and the insulating layer 113. The planarization insulating layer can be formed using an organic material having heat resistance, such as a polyimide, an acrylic resin, a benzocyclobutene-based resin, a polyamide, or an epoxy resin. Other than such organic materials, it is possible to use a low-dielectric constant material (a low-k material), a siloxane-based resin, phosphosilicate glass (PSG), borophosphosilicate glass (BPSG), or the like. The planarization insulating layer may be formed by stacking a plurality of insulating films formed using these materials.

<Example of Method for Manufacturing Semiconductor Device>

A method for manufacturing the semiconductor device 1100 will be described with reference to FIGS. 14A to 14D, FIGS. 15A to 15D, FIGS. 16A to 16D, FIGS. 17A to 17D, FIGS. 18A to 18C, FIGS. 19A and 19B, and FIGS. 20A and 20B. These figures correspond to cross-sectional views taken along dashed-dotted line A1-A2 in FIG. 11A.

First, the element separation region 789 is formed in the substrate 700 by an STI method. In this embodiment, p-type single crystal silicon is used as the substrate 700. Next, the transistor 750 is formed in part of the region except the element separation region 789. As the insulating layer 752, silicon oxide formed by a thermal oxidation method is used. As the electrode 751, n-type polycrystalline silicon formed by a CVD method is used. The electrode 102 and the electrode 104 can be formed at the same time as the electrode 751. Note that before the formation of the electrodes 751, 102, and 104, part of the insulating layer 752 is removed to form an opening 757. As the sidewall insulating layer 756, silicon oxynitride formed by a CVD method is used.

The n-type impurity regions 754 and the n-type impurity regions 755 can be formed by a known method such as an ion implantation method. The n-type impurity region 765 can be formed at the same time as the n-type impurity regions 755.

After the transistor 750 is formed, the insulating layer 790 containing hydrogen is formed to cover the transistor 750, the electrode 102, and the electrode 104. In this embodiment, silicon oxynitride containing hydrogen formed by a CVD method is used as the insulating layer 790. After the insulating layer 790 is formed, treatment for adding hydrogen to the insulating layer 790 may be performed. The treatment for adding hydrogen can be performed with an ion implantation apparatus, an ion doping apparatus, or a plasma treatment apparatus.

Next, the insulating layer 791 is formed over the insulating layer 790. In this embodiment, silicon oxynitride formed by a CVD method is used as the insulating layer 791.

Next, heat treatment for diffusing hydrogen contained in the insulating layer 790 to the transistor 750 to reduce defects due to dangling bonds or the like in the transistor 750 is performed. The heat treatment is performed at a temperature higher than or equal to 300° C. and lower than or equal to 800° C., preferably higher than or equal to 400° C. and lower than or equal to 700° C. The treatment time is shorter than or equal to 24 hours. Heat treatment for over 24 hours is not preferable because the productivity is reduced. By this heat treatment, defects due to dangling bonds or the like in the transistor 750 are reduced, and in addition hydrogen that is an impurity in an oxide semiconductor can be reduced.

There is no particular limitation on the heat treatment apparatus used for the heat treatment, and the apparatus may be provided with a device for heating an object by heat radiation or heat conduction from a heating element such as a resistance heating element.

Next, CMP treatment is performed to expose the surfaces of the electrodes 751, 102, and 104. By the CMP treatment, unevenness of the surfaces can be reduced, and coverage with an insulating layer or a conductive layer to be formed later can be increased (see FIG. 14A).

Note that the heat treatment may be performed after the CMP treatment.

Next, the insulating layer 106 is formed to cover the insulating layer 790, the insulating layer 791, the electrode 751, the electrode 102, and the electrode 104. The insulating layer 106 preferably has a thickness of more than or equal to 10 nm and less than or equal to 200 nm, and further preferably more than or equal to 10 nm and less than or equal to 100 nm. In this embodiment, as the insulating layer 106, 50-nm-thick aluminum oxide is deposited by a sputtering method.

Figure 14A:
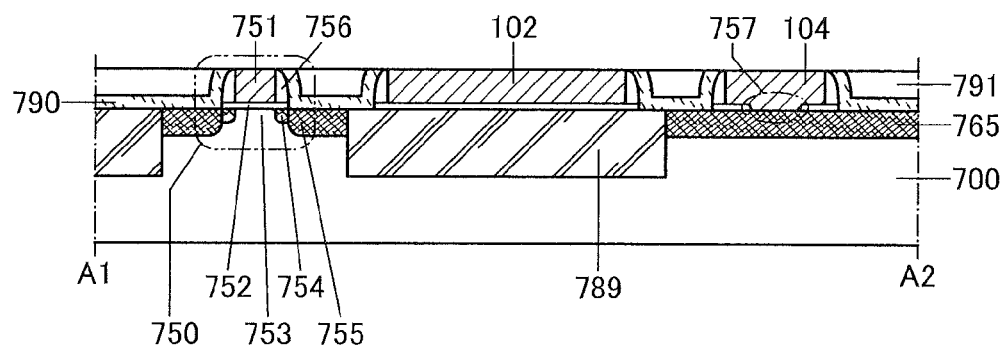
FIGS. 14A to 14D illustrate an example of a manufacturing process of a semiconductor device.
Figure 14B:
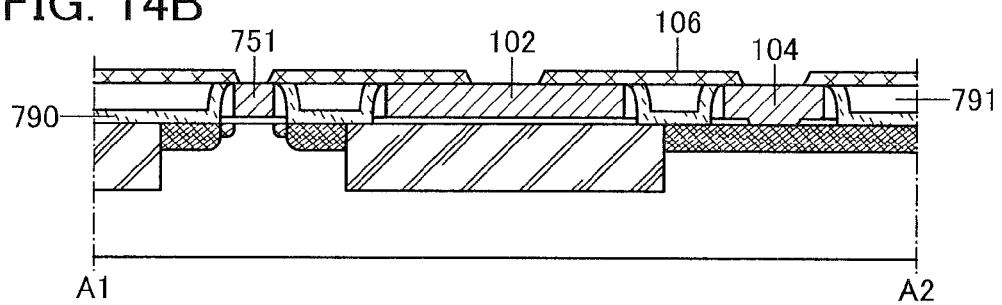
Figure 14C:
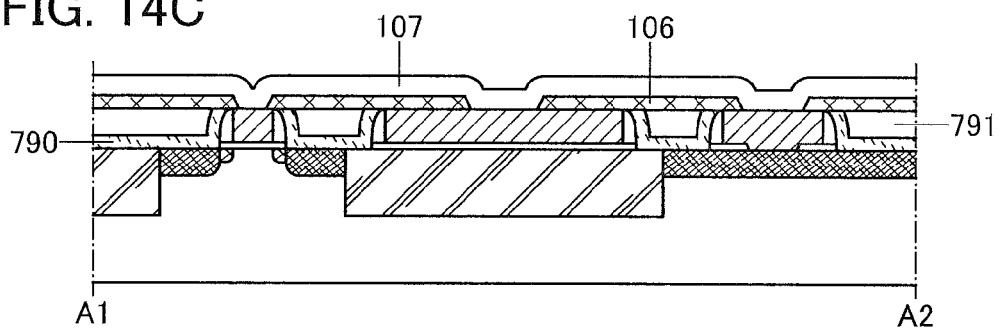

Next, part of the insulating layer 106 is selectively etched using a resist mask to expose the surfaces of the electrodes 751, 102, and 104 (see FIG. 14B).

The resist mask can be formed by a lithography method, a printing method, an inkjet method, or the like as appropriate. Formation of the resist mask by an inkjet method needs no photomask; thus, manufacturing cost can be reduced.

The insulating layer 106 may be etched by either one or both of a dry etching method and a wet etching method. After the etching of the insulating layer 106, the resist mask is removed.

Note that the heat treatment may be performed after the formation of the insulating layer 106.

Next, the insulating layer 107 is formed. The insulating layer 107 preferably has a thickness of more than or equal to 10 nm and less than or equal to 200 nm, and further preferably more than or equal to 10 nm and less than or equal to 100 nm. In this embodiment, as the insulating layer 107, 100-nm-thick silicon oxynitride containing oxygen at a higher proportion than oxygen in the stoichiometric composition is used. The insulating layer 107 can be formed by a CVD method (see FIG. 14C).

The insulating layer containing excess oxygen can be formed by performing treatment for adding oxygen to an insulating layer. The treatment for adding oxygen can be performed by heat treatment under an oxygen atmosphere or performed with an ion implantation apparatus, an ion doping apparatus, or a plasma treatment apparatus. As a gas for adding oxygen, an oxygen gas of $^{16}O_2$, $^{18}O_2$, or the like, a nitrous oxide gas, an ozone gas, or the like can be used. In this specification, the treatment for adding oxygen is also referred to as "oxygen doping treatment".

Figure 14D:
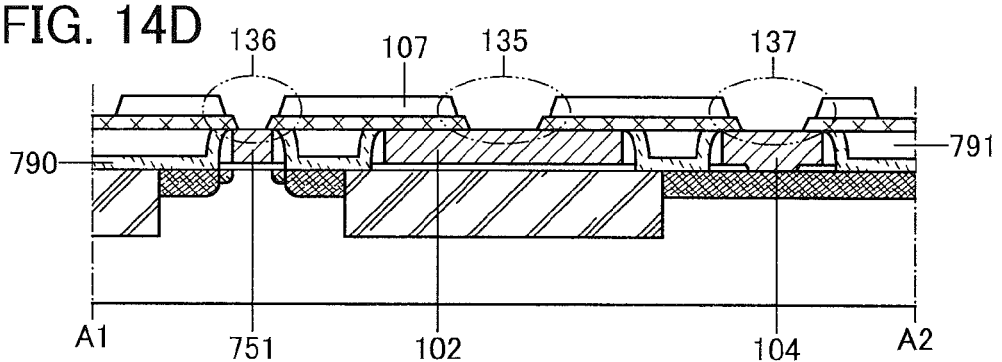

Next, part of the insulating layer 107 is selectively etched using a resist mask to expose the surfaces of the electrode 751, the electrode 102, and the electrode 104 (see FIG. 14D). The insulating layer 107 may be etched by either one or both of a dry etching method and a wet etching method.

Thus, the opening 136 overlapping with the electrode 751, the opening 135 overlapping with the electrode 102, and the opening 137 overlapping with the electrode 104 are formed in the insulating layer 106 and the insulating layer 107.

Figure 19A:
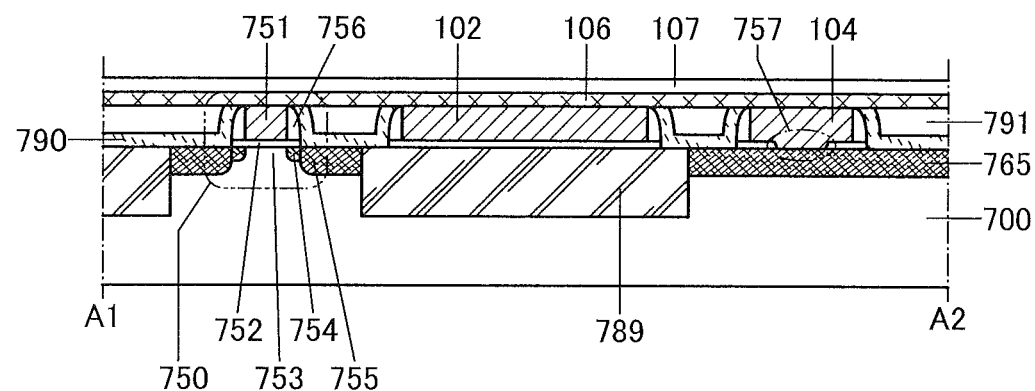
FIGS. 19A and 19B illustrate an example of a manufacturing process of a semiconductor device.
Figure 19B:
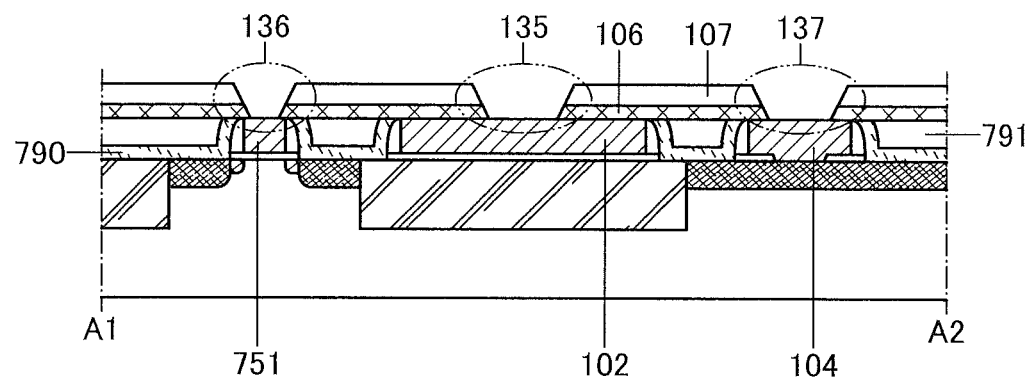

Note that the insulating layers 106 and 107 may be sequentially formed to cover the insulating layers 790 and 791 and the electrodes 751, 102, and 104 (see FIG. 19A), and then, part of the insulating layer 106 and part of the insulating layer 107 may be selectively etched simultaneously to form the openings 135, 136, and 137 (see FIG. 19B). By etching the insulating layers 106 and 107 in the same step, the number of manufacturing steps can be reduced. Accordingly, the productivity of the semiconductor device can be increased. In this case, depending on the etching conditions, an end portion of the insulating layer 106 is aligned with an end portion of the insulating layer 107.

Next, the insulating layer 131 is formed over the insulating layer 107. The insulating layer 131 preferably has a thickness of more than or equal to 10 nm and less than or equal to 200 nm, and further preferably more than or equal to 10 nm and less than or equal to 100 nm. In this embodiment, as the insulating layer 131, a 100-nm-thick silicon oxynitride containing oxygen at a higher proportion than oxygen in the stoichiometric composition is used. The insulating layer 131 can be formed by a CVD method (see FIG. 15A).

Next, part of the insulating layer 131 is selectively etched using a resist mask to expose the surfaces of the electrodes 751 and 104. The opening 135 overlapping with the electrode 102 is covered with the insulating layer 131 (see FIG. 15B).

The resist mask can be formed by a lithography method, a printing method, an inkjet method, or the like as appropriate. Formation of the resist mask by an inkjet method needs no photomask; thus, manufacturing cost can be reduced.

The insulating layer 131 may be etched by either one or both of a dry etching method and a wet etching method. After the etching of the insulating layer 131, the resist mask is removed.

Figure 15A:
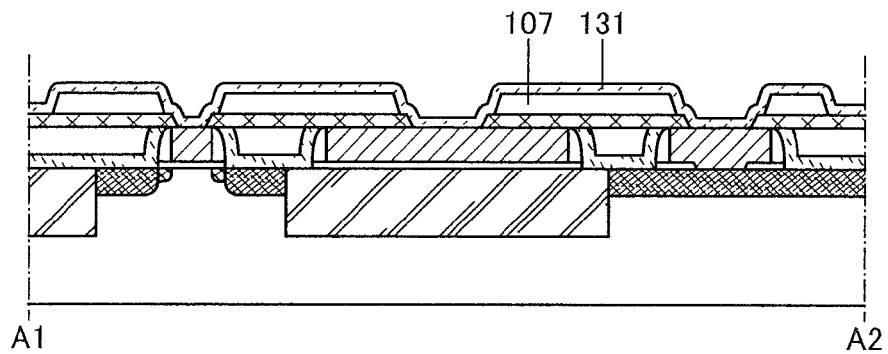
FIGS. 15A to 15D illustrate an example of a manufacturing process of a semiconductor device.
Figure 15B:
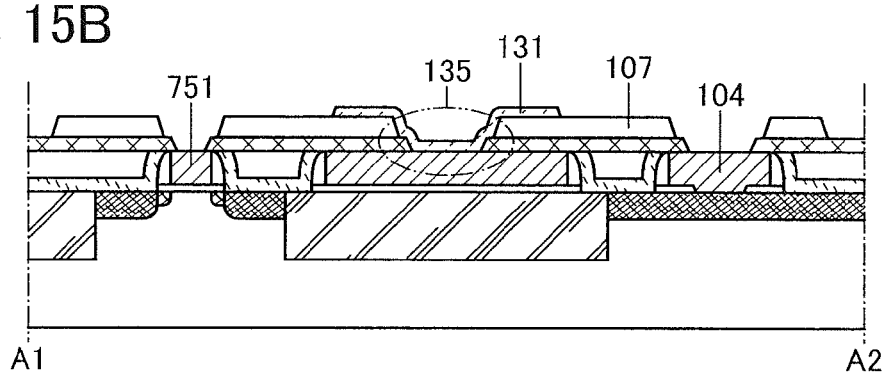
Figure 15C:
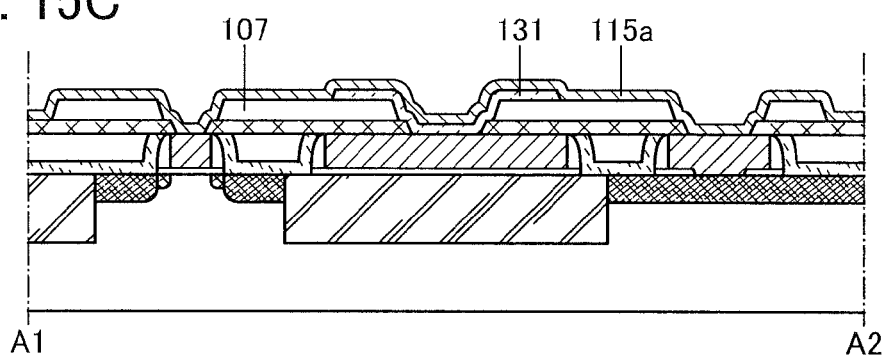
Figure 15D:
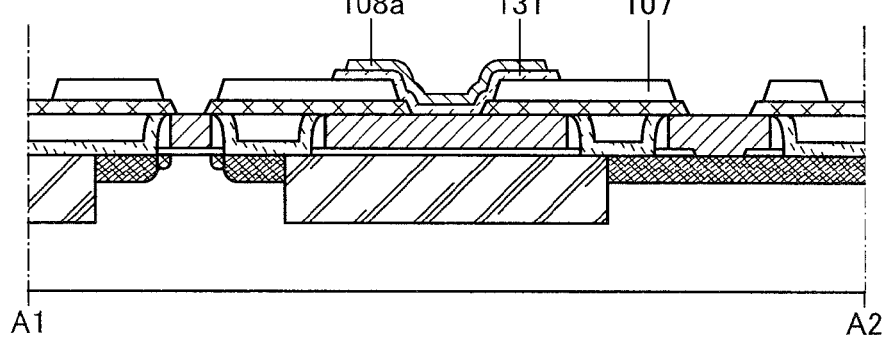

Next, the oxide semiconductor layer 115a for forming the oxide semiconductor layer 108a is formed to cover the insulating layer 107 and the insulating layer 131 (see FIG. 15C).

In this embodiment, as the oxide semiconductor layer 115a, 20-nm-thick In—Ga—Zn oxide is deposited by a sputtering method using an In—Ga—Zn oxide target (In:Ga:Zn=1:3:2). Note that the constituent elements and compositions applicable to the oxide semiconductor layer 115a are not limited thereto.

The oxygen doping treatment may be performed after the formation of the oxide semiconductor layer 115a.

Next, a resist mask is formed over the oxide semiconductor layer 115a, and part of the oxide semiconductor layer 115a is selectively etched using the resist mask, so that the oxide semiconductor layer 108a is formed.

The oxide semiconductor layer 115a may be etched by either one or both of a dry etching method and a wet etching method. After the etching, the resist mask is removed (see FIG. 15D). The oxide semiconductor layer 108a is formed so as to overlap with the insulating layer 131.

Figure 20A:
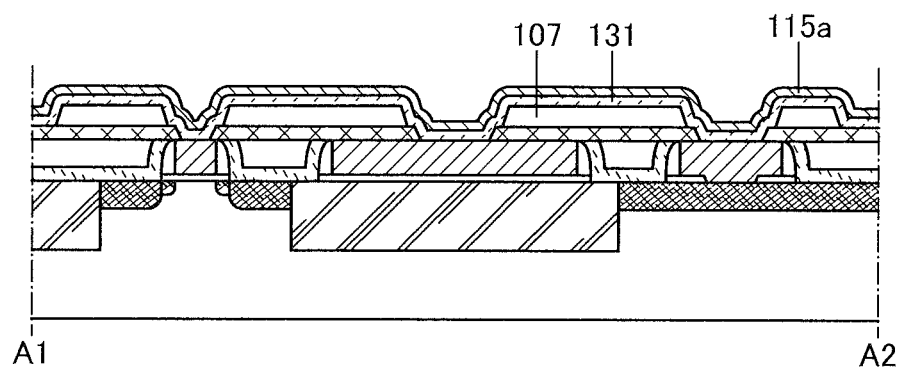
FIGS. 20A and 20B illustrate an example of a manufacturing process of a semiconductor device.
Figure 20B:
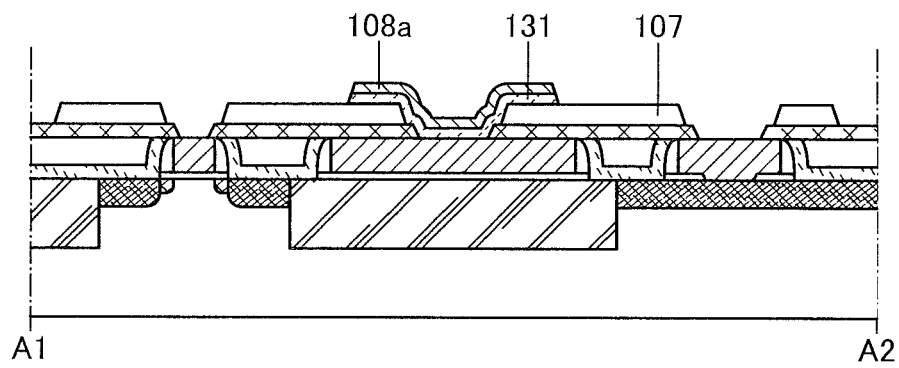

Note that after the step of FIG. 15A, the step of FIG. 15B may be omitted. A cross-sectional view of FIG. 20A corresponds to FIG. 15C where the step of FIG. 15B is omitted. Then, in a manner similar to that of FIG. 15D, the oxide semiconductor layer 115a is etched. At this time, the insulating layer 131 is also etched. Therefore, depending on the etching conditions, an end portion of the oxide semiconductor layer 108a is aligned with an end portion of the insulating layer 131 (FIG. 20B).

Figure 16A:
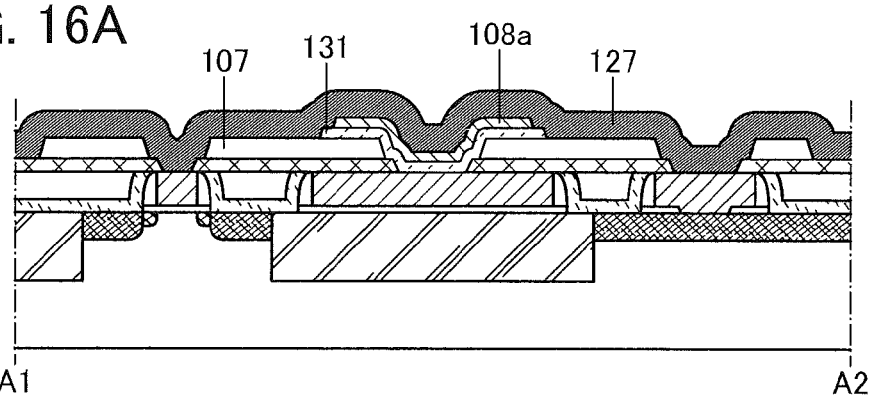
FIGS. 16A to 16D illustrate an example of a manufacturing process of a semiconductor device.

Next, the conductive layer 127 for forming the electrode 109 and the electrode 119 is formed over the insulating layer 107, the insulating layer 131, and the oxide semiconductor layer 108a (see FIG. 16A). In this embodiment, as the conductive layer 127, 100-nm-thick tungsten is deposited by a sputtering method.

Figure 16B:
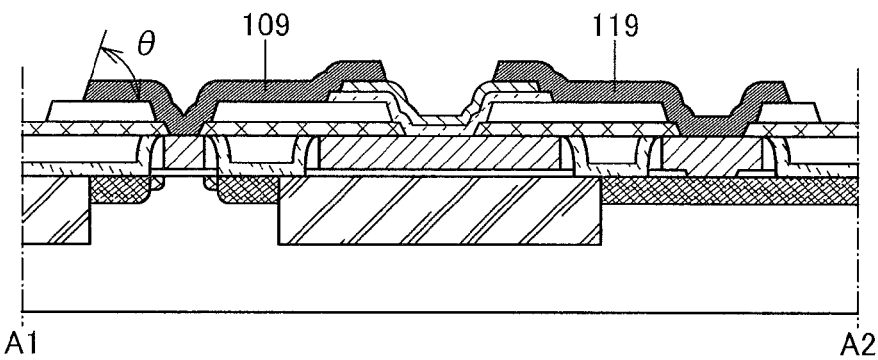

Next, part of the conductive layer 127 is selectively etched using a resist mask, so that the electrode 109 and the electrode 119 (including other electrodes and wirings formed using the same conductive layer) are formed (see FIG. 16B). The etching of the conductive layer 127 may be performed by a dry etching method, a wet etching method, or both of them.

Note that when a transistor having a very short channel length is formed, the electrodes 109 and 119 may be formed in such a manner that the resist mask is formed by a method suitable for thin line processing, such as an electron beam exposure, EUV exposure, or a liquid immersion exposure, and then etching treatment is performed. Note that by the use of a positive type resist for the resist mask, the exposed region can be minimized and throughput can be thus improved. In this manner, a transistor having a channel length of 30 nm or less can be formed.

When the electrodes 109 and 119 (including other electrodes and wirings formed using the same conductive layer) each have an end portion with a tapered shaped, the coverage with a layer that covers side surfaces of the electrodes 109 and 119 can be improved. Specifically, the edge has a taper angle θ of 80° or less, preferably 60° or less, further preferably 45° or less. Note that the "taper angle" refers to an inclination angle formed by a side surface and a bottom surface of a layer having a taper shape when the layer is seen from the cross-section direction of the layer (i.e., the plane perpendicular to the surface of the substrate). A taper angle smaller than 90° is called forward tapered angle and a taper angle larger than 90° is called inverse tapered angle (see FIG. 16B).

When the cross-section of each of the end portions of the electrodes 109 and 119 (including other electrodes and wirings formed using the same conductive layer) has a step-like shape including a plurality of steps, the coverage with a layer that covers the electrodes 109 and 119 can be improved. The above description is not limited to the electrode 109 and the electrode 119, and by providing a forward taper shape or a step-like shape of the end portion of each layer, a phenomenon in that a layer formed to cover the end portion is cut (disconnection) at the end portion can be prevented, so that the coverage becomes favorable.

Next, the oxide semiconductor layer 115b for forming the oxide semiconductor layer 108b is formed over the insulating layer 107, the electrode 109, and the electrode 119.

Figure 16C:
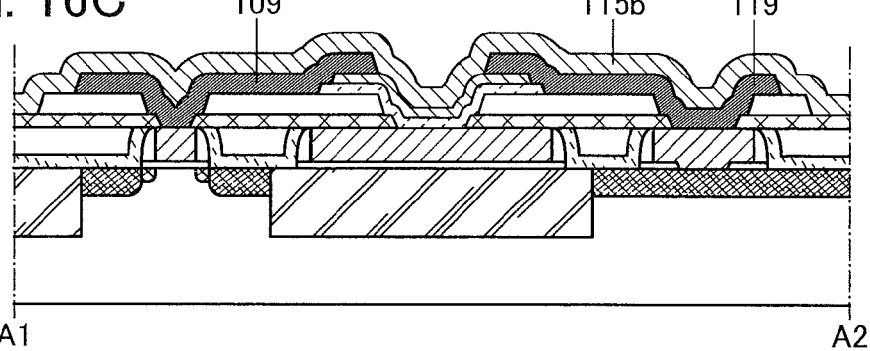
Figure 16D:
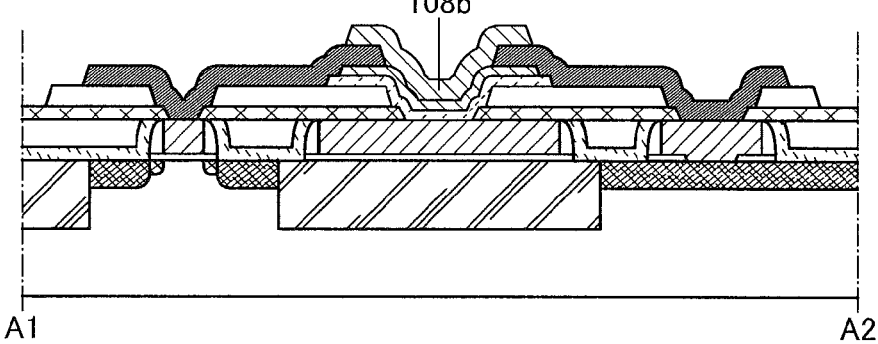

In this embodiment, as the oxide semiconductor layer 115b, 30-nm-thick In—Ga—Zn oxide is deposited by a sputtering method using an In—Ga—Zn oxide target (In:Ga:Zn=1:1:1) (see FIG. 16C). Note that the constituent elements and compositions applicable to the oxide semiconductor layer 115a and the oxide semiconductor layer 115b are not limited thereto.

The oxygen doping treatment may be performed after the formation of the oxide semiconductor layer 115b.

Next, a resist mask is formed over the oxide semiconductor layer 115b, and part of the oxide semiconductor layer 115b is selectively etched using the resist mask, so that the oxide semiconductor layer 108b is formed.

The oxide semiconductor layer 115b may be etched by either one or both of a dry etching method and a wet etching method. After the etching, the resist mask is removed. In this manner, the insulating layer 107 having the projection can be formed (see FIG. 16D).

Next, heat treatment is preferably performed to reduce impurities such as moisture and hydrogen contained in the oxide semiconductor layers 108a and 108b and to purify the oxide semiconductor layers 108a and 108b.

For example, heat treatment is performed to the oxide semiconductor layer 108a and the oxide semiconductor layer 108b in a reduced-pressure atmosphere, an inert gas atmosphere of nitrogen, a rare gas, or the like, an oxidizing gas atmosphere, or an ultra-dry air atmosphere.

By the heat treatment, in addition to the release of the impurities, diffusion of oxygen contained in the insulating layer 107 and/or the insulating layer 131 to the oxide semiconductor layers 108a and 108b occurs to reduce oxygen vacancies in the oxide semiconductor layers 108a and 108b. Note that the heat treatment may be performed in such a manner that heat treatment is performed in an inert gas atmosphere, and then another heat treatment is performed in an atmosphere containing an oxidizing gas at 10 ppm or more, 1% or more, or 10% or more. The heat treatment may be performed at any time after the oxide semiconductor layers 115a and 115b are formed.

The heat treatment is performed at a temperature higher than or equal to 250° C. and lower than or equal to 650° C., preferably higher than or equal to 300° C. and lower than or equal to 500° C. The treatment time is shorter than or equal to 24 hours. Heat treatment for over 24 hours is not preferable because the productivity is reduced.

In this embodiment, after heat treatment is performed at 450° C. in a nitrogen gas atmosphere for 1 hour, heat treatment is performed at 450° C. in an oxygen gas atmosphere for 1 hour.

Next, the oxide semiconductor layer 115c for forming the oxide semiconductor layer 108c is formed. In this embodiment, as the oxide semiconductor layer 115c, 5-nm-thick In—Ga—Zn oxide is deposited by a sputtering method using an In—Ga—Zn oxide target (In:Ga:Zn=1:3:2) (see FIG. 17A). Note that the constituent elements and compositions applicable to the oxide semiconductor layer 115c are not limited thereto.

Figure 17A:
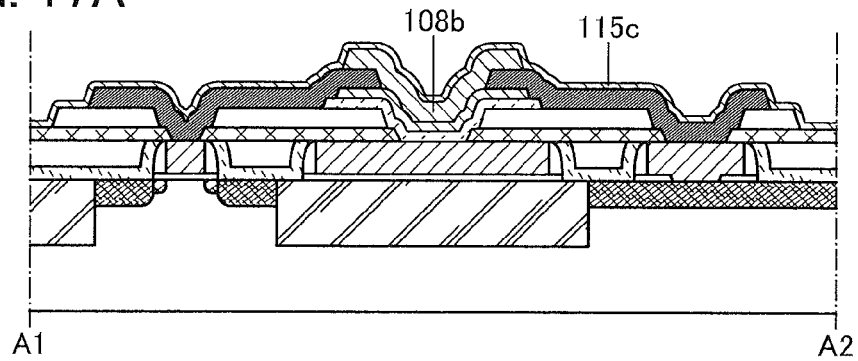
FIGS. 17A to 17D illustrate an example of a manufacturing process of a semiconductor device.
Figure 17B:
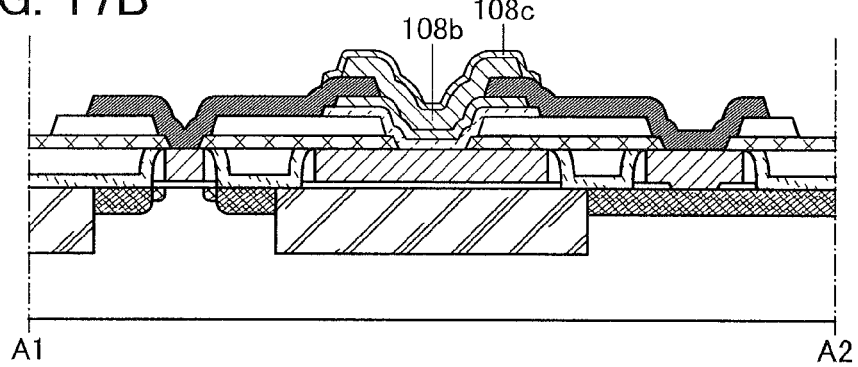
Figure 17C:
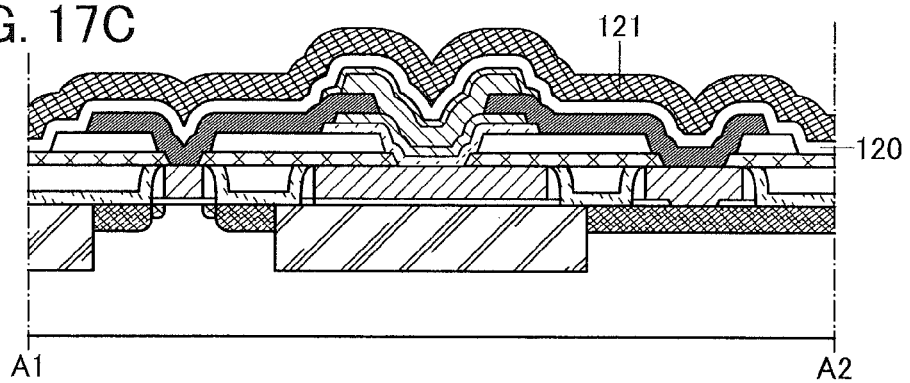
Figure 17D:
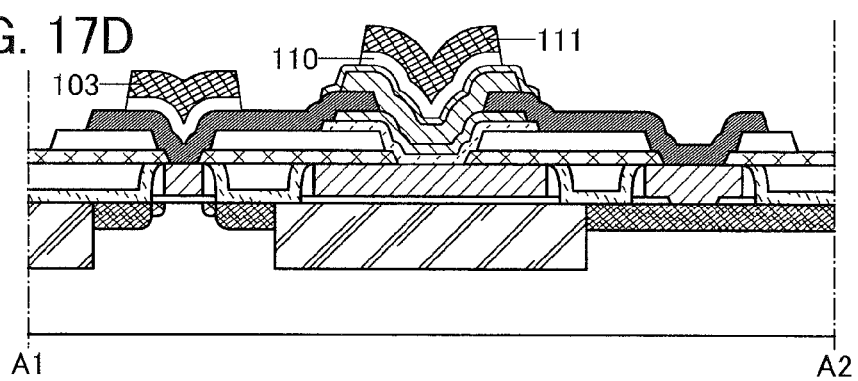

Then, part of the oxide semiconductor layer 115c is selectively etched using a resist mask, so that the oxide semiconductor layer 108c is formed (see FIG. 17B).

The oxide semiconductor layer 115c may be etched by either one or both of a dry etching method and a wet etching method. After the etching, the resist mask is removed.

Next, the insulating layer 120 for forming the insulating layer 110 is formed. In this embodiment, as the insulating layer 120, 20-nm-thick silicon oxynitride is deposited by a plasma CVD method (see FIG. 17C).

Then, the conductive layer 121 for forming the electrodes 103 and 111 is formed over the insulating layer 120. In this embodiment, the conductive layer 121 is formed by depositing 30-nm-thick tantalum nitride and 135-nm-thick tungsten by a sputtering method (see FIG. 17C).

Next, part of the conductive layer 121 is selectively etched using a resist mask, so that the electrode 103 and the electrode 111 (including other electrodes and wirings formed using the same conductive layer) are formed. The etching of the conductive layer may be performed by a dry etching method, a wet etching method, or both of them. After that, the resist mask is removed.

Next, part of the insulating layer 120 is etched using the electrode 103 and the electrode 111 as masks, so that the insulating layer 110 is formed. The etching of the insulating layer 120 may be performed with the resist mask used for etching the conductive layer 121 unremoved. Furthermore, the etching of the conductive layer 121 and the etching of the insulating layer 120 may be performed in the same etching step (see FIG. 17D).

In this manner, the transistor 750, the transistor 160, and the capacitor 190 are formed.

Next, the insulating layer 112 is formed. In this embodiment, 70-nm-thick aluminum oxide is formed as the insulating layer 112. After the formation of the insulating layer 112, oxygen doping treatment may be performed.

Figure 18A:
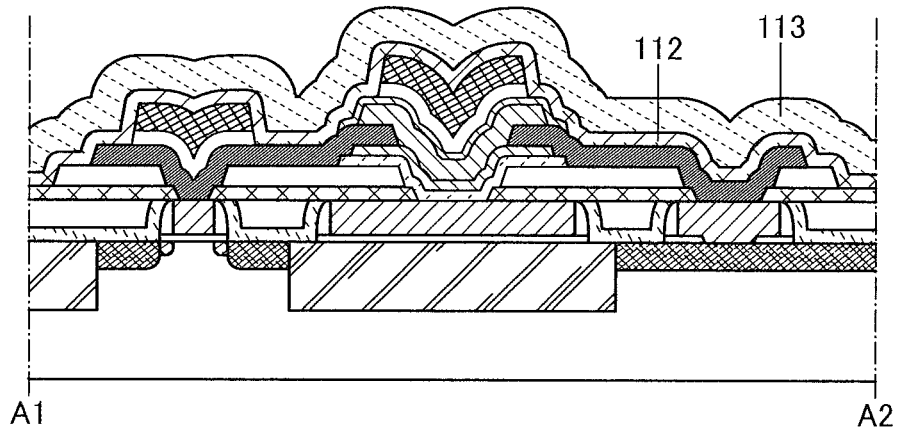
FIGS. 18A to 18C illustrate an example of a manufacturing process of a semiconductor device.

Then, the insulating layer 113 is formed over the insulating layer 112 (see FIG. 18A). In this embodiment, 300-nm-thick silicon oxynitride is formed as the insulating layer 113. After the formation of the insulating layer 113, oxygen doping treatment may be performed.

Next, heat treatment may be performed in a reduced-pressure atmosphere, an inert gas atmosphere of nitrogen, a rare gas, or the like, an oxidizing gas atmosphere, or an ultra-dry air atmosphere. The heat treatment is performed at a temperature higher than or equal to 250° C. and lower than or equal to 650° C., preferably higher than or equal to 300° C. and lower than or equal to 500° C. The treatment time is shorter than or equal to 24 hours. Heat treatment for over 24 hours is not preferable because the productivity is reduced.

Figure 18B:
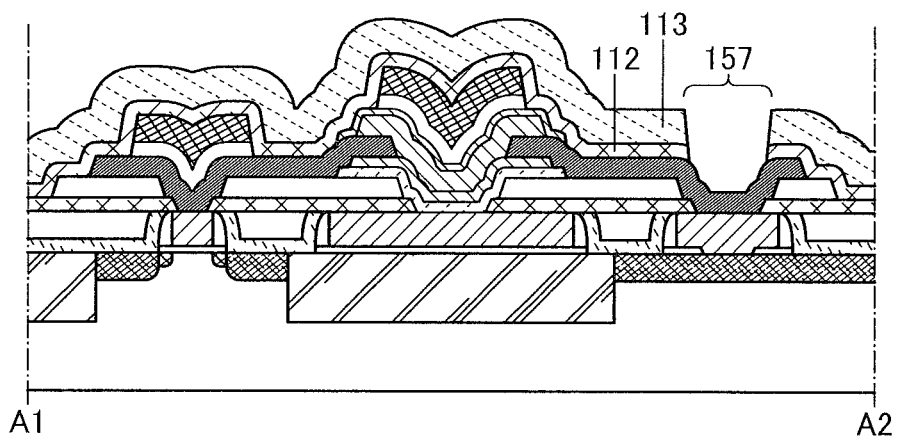
Figure 18C:
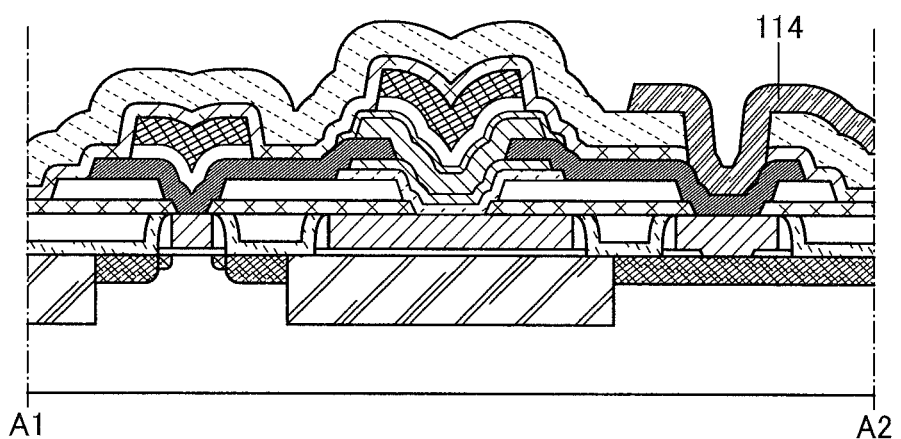

Next, part of the insulating layer 112 and part of the insulating layer 113 are selectively etched using a resist mask to form the opening 157 (see FIG. 18B).

Then, a conductive layer for forming the electrode 114 is formed. In this embodiment, the conductive layer is formed to have a three-layer structure including a 50-nm-thick titanium layer, a 200-nm-thick aluminum layer, and a 50-nm-thick titanium layer in this order by a sputtering method. Then, part of the conductive layer is selectively etched using a resist mask formed over the conductive layer, so that the electrode 114 is formed (see FIG. 18C).

Next, heat treatment may be performed in a reduced-pressure atmosphere, an inert gas atmosphere of nitrogen, a rare gas, or the like, an oxidizing gas atmosphere, or an ultra-dry air atmosphere. The heat treatment is performed at a temperature higher than or equal to 250° C. and lower than or equal to 650° C. preferably higher than or equal to 300° C. and lower than or equal to 500° C. The treatment time is shorter than or equal to 24 hours. Heat treatment for over 24 hours is not preferable because the productivity is reduced.

Through the above-described process, the semiconductor device 1100 can be manufactured.

<Variation of Semiconductor Device>

Figure 21A:
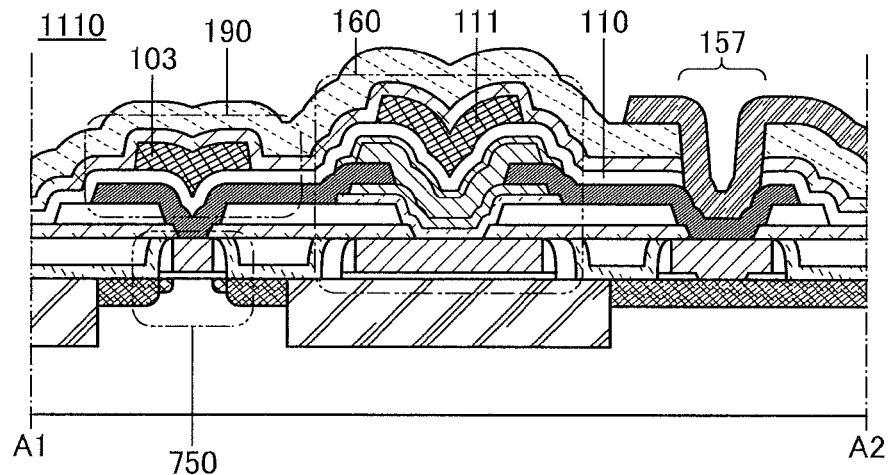
FIGS. 21A to 21C each illustrate an example of a semiconductor device.
Figure 21B:
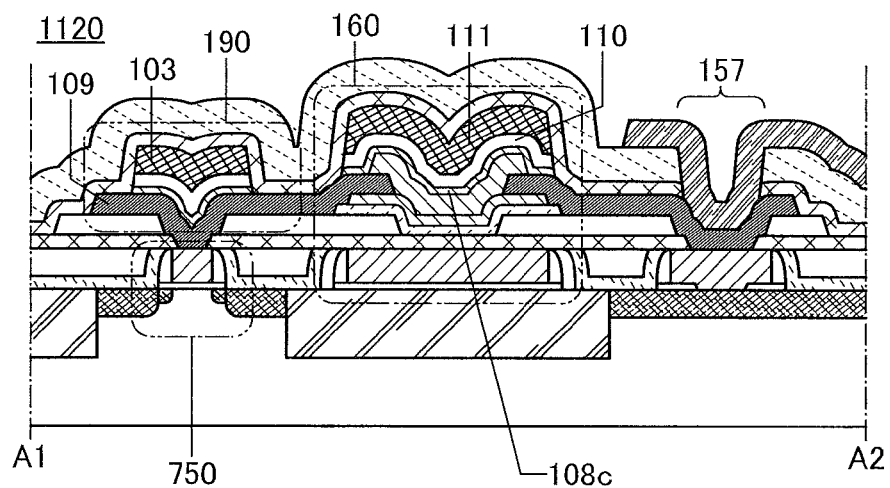
Figure 21C:
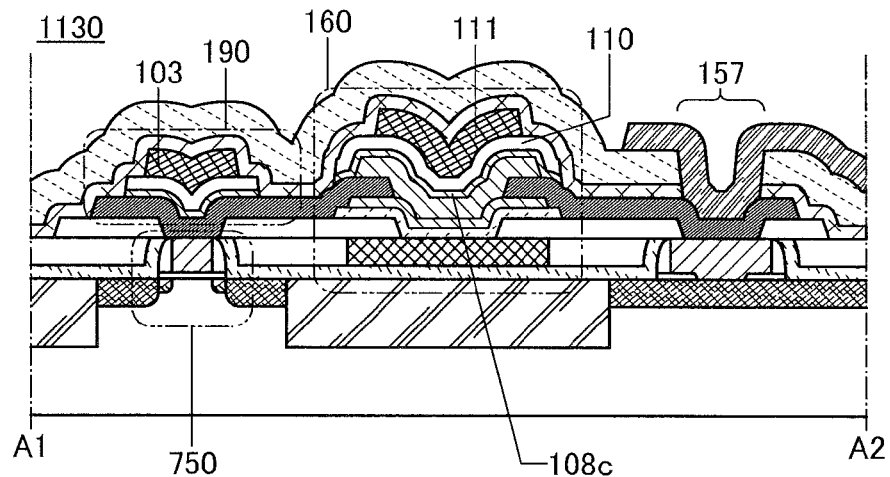

FIGS. 21A to 21C. FIGS. 22A to 22C, and FIGS. 23A to 23C illustrate variations of the semiconductor device 1100.

As in a semiconductor device 1110 illustrated in FIG. 21A, part of the insulating layer 110 may be left without being etched after the electrodes 103 and 111 are formed. In this case, the step of etching part of the insulating layer 110 after the formation of the electrodes 103 and 111 can be eliminated, increasing the productivity of the semiconductor device.

As in a semiconductor device 1120 illustrated in FIG. 21B, part of the insulating layer 110 and part of the oxide semiconductor layer 108c may be selectively etched using the electrode 103 and the electrode 111 as masks. In this case, selective etching of the insulating layer 110 and the oxide semiconductor layer 108c can be performed in the same process for forming the electrodes 103 and 111; accordingly, the step of forming the oxide semiconductor layer 108c before the formation of the insulating layer 110 can be eliminated, increasing the productivity of the semiconductor device.

In the semiconductor device 1120, part of the oxide semiconductor layer 108c as well as part of the insulating layer 110 is formed between the electrode 103 and the electrode 109 in the capacitor 190. By using the insulating layer 110 and the oxide semiconductor layer 108c as a dielectric layer of the capacitor 190, the distance between the electrode 103 and the electrode 109 can be increased, which increases the withstand voltage of the capacitor 190. Moreover, leakage current between the electrode 103 and the electrode 109 can be reduced. Accordingly, the reliability of the semiconductor device can be improved. In addition, power consumption of the semiconductor device can be reduced.

As in a semiconductor device 1130 illustrated in FIG. 21C, after the oxide semiconductor layer 108c and the insulating layer 110 are formed successively, part of the insulating layer 110 and part of the oxide semiconductor layer 108c may be selectively removed using a resist mask, and then the electrodes 103 and 111 may be formed.

Figure 22A:
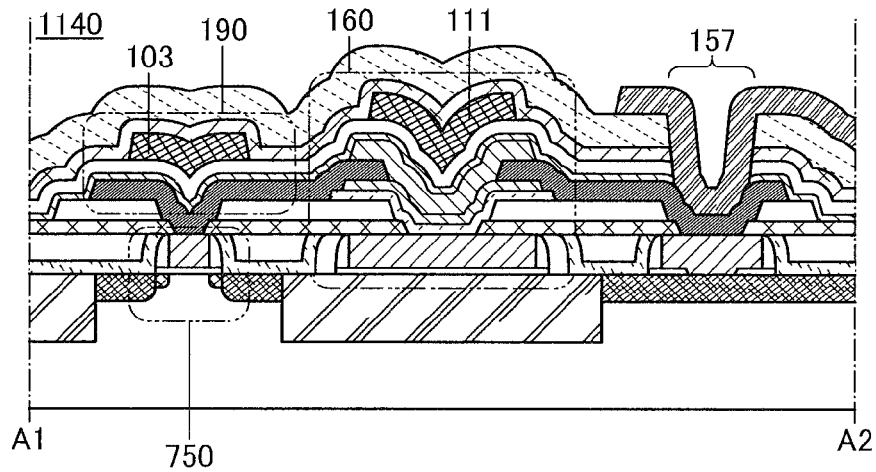
FIGS. 22A to 22C each illustrate an example of a semiconductor device.

As in a semiconductor device 1140 illustrated in FIG. 22A, it is possible to omit etching of the insulating layer 110 and the oxide semiconductor layer 108c.

Figure 22B:
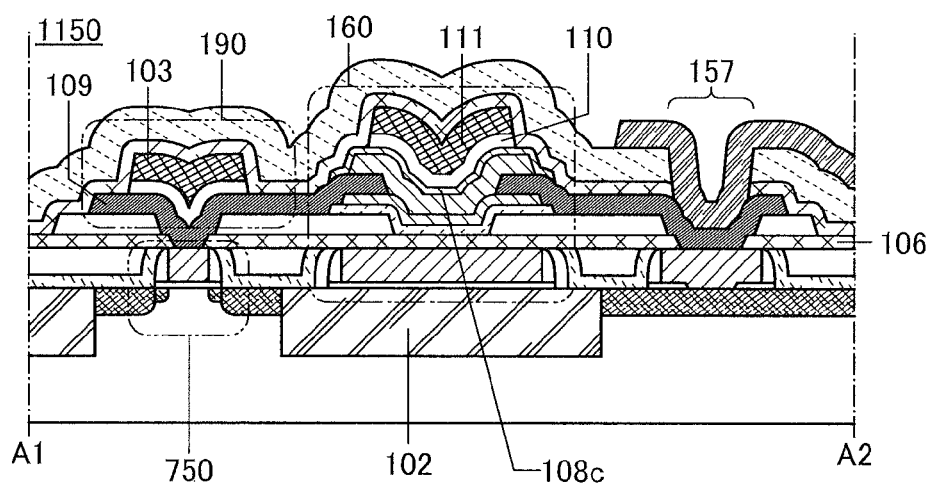

As in a semiconductor device 1150 illustrated in FIG. 22B, the insulating layer 106 over the electrode 102 may be left without being removed. This structure can enhance the effect of preventing diffusion of impurities to the oxide semiconductor layer 108 from the outside. In addition, this structure can enhance the effect of preventing diffusion of oxygen contained in the oxide semiconductor layer 108 to the outside.

Figure 22C:
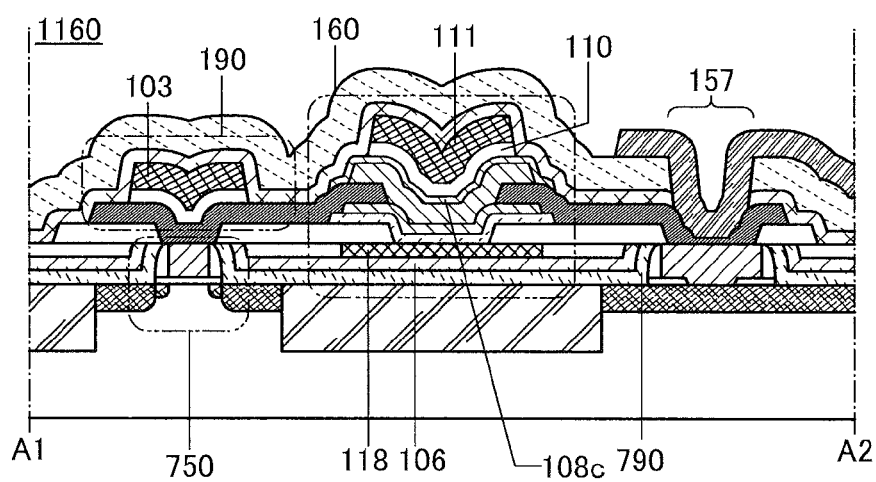

As in a semiconductor device 1160 illustrated in FIG. 22C, the insulating layer 106 may be formed over the insulating layer 790, and an electrode 118 that can function like the electrode 102 may be provided over the insulating layer 106. Since the insulating layer 106 is formed over the insulating layer 790 in the semiconductor device 1160, the electrode 102 cannot be formed at the same time as the electrodes 751 and 104. For this reason, the electrode 118 that can function like the electrode 102 is formed over the insulating layer 106. However, by providing the insulating layer 106 below the electrode 118, the electrode 118 can be positioned closer to the oxide semiconductor layer 108 by the thickness of the insulating layer 106; accordingly, the effect of the electrode 118 as a gate electrode or a back gate electrode can be enhanced. The electrode 118 can be formed using a material and a method that are similar to those of the electrode 103, the electrode 109, the electrode 111, the electrode 114, or the electrode 119.

Figure 23A:
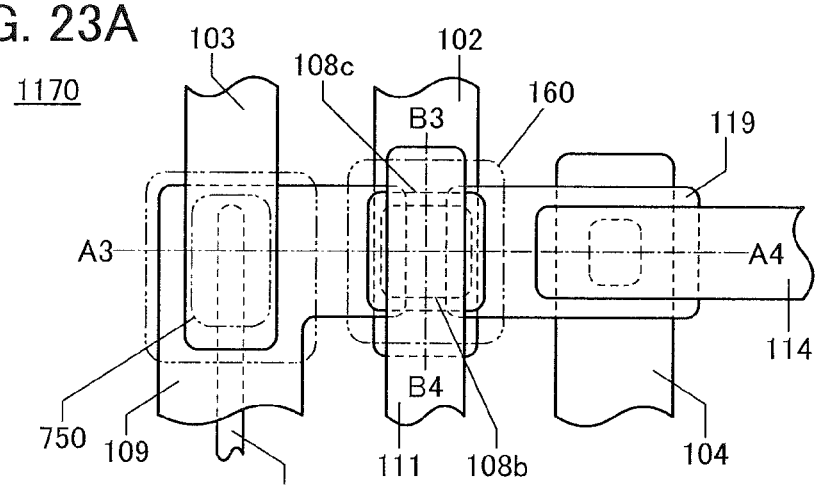
FIGS. 23A to 23C illustrate an example of a semiconductor device.
Figure 23B:
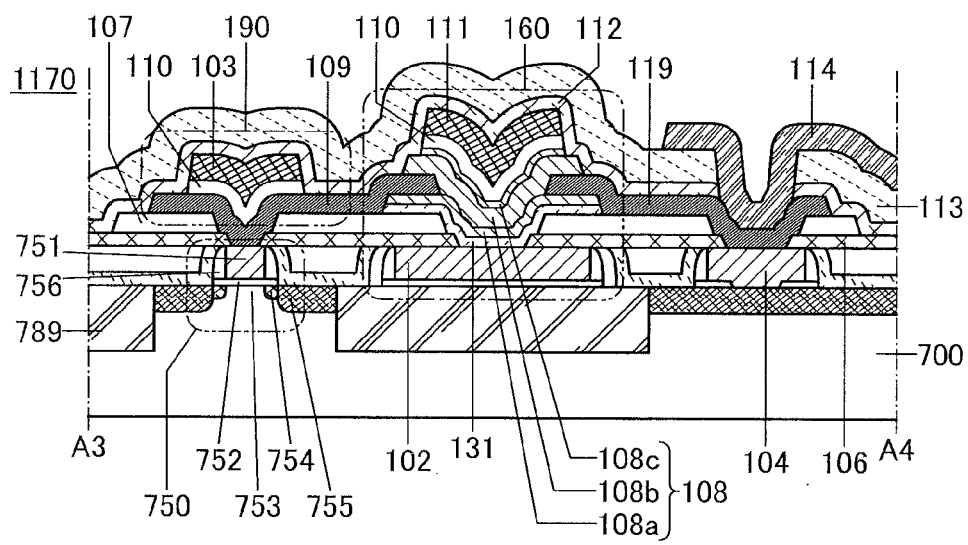
Figure 23C:
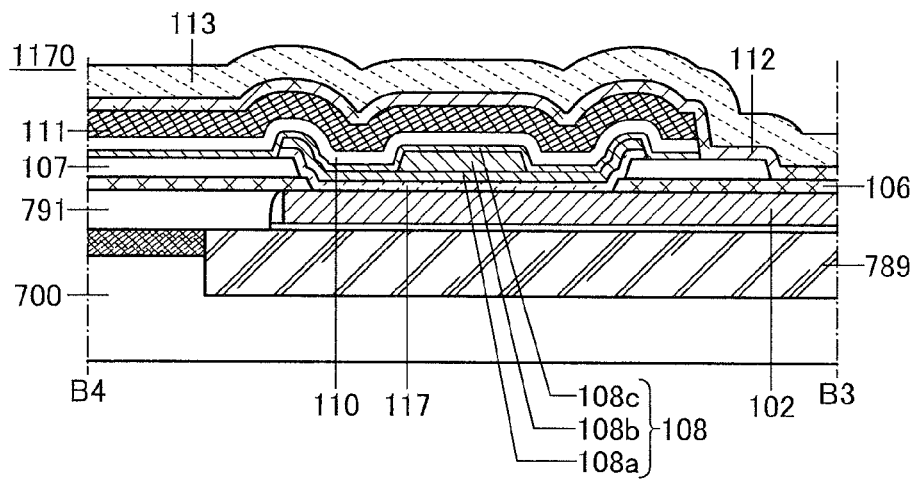

Furthermore, a structure of a semiconductor device 1170 illustrated in FIGS. 23A to 23C may be employed. FIG. 23A is a top view of the semiconductor device 1170. FIG. 23B is a cross-sectional view taken along dashed-dotted line A3-A4 in FIG. 23A. FIG. 23C is a cross-sectional view taken along dashed-dotted line B3-B4 in FIG. 23A.

As to the semiconductor device 1170, the insulating layer 131 and the oxide semiconductor layer 115a are formed successively and then selectively etched in the same etching step. Furthermore, the oxide semiconductor layer 115c, the insulating layer 120, and the conductive layer 121 are formed successively and then etched in the same etching step. By etching a plurality of layers in the same etching step, the number of manufacturing steps of the semiconductor device can be reduced, improving yield and increasing the productivity of the semiconductor device. Moreover, the reduction in the number of manufacturing steps of the semiconductor device can reduce manufacturing cost of the semiconductor device.

With one embodiment of the present invention, a semiconductor device with favorable electrical characteristics can be provided. With one embodiment of the present invention, a semiconductor device with high productivity can be provided. Furthermore, with one embodiment of the present invention, a highly reliable semiconductor device can be provided. Furthermore, with one embodiment of the present invention, a semiconductor device with low power consumption can be provided.

In this embodiment, oxide semiconductors are described as examples of the semiconductor layers of the transistor 160. However, one embodiment of the present invention is not limited to these examples, and an amorphous semiconductor, a microcrystalline semiconductor, a polycrystalline semiconductor, or the like may be used as examples of the semiconductor layers. For example, amorphous silicon, microcrystalline germanium, polycrystalline silicon, or the like may be used. In the case where a higher field-effect mobility of the transistor 160 is required for example, polycrystalline silicon or the like may be used as a semiconductor layer of the transistor 160. Alternatively, a compound semiconductor such as silicon carbide, gallium arsenide, or a nitride semiconductor, an organic semiconductor, or the like may be used.

This embodiment can be combined with any of the other embodiments described in this specification as appropriate.
(Embodiment 3)

In this embodiment, a semiconductor device 1200 having a different structure from the semiconductor device 100, the semiconductor device 1100, and the like disclosed in the above embodiments will be described with reference to drawings. To avoid repeated description in this embodiment, description of the same portions as those of the semiconductor device 100, the semiconductor device 1100, and the like is omitted unless otherwise specified. For the same portions as those of the semiconductor device 100, the semiconductor device 1100, and the like, other embodiments may be referred to.
<Structure Example of Semiconductor Device>

Figure 24A:
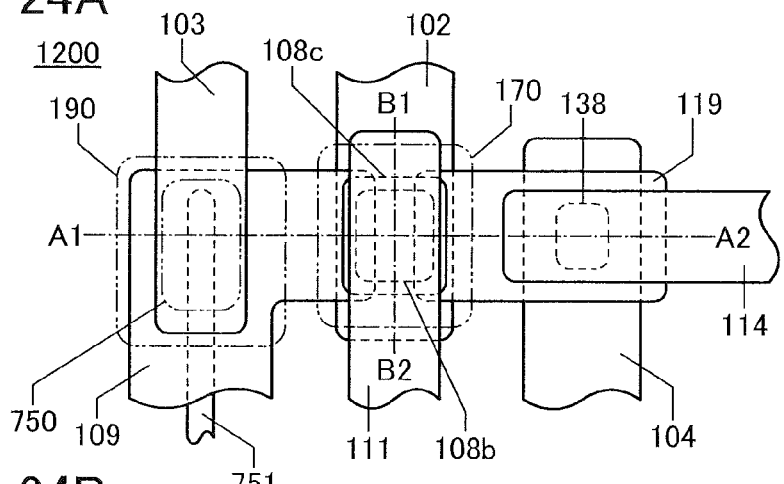
FIGS. 24A to 24C illustrate an example of a semiconductor device.
Figure 24B:
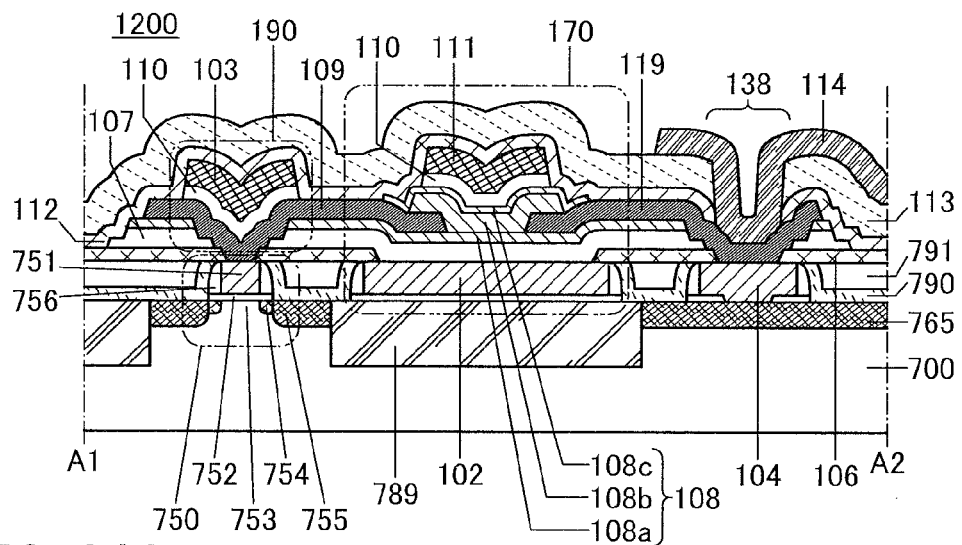
Figure 24C:
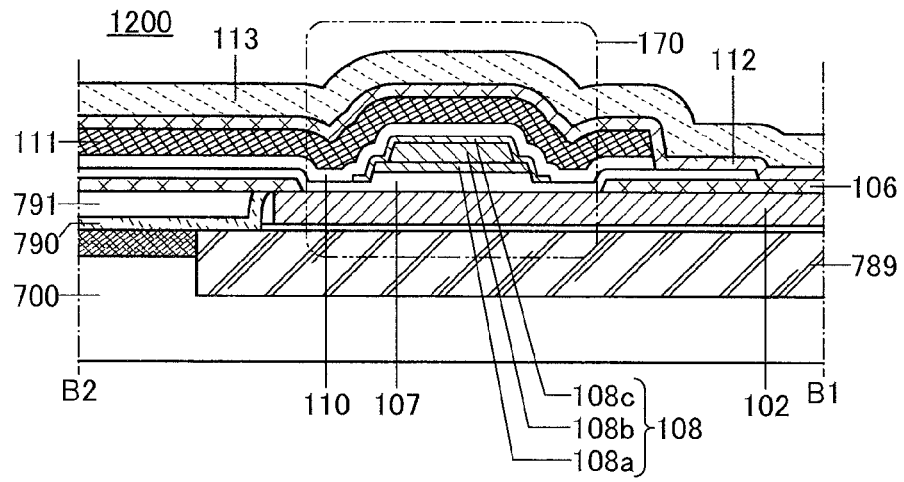

FIG. 24A is a top view of the semiconductor device 1200. FIG. 24B is a cross-sectional view taken along dashed-dotted line A1-A2 in FIG. 24A. FIG. 24C is a cross-sectional view taken along dashed-dotted line B1-B2 in FIG. 24A. The semiconductor device 1200 includes the transistor 750, a transistor 170, and the capacitor 190. FIG. 24B is a cross-sectional view of the transistor 170 in a channel length direction, and FIG. 24C is a cross-sectional view of the transistor 170 in a channel width direction.
[Transistor 750]

The transistor 750 of the semiconductor device 1200 is formed using the substrate 700, in the same manner as that of the semiconductor device 100 described in the above embodiment.

In this embodiment, an example in which a p-type single crystal silicon substrate is used as the substrate 700 is described. The transistor 750 is a transistor whose channel is formed in the substrate 700.

The transistor 750 is separated from other transistors formed on the substrate 700 by the element separation region 789. The insulating layer 790 and the insulating layer 791 are formed around the electrode 751 and the sidewall insulating layer 756.
[Transistor 170]

Figure 25A:
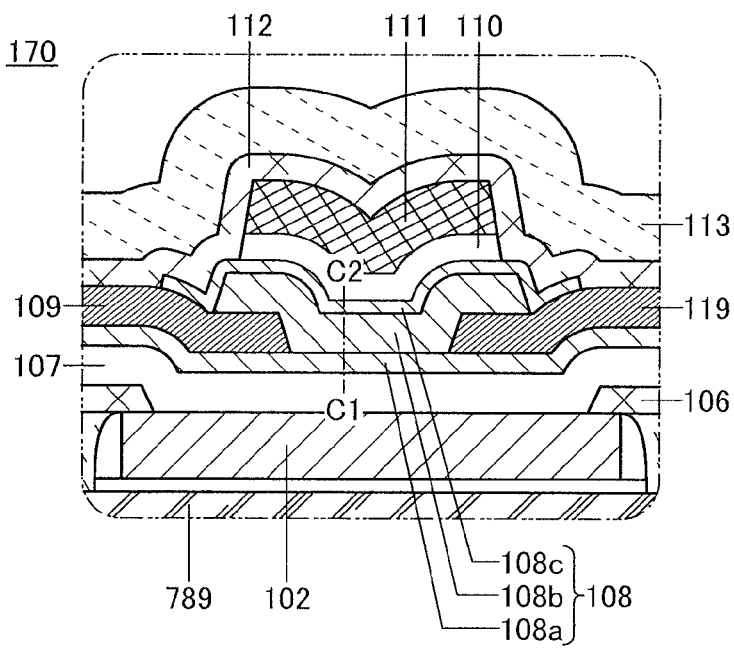
FIGS. 25A to 25C each illustrate an example of a semiconductor device.

The transistor 170 includes the electrode 102, the insulating layer 107, the electrode 109, the electrode 119, the oxide semiconductor layer 108 (the oxide semiconductor layer 108a, the oxide semiconductor layer 108b, and the oxide semiconductor layer 108c), the insulating layer 110, and the electrode 111. FIG. 25A is an enlarged view of the transistor 170 illustrated in FIG. 24B. Note that at least one of the oxide semiconductor layers 108a to 108c may be omitted from the oxide semiconductor layer 108, or another layer may be added to the oxide semiconductor layer 108.

The insulating layer 106 is formed over the insulating layer 791 so as to be in contact with part of the electrode 102, and the insulating layer 107 is formed over the insulating layer 106. Part of the insulating layer 107 is in contact with part of the electrode 102. The oxide semiconductor layer 108a is formed over the insulating layer 107, and the electrode 109 and the electrode 119 are formed over the oxide semiconductor layer 108a. The insulating layer 107 has a projection, and the oxide semiconductor layer 108a is formed over the projection (see FIGS. 24B and 24C).

The electrode 109 is electrically connected to the electrode 751 through an opening provided in the oxide semiconductor layer 108a, the insulating layer 107, and the insulating layer 106. The electrode 119 is electrically connected to the electrode 104 through an opening provided in the oxide semiconductor layer 108a, the insulating layer 107, and the insulating layer 106.

The oxide semiconductor layer 108b is formed over the electrode 109 and the electrode 119 so as to be in contact with part of the oxide semiconductor layer 108a. The oxide semiconductor layer 108c is formed to cover the oxide semiconductor layer 108b.

The electrode 111 is formed over the oxide semiconductor layer 108c with the insulating layer 110 provided therebetween. The electrode 111 overlaps at least each of the following: part of the oxide semiconductor layer 108b, part of the electrode 102, part of the electrode 109, and part of the electrode 119.

The electrodes 109 and 119 can function as a source electrode and a drain electrode.

The transistor 170 described as an example in this embodiment is a transistor which uses an oxide semiconductor for a semiconductor layer in which a channel is formed. The transistor 170 is of one kind of top-gate transistor and also one kind of staggered transistor. The transistor 170 includes a back gate electrode.

Therefore, the transistor 170 has comparatively large on-state current in view of its area. That is, the area occupied by the transistor 170 can be small for required on-state current. With one embodiment of the present invention, the area occupied by a transistor can be reduced. Therefore, a semiconductor device having a high degree of integration can be provided.

The transistor 170 including the back gate electrode has a small change in threshold voltage between before and after a +GBT stress test in which positive charges are applied to a gate.

The transistor 170 can be operated as long as either one of the electrodes 102 and 111 is included. Thus, in accordance with the purpose, formation of either one of the electrodes 102 and 111 may be omitted, in which case productivity of the semiconductor device can be increased.

With one embodiment of the present invention, a transistor with a small variation in electrical characteristics can be provided. Accordingly, a semiconductor device with a small variation in electrical characteristics can be provided. With one embodiment of the present invention, a transistor with high reliability can be provided. Accordingly, a semiconductor device with high reliability can be provided.

An oxide semiconductor has a band gap of 2 eV or more, therefore, a transistor including an oxide semiconductor in a semiconductor layer in which a channel is formed has an extremely small off-state current. Specifically, the off-state current per micrometer of channel width at room temperature can be lower than $1\times10^{-20}$ A, lower than $1\times10^{-22}$ A, or lower than $1\times10^{-24}$ A. That is, the on/off ratio of the transistor can be greater than or equal to 20 digits and less than or equal to 150 digits.

With one embodiment of the present invention, a transistor with low power consumption can be provided. Accordingly, a semiconductor device with low power consumption can be provided.

Note that the above-described three-layer structure is an example. For example, a two-layer structure without either one of the oxide semiconductor layers 108a and 108c may be employed.

As illustrated in FIG. 24C, in the transistor 170 in the channel width direction, the electrode 111 covers the oxide semiconductor layer 108b. By the existence of the insulating layer 107 having the projection, the side surfaces of the oxide semiconductor layer 108b can be covered with the electrode 111. That is, the s-channel structure in which the oxide semiconductor layer 108b is electrically surrounded by an electric field of the electrode 111 is formed.

Figure 25B:
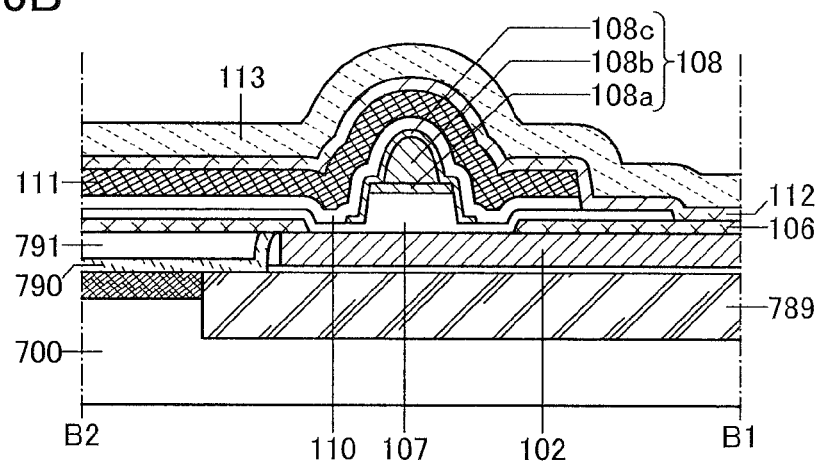
Figure 25C:
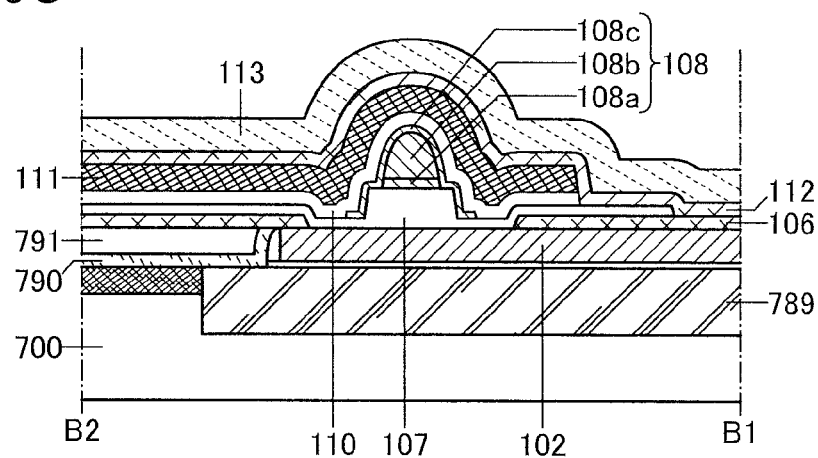

When the projection of the insulating layer 107 is increased in height, the side surfaces of the oxide semiconductor layer 108a are covered with the electrode 111, and the channel width is shortened as illustrated in FIG. 25B, the effects of the s-channel structure to increase the on-state current and reduce the off-state current can be enhanced. Part of the oxide semiconductor layer 108a that is exposed at the etching of the oxide semiconductor layer 115b (formation of the oxide semiconductor layer 108b) may be removed. In this case, as illustrated in FIG. 25C, the side surfaces of the oxide semiconductor layer 108a can be aligned with the side surfaces of the oxide semiconductor layer 108b.

[Capacitor 190]

The capacitor 190 includes the electrode 109, the insulating layer 110, and the electrode 103. By overlapping the transistor 750 with the capacitor 190, the area occupied by the semiconductor device 1200 can be reduced. Therefore, with one embodiment of the present invention, a semiconductor device having a high degree of integration can be provided.

Next, other components of the semiconductor device 1200 will be described.

The insulating layer 112 and the insulating layer 113 are formed to cover the transistor 170 and the capacitor 190. The electrode 114 formed over the insulating layer 113 is electrically connected to the electrode 119 through an opening 138 formed in the insulating layer 112 and the insulating layer 113.

The electrodes 102 and 104 are formed using the same layer as the electrode 751. The electrodes 102, 104, and 751 are formed using a conductive material that can withstand heat treatment performed in a later step. In this embodiment, the electrodes 102, 104, and 751 are formed using p-type silicon.

The electrode 104 is connected to the n-type impurity region 765 through an opening provided in the insulating layer 752.

The insulating layer 107 is preferably formed using an insulating layer containing oxygen at a higher proportion than oxygen in the stoichiometric composition.

The semiconductor device 1200 includes a region where the insulating layer 106 is in contact with the insulating layer 112. In FIG. 24B, a region where the insulating layer 106 is in contact with the insulating layer 112 is illustrated at both ends of the drawing. FIG. 24C illustrates a region where the insulating layer 106 is in contact with the insulating layer 112 at one end of the drawing. This structure can enhance the effect of preventing diffusion of impurities to the oxide semiconductor layer 108 from the outside. In addition, this structure can enhance the effect of preventing diffusion of oxygen contained in the oxide semiconductor layer 108 to the outside. With one embodiment of the present invention, a highly reliable semiconductor device can be provided.

A planarization insulating layer may be provided over the electrode 114 and the insulating layer 113. The planarization insulating layer can be formed using an organic material having heat resistance, such as a polyimide, an acrylic resin, a benzocyclobutene-based resin, a polyamide, or an epoxy resin. Other than such organic materials, it is possible to use a low-dielectric constant material (a low-k material), a siloxane-based resin, phosphosilicate glass (PSG), borophosphosilicate glass (BPSG), or the like. The planarization insulating layer may be formed by stacking a plurality of insulating films formed using these materials.

<Example of Method for Manufacturing Semiconductor Device>

A method for manufacturing the semiconductor device 1200 will be described with reference to FIGS. 26A to 26D, FIGS. 27A to 27D, FIGS. 28A to 28D, FIGS. 29A to 29C. FIGS. 30A and 30B, and FIGS. 31A to 31D. Note that FIGS. 26A to 26D, FIGS. 27A to 27D, FIGS. 28A to 28D, FIGS. 29A to 29C, and FIGS. 30A and 30B correspond to cross-sectional views taken along dashed-dotted line A1-A2 in FIG. 24A. FIGS. 31A to 31D correspond to cross-sectional views taken along dashed-dotted line B1-B2 in FIG. 24A.

First, the element separation region 789 is formed in the substrate 700 by an STI method. In this embodiment, p-type single crystal silicon is used as the substrate 700. Next, the transistor 750 is formed in part of the region except the element separation region 789. As the insulating layer 752, silicon oxide formed by a thermal oxidation method is used. As the electrode 751, n-type polycrystalline silicon formed by a CVD method is used. The electrode 102 and the electrode 104 can be formed at the same time as the electrode 751. Note that before the formation of the electrodes 751, 102, and 104, part of the insulating layer 752 is removed to form an opening 757. As the sidewall insulating layer 756, silicon oxynitride formed by a CVD method is used.

The n-type impurity regions 754 and the n-type impurity regions 755 can be formed by a known method such as an ion implantation method. The n-type impurity region 765 can be formed at the same time as the n-type impurity regions 755.

After the transistor 750 is formed, the insulating layer 790 containing hydrogen is formed to cover the transistor 750, the electrode 102, and the electrode 104. In this embodiment, silicon oxynitride containing hydrogen formed by a CVD method is used as the insulating layer 790. After the insulating layer 790 is formed, treatment for adding hydrogen to the insulating layer 790 may be performed. The treatment for adding hydrogen can be performed with an ion implantation apparatus, an ion doping apparatus, or a plasma treatment apparatus.

Next, the insulating layer 791 is formed over the insulating layer 790. In this embodiment, silicon oxynitride formed by a CVD method is used as the insulating layer 791.

Next, heat treatment for diffusing hydrogen contained in the insulating layer 790 to the transistor 750 to reduce defects due to dangling bonds or the like in the transistor 750 is performed. The heat treatment is performed at a temperature higher than or equal to 300° C. and lower than or equal to 800° C., preferably higher than or equal to 400° C. and lower than or equal to 700° C. The treatment time is shorter than or equal to 24 hours. Heat treatment for over 24 hours is not preferable because the productivity is reduced. By this heat treatment, defects due to dangling bonds or the like in the transistor 750 are reduced, and in addition hydrogen that is an impurity in an oxide semiconductor can be reduced.

There is no particular limitation on the heat treatment apparatus used for the heat treatment, and the apparatus may be provided with a device for heating an object by heat radiation or heat conduction from a heating element such as a resistance heating element.

Next, CMP treatment is performed to expose the surfaces of the electrode 751, the electrode 102, and the electrode 104. By the CMP treatment, unevenness of the surfaces can be reduced, and coverage with an insulating layer or a conductive layer to be formed later can be increased (see FIG. 26A).

Note that the heat treatment may be performed after the CMP treatment.

Next, the insulating layer 106 is formed to cover the insulating layer 790, the insulating layer 791, the electrode 751, the electrode 102, and the electrode 104. The insulating layer 106 preferably has a thickness of more than or equal to 10 nm and less than or equal to 200 nm, and further preferably more than or equal to 10 nm and less than or equal to 100 nm. In this embodiment, as the insulating layer 106, 50-nm-thick aluminum oxide is deposited by a sputtering method.

Figure 26A:
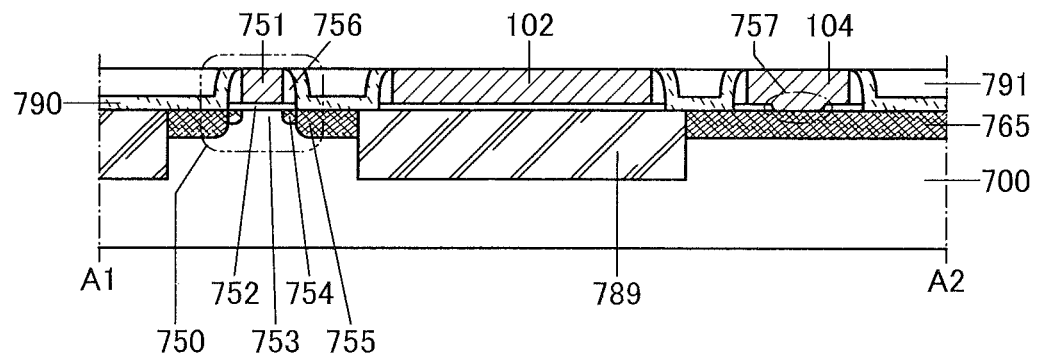
FIGS. 26A to 26D illustrate an example of a manufacturing process of a semiconductor device.
Figure 26B:
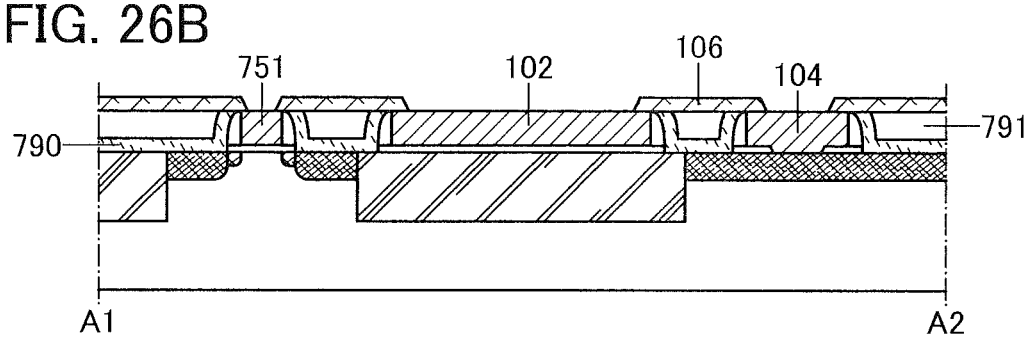
Figure 26C:
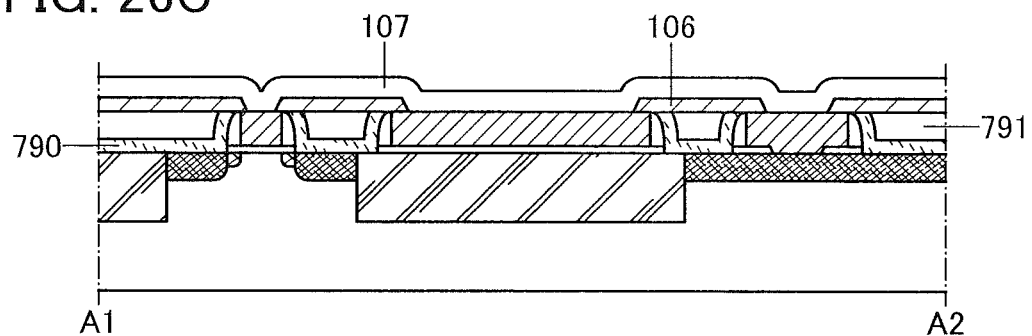
Figure 26D:
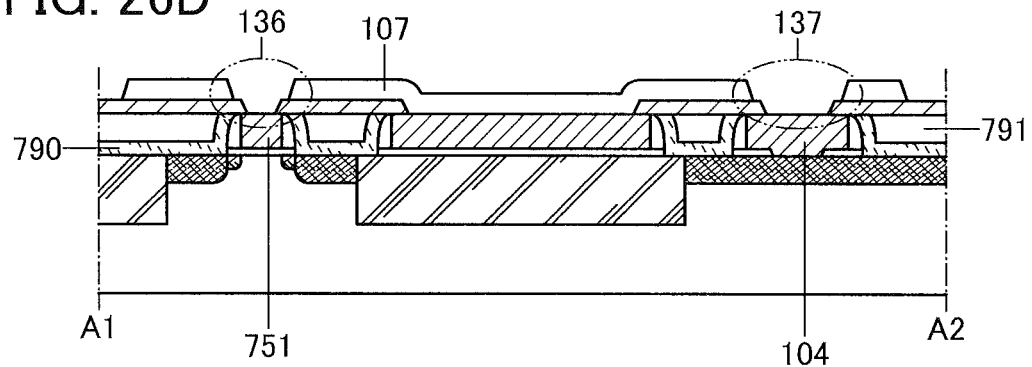

Next, part of the insulating layer 106 is selectively etched using a resist mask to expose the surfaces of the electrodes 751, 102, and 104 (see FIG. 26B).

The resist mask can be formed by a lithography method, a printing method, an inkjet method, or the like as appropriate. Formation of the resist mask by an inkjet method needs no photomask; thus, manufacturing cost can be reduced.

The insulating layer 106 may be etched by either one or both of a dry etching method and a wet etching method. After the etching of the insulating layer 106, the resist mask is removed.

Note that the heat treatment may be performed after the formation of the insulating layer 106.

Next, the insulating layer 107 is formed. The insulating layer 107 preferably has a thickness of more than or equal to 10 nm and less than or equal to 200 nm, and further preferably more than or equal to 10 nm and less than or equal to 100 nm. In this embodiment, as the insulating layer 107, 100-nm-thick silicon oxynitride containing oxygen at a higher proportion than oxygen in the stoichiometric composition is used. The insulating layer 107 can be formed by a CVD method (see FIG. 26C).

The insulating layer containing excess oxygen can be formed by performing treatment for adding oxygen to an insulating layer. The treatment for adding oxygen can be performed by heat treatment under an oxygen atmosphere or performed with an ion implantation apparatus, an ion doping apparatus, or a plasma treatment apparatus. As a gas for adding oxygen, an oxygen gas of $^{16}O_2$, $^{18}O_2$, or the like, a nitrous oxide gas, an ozone gas, or the like can be used. In this specification, the treatment for adding oxygen is also referred to as "oxygen doping treatment".

Next, part of the insulating layer 107 is selectively etched using a resist mask to expose the surfaces of the electrodes 751 and 104. In this way, the openings 136 and 137 can be formed (see FIG. 26D and FIG. 31A). The insulating layer 107 may be etched by either one or both of a dry etching method and a wet etching method.

Next, the oxide semiconductor layer 115a for forming the oxide semiconductor layer 108a is formed over the insulating layer 107.

Figure 27A:
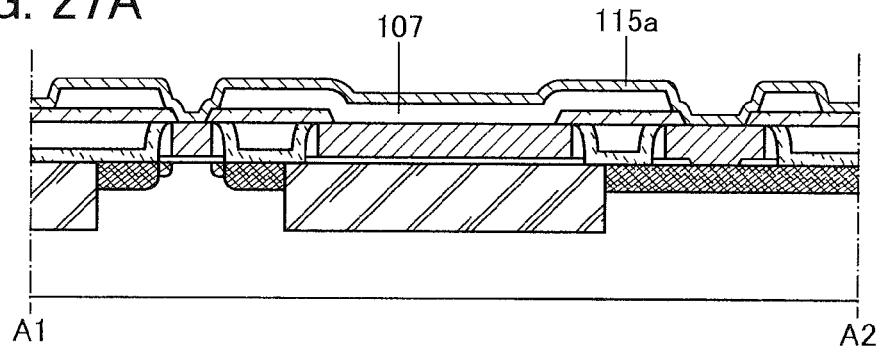
FIGS. 27A to 27D illustrate an example of a manufacturing process of a semiconductor device.
Figure 27B:
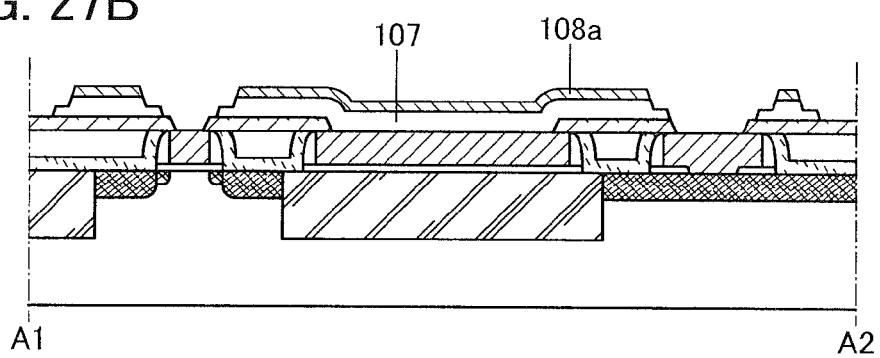
Figure 31A:
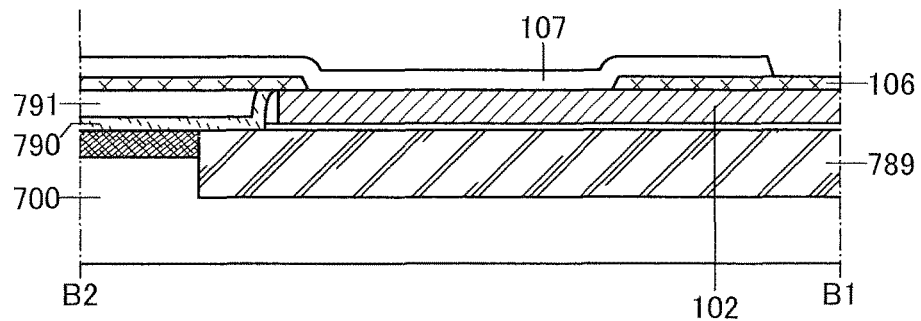
FIGS. 31A to 31D illustrate an example of a manufacturing process of a semiconductor device.
Figure 31B:
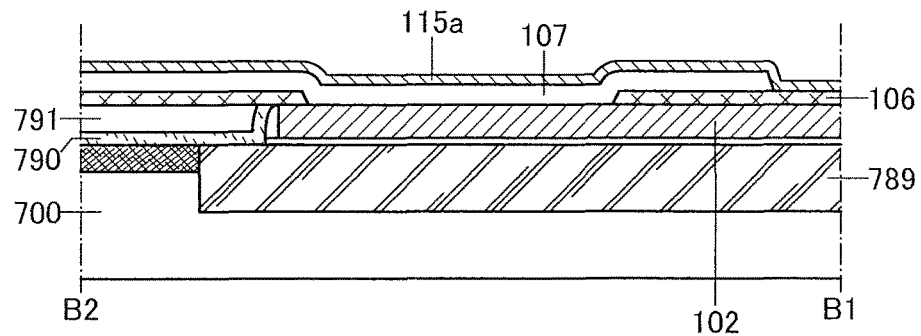
Figure 31C:
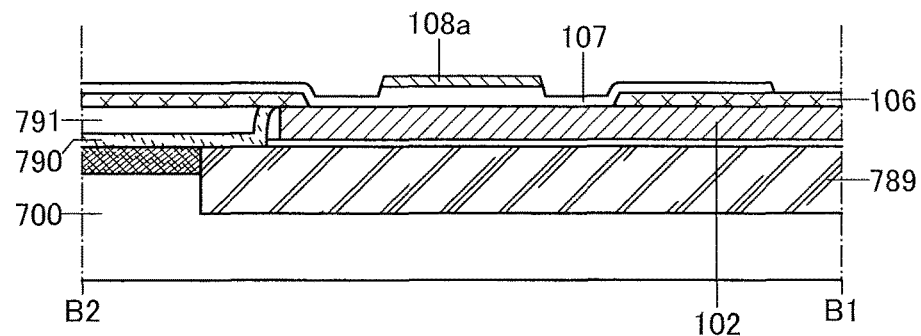
Figure 31D:
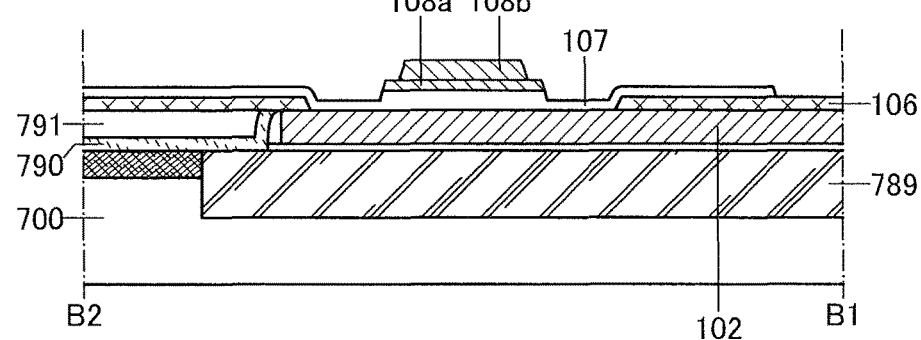

In this embodiment, as the oxide semiconductor layer 115a, 20-nm-thick In—Ga—Zn oxide is deposited by a sputtering method using an In—Ga—Zn oxide target (In:Ga:Zn=1:3:2) (see FIG. 27A and FIG. 31B).

Next, a resist mask is formed over the oxide semiconductor layer 115a, and part of the oxide semiconductor layer 115a is selectively etched using the resist mask, so that the oxide semiconductor layer 108a is formed. In addition, the insulating layer 107 is slightly etched in the region exposed by the etching of the oxide semiconductor layer 115a, so that the insulating layer 107 in that region is reduced in thickness. The etching depth in that region is preferably more than or equal to 20% and less than or equal to 50% of the original thickness of the insulating layer 107. In this manner, the projection can be formed in the insulating layer 107.

The oxide semiconductor layer 115a may be etched by either one or both of a dry etching method and a wet etching method. After the etching, the resist mask is removed (see FIG. 27B and FIG. 31C).

Figure 27C:
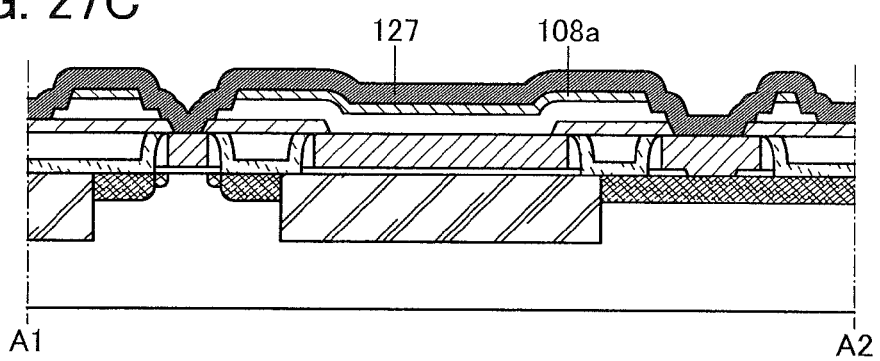

Next, the conductive layer 127 for forming the electrode 109 and the electrode 119 is formed over the oxide semiconductor layer 108a (see FIG. 27C). In this embodiment, as the conductive layer 127, 100-nm-thick tungsten is deposited by a sputtering method.

Figure 27D:
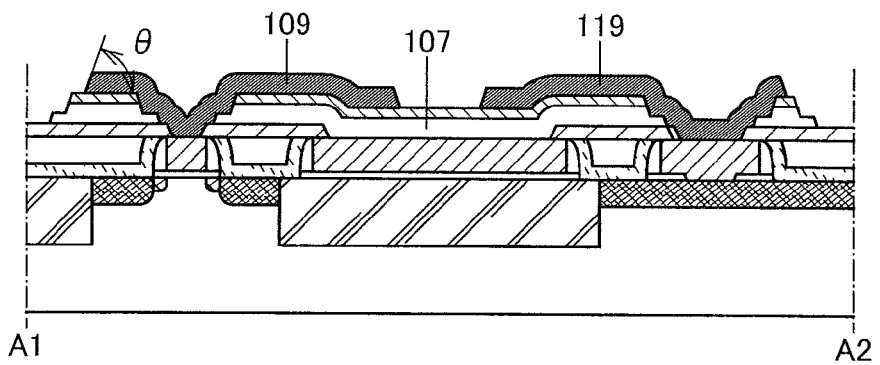

Next, part of the conductive layer 127 is selectively etched using a resist mask, so that the electrode 109 and the electrode 119 (including other electrodes and wirings formed using the same conductive layer) is formed (see FIG. 27D). The etching of the conductive layer 127 may be performed by a dry etching method, a wet etching method, or both of them.

When the electrodes 109 and 119 (including other electrodes and wirings formed using the same conductive layer) each have an end portion with a tapered shaped, the coverage with a layer that covers the side surfaces of the electrodes 109 and can be improved. Specifically, the edge has a taper angle θ of 80° or less, preferably 60° or less, further preferably 45° or less. Note that the "taper angle" refers to an inclination angle formed by a side surface and a bottom surface of a layer having a taper shape when the layer is seen from the cross-section direction of the layer (i.e., the plane perpendicular to the surface of the substrate). A taper angle smaller than 90° is called forward tapered angle and a taper angle larger than 90° is called inverse tapered angle (see FIG. 27D).

When the cross-section of each of the end portions of the electrodes 109 and 119 (including other electrodes and wirings formed using the same conductive layer) has a step-like shape including a plurality of steps, the coverage with a layer that covers the electrodes 109 and 119 can be improved. The above description is not limited to the electrode 109 and the electrode 119, and by providing a forward taper shape or a step-like shape of the end portion of each layer, a phenomenon in that a layer formed to cover the end portion is cut (disconnection) at the end portion can be prevented, so that the coverage becomes favorable.

Next, the oxide semiconductor layer 115b for forming the oxide semiconductor layer 108b is formed over the oxide semiconductor layer 108a, the electrode 109, and the electrode 119.

Figure 28A:
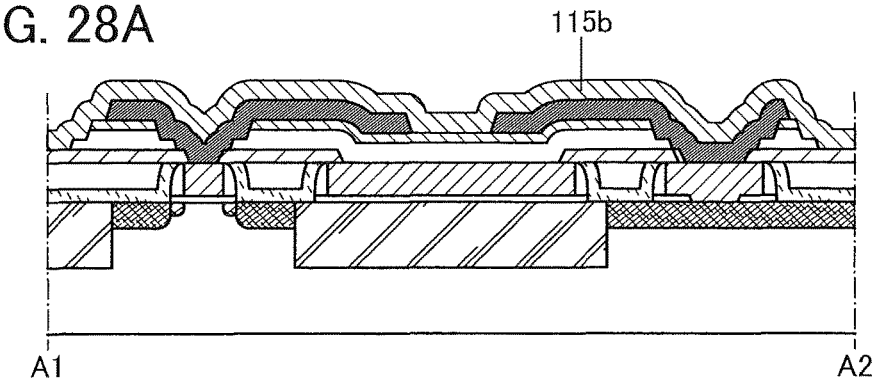
FIGS. 28A to 28D illustrate an example of a manufacturing process of a semiconductor device.
Figure 28B:
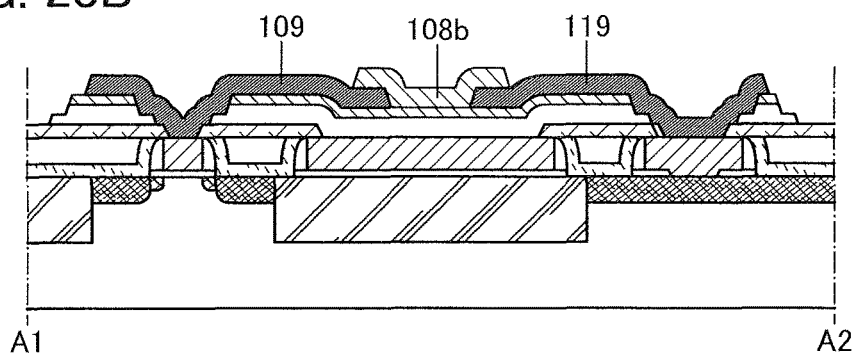
Figure 28C:
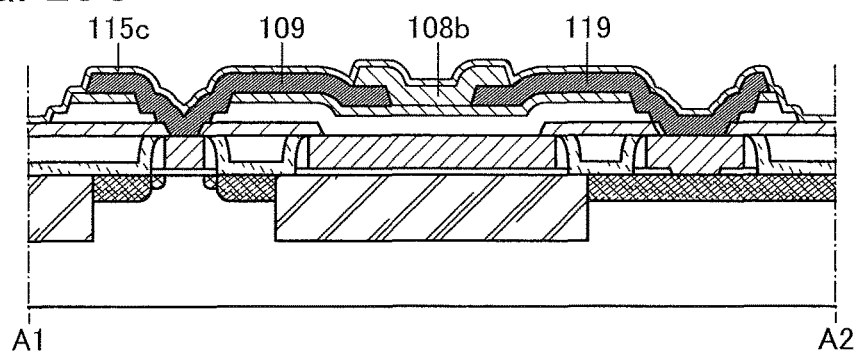

In this embodiment, as the oxide semiconductor layer 115b, 30-nm-thick In—Ga—Zn oxide is deposited by a sputtering method using an In—Ga—Zn oxide target (In:Ga:Zn=1:1:1) (see FIG. 28A). Note that the constituent elements and compositions applicable to the oxide semiconductor layer 115b are not limited thereto.

The oxygen doping treatment may be performed after the formation of the oxide semiconductor layer 115b.

Next, a resist mask is formed over the oxide semiconductor layer 115b, and part of the oxide semiconductor layer 115b is selectively etched using the resist mask, so that the oxide semiconductor layer 108b is formed.

The oxide semiconductor layer 115b may be etched by either one or both of a dry etching method and a wet etching method. After the etching, the resist mask is removed (see FIG. 28B and FIG. 31D).

Next, heat treatment is preferably performed to reduce impurities such as moisture and hydrogen contained in the oxide semiconductor layers 108a and 108b and to purify the oxide semiconductor layers 108a and 108b.

By the heat treatment, in addition to the release of the impurities, diffusion of oxygen contained in the insulating layer 107 to the oxide semiconductor layers 108a and 108b occurs to reduce oxygen vacancies in the oxide semiconductor layers 108a and 108b. Note that the heat treatment may be performed in such a manner that heat treatment is performed in an inert gas atmosphere, and then another heat treatment is performed in an atmosphere containing an oxidizing gas at 10 ppm or more, 1% or more, or 10% or more. The heat treatment may be performed at any time after the oxide semiconductor layer 115b is formed. For example, the heat treatment may be performed before the etching of the oxide semiconductor layer 115b.

The heat treatment is performed at a temperature higher than or equal to 250° C. and lower than or equal to 650° C., preferably higher than or equal to 300° C. and lower than or equal to 500° C. The treatment time is shorter than or equal to 24 hours. Heat treatment for over 24 hours is not preferable because the productivity is reduced.

In this embodiment, after heat treatment is performed at 450° C. in a nitrogen gas atmosphere for 1 hour, heat treatment is performed at 450° C. in an oxygen gas atmosphere for 1 hour.

Next, the oxide semiconductor layer 115c for forming the oxide semiconductor layer 108c is formed. In this embodiment, as the oxide semiconductor layer 115c, 5-nm-thick In—Ga—Zn oxide is deposited by a sputtering method using an In—Ga—Zn oxide target (In:Ga:Zn=1:3:2) (see FIG. 28C). Note that the constituent elements and compositions applicable to the oxide semiconductor layer 115c are not limited thereto.

Figure 28D:
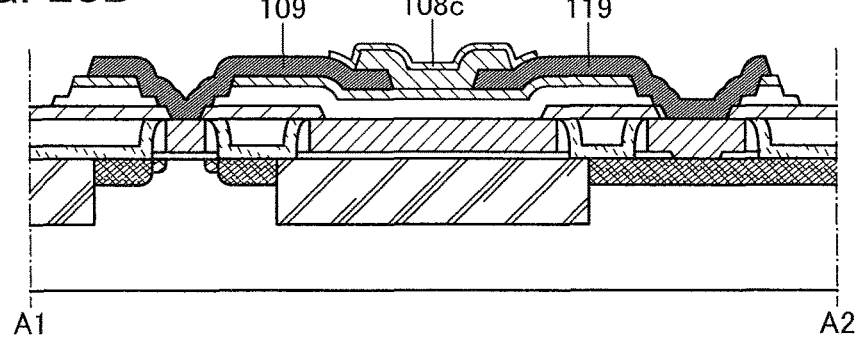

Then, part of the oxide semiconductor layer 115c is selectively etched using a resist mask, so that the oxide semiconductor layer 108c is formed (see FIG. 28D).

The oxide semiconductor layer 115c may be etched by either one or both of a dry etching method and a wet etching method. After the etching, the resist mask is removed.

Next, the insulating layer 120 for forming the insulating layer 110 is formed. In this embodiment, as the insulating layer 120, 20-nm-thick silicon oxynitride is deposited by a plasma CVD method.

Then, the conductive layer 121 for forming the electrodes 103 and 111 is formed over the insulating layer 120. In this embodiment, the conductive layer 121 is formed by depositing 30-nm-thick tantalum nitride and 135-nm-thick tungsten by a sputtering method (see FIG. 29A).

Next, part of the conductive layer 121 is selectively etched using a resist mask, so that the electrode 103 and the electrode 111 (including other electrodes and wirings formed using the same conductive layer) are formed. The etching of the conductive layer may be performed by a dry etching method, a wet etching method, or both of them. After that, the resist mask is removed.

Next, part of the insulating layer 120 is etched using the electrode 103 and the electrode 111 as masks, so that the insulating layer 110 is formed. The etching of the insulating layer 120 may be performed with the resist mask used for etching the conductive layer 121 unremoved. Furthermore, the etching of the conductive layer 121 and the etching of the insulating layer 120 may be performed in the same etching step (see FIG. 29B).

In this manner, the transistor 750, the transistor 170, and the capacitor 190 are formed.

Next, the insulating layer 112 is formed. In this embodiment, 70-nm-thick aluminum oxide is formed as the insulating layer 112. After the formation of the insulating layer 112, oxygen doping treatment may be performed.

Figure 29A:
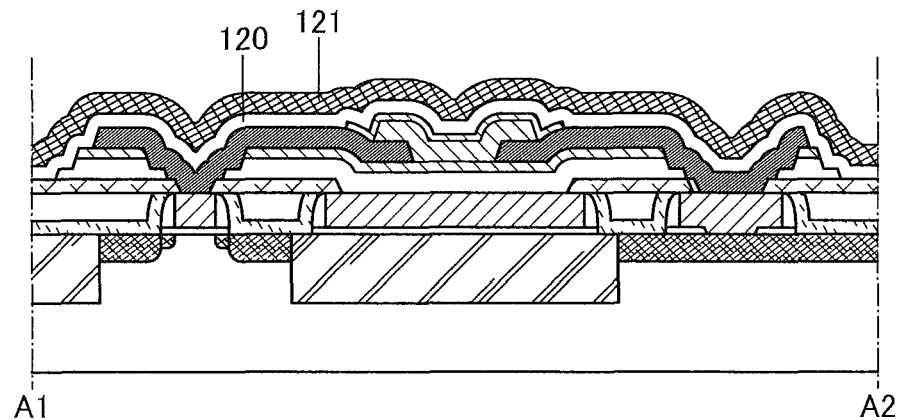
FIGS. 29A to 29C illustrate an example of a manufacturing process of a semiconductor device.
Figure 29B:
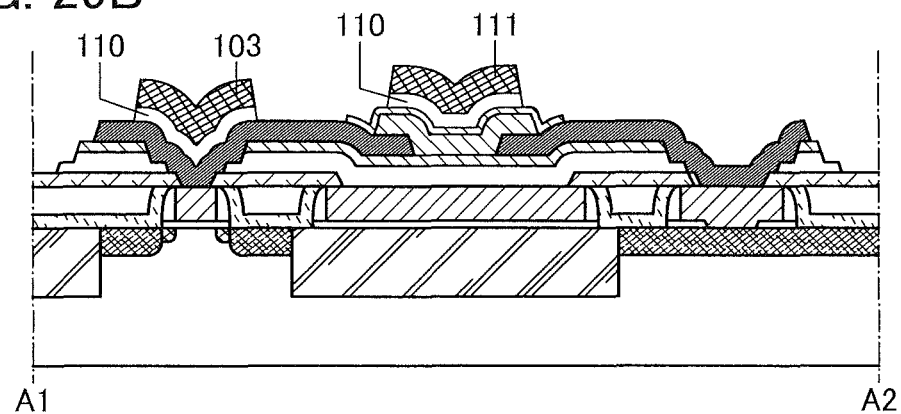
Figure 29C:
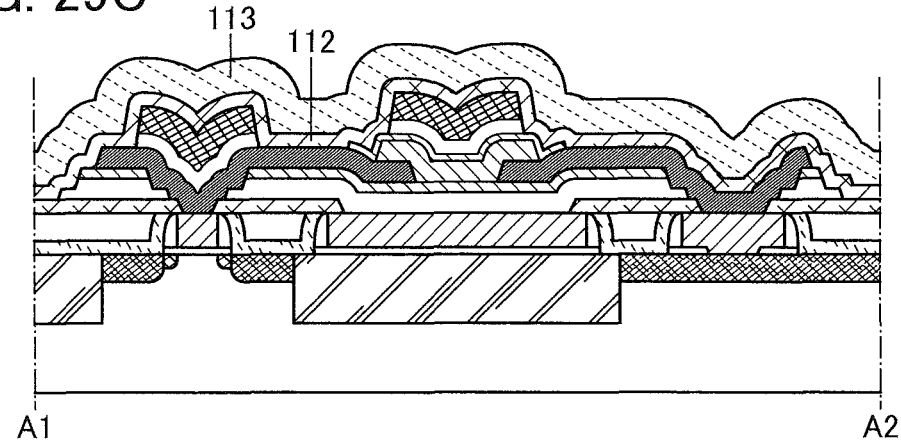

Then, the insulating layer 113 is formed over the insulating layer 112 (see FIG. 29C). In this embodiment, 300-nm-thick silicon oxynitride is formed as the insulating layer 113. After the formation of the insulating layer 113, oxygen doping treatment may be performed.

Next, heat treatment may be performed in a reduced-pressure atmosphere, an inert gas atmosphere of nitrogen, a rare gas, or the like, an oxidizing gas atmosphere, or an ultra-dry air atmosphere. The heat treatment is performed at a temperature higher than or equal to 250° C. and lower than or equal to 650° C., preferably higher than or equal to 300° C. and lower than or equal to 500° C. The treatment time is shorter than or equal to 24 hours. Heat treatment for over 24 hours is not preferable because the productivity is reduced.

Figure 30A:
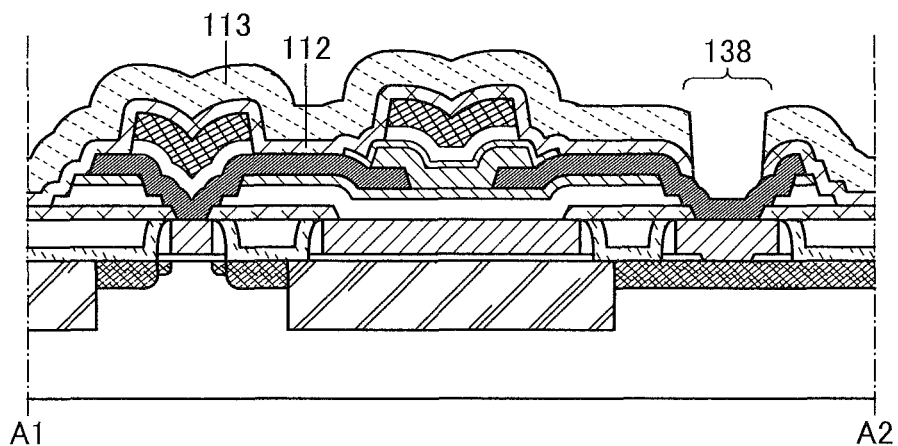
FIGS. 30A and 30B illustrate an example of a manufacturing process of a semiconductor device.
Figure 30B:
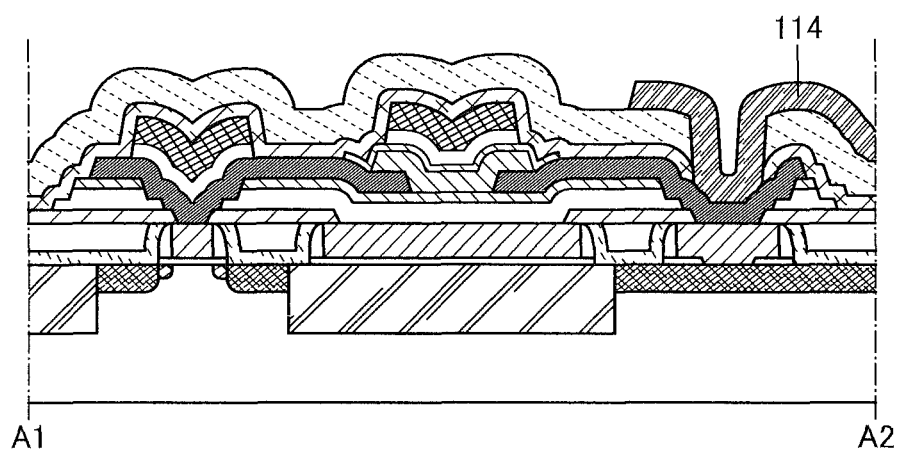

Next, part of the insulating layer 112 and part of the insulating layer 113 are selectively etched using a resist mask to form the opening 138 (see FIG. 30A).

Then, a conductive layer for forming the electrode 114 is formed. In this embodiment, the conductive layer is formed to have a three-layer structure including a 50-nm-thick titanium layer, a 200-nm-thick aluminum layer, and a 50-nm-thick titanium layer in this order by a sputtering method. Then, part of the conductive layer is selectively etched using a resist mask formed over the conductive layer, so that the electrode 114 is formed (see FIG. 30B).

Next, heat treatment may be performed in a reduced-pressure atmosphere, an inert gas atmosphere of nitrogen, a rare gas, or the like, an oxidizing gas atmosphere, or an ultra-dry air atmosphere. The heat treatment is performed at a temperature higher than or equal to 250° C. and lower than or equal to 650° C., preferably higher than or equal to 300° C. and lower than or equal to 500° C. The treatment time is shorter than or equal to 24 hours. Heat treatment for over 24 hours is not preferable because the productivity is reduced.

Through the above-described process, the semiconductor device 1200 can be manufactured.

<Variation of Semiconductor Device>

FIGS. 32A to 32C and FIGS. 33A to 33C illustrate variations of the semiconductor device 1200.

Figure 32A:
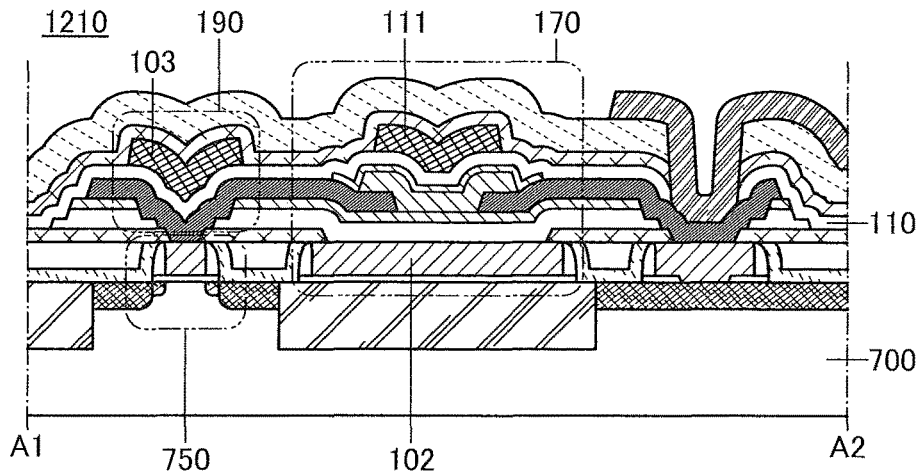
FIGS. 32A to 32C each illustrate an example of a semiconductor device.

As in a semiconductor device 1210 illustrated in FIG. 32A, part of the insulating layer 110 may be left without being etched after the electrodes 103 and 111 are formed. In this case, the step of etching part of the insulating layer 110 after the formation of the electrodes 103 and 111 can be eliminated, increasing the productivity of the semiconductor device.

Figure 32B:
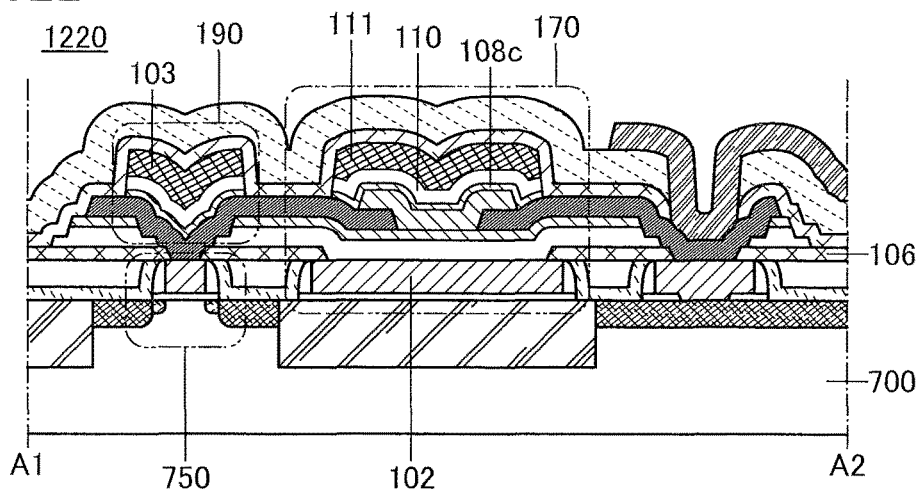

As in a semiconductor device 1220 illustrated in FIG. 32B, part of the insulating layer 110 and part of the oxide semiconductor layer 108c may be selectively etched using the electrode 103 and the electrode 111 as masks. In this case, selective etching of the insulating layer 110 and the oxide semiconductor layer 108c can be performed in the same process for forming the electrodes 103 and 111: accordingly, the step of forming the oxide semiconductor layer 108c before the formation of the insulating layer 110 can be eliminated, increasing the productivity of the semiconductor device.

In the semiconductor device 1220, part of the oxide semiconductor layer 108c as well as part of the insulating layer 110 is formed between the electrode 103 and the electrode 109 in the capacitor 190. By using the insulating layer 110 and the oxide semiconductor layer 108c as a dielectric layer of the capacitor 190, the distance between the electrode 103 and the electrode 109 can be increased, which increases the withstand voltage of the capacitor 190. Moreover, leakage current between the electrode 103 and the electrode 109 can be reduced. Accordingly, the reliability of the semiconductor device can be improved. In addition, power consumption of the semiconductor device can be reduced.

Figure 32C:
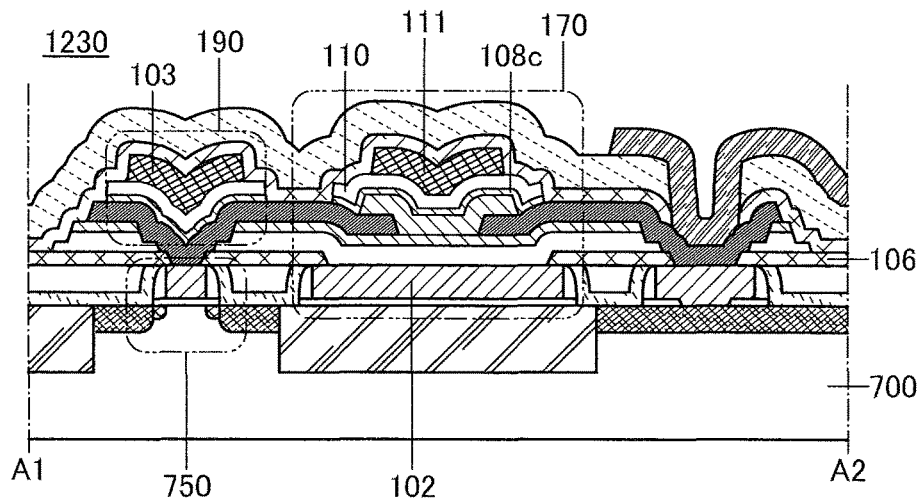

As in a semiconductor device 1230 illustrated in FIG. 32C, after the oxide semiconductor layer 108c and the insulating layer 110 are formed successively, part of the insulating layer 110 and part of the oxide semiconductor layer 108c may be selectively removed using a resist mask, and then the electrodes 103 and 111 may be formed.

Figure 33A:
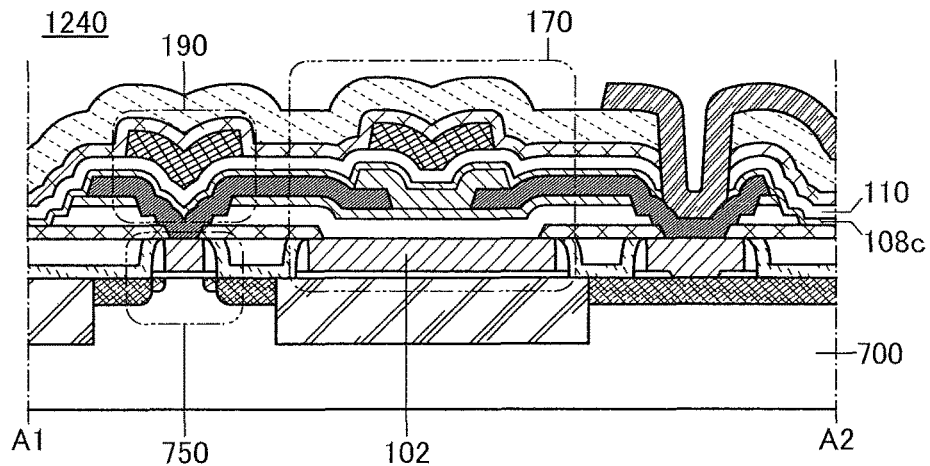
FIGS. 33A to 33C each illustrate an example of a semiconductor device.

As in a semiconductor device 1240 illustrated in FIG. 33A, it is possible to omit etching of the insulating layer 110 and the oxide semiconductor layer 108c.

Figure 33B:
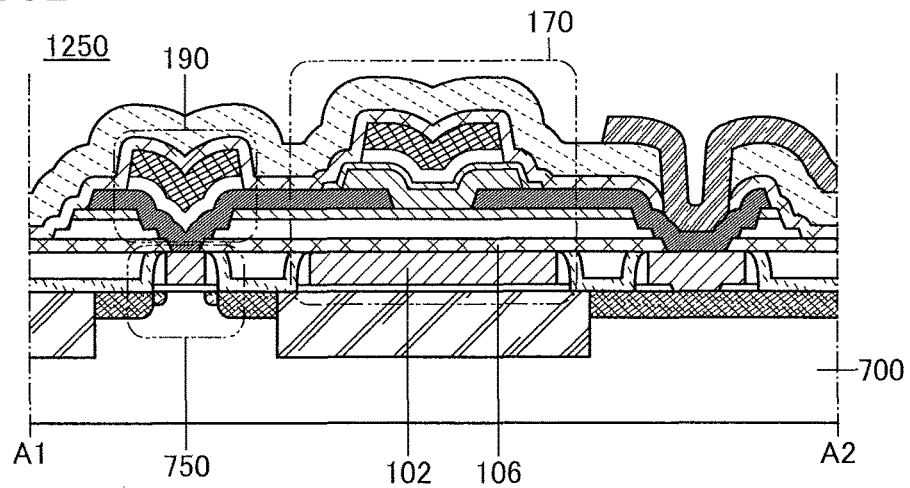

As in a semiconductor device 1250 illustrated in FIG. 33B, the insulating layer 106 over the electrode 102 may be left without being removed. This structure can enhance the effect of preventing diffusion of impurities to the oxide semiconductor layer 108 from the outside. In addition, this structure can enhance the effect of preventing diffusion of oxygen contained in the oxide semiconductor layer 108 to the outside.

Figure 33C:
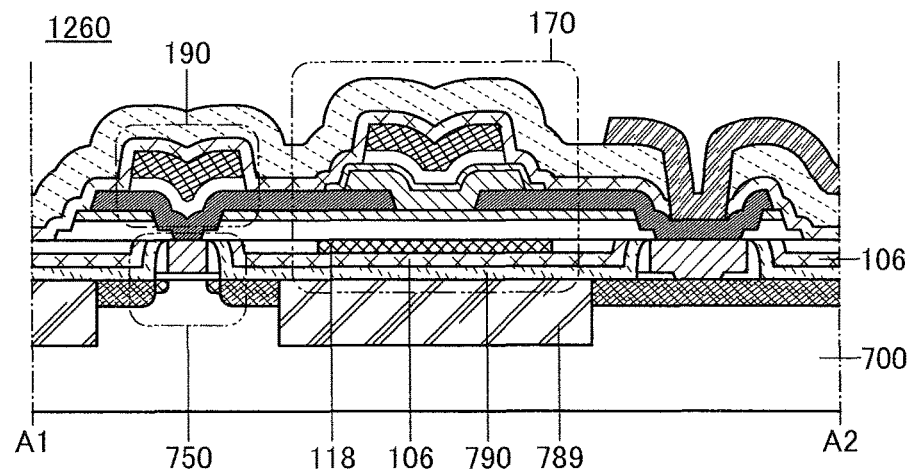

As in a semiconductor device 1260 illustrated in FIG. 33C, the insulating layer 106 may be formed over the insulating layer 790, and an electrode 118 that can function like the electrode 102 may be provided over the insulating layer 106. Since the insulating layer 106 is formed over the insulating layer 790 in the semiconductor device 1260, the electrode 102 cannot be formed at the same time as the electrode 751 and the electrode 104. For this reason, the electrode 118 that can function like the electrode 102 is formed over the insulating layer 106. However, by providing the insulating layer 106 below the electrode 118, the electrode 118 can be positioned closer to the oxide semiconductor layer 108 by the thickness of the insulating layer 106; accordingly, the effect of the electrode 118 as a gate electrode or a back gate electrode can be enhanced. The electrode 118 can be formed using a material and a method that are similar to those of the electrode 103, the electrode 109, the electrode 111, the electrode 114, or the electrode 119.

Figure 34A:
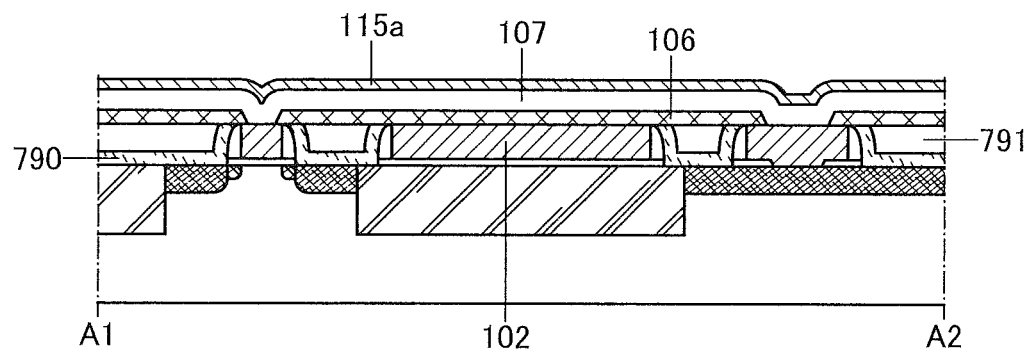
FIGS. 34A to 34B illustrate an example of a manufacturing process of a semiconductor device.
Figure 34B:
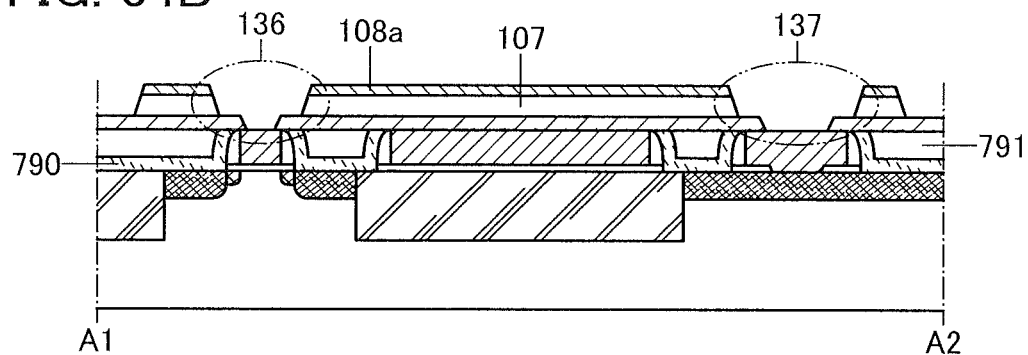

In the case where the insulating layer 106 over the electrode 102 is left without being removed, the insulating layer 107 and the oxide semiconductor layer 115a may be etched in the same step. Specifically, the insulating layer 106 is selectively etched first, and then the insulating layer 107 and the oxide semiconductor layer 115a are successively formed (see FIG. 34A). Next, a resist mask is formed over the oxide semiconductor layer 115a, and the insulating layer 107 and the oxide semiconductor layer 115a are selectively etched in the same step to form the opening 136 and the opening 137 (see FIG. 34B).

By etching the insulating layer 107 and the oxide semiconductor layer 115a in the same step, the number of steps for manufacturing the semiconductor device can be reduced. Accordingly, the productivity of the semiconductor device can be increased.

Figure 35A:
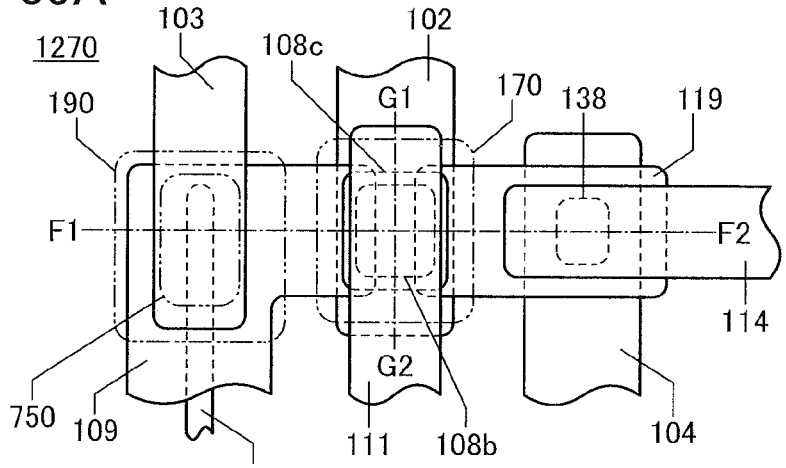
FIGS. 35A to 35C illustrate an example of a semiconductor device.
Figure 35B:
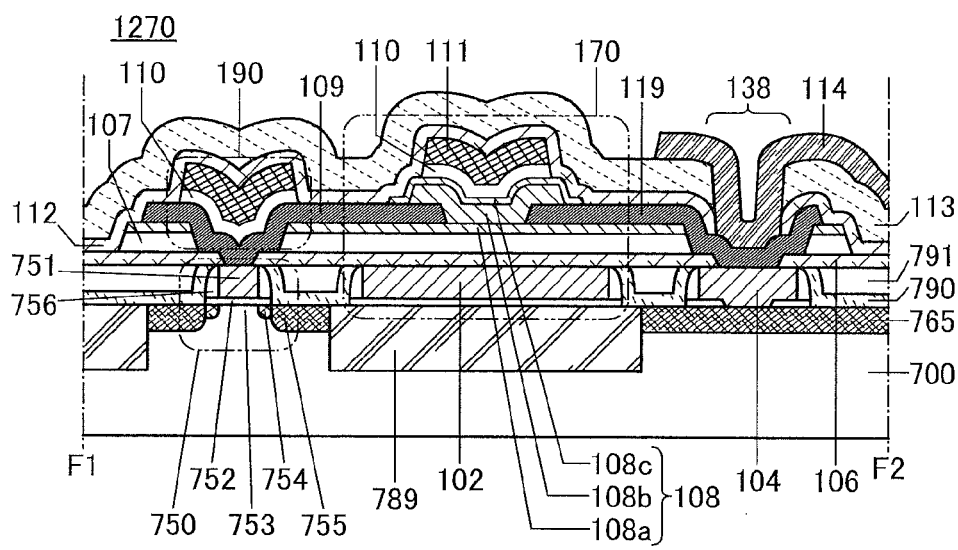
Figure 35C:
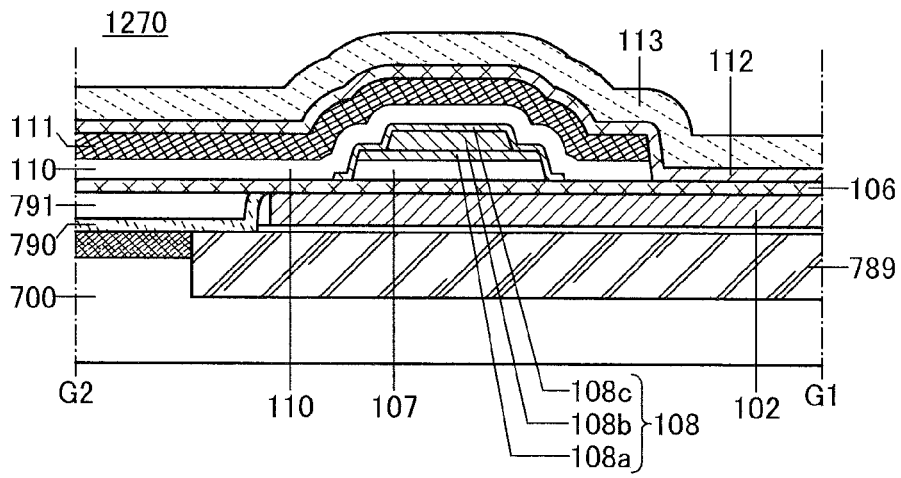

FIG. 35A is a top view of a semiconductor device 1270 manufactured in the above-described manner. FIG. 35B is a cross-sectional view taken along dashed-dotted line F1-F2 in FIG. 35A. FIG. 35C is a cross-sectional view taken along dashed-dotted line G1-G2 in FIG. 35A.

With one embodiment of the present invention, a semiconductor device with favorable electrical characteristics can be provided. With one embodiment of the present invention, a semiconductor device with high productivity can be provided. Furthermore, with one embodiment of the present invention, a highly reliable semiconductor device can be provided. Furthermore, with one embodiment of the present invention, a semiconductor device with low power consumption can be provided.

In this embodiment, oxide semiconductors are described as examples of the semiconductor layers of the transistor 170. However, one embodiment of the present invention is not limited to these examples, and an amorphous semiconductor, a microcrystalline semiconductor, a polycrystalline semiconductor, or the like may be used as examples of the semiconductor layers. For example, amorphous silicon, microcrystalline germanium, polycrystalline silicon, or the like may be used. In the case where a higher field effect mobility of the transistor 170 is required for example, polycrystalline silicon or the like may be used as a semiconductor layer of the transistor 170. Alternatively, a compound semiconductor such as silicon carbide, gallium arsenide, or a nitride semiconductor, an organic semiconductor, or the like may be used.

This embodiment can be combined with any of the other embodiments described in this specification as appropriate.

(Embodiment 4)

In this embodiment, an example of using the semiconductor device disclosed in the above embodiment as a memory device 500 (memory device) which can hold stored data even when not powered and which has an almost unlimited number of write cycles, will be described with reference to drawings.

Figure 36A:
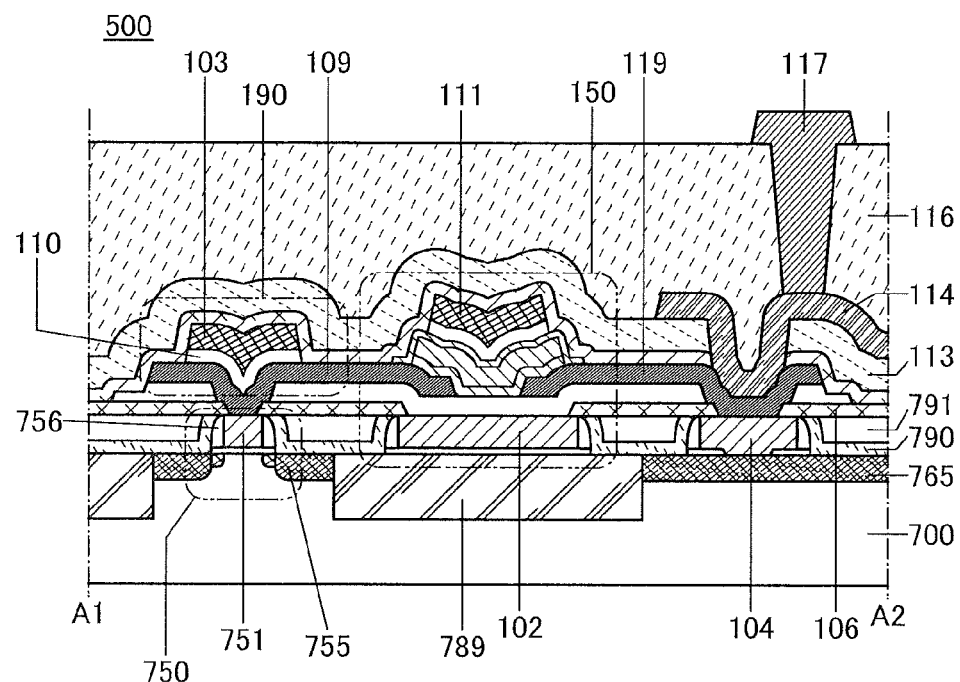
FIGS. 36A and 36B are a cross-sectional view and a circuit diagram illustrating an example of a semiconductor device.
Figure 36B:
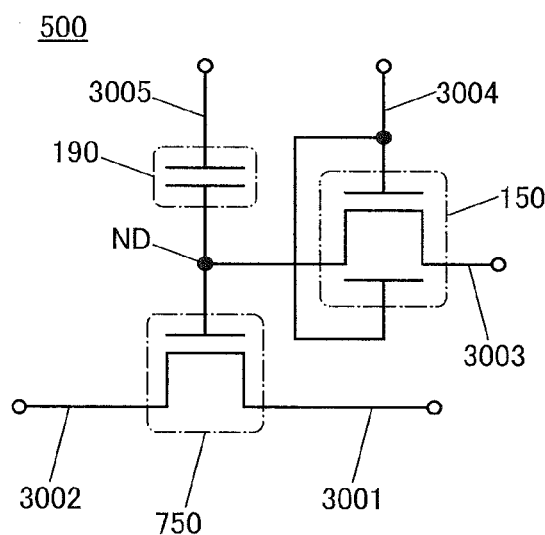
Figure 37A:
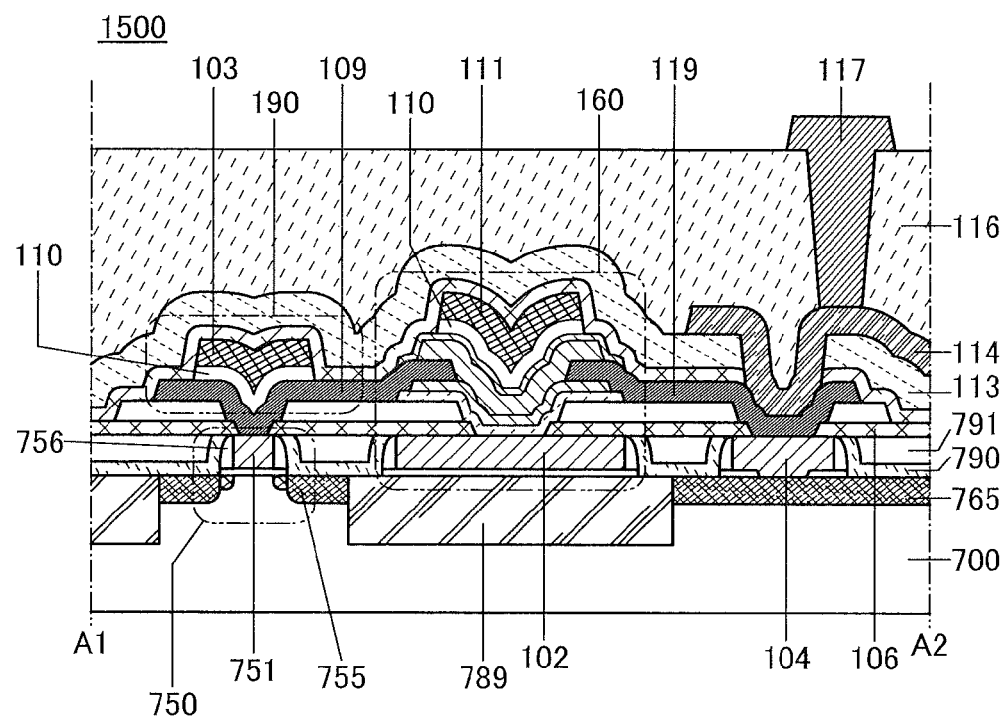
FIGS. 37A and 37B are a cross-sectional view and a circuit diagram illustrating an example of a semiconductor device.
Figure 37B:
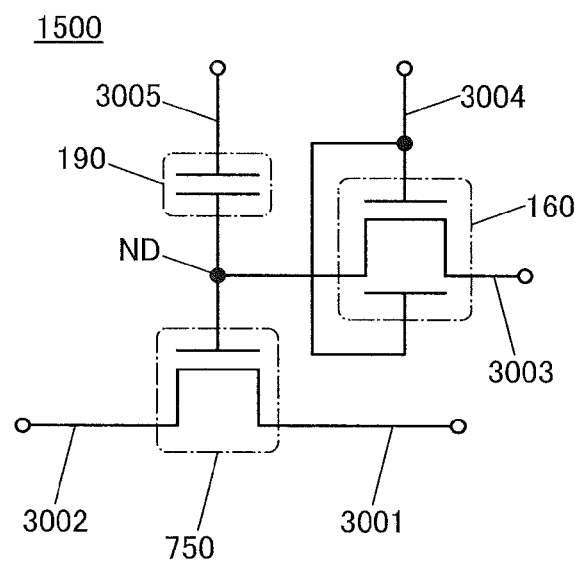
Figure 38A:
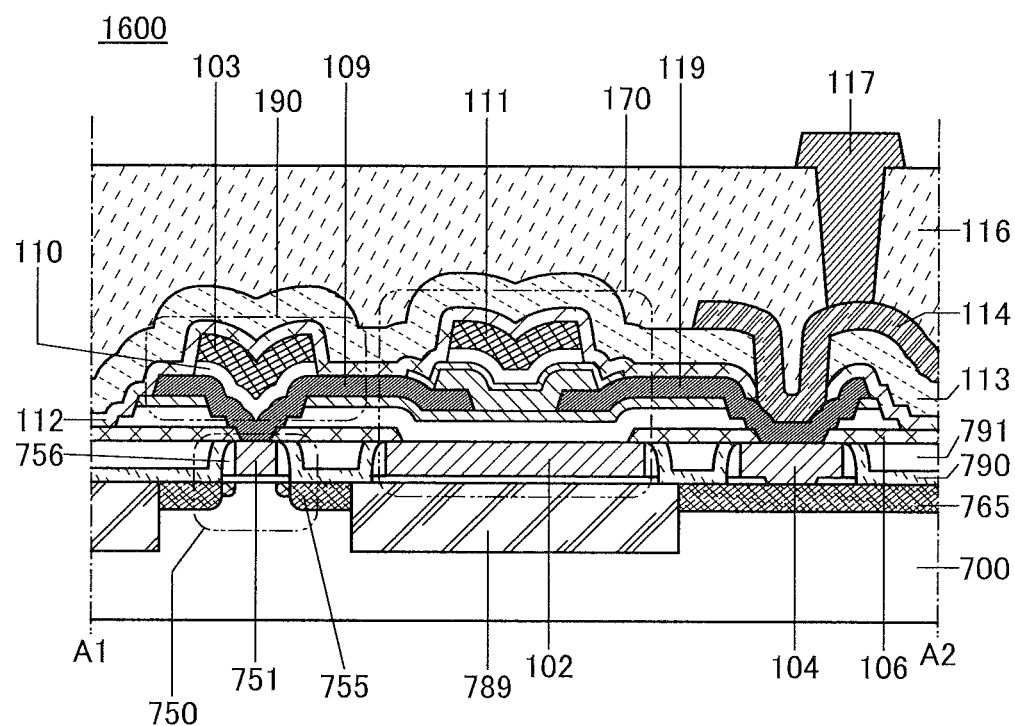
FIGS. 38A and 38B are a cross-sectional view and a circuit diagram illustrating an example of a semiconductor device.
Figure 38B:
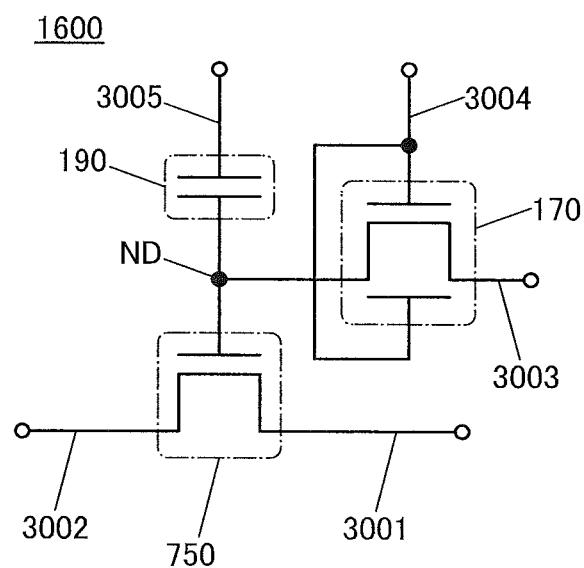

FIG. 36A is a cross-sectional view of the memory device 500 that uses the semiconductor device 100. FIG. 36B is a circuit diagram of the memory device 500. FIG. 37A is a cross-sectional view of a memory device 1500 that uses the semiconductor device 1100. FIG. 37B is a circuit diagram of the memory device 500. FIG. 38A is a cross-sectional view of a memory device 1600 that uses the semiconductor device 1200. FIG. 38B is a circuit diagram of the memory device 1600.

In the memory devices 500, 1500, and 1600, an insulating layer 116 is formed as a planarization insulating layer over the insulating layer 113 and the electrode 114. In this embodiment, a polyimide is used as the insulating layer 116. An electrode 117 is formed over the insulating layer 116 and electrically connected to the electrode 114 through an opening formed in the insulating layer 116.

The electrode 751 is electrically connected to the electrode 109. One of the n-type impurity regions 755 in the transistor 750 is electrically connected to a wiring 3001, and the other thereof is electrically connected to a wiring 3002 (not illustrated in FIGS. 36A, 37A, and 38A). Furthermore, the electrode 119 is electrically connected to a wiring 3003, the electrode 103 is electrically connected to a wiring 3005, and the electrode 111 and the electrode 102 are electrically connected to a wiring 3004 (not illustrated in FIGS. 36A, 37A, and 38A).

Note that a material of a semiconductor layer including a channel formation region of the transistor 750 and a material of a semiconductor layer including a channel formation region of the transistor 150 are preferably materials having different band gaps. For example, in the case where an oxide semiconductor is used in the semiconductor layer including a channel formation region of the transistor 150, a semiconductor material other than an oxide semiconductor is preferably used in the semiconductor layer including a channel formation region of the transistor 750.

A transistor including a semiconductor material other than an oxide semiconductor, such as crystalline silicon, can operate at high speed than a transistor including an oxide semiconductor. By using this transistor as a reading transistor, data can be read at high speed. A transistor including an oxide semiconductor enables charges to be held for a long time owing to its electrical characteristics, that is, the low off-state current.

Although both of the above transistors are n-channel transistors in the following description, it is needless to say that they may be p-channel transistors. Note that unless otherwise specified, the specific structure of the semiconductor device, such as a material used for the semiconductor device and the structure of the semiconductor device, is not limited to that described here.

The transistors 150, 160, and 170 are each a transistor which uses an oxide semiconductor for a semiconductor layer in which a channel is formed. Since the off-state current of the transistors 150, 160, and 170 is low, stored data can be retained for a long period. In other words, semiconductor memory devices in which refresh operation is unnecessary or the frequency of refresh operation is extremely low can be provided. Therefore, power consumption can be sufficiently reduced. Stored data can be retained for a long period even when power is not supplied (note that the potential is preferably fixed).

The transistor 150 and the capacitor 190 can be formed over the substrate with which the transistor 750 is formed as illustrated in FIG. 36A, which enables a higher degree of integration of the semiconductor device.

In FIG. 36B, the wiring 3001 is electrically connected to a source electrode of the transistor 750. The wiring 3002 is electrically connected to a drain electrode of the transistor 750. The wiring 3003 is electrically connected to one of the source electrode and the drain electrode of the transistor 150. The wiring 3004 is electrically connected to the gate electrode of the transistor 150. The gate electrode of the transistor 750, the other of the source electrode and the drain electrode of the transistor 150, and one electrode of the capacitor 190 are electrically connected to a node ND. The wiring 3005 is electrically connected to the other electrode of the capacitor 190.

In FIG. 37B, the wiring 3001 is electrically connected to a source electrode of the transistor 750. The wiring 3002 is electrically connected to a drain electrode of the transistor 750. The wiring 3003 is electrically connected to one of the source electrode and the drain electrode of the transistor 160. The wiring 3004 is electrically connected to the gate electrode of the transistor 160. The gate electrode of the transistor 750, the other of the source electrode and the drain electrode of the transistor 160, and one electrode of the capacitor 190 are electrically connected to a node ND. The wiring 3005 is electrically connected to the other electrode of the capacitor 190.

In FIG. 38B, the wiring 3001 is electrically connected to a source electrode of the transistor 750. The wiring 3002 is electrically connected to a drain electrode of the transistor 750. The wiring 3003 is electrically connected to one of the source electrode and the drain electrode of the transistor 170. The wiring 3004 is electrically connected to the gate electrode of the transistor 170. The gate electrode of the transistor 750, the other of the source electrode and the drain electrode of the transistor 170, and one electrode of the capacitor 190 are electrically connected to a node ND. The wiring 3005 is electrically connected to the other electrode of the capacitor 190.

A transistor including an oxide semiconductor in a semiconductor layer in which a channel is formed has an extremely small off-state current. Since the transistor including an oxide semiconductor in a semiconductor layer in which a channel is formed is used as each of the transistors 150, 160, and 170, electric charges in the node ND can be retained for a long time. Thus, electric charges in the gate electrode of the transistor 750 can be retained for a long time.

By utilizing a feature that electric charges in the gate electrode of the transistor 750 can be retained, the memory devices 500, 1500, and 1600 can perform writing, retaining, and reading of data in the following manner.

Writing and retaining of data in the case of using the memory device 500 are described. First, the potential of the wiring 3004 is set to a potential at which the transistor 150 is turned on, so that the transistor 150 is turned on. Accordingly, the potential of the wiring 3003 is supplied to the gate electrode of the transistor 750 and the capacitor 190. That is, a predetermined charge is supplied to the gate electrode of the transistor 750 (writing). Here, one of two kinds of charges providing different potential levels (hereinafter referred to as a low-level charge and a high-level charge) is supplied. After that, the potential of the wiring 3004 is set to a potential at which the transistor 150 is turned off, so that the transistor 150 is turned off. Thus, the charge supplied to the gate electrode of the transistor 750 is retained (retaining).

Since the off-state current of the transistor 150 is extremely low, the charge of the gate electrode of the transistor 750 is retained for a long time.

Next, reading of data is described. An appropriate potential (a reading potential) is supplied to the wiring 3005 while a predetermined potential (a constant potential) is supplied to the wiring 3001, whereby the potential of the wiring 3002 varies depending on the amount of charge retained in the gate electrode of the transistor 750. This is because in general, in the case of using an n-channel transistor as the transistor 750, an apparent threshold voltage $V_{th\_H}$ at the time when the high-level charge is given to the gate electrode of the transistor 750 is lower than an apparent threshold voltage $V_{th\_L}$ at the time when the low-level charge is given to the gate electrode of the transistor 750. Here, an apparent threshold voltage refers to the potential of the wiring 3005 which is needed to turn on the transistor 750. Thus, the potential of the wiring 3005 is set to a potential $V_0$ which is between $V_{th\_H}$ and $V_{th\_L}$, whereby charge supplied to the gate electrode of the transistor 750 can be determined. For example, in the case where the high-level charge is supplied in writing and the potential of the wiring 3005 is $V_0$ ($>V_{th\_H}$), the transistor 750 is turned on. In the case where the low-level charge is supplied in writing, even when the potential of the wiring 3005 is $V_0$ ($<V_{th\_L}$), the transistor 750 remains off. Thus, the data retained in the gate electrode can be read by determining the potential of the wiring 3002.

The above description of data writing and retaining can apply to the memory device 1500 and the memory device 1600 by replacing the transistor 150 with the transistor 160 or the transistor 170.

Note that in the case where memory cells each having one memory device as a memory element are arrayed, it is necessary that only data of a desired memory cell be able to be read. The wiring 3005 of the memory cell which is not subjected to data reading may be supplied with a potential at which the transistor 750 is off regardless of the state of the gate electrode, that is, a potential lower than $V_{th\_H}$. Alternatively, the wiring 3005 may be supplied with a potential at which the transistor 750 is on regardless of the state of the gate electrode, that is, a potential higher than $V_{th\_L}$.

When including a transistor having a channel formation region formed using an oxide semiconductor and having an extremely low off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that the potential is preferably fixed).

In the semiconductor device described in this embodiment, high voltage is not needed for writing data and there is no problem of deterioration of elements. Unlike in the conventional nonvolatile memory, for example, it is not necessary to inject and extract electrons into and from a floating gate; thus, a problem such as deterioration of a gate insulating film does not occur. That is, the semiconductor device of the disclosed invention does not have a limit on the number of data writing, which is a problem of a conventional nonvolatile memory, and the reliability thereof is drastically improved. Furthermore, data is written depending on the state of the transistor (on or off), whereby high-speed operation can be easily achieved.

Instead of the semiconductor device 100, any of the semiconductor devices 210 to 260 can be used. Instead of the semiconductor device 1100, any of the semiconductor devices 1110 to 1170 can be used. Instead of the semiconductor device 1200, any of the semiconductor devices 1210 to 1260 can be used.

As described above, miniaturized and highly integrated semiconductor devices having excellent electrical characteristics can be provided.

This embodiment can be combined with any of the other embodiments described in this specification as appropriate.

(Embodiment 5)

In this embodiment, an example of a semiconductor device will be described. Note that in this embodiment, a CPU is described as an example of a semiconductor device of one embodiment of the present invention.

Figure 65:
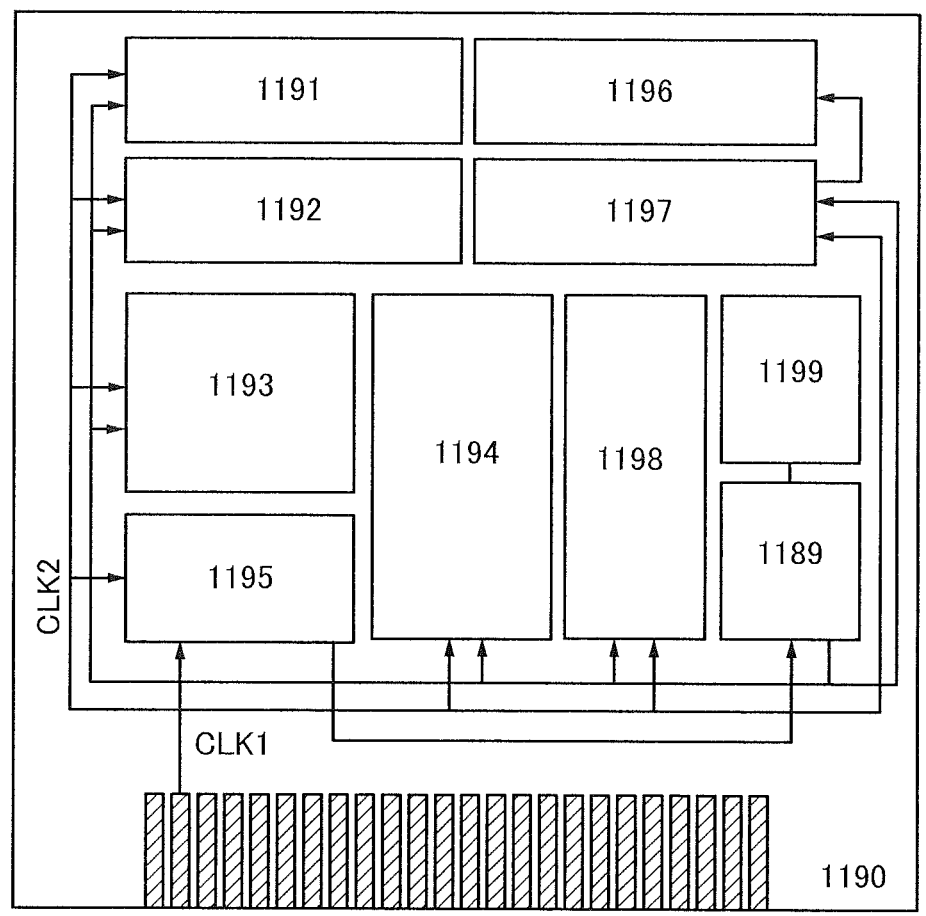
FIG. 65 is a block diagram illustrating an example of a semiconductor device.

FIG. 65 is a block diagram illustrating a configuration example of a CPU including at least the semiconductor device of any of the embodiments of the present invention.

The CPU illustrated in FIG. 65 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (Bus I/F), a rewritable ROM 1199, and a ROM interface 1189 (ROM I/F). A semiconductor substrate, an SOI substrate, a glass substrate, or the like is used as the substrate 1190. The ROM 1199 and the ROM interface 1189 may be provided over a separate chip. Needless to say, the CPU in FIG. 65 is just an example in which the configuration has been simplified, and an actual CPU may have a variety of configurations depending on the application. For example, the CPU may have the following configuration; a structure including the CPU illustrated in FIG. 65 or an arithmetic circuit is considered as one core; a plurality of the cores is included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 in accordance with a reference clock signal CLK1, and supplies the internal clock signal CLK2 to the above circuits.

In the CPU illustrated in FIG. 65, a memory cell is provided in the register 1196. For the memory cell of the register 1196, any of the semiconductor devices described in the above embodiment can be used.

In the CPU illustrated in FIG. 65, the register controller 1197 controls the operation of retaining data in the register 1196 in accordance with an instruction from the ALU 1191.

Figure 66:
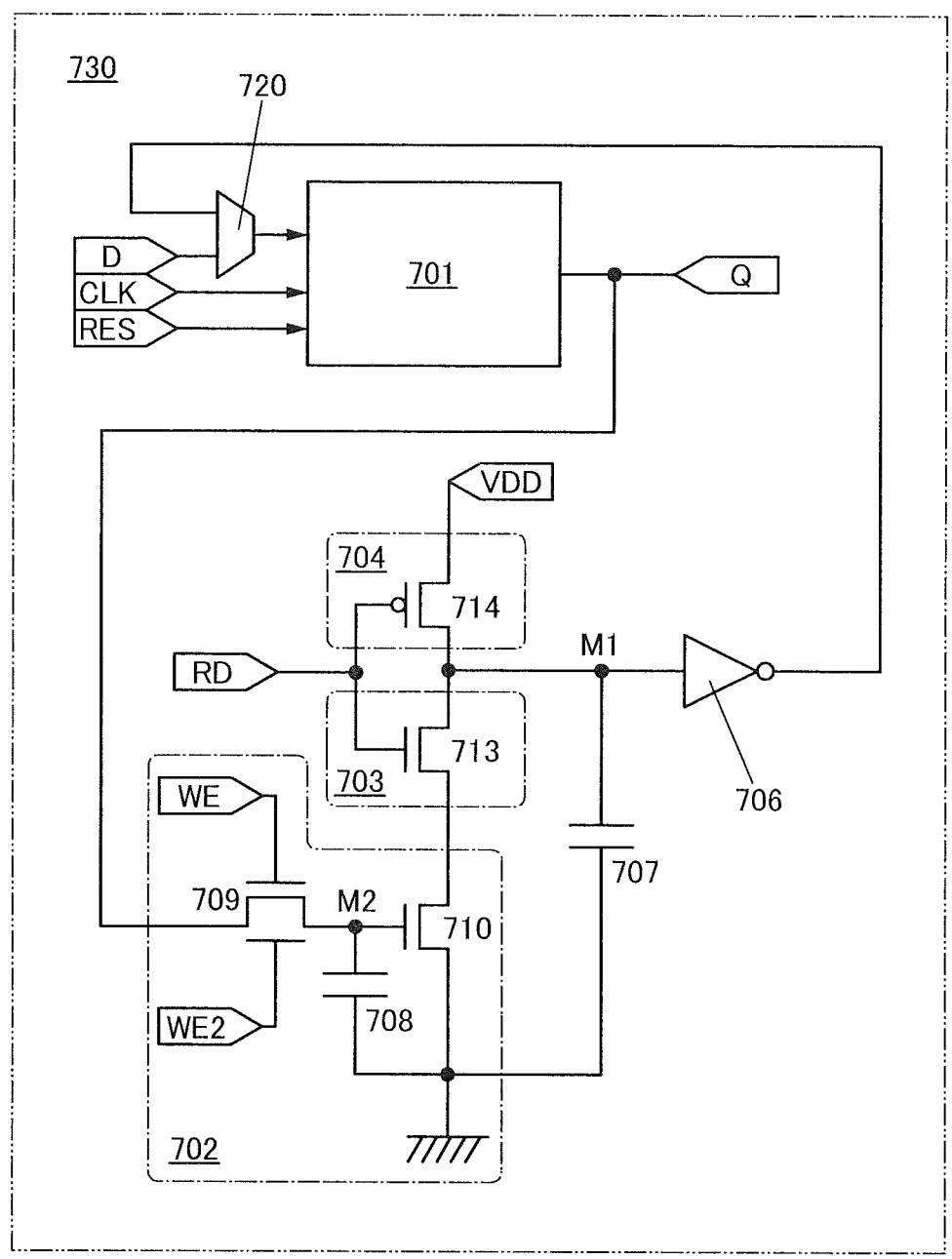
FIG. 66 is a circuit diagram illustrating an example of a memory device.

FIG. 66 is an example of a circuit diagram of a memory device that can be used as the register 1196. A memory device 730 includes a circuit 701 in which stored data is volatile when power supply is stopped, a circuit 702 in which stored data is nonvolatile even when power supply is stopped, a switch 703, a switch 704, a logic element 706, a capacitor 707, and a circuit 720 having a selecting function. The circuit 702 includes a capacitor 708, a transistor 709, and a transistor 710. Note that the memory device 730 may further include another element such as a diode, a resistor, or an inductor, as needed.

Here, the memory device described in Embodiment 4 can be used as the circuit 702 in the memory device 730. When supply of power to the memory device 730 is stopped, a ground potential (0 V) or a potential at which the transistor 709 in the circuit 702 is turned off continues to be input to a gate of the transistor 709. For example, the gate of the transistor 709 is grounded through a load such as a resistor.

Shown here is an example in which the switch 703 is a transistor 713 having one conductivity type (e.g., an n-channel transistor) and the switch 704 is a transistor 714 having a conductivity type opposite to the one conductivity type (e.g., a p-channel transistor). A first terminal of the switch 703 corresponds to one of a source and a drain of the transistor 713, a second terminal of the switch 703 corresponds to the other of the source and the drain of the transistor 713, and conduction or non-conduction between the first terminal and the second terminal of the switch 703 (i.e., the on/off state of the transistor 713) is selected by a control signal RD input to a gate of the transistor 713. A first terminal of the switch 704 corresponds to one of a source and a drain of the transistor 714, a second terminal of the switch 704 corresponds to the other of the source and the drain of the transistor 714, and conduction or non-conduction between the first terminal and the second terminal of the switch 704 (i.e., the on/off state of the transistor 714) is selected by the control signal RD input to a gate of the transistor 714.

One of a source and a drain of the transistor 709 is electrically connected to one of a pair of electrodes of the capacitor 708 and a gate of the transistor 710. Here, the connection portion is referred to as a node M2. One of a source and a drain of the transistor 710 is electrically connected to a line which can supply a low power supply potential (e.g., a GND line), and the other thereof is electrically connected to the first terminal of the switch 703. The second terminal of the switch 703 is electrically connected to the first terminal of the switch 704. The second terminal of the switch 704 is electrically connected to a line which can supply a power supply potential VDD. The second terminal of the switch 703, the first terminal of the switch 704), an input terminal of the logic element 706, and one of a pair of electrodes of the capacitor 707 are electrically connected to each other. Here, the connection portion is referred to as a node M1. The other of the pair of electrodes of the capacitor 707 can be supplied with a constant potential. For example, the other of the pair of electrodes of the capacitor 707 can be supplied with a low power supply potential (e.g., GND) or a high power supply potential (e.g., VDD). The other of the pair of electrodes of the capacitor 708 can be supplied with a constant potential. For example, the other of the pair of electrodes of the capacitor 708 can be supplied with the low power supply potential (e.g., GND) or the high power supply potential (e.g., VDD).

The capacitor 707 and the capacitor 708 are not necessarily provided as long as the parasitic capacitance of the transistor, the wiring, or the like is actively utilized.

A control signal WE is input to the gate of the transistor 709. As for each of the switch 703 and the switch 704, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 701 is input to the other of the source and the drain of the transistor 709. The logic value of a signal output from the second terminal of the switch 703 is inverted by the logic element 706, and the inverted signal is input to the circuit 701 through the circuit 720.

In the example of FIG. 66, a signal output from the second terminal of the switch 703 is input to the circuit 701 through the logic element 706 and the circuit 720; however, this embodiment is not limited thereto. The signal output from the second terminal of the switch 703 may be input to the circuit 701 without inverting the logic value. For example, in the case where the circuit 701 includes a node in which a signal obtained by inversion of the logic value of a signal input from the input terminal is retained, the signal output from the second terminal of the switch 703 can be directly input to the node.

As the transistor 709 in FIG. 66, any of the transistors 150, 160, and 170 of the above-described embodiments can be used. The control signal WE can be input to a gate electrode and the control signal WE2 can be input to a back gate electrode. The control signal WE2 is a signal having a constant potential. As the constant potential, for example, a ground potential GND or a potential lower than a source potential of the transistor 709 is selected. The control signal WE2 is a potential signal for controlling the threshold voltage of the transistor 709, and the drain current at the gate voltage of 0 V of the transistor 709 can be further reduced. Note that as the transistor 709, the transistor without the back gate electrode can be used.

In FIG. 66, the transistors 710, 713, 714 can be a transistor in which a channel is formed in a layer formed using a semiconductor other than an oxide semiconductor or in the substrate 1190. For example, a channel of the transistor can be formed in a silicon layer or a silicon substrate. Alternatively, all the transistors in the memory device 730 may be a transistor in which a channel is formed in an oxide semiconductor layer. Further alternatively, in the memory device 730, a transistor in which a channel is formed in an oxide semiconductor layer can be included besides the transistor 709, and a transistor in which a channel is formed in a layer including a semiconductor other than an oxide semiconductor or the substrate 1190 can be used for the rest of the transistors.

As the circuit 701 in FIG. 66, for example, a flip-flop circuit can be used. As the logic element 706, for example, an inverter, a clocked inverter, or the like can be used.

In a period during which the memory device 730 is not supplied with power, the semiconductor device of one embodiment of the present invention can retain data stored in the circuit 701 by the capacitor 708 which is provided in the circuit 702.

The off-state current of the transistor in which a channel is formed in an oxide semiconductor layer is extremely low. For example, it is significantly lower than that of a transistor in which a channel is formed in silicon having crystallinity. Thus, when such a transistor including an oxide semiconductor is used for the transistor 709, a signal held in the capacitor 708 is retained for a long time even in a period during which power is not supplied to the memory device 730. The memory device 730 can thus retain the stored content (data) even in a period during which the supply of power is stopped.

The memory device 730 performs pre-charge operation with the switch 703 and the switch 704, shortening the time required for the circuit 701 to restore original data again after the supply of power is restarted.

In the circuit 702, a signal retained by the capacitor 708 is input to the gate of the transistor 710. Therefore, after supply of power to the memory device 730 is restarted, the signal retained by the capacitor 708 can be read by the circuit 702 on the basis of the state (the on state or the off state) of the transistor 710. Consequently, an original signal can be accurately read even when a potential corresponding to the signal retained by the capacitor 708 varies to some degree.

By using the above-described memory device 730 in a memory device such as a register or a cache memory included in a processor, data in the memory device can be prevented from being lost owing to the stop of the power supply. Furthermore, after the supply of power is restarted, the memory device can immediately return to the same state as that before the power supply is stopped. Therefore, the power supply can be appropriately stopped in the processor or one or a plurality of logic circuits included in the processor, resulting in lower power consumption.

Although the memory device 730 is used in a CPU in this embodiment, the memory device 730 can also be used in an LSI such as a digital signal processor (DSP), a custom LSI, or a programmable logic device (PLD), and a radio frequency identification (RF-ID).

This embodiment can be combined with any of the other embodiments described in this specification as appropriate.

(Embodiment 6)

In this embodiment, an example of a semiconductor device will be described. Note that in this embodiment, a semiconductor device of one embodiment of the present invention will be described taking an RF tag as an example.

The RF tag of one embodiment of the present invention includes a memory circuit, stores data in the memory circuit, and transmits and receives data to/from the outside by using contactless means, for example, wireless communication. With these features, the RF tag can be used for an individual authentication system in which an object or the like is recognized by reading the individual information, for example. Note that the RF tag is required to have high reliability in order to be used for this purpose.

Figure 39:
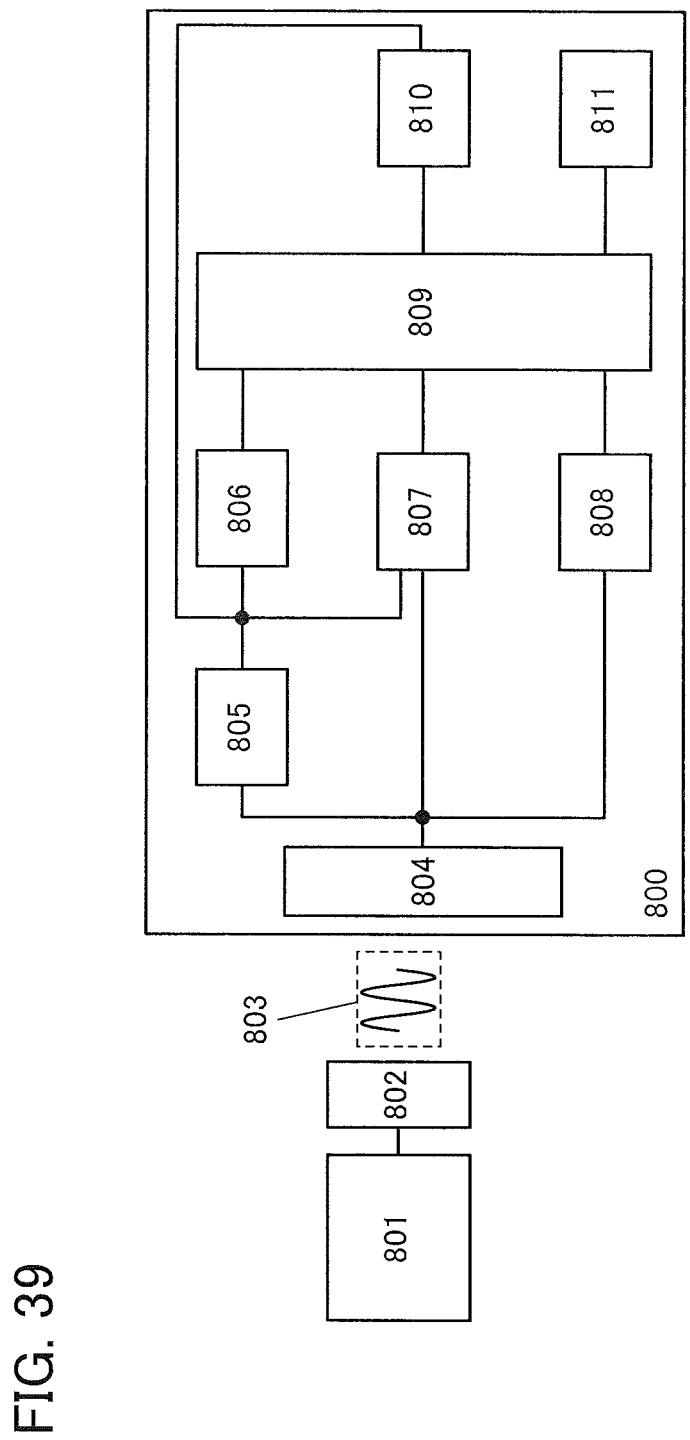
FIG. 39 is a block diagram of an RF tag of one embodiment of the present invention.
Figure 40A:
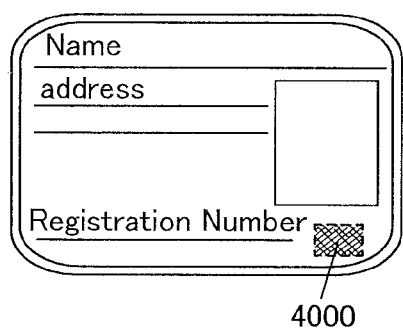
FIGS. 40A to 40F illustrate application examples of an RF tag of one embodiment of the present invention.
Figure 40B:
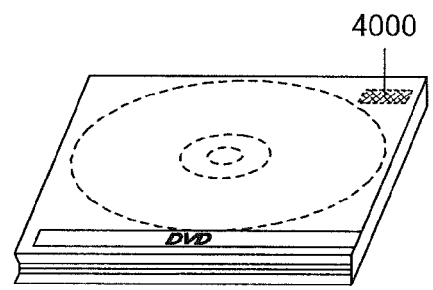
Figure 40C:
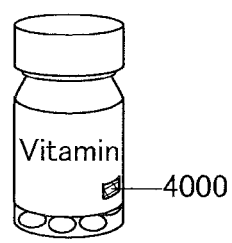
Figure 40D:
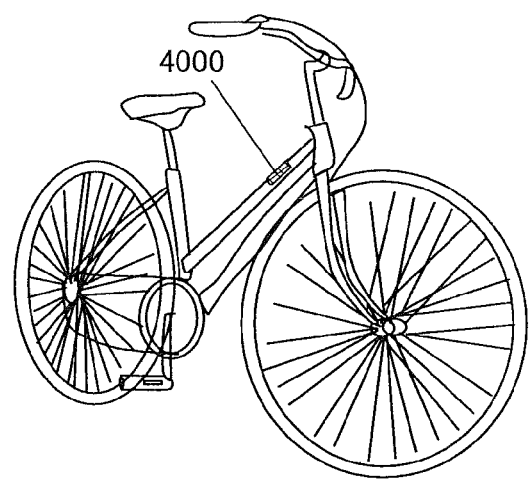
Figure 40E:
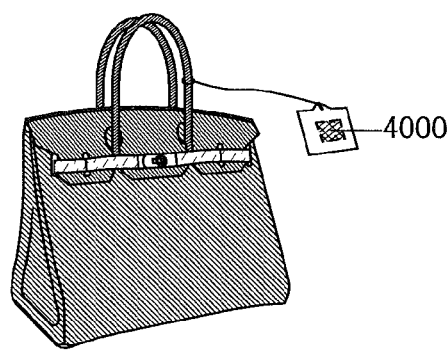
Figure 40F:
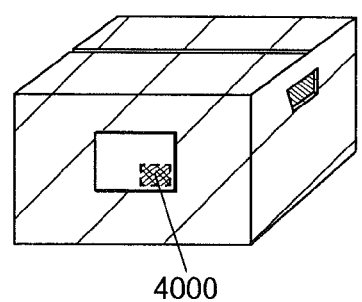

A configuration of the RF tag will be described with reference to FIG. 39. FIG. 39 is a block diagram illustrating a configuration example of an RF tag.

As shown in FIG. 39, an RF tag 800 includes an antenna 804 which receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A semiconductor of a transistor having a rectifying function included in the demodulation circuit 807 may be a material which enables a reverse current to be low enough, for example, an oxide semiconductor. This can suppress the deterioration of a rectifying function due to generation of a reverse current and prevent saturation of the output from the demodulation circuit. In other words, the input to the demodulation circuit and the output from the demodulation circuit can exist in an almost linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800.

Next, the structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. The modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. The ROM 811 stores an identification number (ID) or the like and outputs it in accordance with processing.

Note that the decision whether each circuit described above is provided or not can be made as appropriate.

Here, the memory device described in the above embodiment can be used as the memory circuit 810. Since the memory device of one embodiment of the present invention can retain data even when not powered, the memory device is suitable for an RF tag. Furthermore, the power (voltage) for data writing of the memory device of one embodiment of the present invention is lower than that of a conventional nonvolatile memory; thus, a difference in the maximum communication range between data reading and data writing can be negligible. In addition, it is possible to suppress malfunction or incorrect writing which is caused by power shortage in data writing.

Since the memory device of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment, it is possible to put identification numbers to only good products to be shipped without giving identification numbers to all the manufactured RF tags. Thus, the identification numbers of the shipped products are in series and customer management corresponding to the shipped products is easily performed.

Application examples of the RF tag of one embodiment of the present invention are shown below with reference to FIGS. 40A to 40F. The RF tag is widely used and can be provided for, for example, products such as bills, coins, securities, bearer bonds, documents (e.g., driver's licenses or resident's cards, see FIG. 40A), packaging containers (e.g., wrapping paper or bottles, see FIG. 40C), recording media (e.g., DVD or video tapes, see FIG. 40B), vehicles (e.g., bicycles, see FIG. 40D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 40E and 40F).

An RF tag 4000 of one embodiment of the present invention is fixed to products by being attached to a surface thereof or embedded therein. For example, the RF tag 4000 is fixed to each product by being embedded in paper of a book, or embedded in an organic resin of a package. The RF tag 4000 of one embodiment of the present invention is small, thin, and lightweight, so that the design of a product is not impaired even after the RF tag 4000 of one embodiment of the present invention is fixed thereto. Furthermore, bills, coins, securities, bearer bonds, documents, or the like can have identification functions by being provided with the RF tag 4000 of one embodiment of the present invention, and the identification functions can be utilized to prevent counterfeits. Moreover, the efficiency of a system such as an inspection system can be improved by providing the RF tag 4000 of one embodiment of the present invention for packaging containers, recording media, personal belongings, foods, clothing, household goods, electronic devices, or the like. Vehicles can also have higher security against theft or the like by being provided with the RF tag 4000 of one embodiment of the present invention.

As described above, the RF tag of one embodiment of the present invention can be used for the above-described purposes.

This embodiment can be combined with any of the other embodiments described in this specification as appropriate.

(Embodiment 7)

In this embodiment, a semiconductor device including a transistor that has a different structure from the transistors disclosed in the above embodiments is described with reference to drawings.

First, a semiconductor device 1001 including a transistor 155 will be described with reference to FIGS. 41A to 41C. Note that the transistor 155 and the capacitor 190 included in the semiconductor device 1001 can be manufactured using materials and methods that are similar to those of the transistor 150 and the like disclosed in the above embodiments.

Figure 41A:
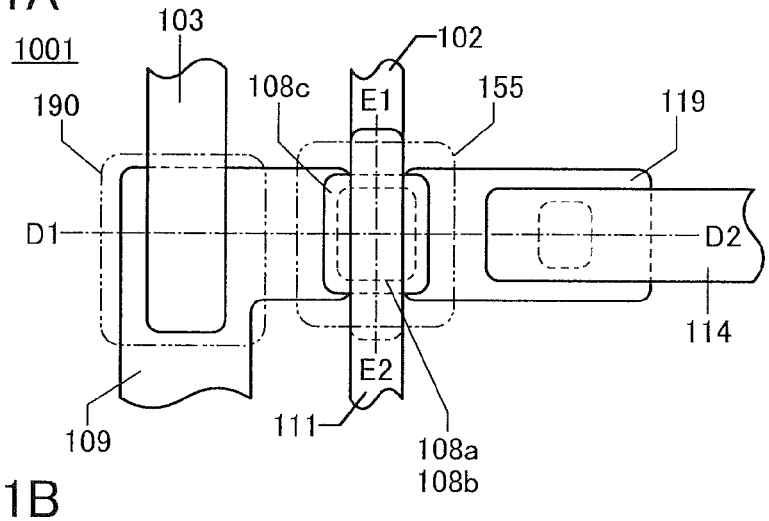
FIGS. 41A to 41C illustrate an example of a semiconductor device.
Figure 41B:
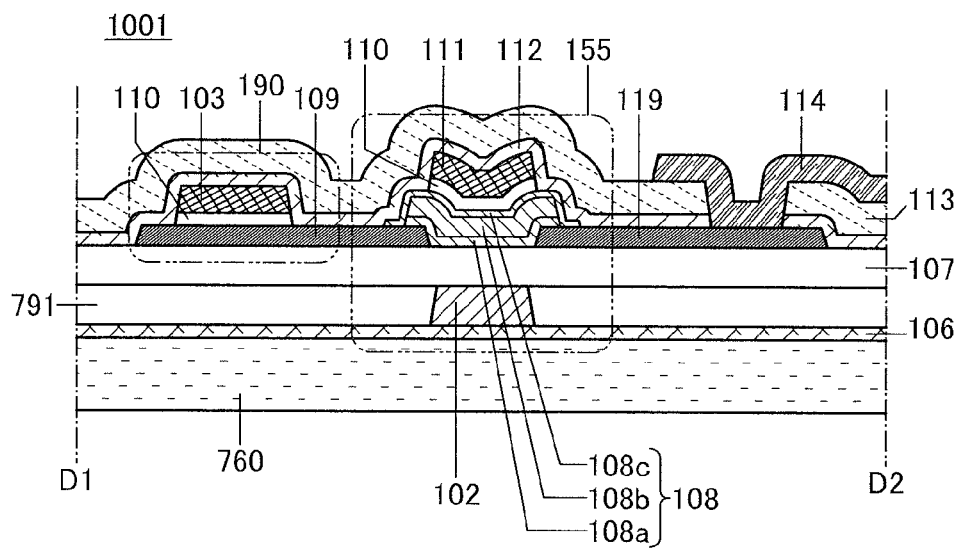
Figure 41C:
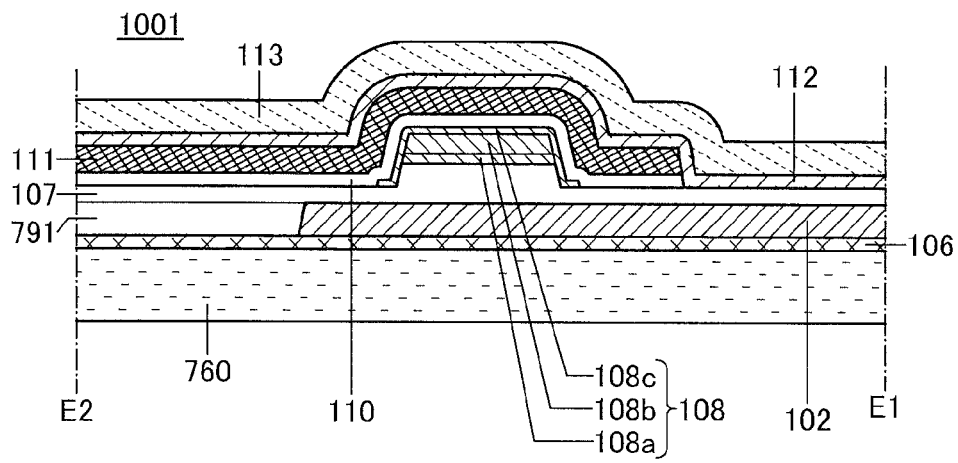

FIG. 41A is a top view of the transistor 155 and the capacitor 190. FIG. 41B is a cross-sectional view taken along dashed-dotted line D1-D2 in FIG. 41A. FIG. 41C is a cross-sectional view taken along dashed-dotted line E1-E2 in FIG. 41A. FIG. 41B is a cross-sectional view of the transistor 155 in a channel length direction, and FIG. 41C is a cross-sectional view of the transistor 155 in a channel width direction.

In the transistor 155 described in this embodiment, the insulating layer 106 is formed over a substrate 760, and the insulating layer 791 and the electrode 102 are formed over the insulating layer 106. The insulating layer 107 is formed over the insulating layer 791 and the electrode 102. Specifically, the electrode 102 is formed over the insulating layer 106, the insulating layer 791 is formed to cover the electrode 102, planarization treatment such as CMP treatment is performed to reduce unevenness and expose a surface of the electrode 102, and the insulating layer 107 is formed over the insulating layer 791 and the electrode 102.

Figure 43A:
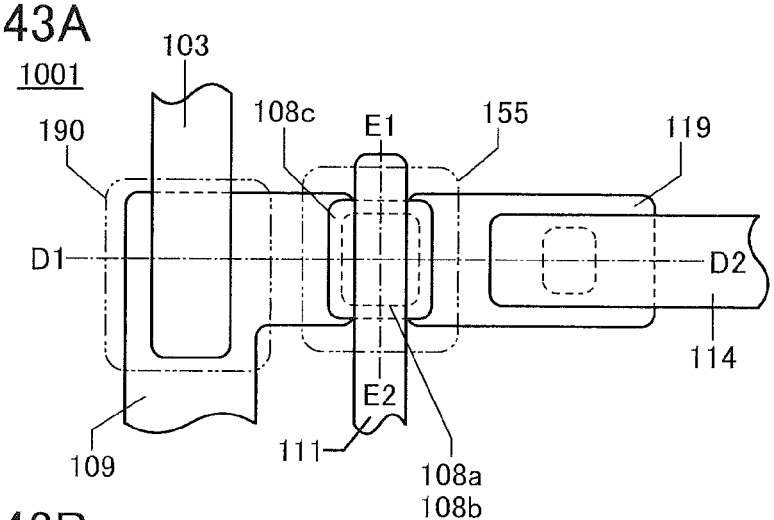
FIGS. 43A to 43C illustrate an example of a semiconductor device.
Figure 43B:
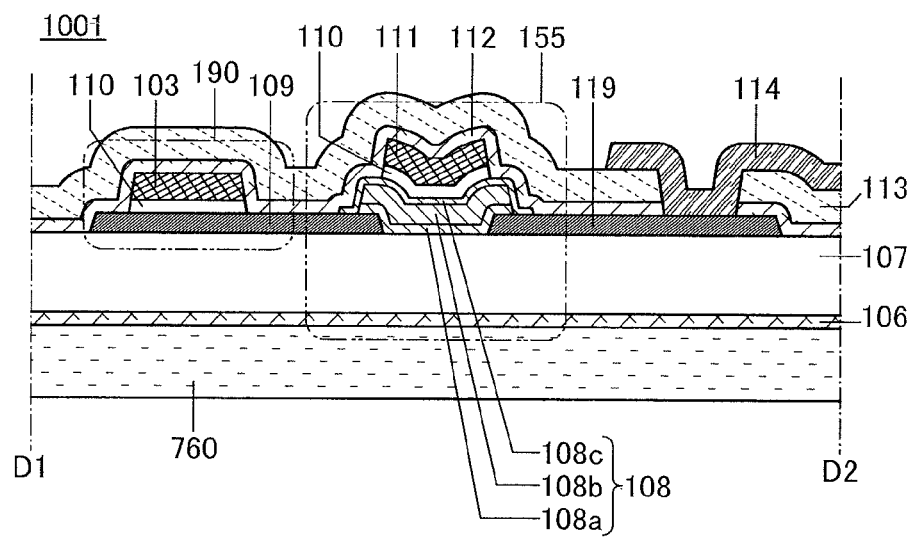
Figure 43C:
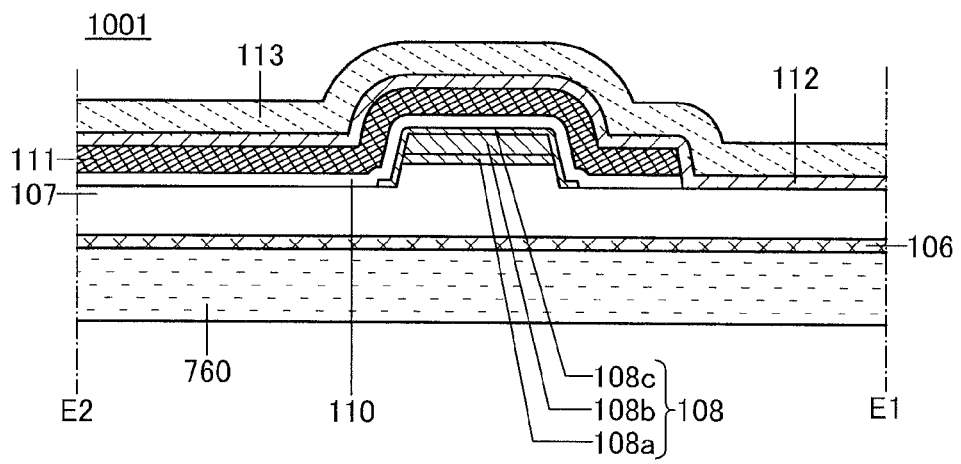

Although the electrode 102 is formed over the insulating layer 106 in this embodiment, the insulating layer 106 may be formed over the electrode 102. Alternatively, formation of the insulating layer 106 may be omitted. As illustrated in FIGS. 43A to 43C, formation of the electrode 102 may be omitted. In the transistors illustrated in the other drawings, the structure without the electrode 102 as in FIGS. 43A to 43C may be employed.

Although there is no particular limitation on a material that can be used as the substrate 760, it is necessary that the substrate have at least heat resistance high enough to withstand heat treatment to be performed later. For example, a glass substrate of barium borosilicate glass, aluminoborosilicate glass, or the like, a ceramic substrate, a quartz substrate, or a sapphire substrate can be used.

A single crystal semiconductor substrate or a polycrystalline semiconductor substrate of silicon, silicon carbide, or the like or a compound semiconductor substrate of silicon germanium or the like may be used as the substrate 760. Alternatively, an SOI substrate, a semiconductor substrate over which a semiconductor element is provided, or the like can also be used.

Note that a flexible substrate may also be used as the substrate 760. In the case where a flexible substrate is used, the transistor, the capacitor, or the like may be directly formed over the flexible substrate; or the transistor, the capacitor, or the like may be formed over a manufacturing substrate and then separated from the manufacturing substrate and transferred onto the flexible substrate. To separate and transfer the transistor, the capacitor, or the like from the manufacturing substrate to the flexible substrate, a separation layer may be provided between the manufacturing substrate and the transistor, the capacitor, or the like.

The substrate 760 is not limited to a simple supporting substrate, and may be a substrate where a device such as a transistor is formed. In this case, at least one of the gate electrode, the source electrode, and the drain electrode of the transistor 155 may be electrically connected to the above device.

The oxide semiconductor layer 108*a* is formed so as to overlap with the electrode 102 and be in contact with part of the electrodes 109 and 119. The oxide semiconductor layer 108*b* is formed so as to overlap with and be positioned over the oxide semiconductor layer 108*a*, and the oxide semiconductor layer 108*c* is formed to cover the oxide semiconductor layers 108*a* and 108*b*. The electrode 111 is formed over the oxide semiconductor layer 108 with the insulating layer 110 provided therebetween.

An insulating layer 112 and an insulating layer 113 are formed to cover the transistor 155 and the capacitor 190. An electrode 114 formed over the insulating layer 113 is electrically connected to the electrode 119 through an opening formed in the insulating layer 112 and the insulating layer 113.

As described in the above embodiments, one of the electrodes 102 and 111 functions as a gate electrode, and the other thereof functions as a back gate electrode. One of the electrodes 109 and 119 functions as a source electrode and the other functions as a drain electrode.

The transistor 155 described in this embodiment has a structure in which the electrodes 102 and 111 do not overlap with the electrodes 109 and 119. Parasitic capacitance generated between the gate or back gate electrode and the source or drain electrode mainly changes in accordance with the overlapping area between the electrode 102 or 111 and the electrode 109 or 119; increase in the overlapping area results in the increase in the parasitic capacitance. The parasitic capacitance may cause attenuation of a signal waveform transmitted between the source and the drain or delay of the signal, which causes malfunction of the semiconductor device or decreases operation characteristics.

By the structure in which the electrodes 102 and 111 do not overlap with the electrodes 109 and 119, parasitic capacitance can be reduced. Accordingly, malfunction of the semiconductor device can be decreased, and the reliability of the semiconductor device can be increased. Moreover, a semiconductor device with favorable operation characteristics can be provided. Furthermore, a semiconductor device with low power consumption can be provided.

Next, a semiconductor device 1002 including a transistor 156 with small parasitic capacitance will be described with reference to FIGS. 42A and 42B. The transistor 156 and the capacitor 190 included in the semiconductor device 1002 can be formed using materials and methods that are similar to those of the transistor 150, the transistor 155, and the like.

Figure 42A:
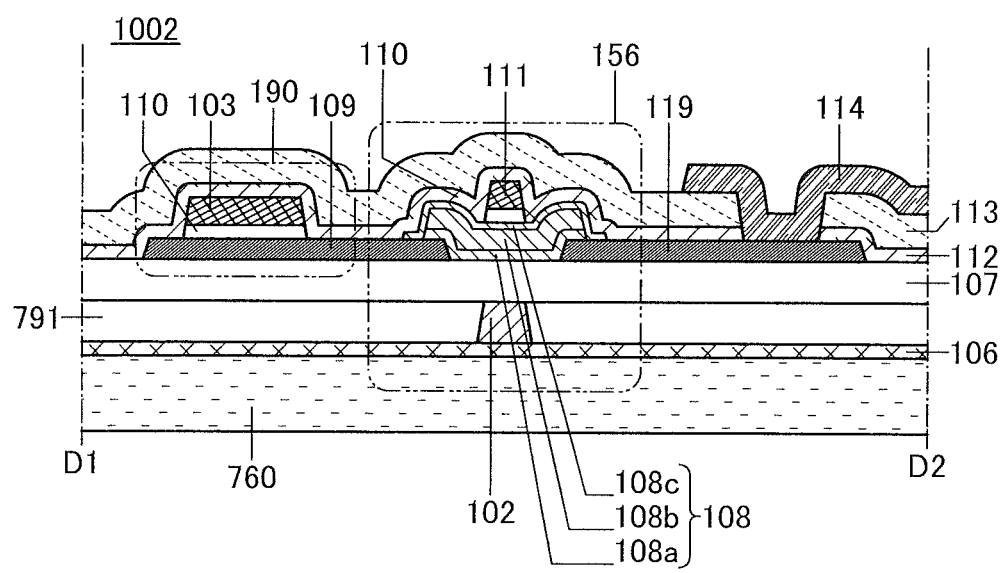
FIGS. 42A and 42B illustrate an example of a semiconductor device.

FIG. 42A is a cross-sectional view of the transistor 156 and the capacitor 190. Note that FIG. 42A corresponds to a cross-sectional view taken along dashed-dotted line D1-D2 in FIG. 41A. The transistor 156 has different lengths of the electrodes 111 and 102 in the channel length direction from the transistor 155. As illustrated in FIG. 42A, in the transistor 156, the electrodes 102 and 111 do not overlap with and are positioned apart from the electrodes 109 and 119. Therefore, the oxide semiconductor layers 108*a* to 108*c* each have a region which overlaps neither the electrode 109 nor electrode 119.

Figure 42B:
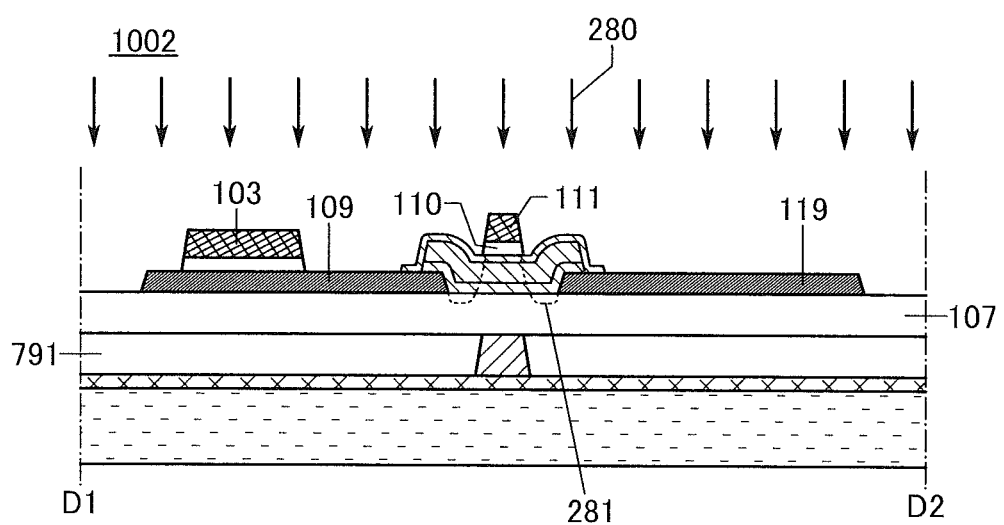

After formation of the electrode 111, an impurity element 280 that is an inert gas such as argon, phosphorus, boron, or the like, may be introduced into the oxide semiconductor layer 108 by an ion implantation method or the like using the electrode 111 as a mask (see FIG. 42B). In FIG. 42B, an edge of the region to which the impurity element 280 is introduced is represented as an edge 281 shown by a broken line. When the distance between the electrode 111 and the electrode 109 (the electrode 119) is short enough (for example, when the distance is less than half, preferably less than one fifth of the width of the electrode 111), the introduction of the impurity element is not necessary.

The oxide semiconductor layer 108 in the region to which the impurity element 280 is introduced (also referred to as "impurity region" below) has higher conductivity than the oxide semiconductor layer 108 in the region overlapping with the electrode 111. By introducing hydrogen, nitrogen, or the like in the impurity region after introducing the impurity element 280 such as argon, the impurity region can have higher conductivity, and variations in characteristics of the transistor can be reduced. Accordingly, the reliability of the semiconductor device can be improved.

After forming the impurity region in the oxide semiconductor layer 108 using the electrode 111 as a mask, a layer containing nitrogen may be formed over the impurity region and nitrogen in the layer may be diffused into the impurity region of the oxide semiconductor layer 108. The layer containing nitrogen may be formed between the insulating layer 112 and the oxide semiconductor layer 108; alternatively, the insulating layer 112 may be formed using a layer containing nitrogen.

The concentration of the impurity element 280 in the oxide semiconductor layer 108 decreases from the oxide semiconductor layer 108*c* side toward the insulating layer 107 side. In other words, the impurity region in the oxide semiconductor layer 108 has a concentration gradation in the depth direction of the impurity region. The impurity element 280 might be scattered at the time of introduction, so that part of the impurity region might overlap with the insulating layer 110 or the electrode 111.

After the electrode 111 is formed, aluminum or aluminum oxide may be deposited to cover the electrode 111 and the oxide semiconductor layer 108 and heat treatment may be performed in an oxidizing atmosphere so as to diffuse aluminum into the oxide semiconductor layer 108 in order to increase the conductivity of the oxide semiconductor layer 108 in the region which contacts with the aluminum or aluminum oxide. Note that the aluminum left over the electrode 111 and the oxide semiconductor layer 108 can be converted to aluminum oxide (insulator) by heating in an oxidizing atmosphere.

After introducing the impurity element 280 by an ion implantation method or the like, the above treatment may be performed.

After formation of the impurity region, heat treatment may be performed.

Note that in the other drawings, the width of the electrode 111 may also be shortened as in FIG. 42A so that the electrode 111 does not overlap with the electrode 109 (the electrode 119).

Figure 44A:
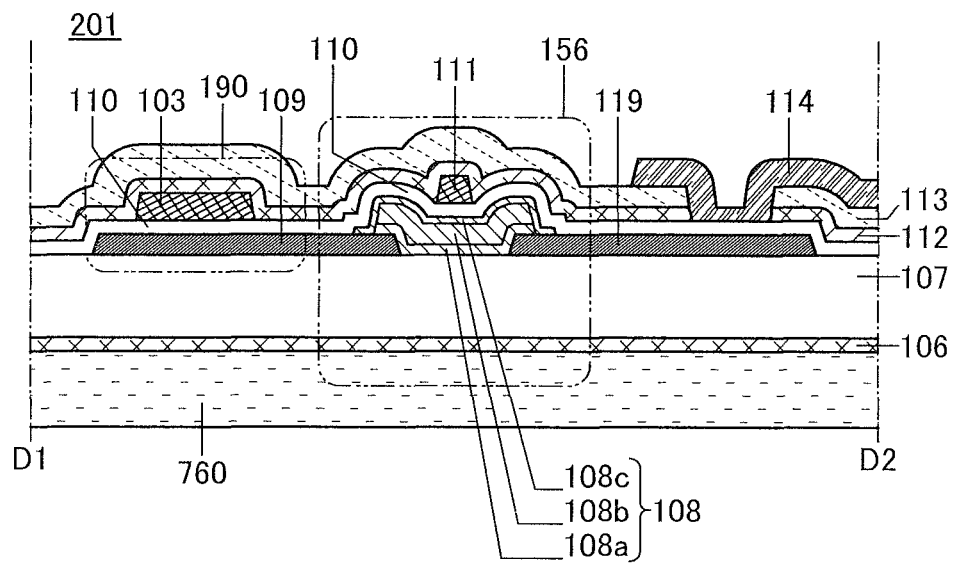
FIGS. 44A and 44B illustrate an example of a semiconductor device.
Figure 44B:
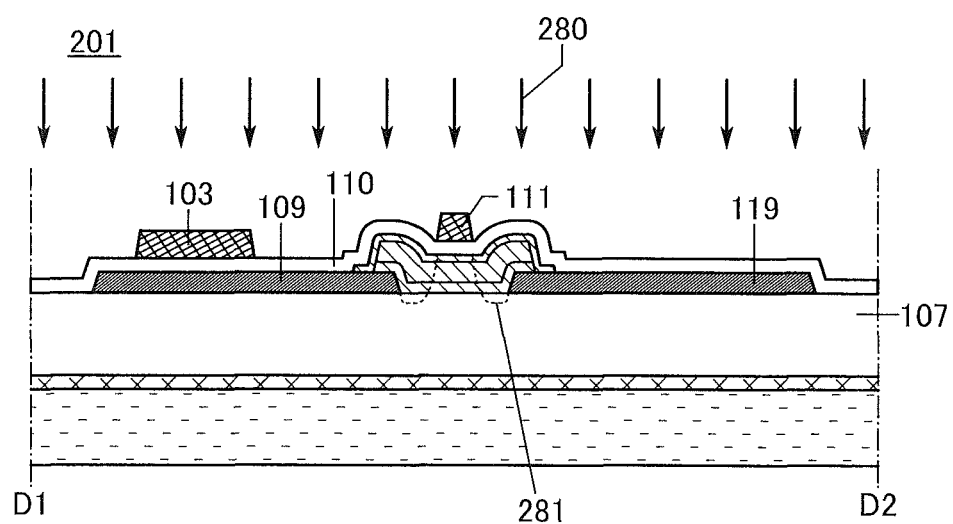

As illustrated in FIG. 44A, the insulating layer 110 may be provided so as to extend from a region under the electrode 111. In this case, as illustrated in FIG. 44B, the impurity element 280 is introduced through the insulating layer 110 by an ion implantation method or the like.

Next, a semiconductor device 1101 including a transistor 165 will be described with reference to FIGS. 45A to 45C. Note that the transistor 165 and the capacitor 190 included in the semiconductor device 1101 can be manufactured using materials and methods that are similar to those of the transistor 160 and the like disclosed in the above embodiments.

Figure 45A:
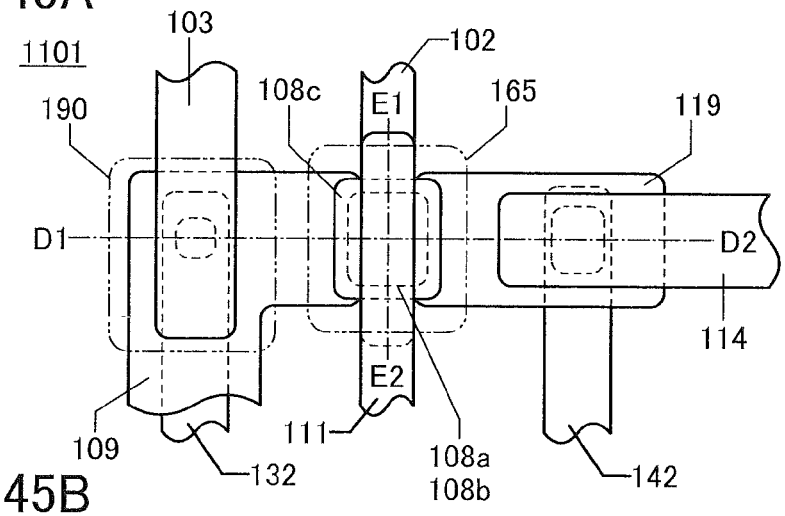
FIGS. 45A to 45C illustrate an example of a semiconductor device.
Figure 45B:
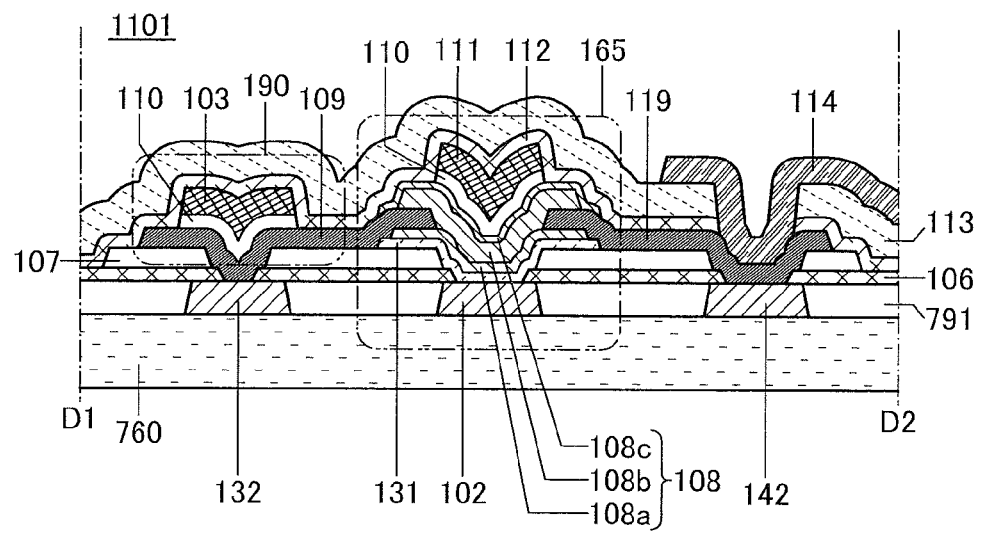
Figure 45C:
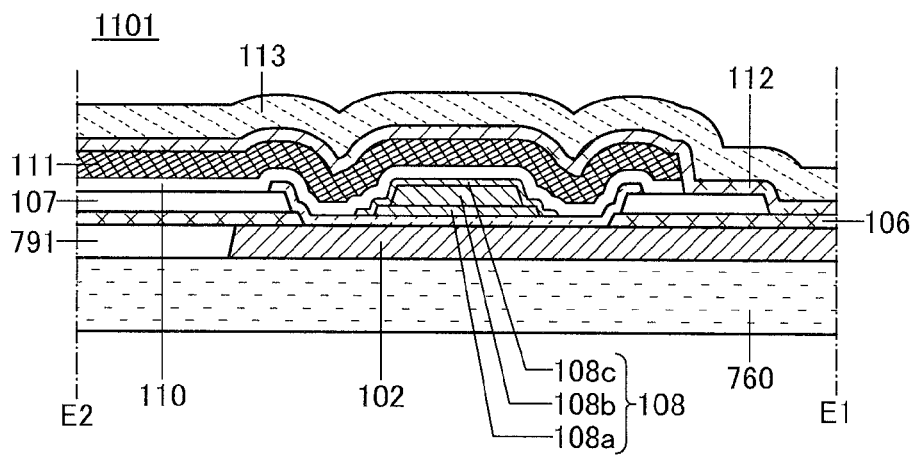

FIG. 45A is a top view of the transistor 165 and the capacitor 190. FIG. 45B is a cross-sectional view taken along dashed-dotted line D1-D2 in FIG. 45A. FIG. 45C is a cross-sectional view taken along dashed-dotted line E1-E2 in FIG. 45A. FIG. 45B is a cross-sectional view of the transistor 165 in a channel length direction, and FIG. 45C is a cross-sectional view of the transistor 165 in a channel width direction.

In the transistor 165 described in this embodiment, the electrode 102, an electrode 132, an electrode 142, and the insulating layer 791 are formed over the substrate 760, and the insulating layer 106 is formed thereover. Specifically, the electrode 102, the electrode 132, and the electrode 142 are formed over the substrate 760; the insulating layer 791 is formed to cover these electrodes; planarization treatment such as CMP treatment is performed to reduce surface unevenness and expose the electrode surface; and then the insulating layer 106 is formed.

Figure 47A:
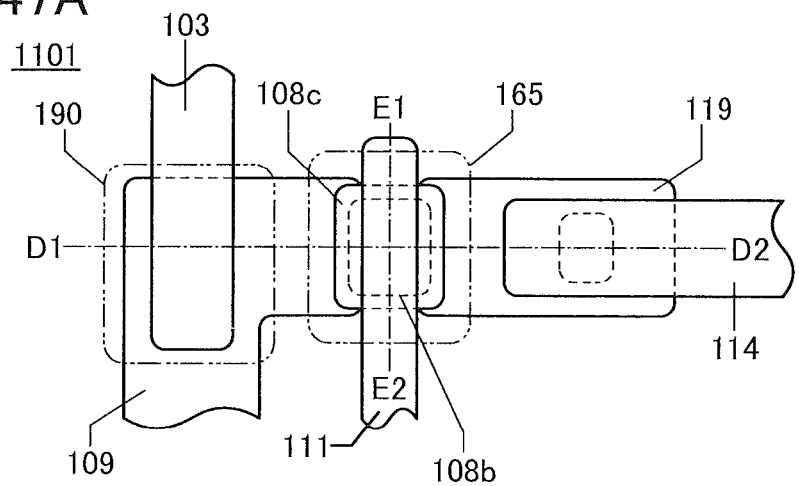
FIGS. 47A to 47C illustrate an example of a semiconductor device.
Figure 47B:
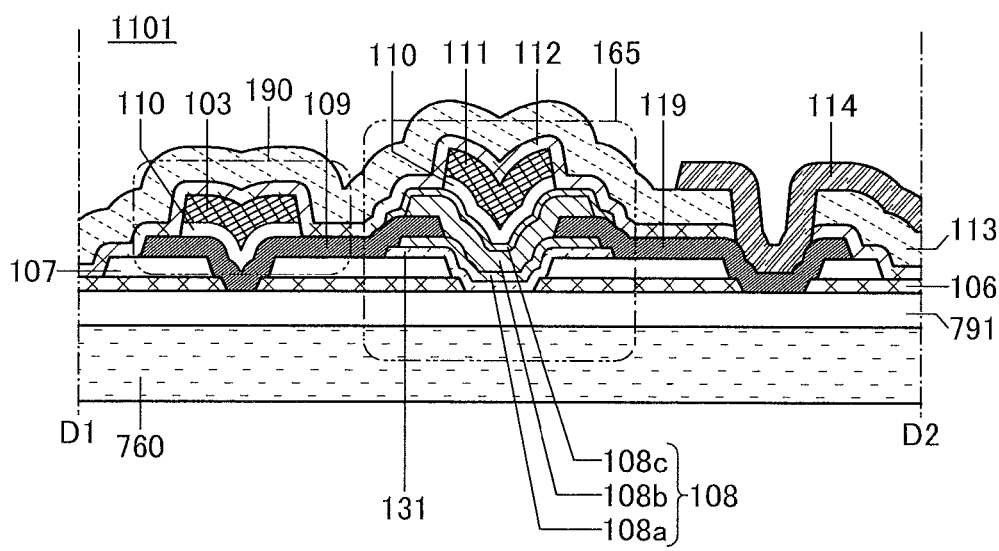
Figure 47C:
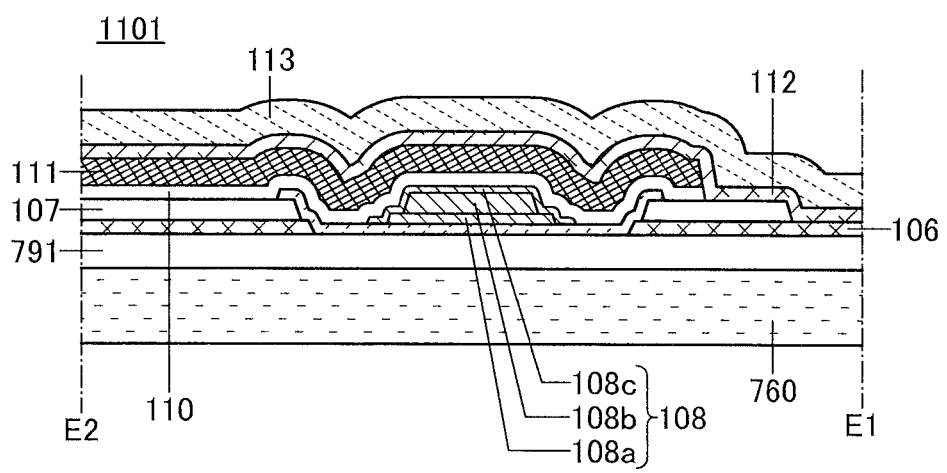
Figure 48A:
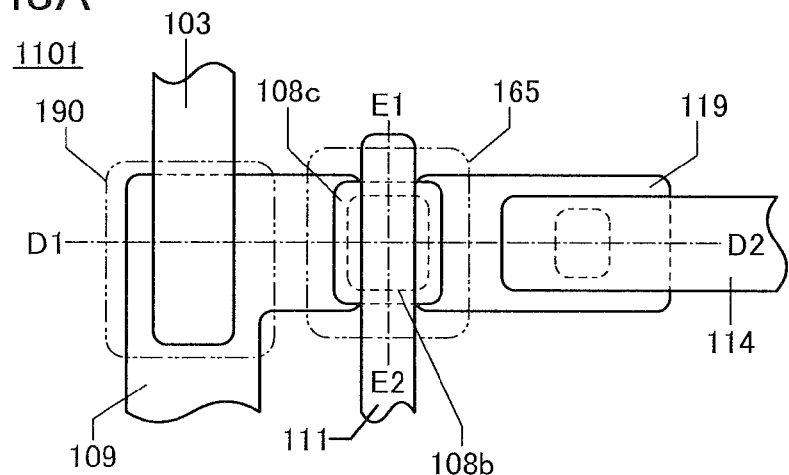
FIGS. 48A to 48C illustrate an example of a semiconductor device.
Figure 48B:
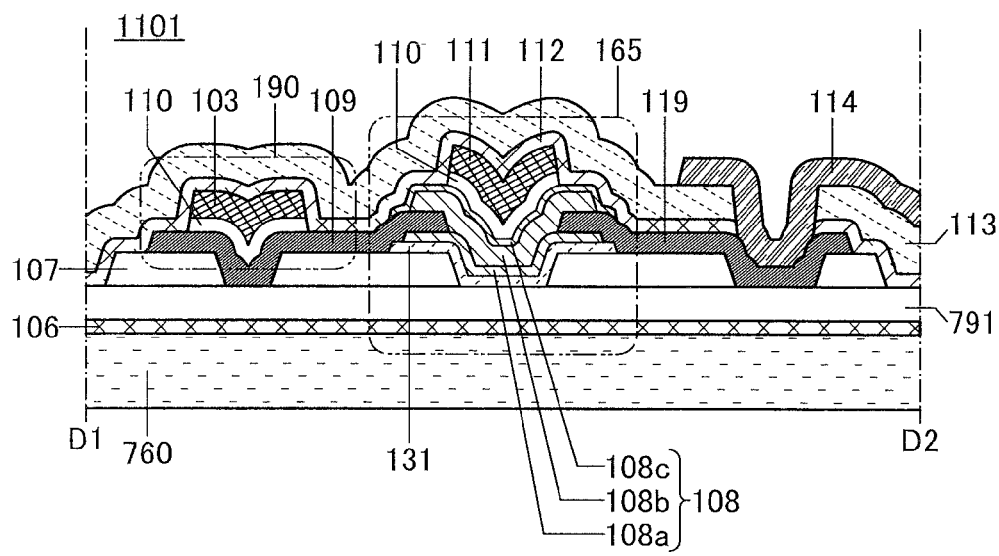
Figure 48C:
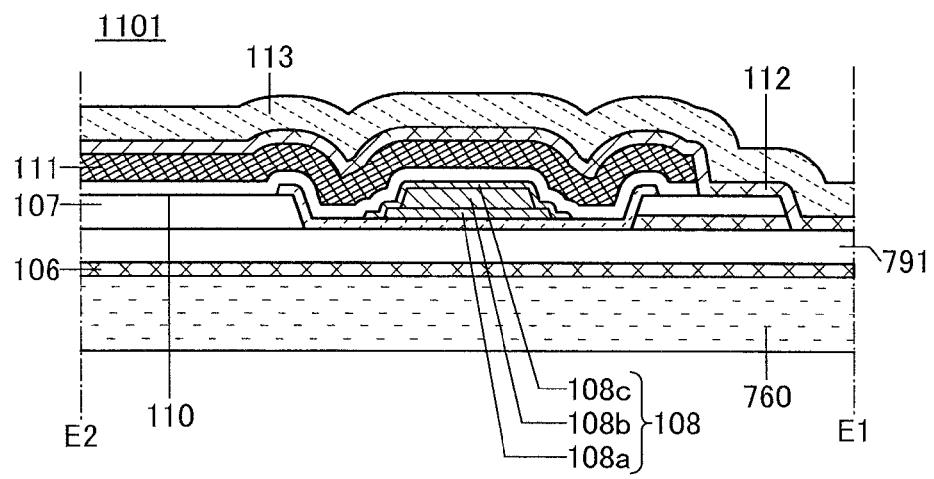

Although the insulating layer 106 is formed over the electrodes 102, 132, and 142 in this embodiment, the electrodes 102, 132, and 142 may be formed over the insulating layer 106. Alternatively, formation of the insulating layer 106 may be omitted. As illustrated in FIGS. 47A to 47C, formation of the electrodes 102, 132, and 142 may be omitted. In the transistors illustrated in the other drawings, the structure without at least one of the electrodes 102, 132, and 142 may be employed. As illustrated in FIGS. 48A to 48C, the insulating layer 106 may be provided over the substrate 760.

The electrode 132 is electrically connected to the electrode 109 through an opening formed in the insulating layers 107 and 106. The electrode 142 is electrically connected to the electrode 119 through an opening formed in the insulating layers 107 and 106. The oxide semiconductor layer 108a is formed so as to overlap with the electrode 102 with the insulating layer 131 provided therebetween and so as to be in contact with part of the electrodes 109 and 119. The oxide semiconductor layer 108b is formed so as to overlap with and be positioned over the electrode 109, the electrode 119, and the oxide semiconductor layer 108a, and the oxide semiconductor layer 108c is formed to cover the oxide semiconductor layer 108b. The electrode 111 is formed over the oxide semiconductor layer 108 with the insulating layer 110 provided therebetween.

The insulating layer 112 and the insulating layer 113 are formed to cover the transistor 165 and the capacitor 190. The electrode 114 formed over the insulating layer 113 is electrically connected to the electrode 119 through an opening formed in the insulating layers 112 and 113.

The transistor 165 described in this embodiment has a structure in which the electrodes 102 and 111 do not overlap with the electrodes 109 and 119.

By the structure in which the electrodes 102 and 111 do not overlap with the electrodes 109 and 119, parasitic capacitance can be reduced. Accordingly, malfunction of the semiconductor device can be decreased, and the reliability of the semiconductor device can be increased. Moreover, a semiconductor device with favorable operation characteristics can be provided. Furthermore, a semiconductor device with low power consumption can be provided.

Next, a semiconductor device 1102 including a transistor 166 with small parasitic capacitance will be described with reference to FIGS. 46A and 46B. The transistor 166 and the capacitor 190 included in the semiconductor device 1102 can be formed using materials and methods that are similar to those of the transistors 160 and 165 and the like.

Figure 46A:
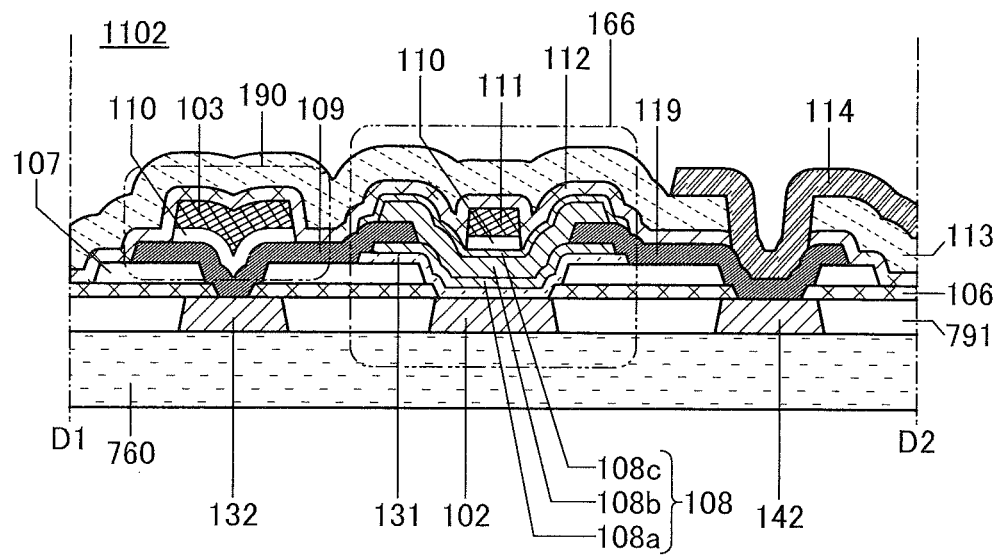
FIGS. 46A and 46B illustrate an example of a semiconductor device.

FIG. 46A is a cross-sectional view of the transistor 166 and the capacitor 190. Note that FIG. 46A corresponds to a cross-sectional view taken along dashed-dotted line D1-D2 in FIG. 45A. The transistor 166 has different lengths of the electrodes 111 and 102 in the channel length direction from the transistor 165. As illustrated in FIG. 46A, in the transistor 166, the electrodes 102 and 111 do not overlap with and are positioned apart from the electrodes 109 and 119. Therefore, the oxide semiconductor layers 108a to 108c each have a region which overlaps neither the electrode 109 nor electrode 119.

Figure 46B:
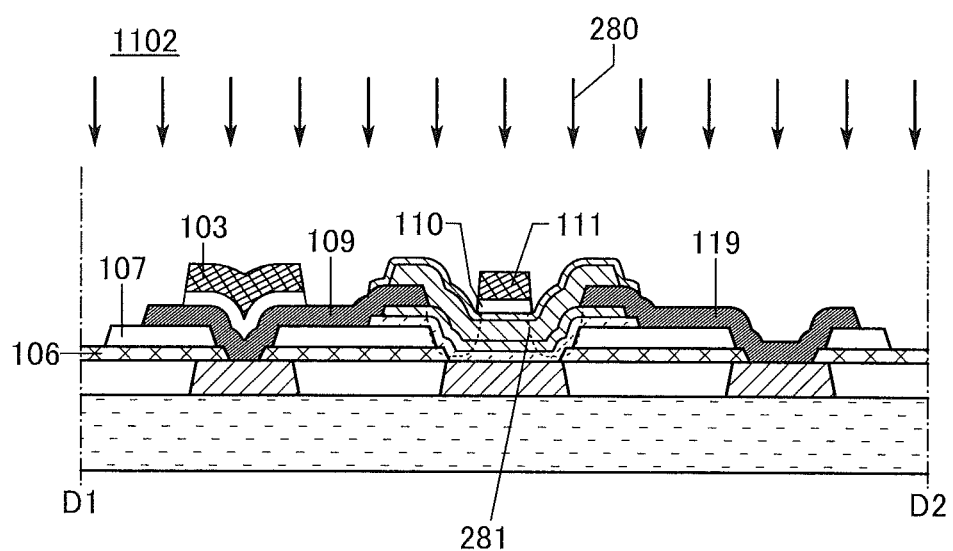

After formation of the electrode 111, the impurity element 280 that is an inert gas such as argon, phosphorus, boron, or the like, may be introduced into the oxide semiconductor layer 108 by an ion implantation method or the like using the electrode 111 as a mask (see FIG. 46B). In FIG. 46B, an edge of the region to which the impurity element 280 is introduced is represented as the edge 281 shown by a broken line. When the distance between the electrode 111 and the electrode 109 (the electrode 119) is short enough (for example, when the distance is less than half, preferably less than one fifth of the width of the electrode 111), the introduction of the impurity element is not necessary.

The oxide semiconductor layer 108 in the impurity region has higher conductivity than the oxide semiconductor layer 108 in the region overlapping with the electrode 111. By introducing hydrogen, nitrogen, or the like in the impurity region after introducing the impurity element 280 such as argon, the impurity region can have higher conductivity, and variations in characteristics of the transistor can be reduced. Accordingly, the reliability of the semiconductor device can be improved.

After forming the impurity region in the oxide semiconductor layer 108 using the electrode 111 as a mask, a layer containing nitrogen may be formed over the impurity region and nitrogen in the layer may be diffused into the impurity region of the oxide semiconductor layer 108. The layer containing nitrogen may be formed between the insulating layer 112 and the oxide semiconductor layer 108; alternatively, the insulating layer 112 may be formed using a layer containing nitrogen.

The concentration of the impurity element 280 in the oxide semiconductor layer 108 decreases from the oxide semiconductor layer 108c side toward the insulating layer 107 side. In other words, the impurity region in the oxide semiconductor layer 108 has a concentration gradation in the depth direction of the impurity region. The impurity element 280 might be scattered at the time of introduction, so that part of the impurity region might overlap with the insulating layer 110 or the electrode 111.

After the electrode 111 is formed, aluminum or aluminum oxide may be deposited to cover the electrode 111 and the oxide semiconductor layer 108 and heat treatment may be performed in an oxidizing atmosphere so as to diffuse aluminum into the oxide semiconductor layer 108 in order to increase the conductivity of the oxide semiconductor layer 108 in the region which contacts with the aluminum or aluminum oxide. Thus, aluminum is one kind of the impurity element 280. Note that the aluminum left over the electrode 111 and the oxide semiconductor layer 108 can be converted to aluminum oxide (insulator) by heating in an oxidizing atmosphere.

After introducing the impurity element 280 by an ion implantation method or the like, the above treatment may be performed.

After formation of the impurity region, heat treatment may be performed.

Figure 49A:
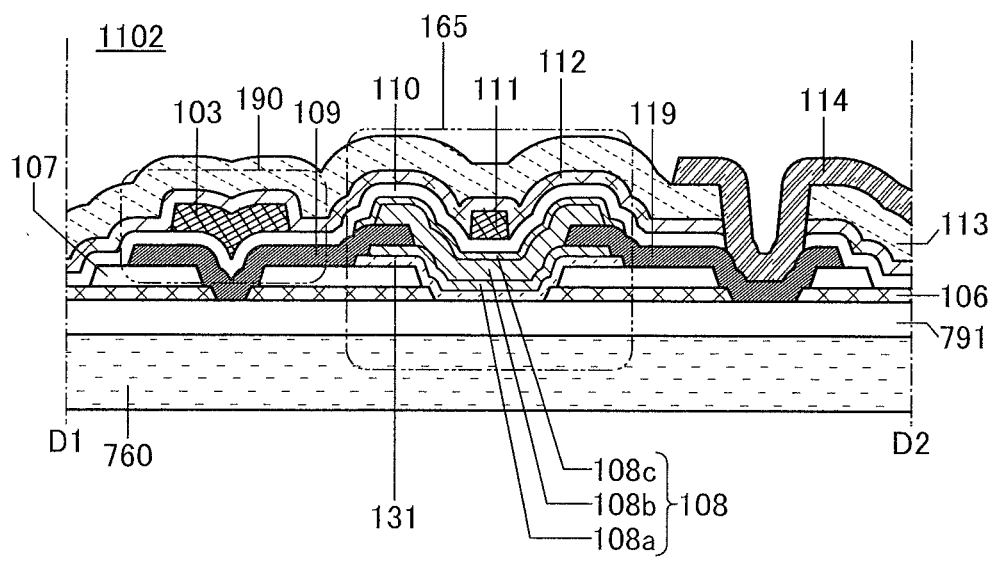
FIGS. 49A and 49B illustrate an example of a semiconductor device.
Figure 49B:
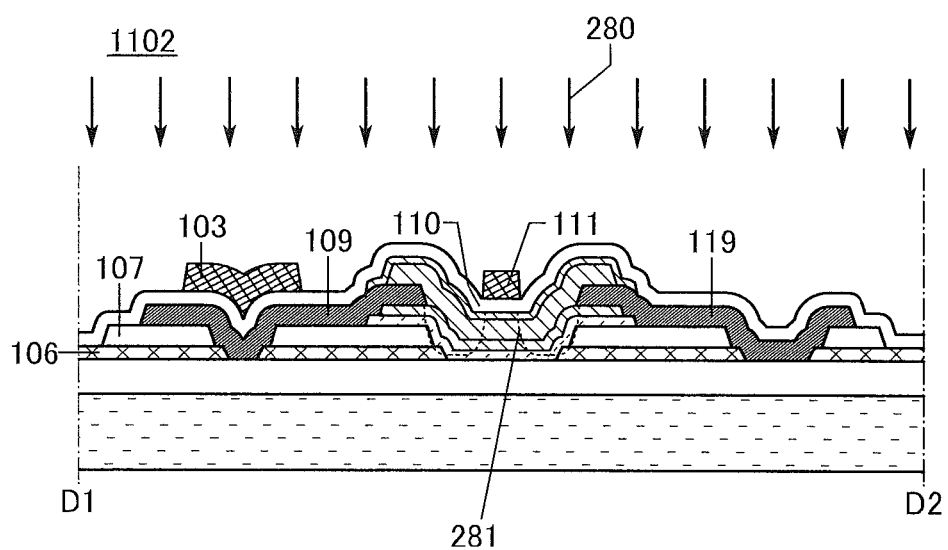

As illustrated in FIG. 49A, the insulating layer 110 may be provided so as to extend from a region under the electrode 111. In this case, as illustrated in FIG. 49B, the impurity element 280 is introduced through the insulating layer 110 by an ion implantation method or the like.

Next, a semiconductor device 1201 including a transistor 175 will be described with reference to FIGS. 50A to 50C. Note that the transistor 175 and the capacitor 190 included in the semiconductor device 1201 can be manufactured using materials and methods that are similar to those of the transistor 170 and the like disclosed in the above embodiments.

Figure 50A:
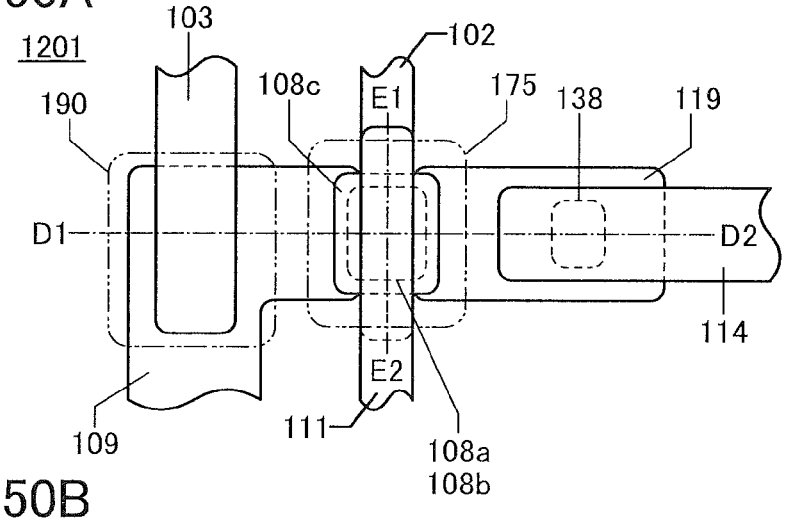
FIGS. 50A to 50C illustrate an example of a semiconductor device.
Figure 50B:
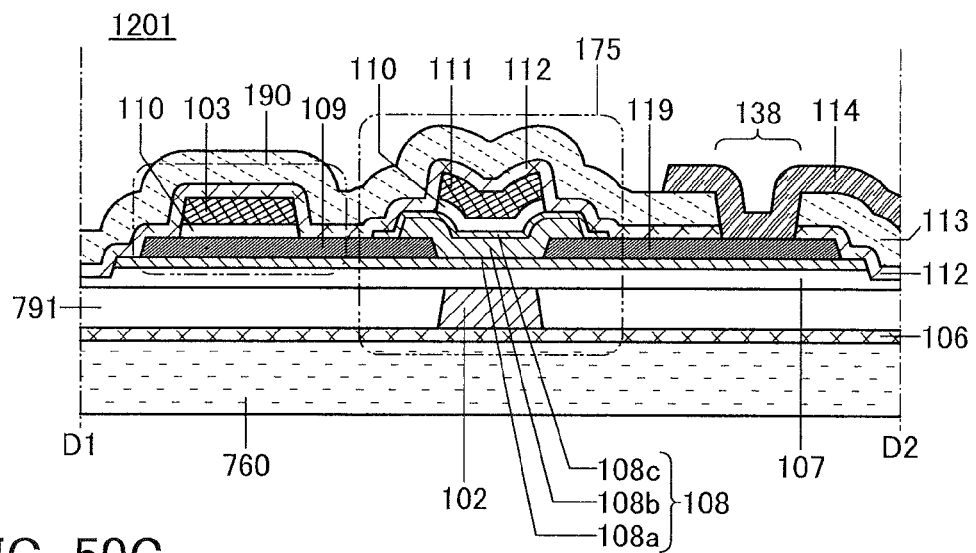
Figure 50C:
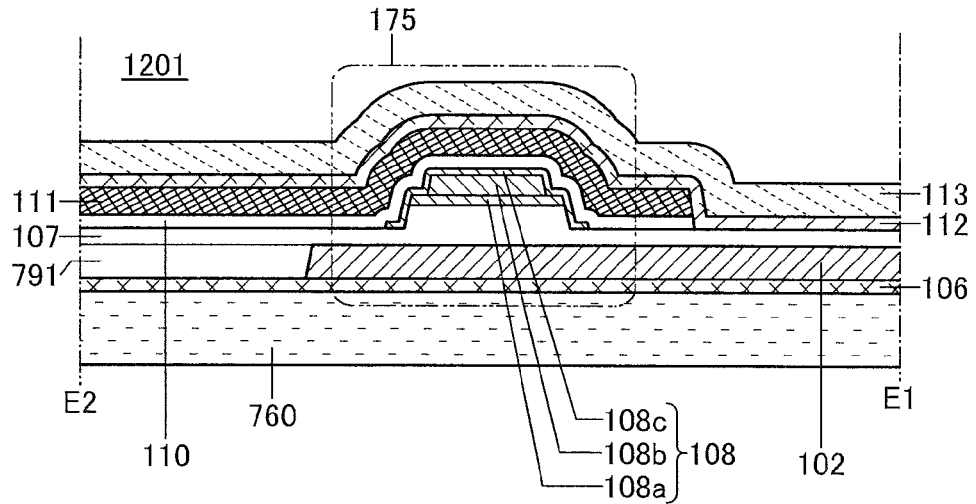

FIG. 50A is a top view of the transistor 175 and the capacitor 190. FIG. 50B is a cross-sectional view taken along dashed-dotted line D1-D2 in FIG. 50A. FIG. 50C is a cross-sectional view taken along dashed-dotted line E1-E2 in FIG. 50A. FIG. 50B is a cross-sectional view of the transistor 175 in a channel length direction, and FIG. 50C is a cross-sectional view of the transistor 175 in a channel width direction.

Figure 52A:
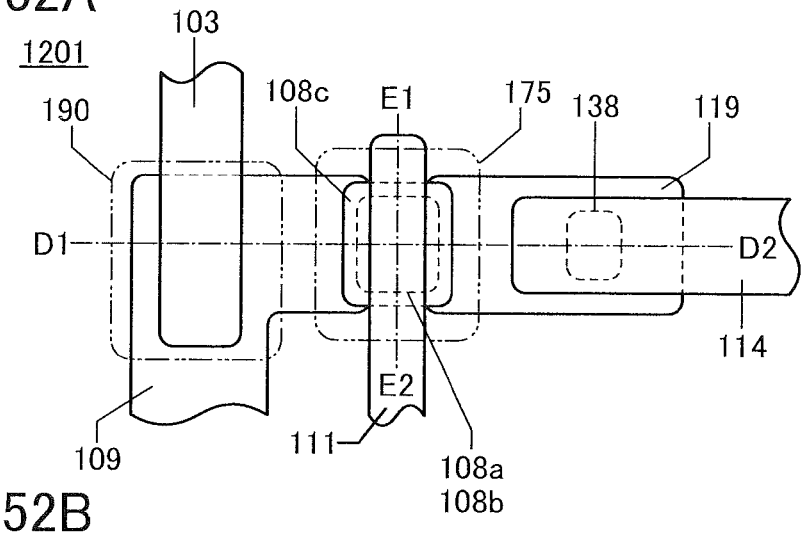
FIGS. 52A to 52C illustrate an example of a semiconductor device.
Figure 52B:
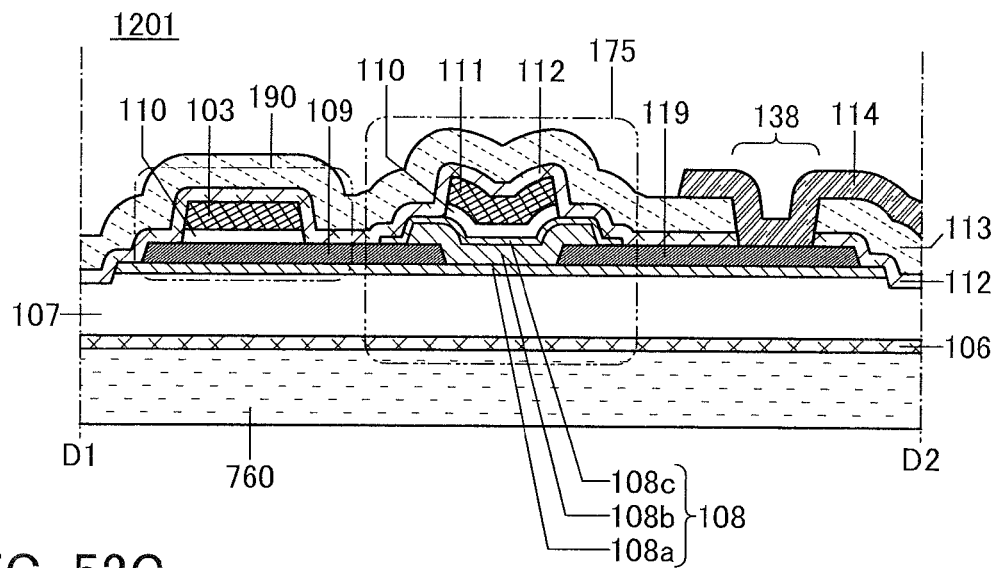
Figure 52C:
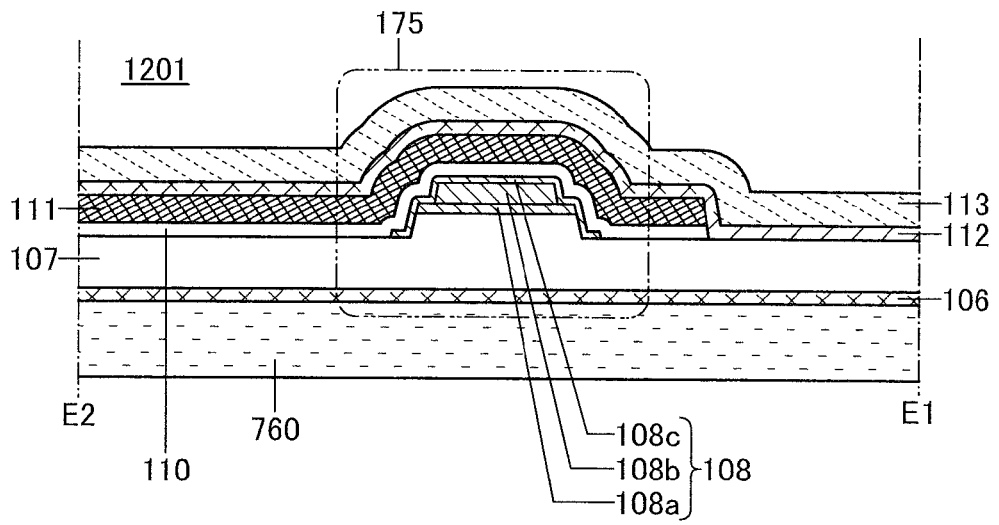

In the transistor 175 described in this embodiment, the insulating layer 106 is formed over a substrate 760, and the insulating layer 791 and the electrode 102 are formed over the insulating layer 106. Furthermore, the insulating layer 107 is formed over the insulating layer 791 and the electrode 102. Specifically, the electrode 102 is formed over the insulating layer 106, the insulating layer 791 is formed to cover the electrode 102, planarization treatment such as CMP treatment is performed to reduce unevenness and expose a surface of the electrode 102, and the insulating layer 107 is formed over the insulating layer 791 and the electrode 102. Although the electrode 102 is formed over the insulating layer 106 in this embodiment, the insulating layer 106 may be formed over the electrode 102. Alternatively, formation of the insulating layer 106 may be omitted. As illustrated in FIGS. 52A to 52C, formation of the electrode 102 may be omitted.

The substrate 760 is not limited to a simple supporting substrate, and may be a substrate where a device such as a transistor is formed. In this case, at least one of the gate electrode, the source electrode, and the drain electrode of the transistor 175 may be electrically connected to the above device.

The oxide semiconductor layer 108a is formed over the insulating layer 107, and the electrodes 109 and 119 are formed over the oxide semiconductor layer 108a. The oxide semiconductor layer 108b is formed over the oxide semiconductor layer 108a and the electrodes 109 and 119 so as to overlap with the electrode 102 and be in contact with part of the electrodes 109 and 119. The oxide semiconductor layer 108c is formed to cover the oxide semiconductor layer 108b. The electrode 111 is formed over the oxide semiconductor layer 108 with the insulating layer 110 provided therebetween.

The insulating layer 112 and the insulating layer 113 are formed to cover the transistor 170 and the capacitor 190. The electrode 114 formed over the insulating layer 113 is electrically connected to the electrode 119 through an opening formed in the insulating layer 112 and the insulating layer 113.

The transistor 175 described in this embodiment has a structure in which the electrodes 102 and 111 do not overlap with the electrodes 109 and 119.

By the structure in which the electrodes 102 and 111 do not overlap with the electrodes 109 and 119, parasitic capacitance can be reduced. Accordingly, malfunction of the semiconductor device can be decreased, and the reliability of the semiconductor device can be increased. Moreover, a semiconductor device with favorable operation characteristics can be provided. Furthermore, a semiconductor device with low power consumption can be provided.

Next, a semiconductor device 1202 including a transistor 176 with small parasitic capacitance will be described with reference to FIGS. 51A and 51B. The transistor 176 and the capacitor 190 included in the semiconductor device 1202 can be formed using materials and methods that are similar to those of the transistors 170 and 175 and the like.

Figure 51A:
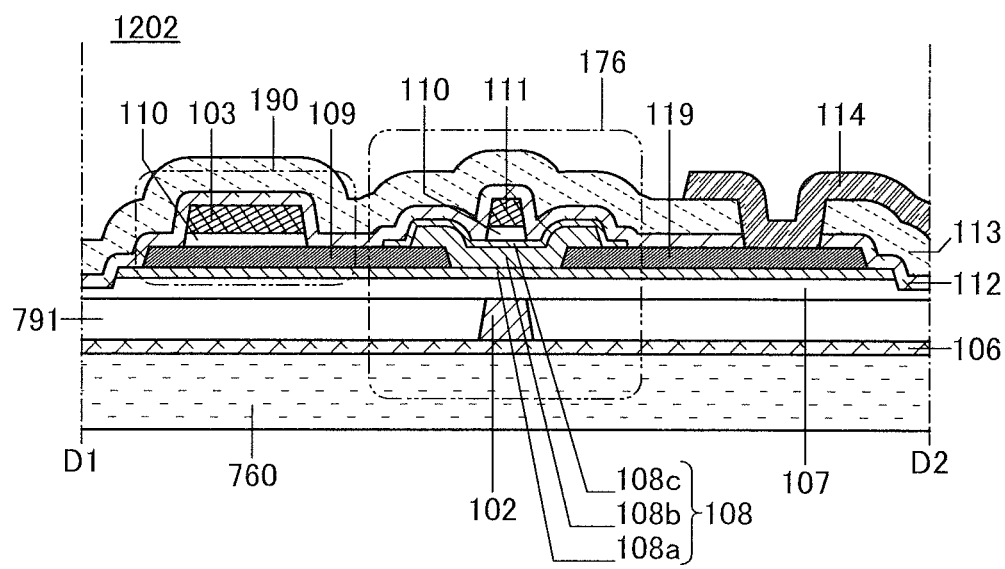
FIGS. 51A and 51B illustrate an example of a semiconductor device.

FIG. 51A is a cross-sectional view of the transistor 176 and the capacitor 190. Note that FIG. 51A corresponds to a cross-sectional view taken along dashed-dotted line D1-D2 in FIG. 50A. The transistor 176 has different lengths of the electrodes 111 and 102 in the channel length direction from the transistor 175. As illustrated in FIG. 51A, in the transistor 176, the electrodes 102 and 111 do not overlap with the electrodes 109 and 119 and are positioned apart from the edges of the electrodes 109 and 119. Therefore, the oxide semiconductor layers 108a to 108c each have a region which overlaps neither the electrode 109 nor electrode 119.

Figure 51B:
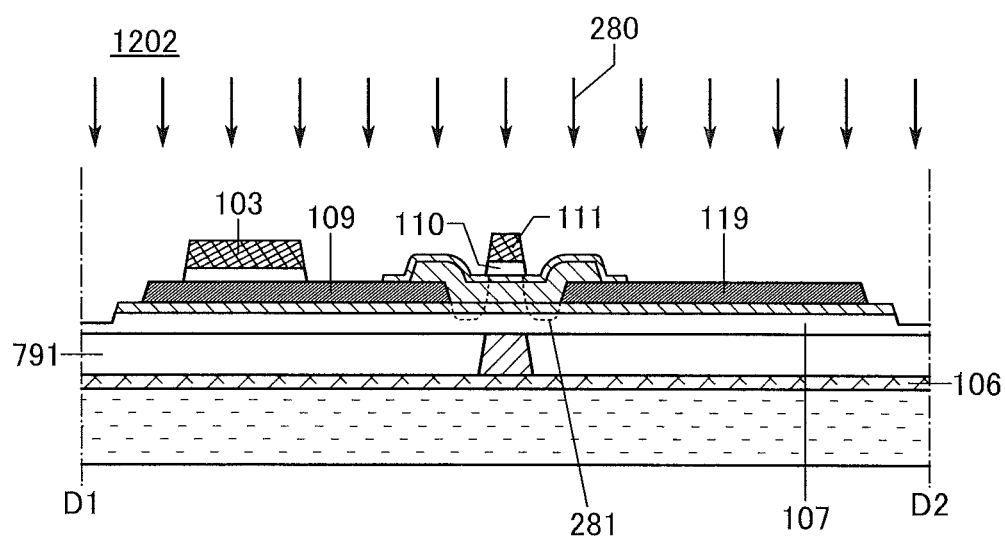

After formation of the electrode 111, an impurity element 280 that is an inert gas such as argon, phosphorus, boron, or the like, may be introduced into the oxide semiconductor layer 108 by an ion implantation method or the like using the electrode 111 as a mask (see FIG. 51B). In FIG. 51B, an edge of the region to which the impurity element 280 is introduced is represented as the edge 281 shown by a broken line. When the distance between the electrode 111 and the electrode 109 (the electrode 119) is short enough (for example, when the distance is less than half, preferably less than one fifth of the width of the electrode 111), the introduction of the impurity element is not necessary.

The oxide semiconductor layer 108 in the impurity region has higher conductivity than the oxide semiconductor layer 108 in the region overlapping with the electrode 111. By introducing hydrogen, nitrogen, or the like in the impurity region after introducing the impurity element 280 such as argon, the impurity region can have higher conductivity, and variations in characteristics of the transistor can be reduced. Accordingly, the reliability of the semiconductor device can be improved.

After forming the impurity region in the oxide semiconductor layer 108 using the electrode 111 as a mask, a layer containing nitrogen may be formed over the impurity region and nitrogen in the layer may be diffused into the impurity region of the oxide semiconductor layer 108. The layer containing nitrogen may be formed between the insulating layer 112 and the oxide semiconductor layer 108; alternatively, the insulating layer 112 may be formed using a layer containing nitrogen.

The concentration of the impurity element 280 in the oxide semiconductor layer 108 decreases from the oxide semiconductor layer 108c side toward the insulating layer 107. In other words, the impurity region in the oxide semiconductor layer 108 has a concentration gradation in the depth direction of the impurity region. The impurity element 280 might be scattered at the time of introduction, so that part of the impurity region might overlap with the insulating layer 110 or the electrode 111.

After the electrode 111 is formed, aluminum or aluminum oxide may be deposited to cover the electrode 111 and the oxide semiconductor layer 108 and heat treatment may be performed in an oxidizing atmosphere so as to diffuse aluminum into the oxide semiconductor layer 108 in order to increase the conductivity of the oxide semiconductor layer 108 in the region which contacts with the aluminum or aluminum oxide. Note that the aluminum left over the electrode 111 and the oxide semiconductor layer 108 can be converted to aluminum oxide (insulator) by heating in an oxidizing atmosphere.

After introducing the impurity element 280 by an ion implantation method or the like, the above treatment may be performed.

After formation of the impurity region, heat treatment may be performed.

Figure 53A:
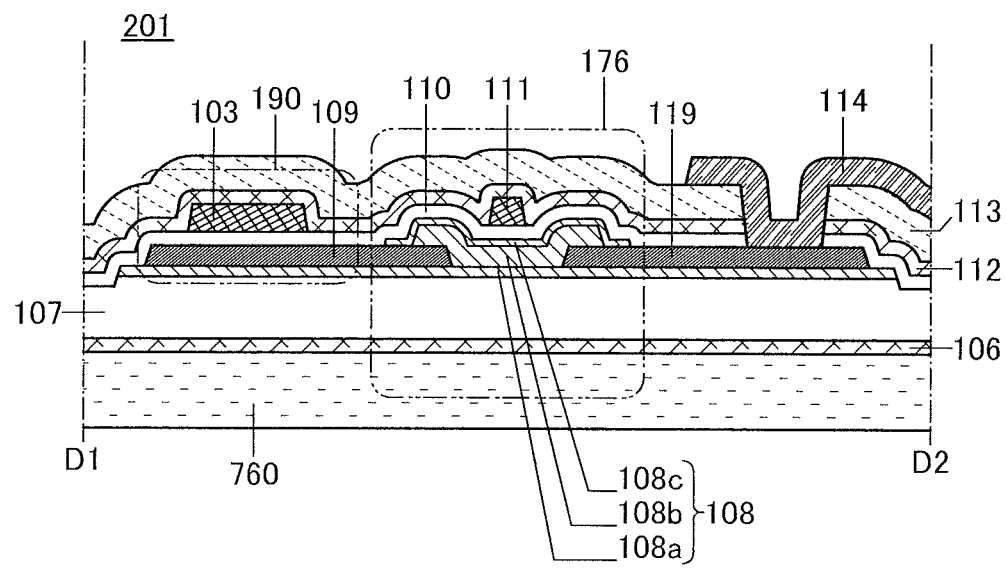
FIGS. 53A and 53B illustrate an example of a semiconductor device.
Figure 53B:
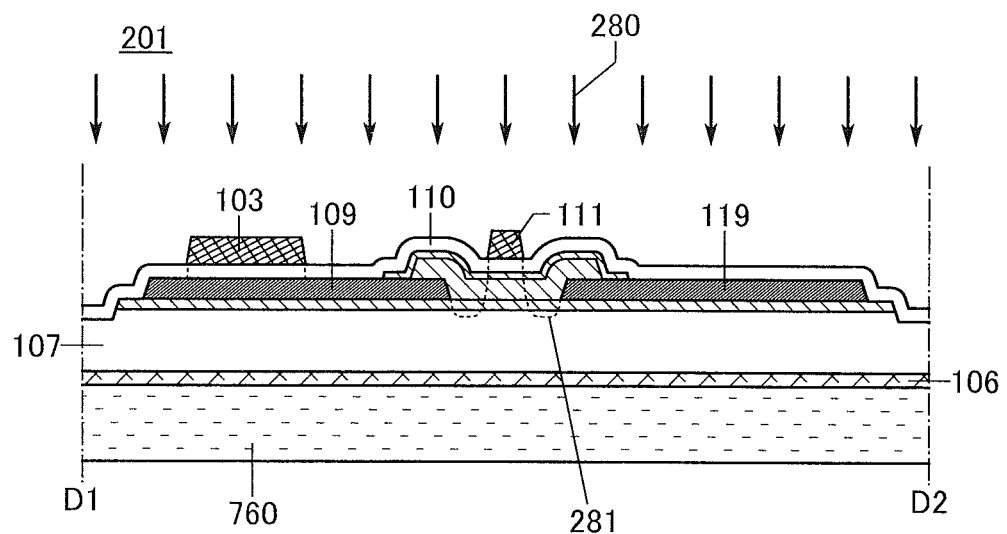

As illustrated in FIG. 53A, the insulating layer 110 may be provided so as to extend from a region under the electrode 111. In this case, as illustrated in FIG. 53B, the impurity element 280 is introduced through the insulating layer 110 by an ion implantation method or the like.

This embodiment can be combined with any of the other embodiments described in this specification as appropriate.

(Embodiment 8)

In this embodiment, an example of a semiconductor device that is one embodiment of the present invention is described with reference to drawings. In this embodiment, a display device is described as an example of the semiconductor device.

FIG. 54A illustrates an example of a display device. The display device in FIG. 54A includes a pixel portion 401, a scan line driver circuit 404, a signal line driver circuit 406, m scan lines 407 that are arranged parallel or substantially parallel to each other and whose potentials are controlled by the scan line driver circuit 404, and n signal lines 409 that are arranged parallel or substantially parallel to each other and whose potentials are controlled by the signal line driver circuit 406. m and n are each an integer of 1 or more. The pixel portion 401 includes a plurality of pixels 411 arranged in a matrix having m rows and n columns.

By using three pixels 411 as one pixel, color display can be performed. For example, color display can be performed by operating the pixel 411 for emitting red light, the pixel 411 for emitting green light, and the pixel 411 for emitting blue light as one pixel. The colors of light emitted from the three pixels 411 may be yellow, cyan, magenta, and the like instead of red, green, and blue.

Alternatively, four pixels 411 may be used as one pixel. For example, the four pixels 411 may emit red light, green light, blue light, and yellow light. By increasing the number of pixels 411 used as one pixel, the color reproducibility can be particularly improved. Thus, the display quality of the display device can be improved. In another example, the four pixels 411 may emit red light, green light, blue light, and white light. With the pixel 411 that emits white light, the luminance of the display region can be increased. Depending on the intended use of the display device, the two pixels 411 can be used as one pixel.

The display device illustrated in FIG. 54A includes capacitor lines 415 arranged parallel or substantially parallel to each other along the scan lines 407. Note that the capacitor lines 415 may be arranged parallel or substantially parallel to each other along the signal lines 409. The scan line driver circuit 404 and the signal line driver circuit 406 are collectively referred to as a driver circuit portion in some cases.

Each scan line 407 is electrically connected to the n pixels 411 in the corresponding row among the pixels 411 in the pixel portion 401. Each signal line 409 is electrically connected to the m pixels 411 in the corresponding column among the pixels 411. Each capacitor line 415 is electrically connected to the n pixels 411 in the corresponding row among the pixels 411. In the case where the capacitor lines 415 are arranged parallel or substantially parallel to each other along the signal lines 409, each capacitor line 415 is electrically connected to the m pixels 411 in the corresponding column among the pixels 411.

FIGS. 54B and 54C illustrate circuit configurations that can be used for the pixels 411 in the display device illustrated in FIG. 54A.

The pixel 411 illustrated in FIG. 54B includes a liquid crystal element 432, a transistor 431_1, and a capacitor 433_1. As the transistor 431_1, any of the above-described transistors disclosed in the above embodiments can be used. In particular, a transistor including an oxide semiconductor in a semiconductor layer in which a channel is formed is preferably used as the transistor 431_1 due to its extremely small off-state current.

The potential of one of a pair of electrodes of the liquid crystal element 432 is set according to the specifications of the pixels 411 as appropriate. The alignment state of a liquid crystal in the liquid crystal element 432 depends on written data. A common potential may be applied to one of the pair of electrodes of the liquid crystal element 432 included in each of the plurality of pixels 411. The potential supplied to one of a pair of electrodes of the liquid crystal element 432 in the pixel 411 in one row may be different from the potential supplied to one of a pair of electrodes of the liquid crystal element 432 in the pixel 411 in another row.

As examples of a mode of the liquid crystal element 432, any of the following modes can be given: a TN mode, an STN mode, a VA mode, an ASM (axially symmetric aligned micro-cell) mode, an OCB (optically compensated birefringence) mode, an FLC (ferroelectric liquid crystal) mode, an AFLC (antiferroelectric liquid crystal) mode, an MVA mode, a PVA (patterned vertical alignment) mode, an IPS mode, an FFS mode, a TBA (transverse bend alignment) mode, and the like. Other examples include ECB (electrically controlled birefringence) mode, PDLC (polymer dispersed liquid crystal) mode, PNLC (polymer network liquid crystal) mode, and a guest-host mode. Note that the present invention is not limited to these modes, and various modes can be used.

The liquid crystal element may be formed using a liquid crystal composition including liquid crystal exhibiting a blue phase and a chiral material. The liquid crystal exhibiting a blue phase has a short response time of 1 ms or less. Further, the liquid crystal is optically isotropic, which makes the alignment process unneeded and the viewing angle dependence small.

In the pixel 411 in the m-th row and the n-th column, one of a source electrode and a drain electrode of the transistor 431_1 is electrically connected to a signal line DL_n, and the other is electrically connected to the other of a pair of electrodes of the liquid crystal element 432. A gate electrode of the transistor 431_1 is electrically connected to a scan line GL_m. The transistor 431_1 has a function of controlling the writing of a data signal by being turned on or off.

One of a pair of electrodes of the capacitor 433_1 is electrically connected to the capacitor line CL, and the other is electrically connected to the other of the pair of electrodes of the liquid crystal element 432. The potential of the capacitor line CL is set in accordance with the specifications of the pixel 411 as appropriate. The capacitor 433_1 functions as a storage capacitor for storing written data.

For example, in the display device including the pixel 411 in FIG. 54B, the pixels 411 are sequentially selected row by row by the scan line driver circuit 404, whereby the transistors 431_1 are turned on and a data signal is written.

When the transistors 431_1 are turned off, the pixels 411 in which the data has been written exists in a holding state. This operation is sequentially performed row by row; thus, an image is displayed.

The pixel 411 illustrated in FIG. 54C includes a transistor 431_2, a capacitor 433_2, a transistor 434, and a light-emitting element 435. Any of the transistors disclosed in the above embodiments can be used as the transistor 431_2 and the transistor 434. In particular, it is preferable to use, as the transistor 431_2, a transistor including an oxide semiconductor in a semiconductor layer in which a channel is formed due to its extremely a small off-state current.

One of a source electrode and a drain electrode of the transistor 431_2 is electrically connected to a signal line DL_n. A gate electrode of the transistor 431_2 is electrically connected to a scan line GL_m.

The transistor 431_2 has a function of controlling the writing of a data signal by being turned on or off.

One of a pair of electrodes of the capacitor 433_2 is electrically connected to a node 436, and the other is electrically connected to a node 437.

The capacitor 433_2 functions as a storage capacitor for storing written data.

One of a source electrode and a drain electrode of the transistor 434 is electrically connected to the potential supply line VL_a. A gate electrode of the transistor 434 is electrically connected to the node 436.

One of an anode and a cathode of the light-emitting element 435 is electrically connected to a potential supply line VL_b, and the other is electrically connected to the node 437.

As the light-emitting element 435, an organic electroluminescent element (also referred to as an organic EL element) or the like can be used, for example. Note that the light-emitting element 435 is not limited to an organic EL element; an inorganic EL element including an inorganic material may be used.

A high power supply potential VDD is supplied to one of the potential supply line VL_a and the potential supply line VL_b, and a low power supply potential VSS is supplied to the other.

In the display device including the pixel 411 in FIG. 54C, the pixels 411 are sequentially selected row by row by the scan line driver circuit 404, whereby the transistors 431_2 are turned on and a data signal is written.

When the transistors 431_2 are turned off, the pixels 411 in which the data has been written exists in a holding state. The current flowing between the source electrode and the drain electrode of the transistor 434 is controlled in accordance with the potential of the written data signal. The light-emitting element 435 emits light with a luminance corresponding to the flowing current. This operation is sequentially performed row by row; thus, an image is displayed.

Although the examples of using a liquid crystal element and a light-emitting element as display elements are described in this embodiment, one embodiment of the present invention is not limited these examples.

For example, in this specification and the like, a display element, a display device which is a device including a display element, a light-emitting element, and a light-emitting device which is a device including a light-emitting element can employ a variety of modes or can include a variety of elements. The display element, the display device, the light-emitting element, or the light-emitting device, for example, includes at least one of an electroluminescence (EL) element (e.g., an EL element including organic and inorganic materials, an organic EL element, and an inorganic EL element), an LED (e.g., a white LED, a red LED, a green LED, and a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulation (IMOD) element, a MEMS shutter display element, an optical-interference-type MEMS display element, an electrowetting element, a piezoelectric ceramic display, and a display element including a carbon nanotube. Other than the above, display media whose contrast, luminance, reflectivity, transmittance, or the like is changed by electrical or magnetic effect may be included. Note that examples of display devices including EL elements include an EL display. Examples of display devices including electron emitters include a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, electronic liquid powder, or electrophoretic elements include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Accordingly, power consumption can be further reduced.

This embodiment can be combined with any of the other embodiments described in this specification as appropriate.

(Embodiment 9)

In this embodiment, a display module using a semiconductor device of one embodiment of the present invention is described with reference to FIG. 55.

Figure 55:
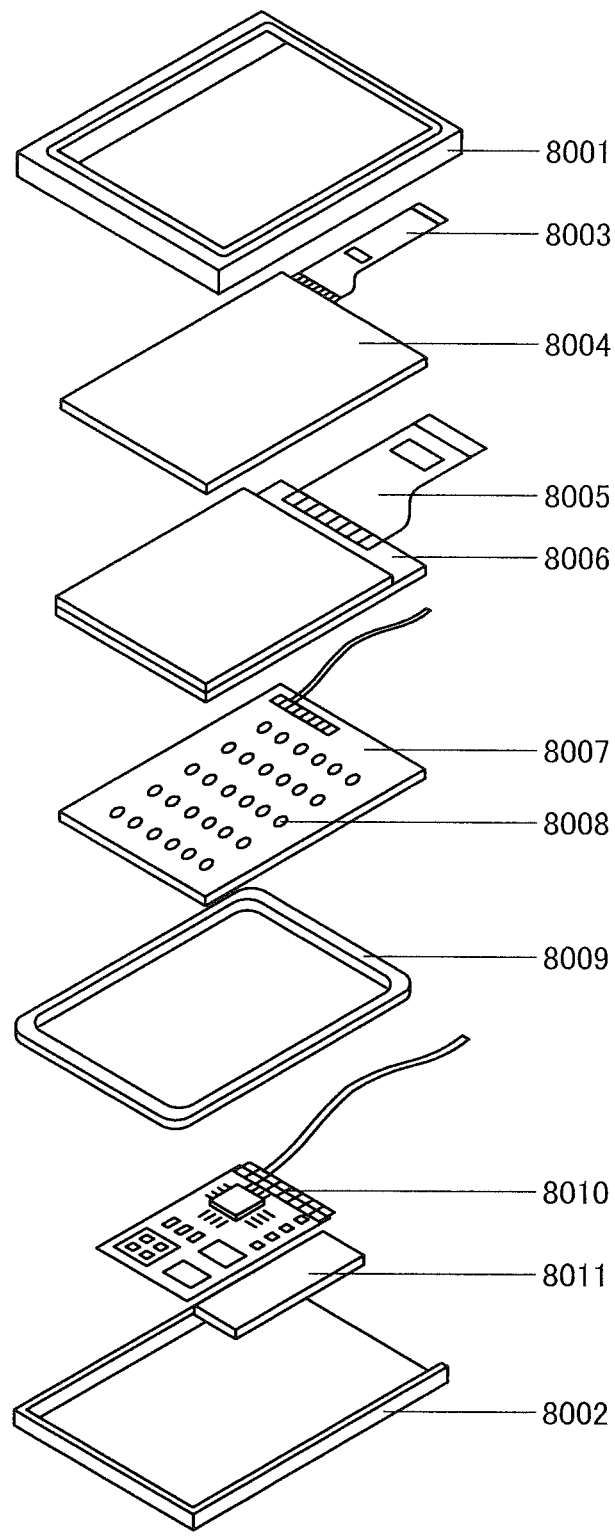
FIG. 55 illustrates a display module.

In a display module 8000 in FIG. 55, a touch sensor 8004 connected to an FPC 8003, a cell 8006 connected to an FPC 8005, a backlight unit 8007, a frame 8009, a printed board 8010, and a battery 8011 are provided between an upper cover 8001 and a lower cover 8002. The backlight unit 8007, the battery 8011, the touch sensor 8004, or the like is not provided in some cases.

The semiconductor device of one embodiment of the present invention can be used for the cell 8006, for example.

The shapes and sizes of the upper cover 8001 and the lower cover 8002 can be changed as appropriate in accordance with the sizes of the touch sensor 8004 and the cell 8006.

The touch sensor 8004 can be a resistive touch sensor or a capacitive touch sensor and may be formed to overlap with the cell 8006. A counter substrate (sealing substrate) of the cell 8006 can have a touch sensor function. A photosensor may be provided in each pixel of the cell 8006 so that an optical touch sensor is obtained. An electrode for a touch sensor may be provided in each pixel of the cell 8006 so that a capacitive touch sensor is obtained.

The backlight unit 8007 includes a light source 8008. The light source 8008 may be provided at an end portion of the backlight unit 8007 and a light diffusing plate may be used.

The frame 8009 may protect the cell 8006 and also function as an electromagnetic shield for blocking electromagnetic waves generated by the operation of the printed board 8010. The frame 8009 may function as a radiator plate.

The printed board 8010 has a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 can be additionally provided with a member such as a polarizing plate, a retardation plate, or a prism sheet.

This embodiment can be combined with any of the other embodiments described in this specification as appropriate.

(Embodiment 10)

In this embodiment, examples of an electronic device that uses a semiconductor device of one embodiment of the present invention will be described.

Specific examples of the electronic device that uses the semiconductor device of one embodiment of the present invention are as follows: display devices of televisions, monitors, and the like, lighting devices, desktop and laptop personal computers, word processors, image reproduction devices which reproduce still images and moving images stored in recording media such as digital versatile discs (DVDs), portable CD players, radios, tape recorders, headphone stereos, stereos, table clocks, wall clocks, cordless phone handsets, transceivers, mobile phones, car phones, portable game machines, tablet terminals, stationary game machines such as pachinko machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electrical tools such as a chain saw, smoke detectors, and medical equipment such as dialyzers. Other examples are as follows: industrial equipment such as guide lights, traffic lights, conveyor belts, elevators, escalators, industrial robots, power storage systems, and power storage devices for leveling the amount of power supply and smart grid. In addition, moving objects and the like driven by fuel engines or electric motors using power from a power storage unit are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts.

Figure 56A:
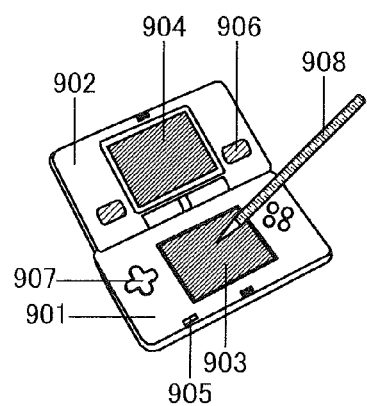
FIGS. 56A to 56F illustrate electronic devices of one embodiment of the present invention.

FIG. 56A illustrates an example of a portable game console including a housing 901, a housing 902, a display portion 903, a display portion 904, a microphone 905, a speaker 906, an operation key 907, a stylus 908, and the like. Although the portable game machine in FIG. 56A has the two display portions 903 and 904, the number of display portions is not limited to this.

Figure 56B:
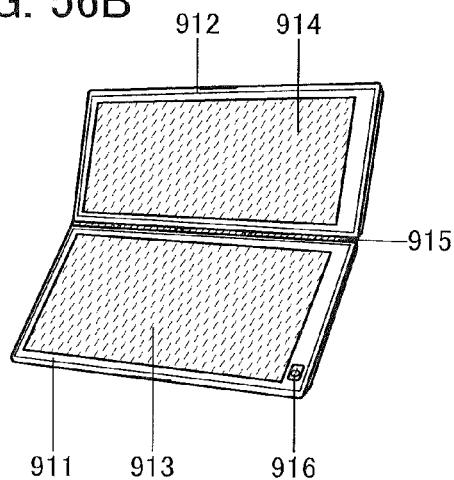

FIG. 56B illustrates an example of a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 56C:
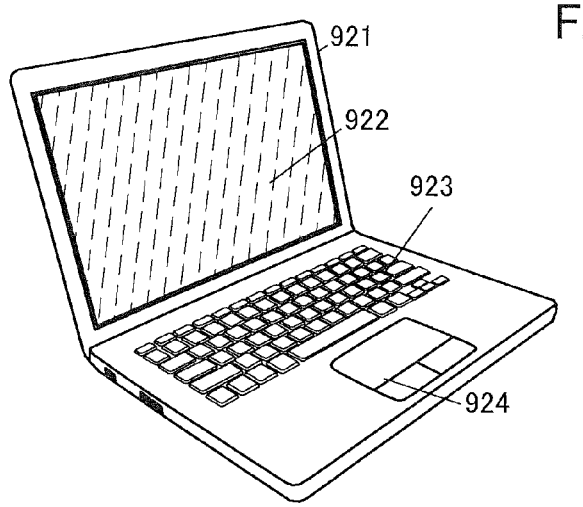

FIG. 56C illustrates an example of a laptop personal computer, which includes a housing 921, a display portion 922, a keyboard 923, a pointing device 924, and the like.

Figure 56D:
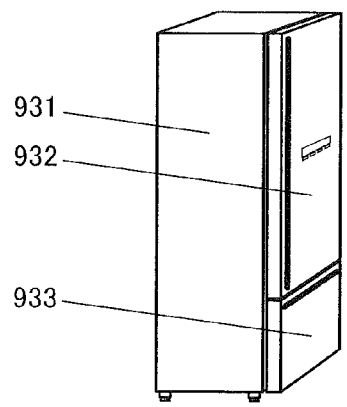

FIG. 56D illustrates an example of an electric refrigerator-freezer including a housing 931, a door for a refrigerator 932, a door for a freezer 933, and the like.

Figure 56E:
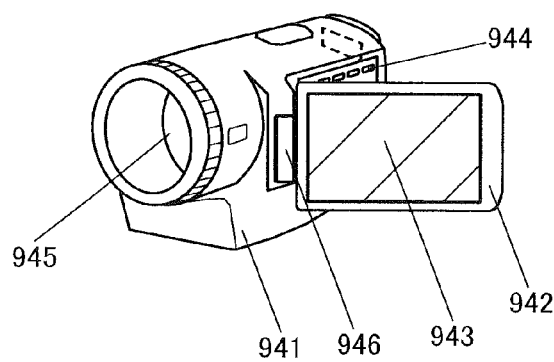

FIG. 56E illustrates an example of a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 56F:
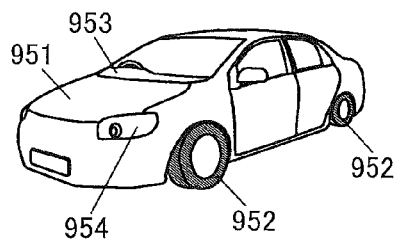

FIG. 56F illustrates an example of an automobile including a car body 951, wheels 952, a dashboard 953, lights 954, and the like.

This embodiment can be combined with any of the other embodiments described in this specification as appropriate.

(Embodiment 11)

In this embodiment, structures and properties of oxide semiconductors are described.

<Structure of Oxide Semiconductor>

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor (a-OS) and a crystalline oxide semiconductor. Examples of a crystalline oxide semiconductor include a single crystal oxide semiconductor, a CAAC-OS, a polycrystalline oxide semiconductor, and an nc-OS.

[a-OS]

It is known that an amorphous structure is generally defined as being metastable and unfixed, and being isotropic and having no non-uniform structure. In other words, an amorphous structure has a non-fixed bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor.

Note that an a-like OS has a periodic structure in a microscopic region, but at the same time has a void and has an unstable structure. For this reason, an a-like OS has physical properties similar to those of an amorphous oxide semiconductor.

[CAAC-OS]

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 57A:
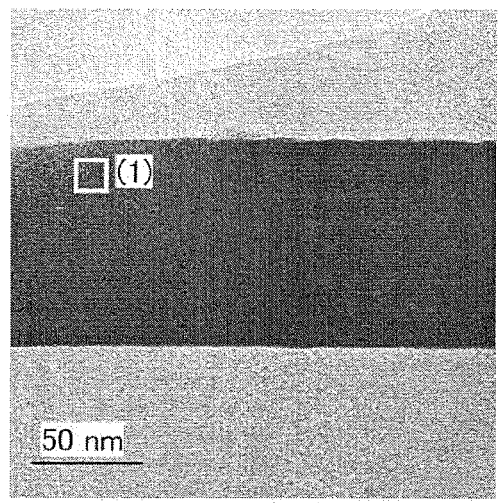
FIGS. 57A to 57D are Cs-corrected high-resolution TEM images of a cross section of a CAAC-OS and a cross-sectional schematic view of the CAAC-OS.

A CAAC-OS observed with TEM is described below. FIG. 57A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 57B:
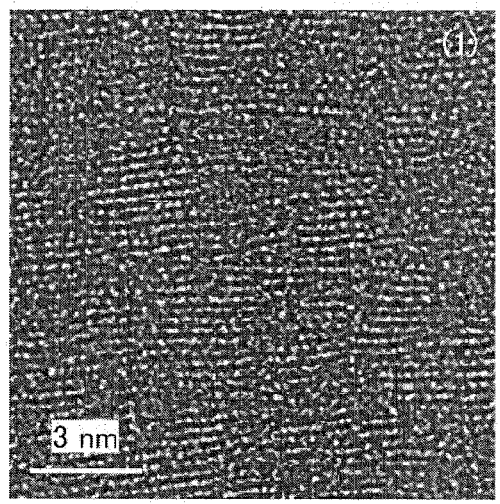

FIG. 57B is an enlarged Cs-corrected high-resolution TEM image of a region (1) in FIG. 57A. FIG. 57B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 57C:
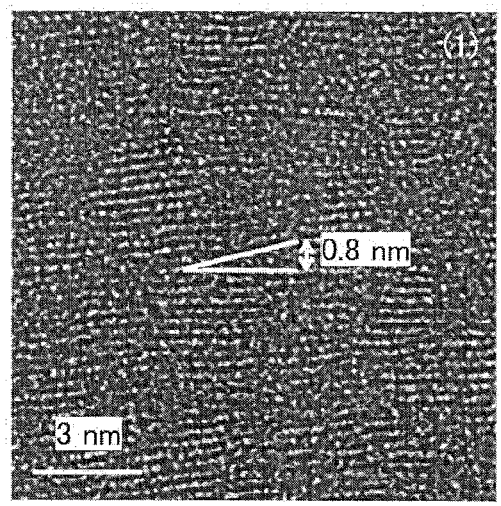

As shown in FIG. 57B, the CAAC-OS has a characteristic atomic arrangement. The characteristic atomic arrangement is denoted by an auxiliary line in FIG. 57C. FIGS. 57B and 57C prove that the size of a pellet is approximately 1 nm to 3 nm, and the space between the pellets caused by the tilt is approximately 0.8 nm. Therefore, the pellet can also be referred to as a nanocrystal (nc). Thus, a CAAC-OS can be also referred to as an oxide semiconductor including c-axis aligned nanocrystals (CANC).

Figure 57D:
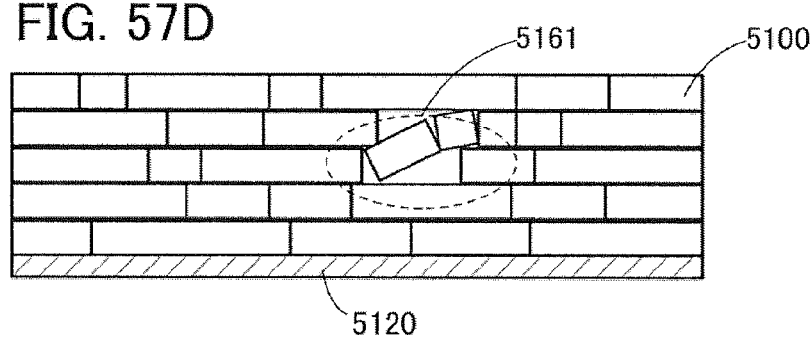

Here, according to the Cs-corrected high-resolution TEM images, the schematic arrangement of pellets 5100 of a CAAC-OS over a substrate 5120 is illustrated by such a structure in which bricks or blocks are stacked (see FIG. 57D). The part in which the pellets are tilted as observed in FIG. 57C corresponds to a region 5161 shown in FIG. 57D.

Figure 58A:
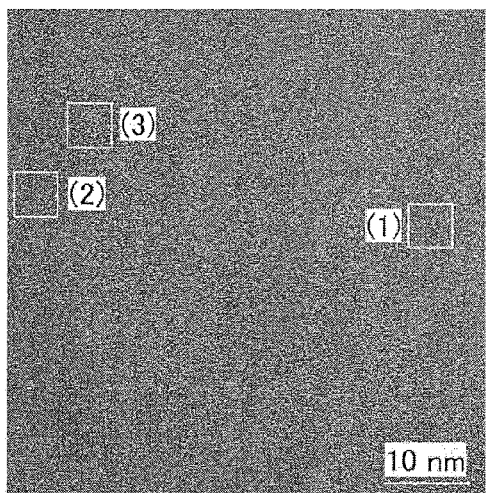
FIGS. 58A to 58D are Cs-corrected high-resolution TEM images of a plane of a CAAC-OS.
Figure 58B:
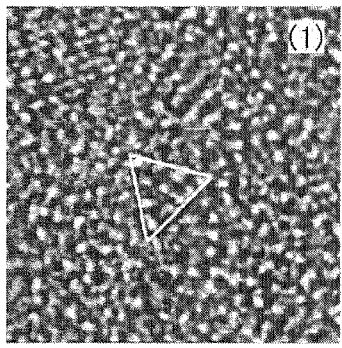
Figure 58C:
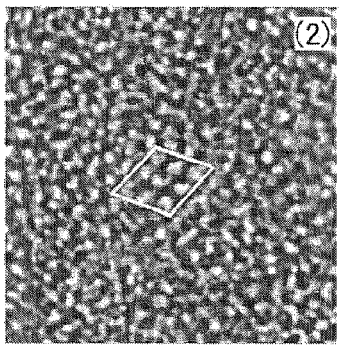
Figure 58D:
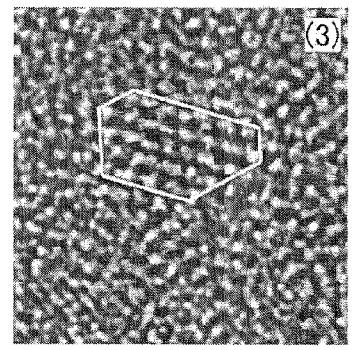

FIG. 58A shows a Cs-corrected high-resolution TEM image of a plane of the CAAC-OS observed from a direction substantially perpendicular to the sample surface. FIGS. 58B, 58C, and 58D are enlarged Cs-corrected high-resolution TEM images of regions (1), (2), and (3) in FIG. 58A, respectively. FIGS. 58B, 58C, and 58D indicate that metal atoms are arranged in a triangular, quadrangular, or hexagonal configuration in a pellet. However, there is no regularity of arrangement of metal atoms between different pellets.

Figure 59A:
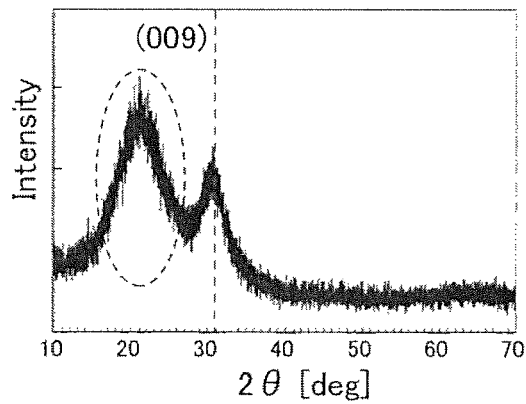
FIGS. 59A to 59C show structural analysis of a CAAC-OS and a single crystal oxide semiconductor by XRD.

Next, a CAAC-OS analyzed by X-ray diffraction (XRD) is described. For example, when the structure of a CAAC-OS including an InGaZnO$_4$ crystal is analyzed by an out-of-plane method, a peak appears at a diffraction angle (2θ) of 31° as shown in FIG. 59A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is 36°, in addition to the peak at 2θ of 31°. The peak at 2θ of 36° indicates that a crystal having no c-axis alignment is included in part of the CAAC-OS. A highly c-axis aligned CAAC-OS shows a peak at 2θ of 31° but does not give a peak at 2θ of 36° in the analysis by the out-of-plane method.

Figure 59B:
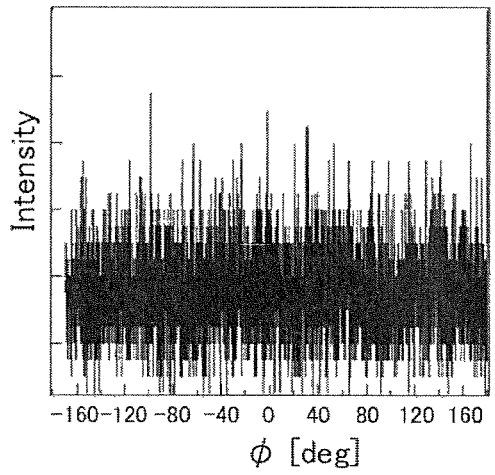
Figure 59C:
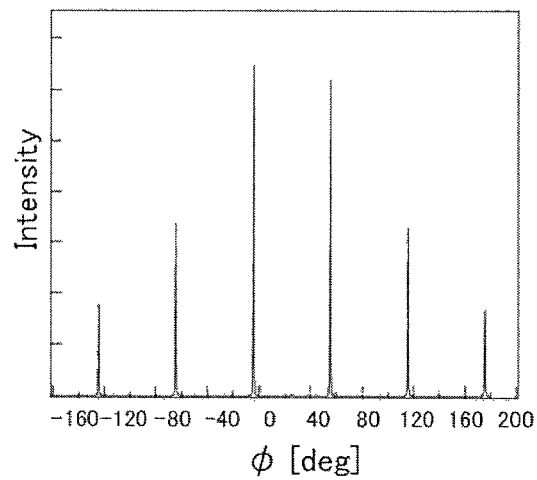

On the other hand, in structural analysis of the CAAC-OS by an in-plane method in which an X-ray is incident on a sample in a direction substantially perpendicular to the c-axis, a peak appears when 2θ is 56°. This peak is attributed to the (110) plane of the InGaZnO$_4$ crystal. In the case of the CAAC-OS, when analysis (ϕ scan) is performed with 2θ fixed at 56° and with the sample rotated about a normal vector of the sample surface as an axis (ϕ axis), as shown in FIG. 59B, a peak is not clearly observed. In contrast, in the case of a single crystal oxide semiconductor of InGaZnO$_4$, when ϕ scan is performed with 2θ fixed at 56°, as shown in FIG. 59C, six peaks which are derived from crystal planes equivalent to the (110) plane are observed. Accordingly, the structural analysis using XRD shows that the directions of a-axes and b-axes are irregularly orientated in the CAAC-OS.

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 60A can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 60B shows a diffraction pattern obtained in such a manner that an electron beam with a probe diameter of 300 nm is incident on the same sample in a direction perpendicular to the sample surface. As shown in FIG. 60B, a ring-like diffraction pattern is observed. Thus, the electron diffraction also indicates that the a-axes and b-axes of the pellets included in the CAAC-OS do not have regular orientation. The first ring in FIG. 60B is considered to be derived from the (010) plane, the (100) plane, and the like of the InGaZnO$_4$ crystal. The second ring in FIG. 60B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has negligible amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor abstracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The impurity contained in the oxide semiconductor serves as a carrier trap or a carrier generation source, for example. Furthermore, oxygen vacancies in the oxide semiconductor serve as carrier traps or carrier generation sources when hydrogen is captured therein.

Thus, the CAAC-OS having small numbers of impurities and oxygen vacancies has a very low carrier density (specifically, lower than $8\times10^{11}/cm^3$, preferably lower than $1\times10^{11}/cm^3$, further preferably lower than $1\times10^{10}/cm^3$, and is higher than or equal to $1\times10^{-9}/cm^3$). Such an oxide semiconductor film is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. An oxide semiconductor including a crystal part whose size is greater than 10 nm and less than or equal to 100 nm can be referred to as a microcrystalline oxide semiconductor. In a high-resolution TEM image of the nc-OS, for example, a grain boundary is not clearly observed in some cases. The crystal part of the nanocrystal can be considered to correspond to the pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, any crystal orientation is not observed in the whole film. Accordingly, the nc-OS cannot be distinguished from an a-like OS or a-OS, depending on an analysis method. For example, when the nc-OS is analyzed by an out-of-plane method using an X-ray beam having a diameter larger than the size of a pellet, a peak which shows a crystal plane cannot be detected. Furthermore, a diffraction pattern like a halo pattern is observed when the nc-OS is subjected to electron diffraction using an electron beam with a probe diameter (e.g., 50 nm or larger) that is larger than the size of a pellet.

On the other hand, spots appear in a nanobeam electron diffraction pattern of the nc-OS when an electron beam having a probe diameter close to or smaller than the size of a pellet is applied. Moreover, in a nanobeam electron diffraction pattern of the nc-OS, a plurality of circumferentially distributed spots can be observed. Also in a nanobeam electron diffraction pattern of the nc-OS, a plurality of spots can be observed in a ring-like region.

Since there is no regularity of crystal orientation between the pellets (nanocrystals) as mentioned above, the nc-OS can also be referred to as an oxide semiconductor including randomly aligned nanocrystals (RANC) or an oxide semiconductor including non-aligned nanocrystals (NANC).

The nc-OS is an oxide semiconductor that has high regularity as compared with an a-OS. Therefore, the nc-OS is likely to have a lower density of defect states than an a-like OS and an a-OS, but has a higher density of defect states than the CAAC-OS.

[a-Like OS]

An a-like OS is an oxide semiconductor having a structure intermediate between the nc-OS and the a-OS. The oxide semiconductor having such a structure is specifically referred to as an amorphous-like oxide semiconductor (a-like OS).

In a high-resolution TEM image of the a-like OS, a void can be observed. Furthermore, in the high-resolution TEM image, there are a region where a crystal part is clearly observed and a region where a crystal part is not observed.

The a-like OS has an unstable structure because it includes a void. To verify the instability of the structure of an a-like OS compared with those of a CAAC-OS and an nc-OS, a change in structure induced by electron irradiation is described below.

An a-like OS (referred to as Sample A), an nc-OS (referred to as Sample B), and a CAAC-OS (referred to as Sample C) were prepared as samples subjected to electron irradiation. Each of the samples was an In—Ga—Zn oxide.

First, a high-resolution cross-sectional TEM image of each sample was obtained for each sample. The high-resolution cross-sectional TEM images show that all the samples have crystal parts.

The determination of the crystal part was carried out as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value has been calculated to be 0.29 nm from crystal structural analysis. On the basis of this information, a portion where the lattice spacing between lattice fringes is greater than or equal to 0.28 nm and less than or equal to 0.30 nm was regarded as a crystal part of InGaZnO$_4$. Each of lattice fringes corresponds to the a-b plane of the InGaZnO$_4$ crystal.

Figure 61:
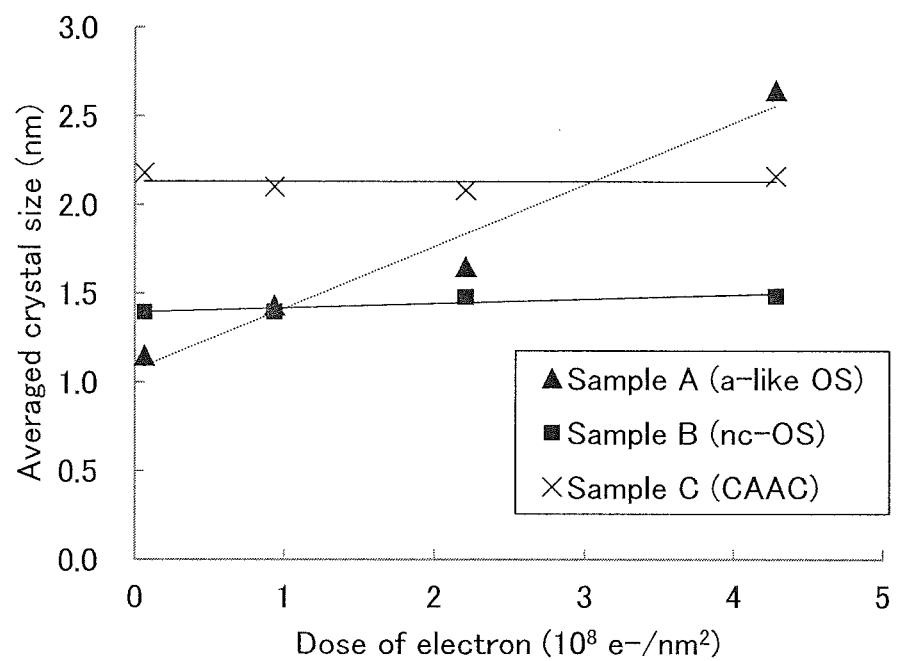
FIG. 61 shows a change in crystal part of an In—Ga—Zn oxide induced by electron irradiation.

Electron beam was irradiated on the samples, and the averaged size of crystal parts (at 22 points to 45 points) in each sample was plotted as shown in FIG. 61. FIG. 61 indicates that the crystal part size in the a-like OS increases with an increase in the cumulative electron dose. Specifically, as shown in FIG. 61, a crystal part of approximately 1.2 nm (also referred to as an initial nucleus) at the initial stage of the TEM observation grows to a size of approximately 2.6 nm at a cumulative electron dose of $4.2 \times 10^8$ $e^-/nm^2$. In contrast, the crystal part size in the nc-OS and the CAAC-OS shows little change even though the cumulative electron dose reaches $4.2 \times 10^8$ $e^-/nm^2$. Specifically, as shown in FIG. 61, the averaged crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is negligibly induced by electron irradiation. Therefore, it can be concluded that the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

<Deposition Model>

Examples of deposition models of a CAAC-OS and an nc-OS are described below.

Figure 62A:
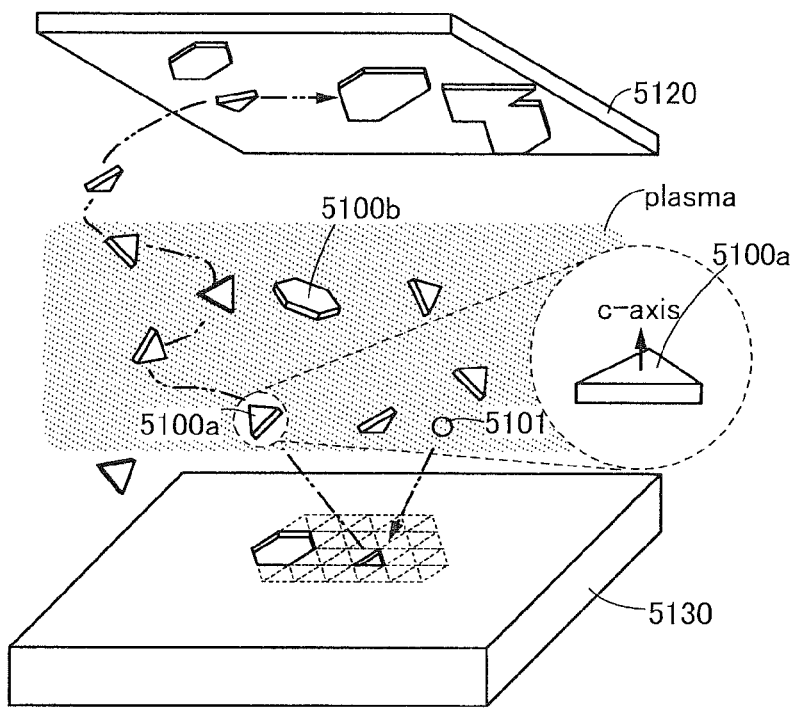
FIGS. 62A and 62B are schematic views illustrating deposition models of a CAAC-OS and an nc-OS.

FIG. 62A is a schematic view of the inside of a deposition chamber where a CAAC-OS is deposited by a sputtering method.

A target 5130 is attached to a backing plate. A plurality of magnets is provided to face the target 5130 with the backing plate positioned therebetween. The plurality of magnets generates a magnetic field. A sputtering method in which the disposition rate is increased by utilizing a magnetic field of magnets is referred to as a magnetron sputtering method.

The substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation ($O^+$) and an argon cation ($Ar^+$).

Figure 63A:
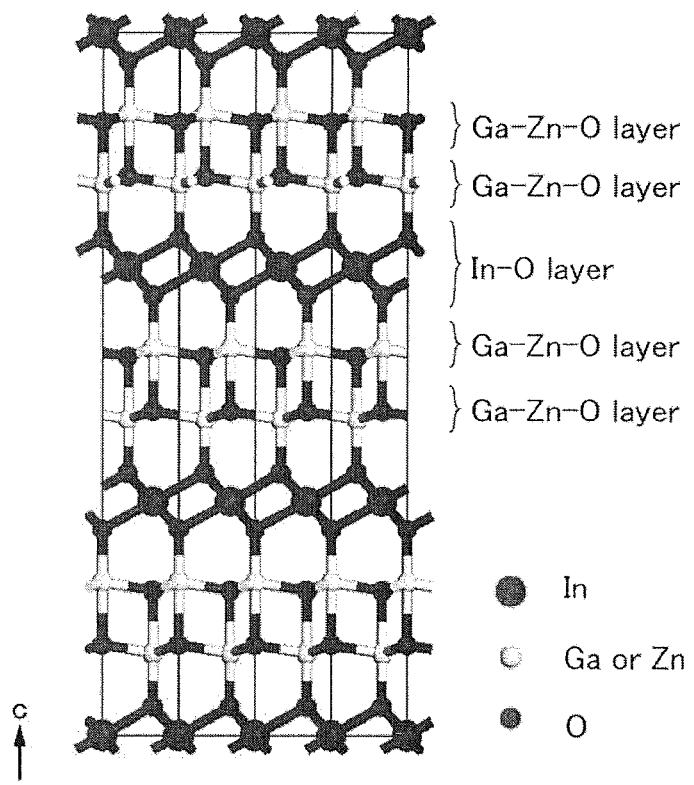
FIGS. 63A to 63C show an $InGaZnO_4$ crystal and a pellet.

Here, the target 5130 has a polycrystalline structure which includes a plurality of crystal grains and in which a cleavage plane exists in at least one crystal grain. FIG. 63A shows a structure of an $InGaZnO_4$ crystal included in the target 5130 as an example. Note that FIG. 63A shows a structure of the case where the $InGaZnO_4$ crystal is observed from a direction parallel to the b-axis. FIG. 63A indicates that oxygen atoms in a Ga—Zn—O layer are positioned close to those in an adjacent Ga—Zn—O layer. The oxygen atoms have negative charge, whereby repulsive force is generated between the two adjacent Ga—Zn—O layers. As a result, the $InGaZnO_4$ crystal is considered to have a cleavage plane between the two adjacent Ga—Zn—O layers.

The ion 5101 generated in the high-density plasma region is accelerated toward the target 5130 side by an electric field, and then collides with the target 5130. At this time, a pellet 5100a and a pellet 5100b which are flat-plate-like (pellet-like) sputtered particles are separated and sputtered from the cleavage plane. Note that structures of the pellet 5100a and the pellet 5100b may be distorted by an impact of collision of the ion 5101.

The pellet 5100a is a flat-plate-like (pellet-like) sputtered particle having a triangle plane, e.g., regular triangle plane. The pellet 5100b is a flat-plate-like (pellet-like) sputtered particle having a hexagon plane, e.g., regular hexagon plane. Note that flat-plate-like (pellet-like) sputtered particles such as the pellet 5100a and the pellet 5100b are collectively called pellets 5100. The shape of a flat plane of the pellet 5100 is not limited to a triangle or a hexagon. For example, the flat plane may have a shape formed by combining two or more triangles. For example, a quadrangle (e.g., rhombus) may be formed by combining two triangles (e.g., regular triangles).

Figure 63B:
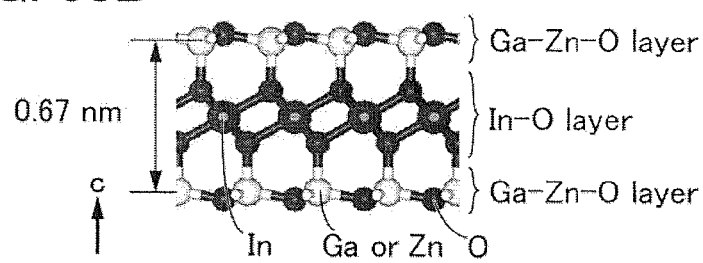
Figure 63C:
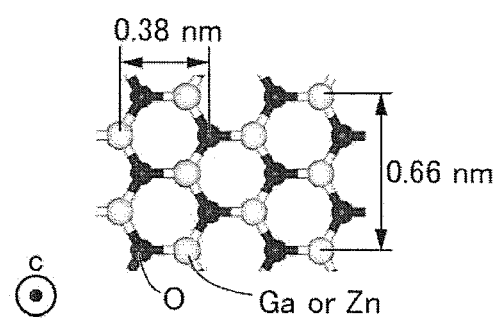

The thickness of the pellet 5100 is determined depending on the kind of deposition gas and the like. The thicknesses of the pellets 5100 are preferably uniform; the reason for this is described later. In addition, the sputtered particle preferably has a pellet shape with a small thickness as compared to a dice shape with a large thickness. For example, the thickness of the pellet 5100 is greater than or equal to 0.4 nm and less than or equal to 1 nm, preferably greater than or equal to 0.6 nm and less than or equal to 0.8 nm. In addition, for example, the width of the pellet 5100 is greater than or equal to 1 nm and less than or equal to 3 nm, preferably greater than or equal to 1.2 nm and less than or equal to 2.5 nm. The pellet 5100 may correspond to the initial nucleus at the initial stage of the TEM observation of an a-like OS. For example, when the ion 5101 collides with the target 5130 including an In—Ga—Zn oxide, the pellet 5100 that includes three layers of a Ga—Zn—O layer, an In—O layer, and a Ga—Zn—O layer as shown in FIG. 63B is separated. Note that FIG. 63C shows the structure of the separated pellet 5100 which is observed from a direction parallel to the c-axis. The pellet 5100 has a nanometer-sized sandwich structure including two Ga—Zn—O layers having an In—O layer therebetween.

The pellet 5100 may receive a charge when passing through the plasma, so that side surfaces thereof are negatively or positively charged. In the pellet 5100, for example, an oxygen atom positioned on its side surface may be negatively charged. When the side surfaces are charged with the same polarity, charges repel each other, and accordingly, the pellet 5100 can maintain a flat-plate (pellet) shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged. In addition, the pellet 5100 may grow by being bonded with an indium atom, a gallium atom, a zinc atom, an oxygen atom, or the like when passing through plasma. The increase in the averaged crystal size for Sample A shown in FIG. 61 may correspond to the amount of growth in plasma. Here, in the case where the temperature of the substrate 5120 is at around room temperature, the pellet 5100 on the substrate 5120 hardly grows; thus, an nc-OS is formed (see FIG. 62B). An nc-OS can be deposited when the substrate 5120 has a large size because the deposition of an nc-OS can be carried out at room temperature. Note that in order that the pellet 5100 grows in plasma, it is effective to increase deposition power in sputtering. High deposition power can stabilize the structure of the pellet 5100.

Figure 62B:
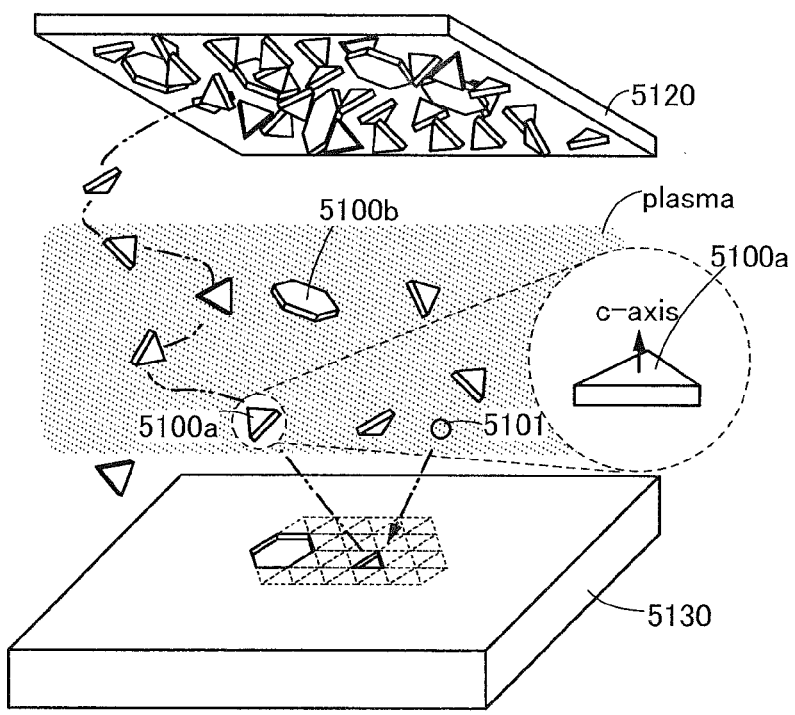

As shown in FIGS. 62A and 62B, the pellet 5100 flies in plasma and flutters up to the substrate 5120. Since the pellets 5100 are charged, when the pellet 5100 approaches a deposited another pellet 5100, repulsion occurs. Here, above the substrate 5120, a magnetic field in a direction parallel to the top surface of the substrate 5120 (also referred to as a horizontal magnetic field) is generated. A potential difference is given between the substrate 5120 and the target 5130, and accordingly, current might flow from the substrate 5120 toward the target 5130. Thus, the pellet 5100 might be given a force (Lorentz force) on the top surface of the substrate 5120 by an effect of the magnetic field and the current. This is explainable with Fleming's left-hand rule.

The mass of the pellet 5100 is larger than that of an atom. Therefore, to move the pellet 5100 over the top surface of the substrate 5120, it is important to apply some force to the pellet 5100 from the outside. One kind of the force might be generated by the action of a magnetic field and current. In order to apply a sufficient force to the pellet 5100 so that the pellet 5100 moves over a top surface of the substrate 5120, it is preferable to provide, on the top surface, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 5120 is 1.5 times or higher, preferably twice or higher, further preferably 3 times or higher, still further preferably 5 times or higher as high as the magnetic field in a direction perpendicular to the top surface of the substrate 5120.

At this time, the magnets and the substrate 5120 are moved or rotated relatively, whereby the direction of the horizontal magnetic field on the top surface of the substrate 5120 continues to change. Therefore, the pellet 5100 might be moved in various directions on the top surface of the substrate 5120 by receiving forces in various directions.

Furthermore, as shown in FIG. 62A, when the substrate 5120 is heated, resistance between the pellet 5100 and the substrate 5120 due to friction or the like could be decreased. As a result, the pellet 5100 might glide above the top surface of the substrate 5120 in a state where its flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is eliminated. With the eliminated oxygen atom, oxygen vacancies in a CAAC-OS might be filled; thus, the CAAC-OS has a low density of defect states. Note that the temperature of the top surface of the substrate 5120 is, for example, higher than or equal to 100° C. and lower than 500° C., higher than or equal to 150° C. and lower than 450° C., or higher than or equal to 170° C. and lower than 400° C. Hence, even when the substrate 5120 has a large size, it is possible to deposit a CAAC-OS.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur because the pellet 5100 is substantially single crystal. Thus, formation of defects such as a grain boundary due to expansion of a space between the pellets 5100 can be prevented, and accordingly, generation of crevasses can be prevented.

The CAAC-OS does not have a structure like a board of a single crystal oxide semiconductor but has arrangement with a group of pellets 5100 (nanocrystals) like stacked bricks or blocks. Furthermore, a grain boundary does not exist between the pellets 5100. Therefore, even if deformation such as shrink could occur in the CAAC-OS owing to heating during deposition or heating or bending after deposition, it might be possible to relieve local stress or release distortion. Therefore, this structure is suitable for a flexible semiconductor device. Note that the nc-OS has arrangement in which pellets 5100 (nanocrystals) are randomly stacked.

When the target 5130 is sputtered with the ion 5101, in addition to the pellets 5100, zinc oxide or the like may be separated. The zinc oxide is lighter than the pellet 5100 and thus might reach the top surface of the substrate 5120 before the pellet 5100. As a result, the zinc oxide forms a zinc oxide layer 5102 with a thickness greater than or equal to 0.1 nm and less than or equal to 10 nm, greater than or equal to 0.2 nm and less than or equal to 5 nm, or greater than or equal to 0.5 nm and less than or equal to 2 nm. FIGS. 64A to 64D are cross-sectional schematic views.

Figure 64A:
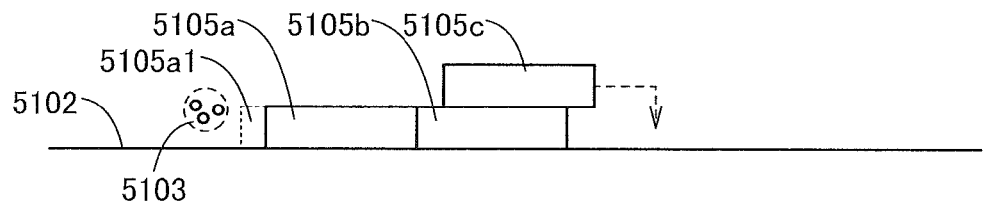
FIGS. 64A to 64D are schematic diagrams illustrating a deposition model of a CAAC-OS.

As illustrated in FIG. 64A, a pellet 5105a and a pellet 5105b are deposited over the zinc oxide layer 5102. Here, side surfaces of the pellet 5105a and the pellet 5105b are in contact with each other. In addition, a pellet 5105c is considered to be deposited over the pellet 5105b, and then glide over the pellet 5105b. Furthermore, a plurality of particles 5103 separated from the target together with the zinc oxide is crystallized by heat from the substrate 5120 to form a region 5105a1 on another side surface of the pellet 5105a. Note that the plurality of particles 5103 may contain oxygen, zinc, indium, gallium, or the like.

Figure 64B:
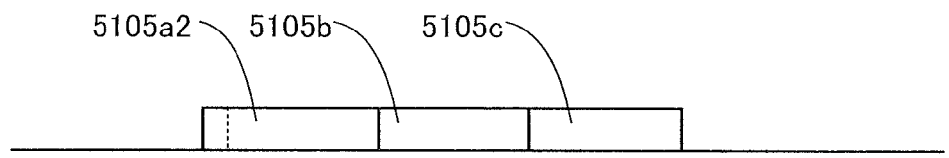

Then, as illustrated in FIG. 64B, the region 5105a1 grows to part of the pellet 5105a to form a pellet 5105a2. In addition, a side surface of the pellet 5105c is in contact with another side surface of the pellet 5105b.

Figure 64C:
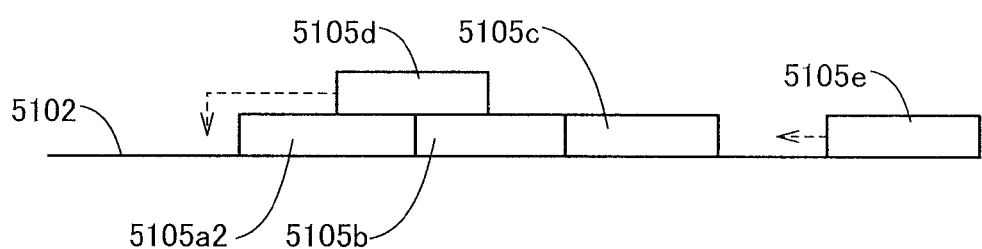

Next, as illustrated in FIG. 64C, a pellet 5105d might be deposited over the pellet 5105a2 and the pellet 5105b, and then glide over the pellet 5105a2 and the pellet 5105b. Furthermore, a pellet 5105e might glide toward another side surface of the pellet 5105c over the zinc oxide layer 5102.

Figure 64D:
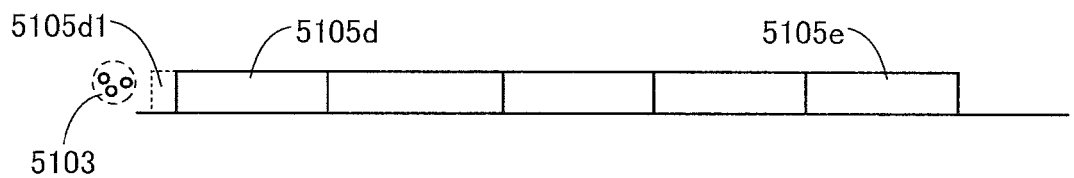

Then, as illustrated in FIG. 64D, the pellet 5105d might be placed so that a side surface of the pellet 5105d is in contact with a side surface of the pellet 5105a2. Furthermore, a side surface of the pellet 5105e might be in contact with another side surface of the pellet 5105c. A plurality of particles 5103 separated from the target 5130 together with the zinc oxide is crystallized by heat from the substrate 5120 to form a region 5105d1 on another side surface of the pellet 5105d.

As described above, it can be considered that the deposited pellets are placed to be in contact with each other and then growth is caused at side surfaces of the pellets, whereby a CAAC-OS is formed over the substrate 5120. Therefore, each pellet of the CAAC-OS is larger than that of the nc-OS. A difference in the averaged crystal size between Samples B and C shown in FIG. 61 corresponds to the amount of growth after deposition.

When spaces between pellets are extremely small, the pellets may form a large pellet. The large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above. In this case, in an oxide semiconductor used for a minute transistor, a channel formation region might be fit inside the large pellet. That is, the region having a single crystal structure can be used as the channel formation region. Furthermore, when the size of the pellet is increased, the region having a single crystal structure can be used as the channel formation region, the source region, and the drain region of the transistor.

In this manner, when the channel formation region or the like of the transistor is formed in a region having a single crystal structure, the frequency characteristics of the transistor can be increased in some cases.

As shown in such a model, the pellets 5100 are considered to be deposited on the substrate 5120. Thus, a CAAC-OS can be deposited even when a formation surface does not have a crystal structure; therefore, a growth mechanism in this case is different from epitaxial growth. In addition, laser crystallization is not needed for formation of a CAAC-OS, and a uniform film can be formed even over a large-sized glass substrate or the like. For example, even when the formation surface has an amorphous structure (e.g., the formation surface is formed of amorphous silicon oxide), a CAAC-OS can be formed.

In addition, it was found that in formation of the CAAC-OS, the pellets 5100 are arranged in accordance with the top surface shape of the substrate 5120 that is the formation surface even when the formation surface has unevenness. For example, in the case where the top surface of the substrate 5120 is flat at the atomic level, the pellets 5100 are arranged so that flat planes parallel to the a-b plane face downwards. In the case where the thickness of the pellets 5100 is uniform, a layer with a uniform thickness, flatness, and high crystallinity might be formed. By stacking n layers (n is a natural number), the CAAC-OS can be obtained.

In the case where the top surface of the substrate 5120 has unevenness, n layers (n is a natural number) in which the pellets 5100 are arranged along the unevenness are stacked in a CAAC-OS. Since the substrate 5120 has unevenness, a gap is easily generated between the pellets 5100 in the CAAC-OS in some cases. Note that, even in such a case, the pellets 5100 are arranged so that a gap between the pellets is as small as possible. Therefore, even when the formation surface has unevenness, a CAAC-OS with high crystallinity can be obtained.

Since a CAAC-OS is considered to be deposited in accordance with such a model, the sputtered particle preferably has a pellet shape with a small thickness. Note that when the sputtered particles have a dice shape with a large thickness, planes facing the substrate 5120 vary; thus, the thicknesses and orientations of the crystals cannot be uniform in some cases.

According to the deposition model described above, a CAAC-OS with high crystallinity could be formed even on a formation surface with an amorphous structure.

II. EXPLANATION OF REFERENCE

100: semiconductor device, 102: electrode, 103: electrode, 104: electrode, 106: insulating layer, 107: insulating layer, 108: oxide semiconductor layer, 109: electrode, 110: insulating layer, 111: electrode, 112: insulating layer, 113: insulating layer, 114: electrode, 116: insulating layer, 117: electrode, 118: electrode, 119: electrode, 120: insulating layer, 121: conductive layer, 127: conductive layer, 131: insulating layer, 132: electrode, 135: opening, 136: opening, 137: opening, 138: opening, 142: electrode, 150: transistor, 155: transistor, 156: transistor, 157: opening, 160: transistor, 165: transistor, 166: transistor, 170: transistor, 175: transistor, 176: transistor, 190: capacitor, 210: semiconductor device, 220: semiconductor device, 230: semiconductor device, 240: semiconductor device, 250: semiconductor device, 260: semiconductor device, 280: impurity element, 281: edge, 382: Ec, 386: Ec, 390: trap states, 401: pixel portion, 404: scan line driver circuit, 406: signal line driver circuit, 407: scan line. 409: signal line, 411: pixel, 415: capacitor line, 432: liquid crystal element, 434: transistor, 435: light-emitting element, 436: node, 437: node, 500: memory device, 700: substrate, 701: circuit, 702: circuit, 703: switch, 704: switch, 706: logic element, 707: capacitor, 708: capacitor, 709: transistor, 710: transistor, 713: transistor, 714: transistor, 720: circuit, 730: memory device, 750: transistor, 751: electrode, 752: insulating layer, 753: channel formation region, 754: n-type impurity region, 755: n-type impurity region, 756: sidewall insulating layer, 757: opening, 760: substrate, 765: n-type impurity region, 789: element separation region, 790: insulating layer, 791: insulating layer, 800: RF tag, 801: communication device, 802: antenna, 803: radio signal, 804: antenna, 805: rectifier circuit, 806: constant voltage circuit, 807: demodulation circuit, 808: modulation circuit, 809: logic circuit, 810: memory circuit, 811: ROM, 901: housing, 902: housing, 903: display portion, 904: display portion, 905: microphone, 906: speaker, 907: operation key, 908: stylus, 911: housing, 912: housing, 913: display portion, 914: display portion, 915: joint, 916: operation key, 921: housing, 922: display portion, 923: keyboard, 924: pointing device, 931: housing, 932: door for a refrigerator, 933: door for a freezer, 941: housing, 942: housing, 943: display portion, 944: operation key, 945: lens, 946: joint, 951: car body, 952: wheel, 953: dashboard, 954: light, 1001: semiconductor device, 1002: semiconductor device, 1100: semiconductor device, 1101: semiconductor device, 1102: semiconductor device, 1110: semiconductor device, 1120: semiconductor device, 1130: semiconductor device, 1140: semiconductor device, 1150: semiconductor device, 1160: semiconductor device, 1170: semiconductor device, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 1200: semiconductor device, 1201: semiconductor device, 1202: semiconductor device, 1210: semiconductor device, 1220: semiconductor device, 1230: semiconductor device, 1240: semiconductor device, 1250: semiconductor device, 1260: semiconductor device, 1270: semiconductor device, 1500: memory device, 1600: memory device, 3001: wiring, 3002: wiring, 3003: wiring, 3004: wiring, 3005: wiring, 4000: RF rag, 8000: display module, 8001: upper cover, 8002: lower cover, 8003: FPC, 8004: touch sensor, 8005: FPC, 8006: cell, 8007: backlight unit, 8008: light source, 8009: frame, 8010: printed board, 8011: battery, 108*a*: oxide semiconductor layer, 108*b*: oxide semiconductor layer, 108*c*: oxide semiconductor layer, 115*a*: oxide semiconductor layer, 115*b*: oxide semiconductor layer, 115*c*: oxide semiconductor layer, 151*a*: oxide semiconductor layer, 151*c*: oxide semiconductor layer, 383*a*: Ec, 383*b*: Ec, 383*c*: Ec, 431_1: transistor, 431_2: transistor, 433_1: capacitor, 433_2: capacitor.

This application is based on Japanese Patent Application serial no. 2013-269090 filed with Japan Patent Office on Dec. 26, 2013, Japanese Patent Application serial no. 2013-269129 filed with Japan Patent Office on Dec. 26, 2013, and Japanese Patent Application serial no. 2014-006675 filed with Japan Patent Office on Jan. 17, 2014, the entire contents of which are hereby incorporated by reference.

The invention claimed is:

1. A semiconductor device comprising:
a first transistor comprising a first gate electrode; and
a second transistor comprising a second gate electrode, a source electrode, a drain electrode, and a semiconductor layer,
wherein:
the source electrode is over and electrically connected to the first gate electrode;
the semiconductor layer is in contact with the source electrode and the drain electrode;
the second gate electrode is over the semiconductor layer; and
the semiconductor layer comprises:
a first oxide semiconductor layer underneath and in contact with the source electrode and the drain electrode;
a second oxide semiconductor layer over and in contact with the first oxide semiconductor layer, the source electrode, and the drain electrode; and
a third oxide semiconductor layer over and in contact with the second oxide semiconductor layer.

2. The semiconductor device according to claim 1, wherein the third oxide semiconductor layer is in contact with a side surface of the first oxide semiconductor layer and a side surface of the second oxide semiconductor layer.

3. The semiconductor device according to claim 1, wherein a conduction band minimum of the first oxide semiconductor layer and a conduction band minimum of the third oxide semiconductor layer are each closer to a vacuum level than a conduction band minimum of the second oxide semiconductor layer is.

4. The semiconductor device according to claim 1, wherein:
the first oxide semiconductor layer and the second oxide semiconductor layer each comprise an In-M-Zn oxide where M is selected from Al, Ti, Ga, Y, Zr, La, Ce, Nd, and Hf; and
$y_1/x_1$ is larger than $y_2/x_2$ where:
a composition of the In-M-Zn oxide in the first oxide semiconductor layer is $In:M:Zn=x_1:y_1:z_1$; and
a composition of the In-M-Zn oxide in the second oxide semiconductor layer is $In:M:Zn=x_2:y_2:z_2$.

5. The semiconductor device according to claim 1, further comprising a capacitor which overlaps with the first transistor,
wherein:
the capacitor comprises a dielectric interposed between a pair of electrodes; and
one of the pair of electrodes is shared by the source electrode.

6. The semiconductor device according to claim 1, wherein:
the second transistor further comprises a third gate electrode; and
the third gate electrode originates from the same layer of the first gate electrode.

7. The semiconductor device according to claim 2, wherein the side surface of the first oxide semiconductor layer and the side surface of the second oxide semiconductor layer are aligned with each other.

8. An electronic device comprising the semiconductor device according to claim 1.

9. A semiconductor device comprising:
a first transistor comprising a first gate electrode; and
a second transistor comprising a second gate electrode, a source electrode, a drain electrode, and a semiconductor layer,
wherein:
the source electrode is over and electrically connected to the first gate electrode;
the semiconductor layer is in contact with the source electrode and the drain electrode;
the second gate electrode is over the semiconductor layer; and
the semiconductor layer comprises:
a first oxide semiconductor layer in contact with the source electrode and the drain electrode;
a second oxide semiconductor layer over and in contact with the first oxide semiconductor layer, the source electrode, and the drain electrode;
a third oxide semiconductor layer over and in contact with the second oxide semiconductor layer; and
the source electrode and the drain electrode are provided between the first oxide semiconductor layer and the second oxide semiconductor layer.

10. The semiconductor device according to claim 9, wherein the third oxide semiconductor layer is in contact with a side surface of the first oxide semiconductor layer and a side surface of the second oxide semiconductor layer.

11. The semiconductor device according to claim 9, wherein a conduction band minimum of the first oxide semiconductor layer and a conduction band minimum of the third oxide semiconductor layer are each closer to a vacuum level than a conduction band minimum of the second oxide semiconductor layer is.

12. The semiconductor device according to claim 9, wherein:
   the first oxide semiconductor layer and the second oxide semiconductor layer each comprise an In-M-Zn oxide where M is selected from Al, Ti, Ga, Y, Zr, La, Ce, Nd, and Hf; and
   $y_1/x_1$ is larger than $y_2/x_2$ where:
      a composition of the In-M-Zn oxide in the first oxide semiconductor layer is In:M:Zn=$x_1$:$y_1$:$z_1$; and
      a composition of the In-M-Zn oxide in the second oxide semiconductor layer is In:M:Zn=$x_2$:$y_2$:$z_2$.

13. The semiconductor device according to claim 9, further comprising a capacitor which overlaps with the first transistor,
   wherein:
      the capacitor comprises a dielectric interposed between a pair of electrodes; and
      one of the pair of electrodes is shared by the source electrode.

14. The semiconductor device according to claim 9, wherein:
   the second transistor further comprises a third gate electrode; and
   the third gate electrode originates from the same layer of the first gate electrode.

15. The semiconductor device according to claim 10, wherein the side surface of the first oxide semiconductor layer and the side surface of the second oxide semiconductor layer are aligned with each other.

16. An electronic device comprising the semiconductor device according to claim 9.

* * * * *